US012085263B2

(12) United States Patent
Jiang et al.

(10) Patent No.: US 12,085,263 B2
(45) Date of Patent: Sep. 10, 2024

(54) LED TUBE LAMP

(71) Applicant: JIAXING SUPER LIGHTING ELECTRIC APPLIANCE CO., LTD, Zhejiang (CN)

(72) Inventors: Tao Jiang, Zhejiang (CN); Qifeng Ye, Zhejiang (CN); Aiming Xiong, Zhejiang (CN); Yueqiang Zhang, Zhejiang (CN)

(73) Assignee: JIAXING SUPER LIGHTING ELECTRIC APPLIANCE CO., LTD, Zhejiang (CN)

( * ) Notice: Subject to any disclaimer, the term of this patent is extended or adjusted under 35 U.S.C. 154(b) by 0 days.

(21) Appl. No.: 18/209,706

(22) Filed: Jun. 14, 2023

(65) Prior Publication Data

US 2023/0324031 A1 Oct. 12, 2023

Related U.S. Application Data

(63) Continuation of application No. 17/149,090, filed on Jan. 14, 2021, now Pat. No. 11,686,457, which is a
(Continued)

(30) Foreign Application Priority Data

Sep. 28, 2014 (CN) .......................... 201410507660.9
Sep. 28, 2014 (CN) .......................... 201410508899.8
(Continued)

(51) Int. Cl.
*F21V 19/00* (2006.01)
*F21K 9/27* (2016.01)
(Continued)

(52) U.S. Cl.
CPC .............. *F21V 19/003* (2013.01); *F21K 9/27* (2016.08); *F21K 9/278* (2016.08); *F21V 23/009* (2013.01);
(Continued)

(58) Field of Classification Search
CPC ........ F21V 19/003; F21V 23/023; F21K 9/27; F21K 9/278; H05B 45/00; H05B 45/37; H05B 45/395
See application file for complete search history.

(56) References Cited

U.S. PATENT DOCUMENTS 1,088,142 A 2/1914 Gardner
5,616,990 A 4/1997 Garbowicz et al.
(Continued)

FOREIGN PATENT DOCUMENTS

CN 2058533 U 6/1990
CN 1171839 A 1/1998
(Continued)

OTHER PUBLICATIONS

Petition for Inter Parte Review of U.S. Pat. No. 9,897,265 Under 35 U.S.C.311-319 and 37 C.F.R. 42.1-080, 42.100-.123., Nov. 18, 2019.
(Continued)

*Primary Examiner* — Alexander H Taningco
*Assistant Examiner* — Pedro C Fernandez
(74) *Attorney, Agent, or Firm* — Andrew M. Calderon; Calderon Safran & Wright, PC

(57) ABSTRACT

An LED light tube includes a glass tube, end caps, an LED light strip, LED light sources, and a power supply module. The end caps are respectively attached at two ends of the glass tube. The LED light strip is attached to an inner circumferential surface of the glass tube. The LED light sources are mounted on the LED light strip. The power
(Continued)

supply module is electrically connected to the LED light strip. Each of the end caps includes a lateral wall and an end wall. The lateral wall is substantially coaxial with the glass tube and connected to the glass tube. The end wall is substantially perpendicular to an axial direction of the lateral wall and connected to an end of the lateral wall away from the glass tube. The power supply module includes a rectifying circuit and a filtering circuit electrically connected to the rectifying circuit.

38 Claims, 66 Drawing Sheets

Related U.S. Application Data continuation of application No. 16/743,526, filed on Jan. 15, 2020, now Pat. No. 10,897,801, which is a continuation of application No. 16/373,200, filed on Apr. 2, 2019, now Pat. No. 10,560,989, which is a continuation of application No. 15/888,335, filed on Feb. 5, 2018, now Pat. No. 10,426,003, which is a continuation of application No. 15/643,034, filed on Jul. 6, 2017, now Pat. No. 10,021,742, which is a continuation-in-part of application No. 15/258,068, filed on Sep. 7, 2016, now Pat. No. 9,723,662, which is a continuation of application No. 14/699,138, filed on Apr. 29, 2015, now Pat. No. 9,480,109, said application No. 15/643,034 is a continuation-in-part of application No. 15/298,955, filed on Oct. 20, 2016, now Pat. No. 9,845,923, which is a continuation of application No. 14/865,387, filed on Sep. 25, 2015, now Pat. No. 9,609,711, said application No. 15/643,034 is a continuation-in-part of application No. 15/211,783, filed on Jul. 15, 2016, now Pat. No. 9,885,449, which is a continuation-in-part of application No. 15/087,088, filed on Mar. 31, 2016, now Pat. No. 9,879,852, said application No. 15/643,034 is a continuation-in-part of application No. 15/483,368, filed on Apr. 10, 2017, now Pat. No. 9,945,520, which is a continuation of application No. 15/211,717, filed on Jul. 15, 2016, now Pat. No. 9,618,168, which is a continuation-in-part of application No. 15/056,121, filed on Feb. 29, 2016, now Pat. No. 9,447,929, said application No. 15/643,034 is a continuation-in-part of application No. 15/168,962, filed on May 31, 2016, now Pat. No. 10,634,337, which is a continuation-in-part of application No. PCT/CN2015/096502, filed on Dec. 5, 2015, and a continuation-in-part of application No. 15/087,092, filed on Mar. 31, 2016, now Pat. No. 10,082,250, said application No. 15/643,034 is a continuation-in-part of application No. 15/055,630, filed on Feb. 28, 2016, now Pat. No. 9,781,805, and a continuation-in-part of application No. 15/339,221, filed on Oct. 31, 2016, now Pat. No. 9,939,140, which is a continuation-in-part of application No. 15/210,989, filed on Jul. 15, 2016, now Pat. No. 9,587,817, which is a continuation-in-part of application No. 15/205,011, filed on Jul. 8, 2016, now Pat. No. 9,629,211, which is a continuation-in-part of application No. 15/150,458, filed on May 10, 2016, now Pat. No. 9,794,990, which is a continuation of application No. 14/865,387, filed on Sep. 25, 2015, now Pat. No. 9,609,711, which is a continuation-in-part of application No. 14/699,138, filed on Apr. 29, 2015, now Pat. No. 9,480,109, said application No. 15/210,989 is a continuation-in-part of application No. 15/066,645, filed on Mar. 10, 2016, now Pat. No. 9,497,821, which is a continuation-in-part of application No. 14/865,387, filed on Sep. 25, 2015, now Pat. No. 9,609,711.

(30) Foreign Application Priority Data

| Date | | Number |
|---|---|---|
| Oct. 17, 2014 | (CN) | 201420602526.2 |
| Nov. 6, 2014 | (CN) | 201410623355.6 |
| Dec. 5, 2014 | (CN) | 201410734425.5 |
| Feb. 12, 2015 | (CN) | 201510075925.7 |
| Mar. 10, 2015 | (CN) | 201510104823.3 |
| Mar. 25, 2015 | (CN) | 201510133689.X |
| Mar. 26, 2015 | (CN) | 201510134586.5 |
| Mar. 27, 2015 | (CN) | 201510136796.8 |
| Apr. 3, 2015 | (CN) | 201510155807.7 |
| Apr. 14, 2015 | (CN) | 201510173861.4 |
| Apr. 22, 2015 | (CN) | 201510193980.6 |
| May 19, 2015 | (CN) | 201510259151.3 |
| May 22, 2015 | (CN) | 201510268927.8 |
| May 29, 2015 | (CN) | 201510284720.X |
| Jun. 10, 2015 | (CN) | 201510315636.X |
| Jun. 12, 2015 | (CN) | 201510324394.0 |
| Jun. 17, 2015 | (CN) | 201510338027.6 |
| Jun. 26, 2015 | (CN) | 201510364735.7 |
| Jun. 26, 2015 | (CN) | 201510372375.5 |
| Jun. 26, 2015 | (CN) | 201510373492.3 |
| Jun. 29, 2015 | (CN) | 201510378322.4 |
| Jul. 2, 2015 | (CN) | 201510391910.1 |
| Jul. 10, 2015 | (CN) | 201510406595.5 |
| Jul. 20, 2015 | (CN) | 201510428680.1 |
| Jul. 27, 2015 | (CN) | 201510448220.5 |
| Aug. 7, 2015 | (CN) | 201510482944.1 |
| Aug. 8, 2015 | (CN) | 201510483475.5 |
| Aug. 8, 2015 | (CN) | 201510486115.0 |
| Aug. 14, 2015 | (CN) | 201510499512.1 |
| Aug. 26, 2015 | (CN) | 201510530110.3 |
| Sep. 2, 2015 | (CN) | 201510555543.4 |
| Sep. 6, 2015 | (CN) | 201510557717.0 |
| Sep. 18, 2015 | (CN) | 201510595173.7 |
| Sep. 25, 2015 | (CN) | 201510617370.4 |
| Oct. 8, 2015 | (CN) | 201510645134.3 |
| Oct. 10, 2015 | (CN) | 201510651572.0 |
| Oct. 20, 2015 | (CN) | 201510680883.X |
| Oct. 27, 2015 | (CN) | 201510705222.8 |
| Oct. 29, 2015 | (CN) | 201510716899.1 |
| Oct. 29, 2015 | (CN) | 201510724263.1 |
| Oct. 30, 2015 | (CN) | 201510726365.7 |
| Oct. 30, 2015 | (CN) | 201510726484.2 |
| Nov. 27, 2015 | (CN) | 201510848766.X |
| Dec. 2, 2015 | (CN) | 201510868263.9 |
| Dec. 9, 2015 | (CN) | 201510903680.2 |
| Dec. 31, 2015 | (CN) | 201511025998.1 |
| Jan. 22, 2016 | (CN) | 201610044148.4 |
| Jan. 26, 2016 | (CN) | 201610050944.9 |
| Jan. 26, 2016 | (CN) | 201610051691.7 |
| Jan. 28, 2016 | (CN) | 201620089157.0 |
| Feb. 15, 2016 | (CN) | 201610085895.2 |
| Feb. 16, 2016 | (CN) | 201610087627.4 |
| Feb. 23, 2016 | (CN) | 201610098424.5 |
| Mar. 3, 2016 | (CN) | 201610120993.5 |
| Mar. 4, 2016 | (CN) | 201610123852.9 |
| Mar. 4, 2016 | (CN) | 201620165131.X |
| Mar. 9, 2016 | (CN) | 201610132513.7 |
| Mar. 14, 2016 | (CN) | 201610142140.1 |

| Date | Country | Number |
|---|---|---|
| Mar. 25, 2016 | (CN) | 201610177706.4 |
| Apr. 22, 2016 | (CN) | 201610256190.2 |
| Apr. 29, 2016 | (CN) | 201610281812.7 |
| May 18, 2016 | (CN) | 201610327806.0 |
| May 27, 2016 | (CN) | 201610363805.1 |
| Jun. 14, 2016 | (CN) | 201610420790.8 |
| Jun. 20, 2016 | (CN) | 201610452437.8 |
| Oct. 8, 2016 | (CN) | 201610876593.7 |

(51) Int. Cl.

| | |
|---|---|
| F21K 9/278 | (2016.01) |
| F21V 23/00 | (2015.01) |
| F21V 23/02 | (2006.01) |
| H05B 45/00 | (2022.01) |
| H05B 45/3578 | (2020.01) |
| H05B 45/37 | (2020.01) |
| H05B 45/3725 | (2020.01) |
| H05B 45/395 | (2020.01) |
| H05B 45/50 | (2022.01) |
| H05B 45/59 | (2022.01) |
| F21Y 103/10 | (2016.01) |
| F21Y 115/10 | (2016.01) |
| H05B 45/10 | (2020.01) |
| H05B 45/375 | (2020.01) |
| H05B 45/38 | (2020.01) |

(52) U.S. Cl.
CPC ........... *F21V 23/023* (2013.01); *H05B 45/00* (2020.01); *H05B 45/3578* (2020.01); *H05B 45/37* (2020.01); *H05B 45/3725* (2020.01); *H05B 45/395* (2020.01); *H05B 45/50* (2020.01); *H05B 45/59* (2022.01); *F21Y 2103/10* (2016.08); *F21Y 2115/10* (2016.08); *H05B 45/10* (2020.01); *H05B 45/375* (2020.01); *H05B 45/38* (2020.01); *Y02B 20/30* (2013.01)

(56) References Cited

U.S. PATENT DOCUMENTS

| | | | |
|---|---|---|---|
| 5,920,465 | A | 7/1999 | Tanaka |
| 5,964,518 | A | 10/1999 | Shen |
| 6,118,072 | A | 9/2000 | Scott |
| 6,186,649 | B1 | 2/2001 | Zou et al. |
| 6,246,167 | B1 | 6/2001 | Sica |
| 6,365,841 | B1 | 4/2002 | Takigami |
| 6,703,795 | B2 | 3/2004 | Johnson |
| 6,762,562 | B2 | 7/2004 | Leong |
| 6,846,094 | B2 | 1/2005 | Luk |
| 6,853,151 | B2 | 2/2005 | Leong et al. |
| 6,860,628 | B2 | 3/2005 | Robertson et al. |
| 7,033,239 | B2 | 4/2006 | Cunkelman et al. |
| 7,049,761 | B2 | 5/2006 | Timmermans et al. |
| 7,067,032 | B1 | 6/2006 | Bremont et al. |
| 7,067,992 | B2 | 6/2006 | Leong et al. |
| 7,086,747 | B2 | 8/2006 | Nielson et al. |
| 7,114,830 | B2 | 10/2006 | Robertson et al. |
| 7,155,815 | B2 | 1/2007 | Gernhardt et al. |
| 7,256,505 | B2 | 8/2007 | Arms et al. |
| 7,380,961 | B2 | 6/2008 | Moriyama |
| 7,399,429 | B2 | 7/2008 | Liu et al. |
| 7,482,059 | B2 | 1/2009 | Peng et al. |
| 7,534,966 | B2 | 5/2009 | Cho |
| 7,557,521 | B2 | 7/2009 | Lys |
| 7,594,738 | B1 | 9/2009 | Lin et al. |
| 7,600,315 | B2 | 10/2009 | Haze |
| 7,611,260 | B1 | 11/2009 | Lin et al. |
| 7,766,536 | B2 | 8/2010 | Peifer et al. |
| 7,806,541 | B2 | 10/2010 | Schug et al. |
| 7,815,338 | B2 | 10/2010 | Siemiet et al. |
| 7,834,273 | B2 | 11/2010 | Takahashi et al. |
| 7,887,226 | B2 * | 2/2011 | Huang ............. F21K 9/27 362/225 |
| 7,914,193 | B2 | 3/2011 | Peifer et al. |
| 7,918,598 | B2 | 4/2011 | Peifer et al. |
| 7,926,975 | B2 | 4/2011 | Siemiet |
| 7,929,100 | B2 * | 4/2011 | Kim ............. G02F 1/13452 349/150 |
| 7,948,001 | B2 | 5/2011 | Kamada et al. |
| 7,966,075 | B2 | 6/2011 | Johnson et al. |
| 7,980,863 | B1 | 7/2011 | Holec et al. |
| 8,007,286 | B1 | 8/2011 | Holec et al. |
| 8,093,823 | B1 | 1/2012 | Ivey et al. |
| 8,134,297 | B2 | 3/2012 | Busse et al. |
| 8,143,803 | B2 | 3/2012 | Beij et al. |
| 8,240,875 | B2 | 8/2012 | Cree |
| 8,247,999 | B2 | 8/2012 | Chen et al. |
| 8,262,250 | B2 | 9/2012 | Li et al. |
| 8,304,993 | B2 | 11/2012 | Tzou et al. |
| 8,330,381 | B2 | 12/2012 | Langovsky |
| 8,358,056 | B2 | 1/2013 | Park |
| 8,360,599 | B2 | 1/2013 | Ivet et al. |
| 8,381,299 | B2 | 2/2013 | Burdalski et al. |
| 8,441,824 | B2 | 5/2013 | Eberbaum |
| 8,456,075 | B2 | 6/2013 | Axelsson |
| 8,461,602 | B2 | 6/2013 | Lerman et al. |
| 8,482,212 | B1 | 7/2013 | Ivey et al. |
| 8,558,255 | B2 | 10/2013 | Bisberg |
| 8,591,057 | B2 | 11/2013 | KaWabata et al. |
| 8,596,813 | B2 | 12/2013 | Ivey |
| 8,602,604 | B2 | 12/2013 | Zhang et al. |
| 8,608,351 | B2 | 12/2013 | Peifer |
| 8,651,690 | B2 | 2/2014 | Wu |
| 8,684,566 | B2 | 4/2014 | Bretschneider et al. |
| 8,729,809 | B2 | 5/2014 | Kit et al. |
| 8,740,410 | B2 | 6/2014 | Peifer et al. |
| 8,757,832 | B2 | 6/2014 | Kim |
| 8,773,031 | B2 | 7/2014 | Sadwick |
| 8,779,679 | B2 | 7/2014 | Miyamichi |
| 8,789,970 | B2 | 7/2014 | Mahowald |
| 8,791,650 | B2 | 7/2014 | Shan |
| 8,792,253 | B2 | 7/2014 | Wang et al. |
| 8,796,943 | B2 | 8/2014 | Miyamichi |
| 8,801,228 | B2 | 8/2014 | Suen et al. |
| 8,833,965 | B2 | 9/2014 | Shimasaki et al. |
| 8,841,897 | B2 | 9/2014 | Williams et al. |
| 8,866,396 | B2 | 10/2014 | Timmermans et al. |
| 8,870,415 | B2 | 10/2014 | Ivey |
| 8,872,437 | B2 | 10/2014 | Esaki et al. |
| 8,888,976 | B2 | 11/2014 | Zhang et al. |
| 8,896,207 | B2 | 11/2014 | Thomas et al. |
| 8,907,556 | B2 | 12/2014 | Park |
| 8,915,611 | B2 | 12/2014 | Zhang |
| 8,931,918 | B2 | 1/2015 | Liu et al. |
| 9,000,668 | B2 | 4/2015 | Qiu |
| 9,006,993 | B1 | 4/2015 | Timmermans et al. |
| 9,016,890 | B2 | 4/2015 | Kim et al. |
| 9,028,105 | B2 | 5/2015 | Barnetson et al. |
| 9,033,545 | B2 | 5/2015 | Barnetson et al. |
| 9,057,504 | B2 | 6/2015 | Levante et al. |
| 9,066,403 | B2 | 6/2015 | Neser et al. |
| 9,103,953 | B2 | 8/2015 | Gardner et al. |
| 9,146,017 | B2 | 9/2015 | Van Der Wei et al. |
| 9,148,922 | B2 | 9/2015 | Shteynberg et al. |
| 9,151,475 | B2 | 10/2015 | Huang et al. |
| 9,163,818 | B2 | 10/2015 | Hsia et al. |
| 9,184,518 | B2 | 11/2015 | Ivey et al. |
| 9,206,970 | B2 | 12/2015 | Halliwell et al. |
| 9,210,774 | B2 | 12/2015 | Kim et al. |
| 9,222,659 | B2 | 12/2015 | Medendorp, Jr. et al. |
| 9,228,727 | B2 | 1/2016 | May |
| 9,234,632 | B2 | 1/2016 | Kawabata |
| 9,237,610 | B2 | 1/2016 | Neser et al. |
| 9,243,757 | B2 | 1/2016 | Barnetson et al. |
| 9,271,354 | B2 | 2/2016 | Takahashi et al. |
| 9,288,867 | B2 | 3/2016 | Hsia et al. |
| 9,322,531 | B2 | 4/2016 | Liang et al. |
| 9,328,874 | B2 | 5/2016 | Demuynck et al. |
| 9,338,853 | B2 | 5/2016 | Guang |
| 9,360,188 | B2 | 6/2016 | Kircher et al. |

(56) References Cited

U.S. PATENT DOCUMENTS

| | | |
|---|---|---|
| 9,388,948 B2 | 7/2016 | Demuynck |
| 9,445,463 B2 | 9/2016 | Choi et al. |
| 9,448,660 B2 | 9/2016 | Seo et al. |
| 9,462,658 B1 | 10/2016 | Kim |
| 9,464,793 B2 | 10/2016 | May |
| 9,468,046 B2 | 10/2016 | Barnetson et al. |
| 9,468,054 B2 | 10/2016 | Barnetson et al. |
| 9,468,060 B2 | 10/2016 | Barnetson et al. |
| 9,480,109 B2 | 10/2016 | Ye et al. |
| 9,488,767 B2 | 11/2016 | Nava et al. |
| 9,497,821 B2 | 11/2016 | Liu |
| 9,526,133 B2 | 12/2016 | Tao et al. |
| 9,541,274 B2 | 1/2017 | Bertram et al. |
| 9,551,463 B2 | 1/2017 | Barnetson et al. |
| 9,551,480 B2 | 1/2017 | Speer |
| 9,574,717 B2 | 2/2017 | Scapa et al. |
| 9,585,221 B1 | 2/2017 | Chen |
| 9,587,817 B2 | 3/2017 | Liu et al. |
| 9,609,711 B2 | 3/2017 | Jiang et al. |
| 9,618,168 B1 | 4/2017 | Jiang et al. |
| 9,622,317 B2 | 4/2017 | Ackermann |
| 9,625,129 B2 | 4/2017 | Jiang et al. |
| 9,625,137 B2 | 4/2017 | Li et al. |
| 9,629,211 B2 | 4/2017 | Xiong et al. |
| 9,629,215 B2 | 4/2017 | Xiong et al. |
| 9,629,216 B2 | 4/2017 | Jiang et al. |
| 9,668,308 B2 | 5/2017 | Hsia |
| 9,723,662 B2 | 8/2017 | Ye et al. |
| 9,726,330 B2 | 8/2017 | Wilcox et al. |
| D797,323 S | 9/2017 | Yang et al. |
| 9,756,698 B2 | 9/2017 | Xiong et al. |
| 9,765,935 B2 | 9/2017 | Rowlete, Jr. et al. |
| 9,775,215 B2 | 9/2017 | Xiong et al. |
| 9,777,891 B2 | 10/2017 | Kawabata et al. |
| 9,791,139 B2 | 10/2017 | Van Delden et al. |
| 9,794,990 B2 | 10/2017 | Ye et al. |
| 9,795,001 B2 | 10/2017 | Ye et al. |
| 9,810,384 B2 | 11/2017 | Yingchun |
| 9,820,341 B2 | 11/2017 | Xiong et al. |
| 9,839,081 B2 | 12/2017 | Park |
| 9,864,438 B2 | 1/2018 | Seo et al. |
| 9,883,555 B2 | 1/2018 | Deng et al. |
| 9,885,449 B2 | 2/2018 | Jiang |
| 9,894,732 B2 | 2/2018 | Xiong et al. |
| 9,897,265 B2 | 2/2018 | Xiong et al. |
| 9,920,887 B2 | 3/2018 | Wilhelmus et al. |
| 9,927,100 B2 | 3/2018 | Rowlette, Jr. et al. |
| 9,945,542 B2 | 4/2018 | Evitt |
| 9,958,117 B2 | 5/2018 | Engel et al. |
| 9,958,118 B2 | 5/2018 | Luo et al. |
| 9,970,640 B2 | 5/2018 | Zhao |
| 9,989,200 B2 | 6/2018 | Yingchun |
| 10,021,742 B2 | 7/2018 | Jiang |
| 10,045,406 B2 | 8/2018 | Zhang |
| 10,104,723 B2 | 10/2018 | Zhang |
| 10,117,296 B1 | 10/2018 | Zhao |
| 10,161,569 B2 | 12/2018 | Xu et al. |
| 10,176,689 B2 | 1/2019 | Ivey et al. |
| 10,199,714 B2 | 2/2019 | Ge et al. |
| 10,208,898 B2 | 2/2019 | Xiong et al. |
| 10,288,272 B2 | 5/2019 | Yao et al. |
| 10,299,333 B2 | 5/2019 | Xiong et al. |
| 10,560,989 B2 | 2/2020 | Jiang et al. |
| 10,697,593 B2 | 6/2020 | Yingchun |
| 11,122,665 B1 | 9/2021 | He |
| 11,262,028 B2 | 3/2022 | Janik et al. |
| 2002/0093082 A1 | 7/2002 | Miyamoto et al. |
| 2003/0189829 A1 | 10/2003 | Shimizu et al. |
| 2004/0007980 A1 | 1/2004 | Shibata |
| 2004/0026006 A1 | 2/2004 | Arai et al. |
| 2004/0095078 A1 | 5/2004 | Leong |
| 2004/0189218 A1 | 9/2004 | Leong et al. |
| 2005/0162101 A1 | 7/2005 | Leong et al. |
| 2005/0162850 A1 | 7/2005 | Luk et al. |
| 2005/0168123 A1 | 8/2005 | Taniwa |
| 2005/0185396 A1 | 8/2005 | Kutler |
| 2005/0281030 A1 | 12/2005 | Leong |
| 2006/0146527 A1 | 7/2006 | VanderSchuit |
| 2007/0001709 A1 | 1/2007 | Shen |
| 2007/0103902 A1 | 5/2007 | Hsiao |
| 2007/0267976 A1 | 11/2007 | Bohler et al. |
| 2008/0037245 A1 | 2/2008 | Chan |
| 2008/0055894 A1 | 3/2008 | Deng et al. |
| 2008/0192476 A1 | 8/2008 | Hiratsuka |
| 2008/0290814 A1 | 11/2008 | Leong et al. |
| 2009/0040415 A1 | 2/2009 | Kim |
| 2009/0045715 A1 | 2/2009 | Shantha et al. |
| 2009/0159919 A1 | 6/2009 | Simon et al. |
| 2009/0160369 A1 | 6/2009 | Godbole et al. |
| 2009/0161359 A1 | 6/2009 | Siemiet et al. |
| 2009/0219713 A1 | 9/2009 | Siemiet et al. |
| 2009/0290334 A1 | 11/2009 | Ivey et al. |
| 2010/0033964 A1 | 2/2010 | Choi et al. |
| 2010/0053394 A1 | 3/2010 | Kinoshita |
| 2010/0066230 A1 | 3/2010 | Lin et al. |
| 2010/0102729 A1 | 4/2010 | Katzir et al. |
| 2010/0103673 A1 | 4/2010 | Ivey |
| 2010/0185772 A1 | 4/2010 | Song et al. |
| 2010/0124054 A1 | 5/2010 | Chen et al. |
| 2010/0135009 A1 | 6/2010 | Duncan et al. |
| 2010/0157608 A1 | 6/2010 | Chen et al. |
| 2010/0181925 A1 | 7/2010 | Ivey et al. |
| 2010/0188001 A1 | 7/2010 | Broitzman et al. |
| 2010/0201239 A1 | 8/2010 | Mostoller et al. |
| 2010/0201269 A1 | 8/2010 | Tzou et al. |
| 2010/0220469 A1 | 9/2010 | Ivey et al. |
| 2010/0253226 A1 | 10/2010 | Oki |
| 2010/0265732 A1 | 10/2010 | Liu |
| 2010/0277918 A1 | 11/2010 | Chen et al. |
| 2010/0289428 A1 | 11/2010 | Frazier et al. |
| 2011/0006688 A1 | 1/2011 | Shim |
| 2011/0019421 A1 | 1/2011 | Lai |
| 2011/0038146 A1 | 2/2011 | Chen |
| 2011/0043127 A1 | 2/2011 | Yamasaki |
| 2011/0057572 A1 | 3/2011 | Kit et al. |
| 2011/0080110 A1 | 4/2011 | Nuhfer et al. |
| 2011/0084554 A1 | 4/2011 | Tian |
| 2011/0084608 A1 | 4/2011 | Lin et al. |
| 2011/0084627 A1 | 4/2011 | Sloan et al. |
| 2011/0121756 A1 | 5/2011 | Thomas et al. |
| 2011/0149563 A1 | 6/2011 | Hsia et al. |
| 2011/0175536 A1 | 7/2011 | Fujita et al. |
| 2011/0176297 A1 | 7/2011 | Hsia et al. |
| 2011/0205738 A1 | 8/2011 | Peifer et al. |
| 2011/0228526 A1 | 9/2011 | Hartikka et al. |
| 2011/0234107 A1 | 9/2011 | Simon et al. |
| 2011/0260614 A1 | 10/2011 | Hartikka et al. |
| 2011/0279063 A1 | 11/2011 | Wang et al. |
| 2011/0291154 A1 | 12/2011 | Noichi et al. |
| 2011/0291592 A1 | 12/2011 | Sylvania |
| 2011/0305021 A1 | 12/2011 | Chang |
| 2011/0309745 A1 | 12/2011 | Westermarck et al. |
| 2012/0008316 A1 | 1/2012 | Ivey |
| 2012/0026761 A1 | 2/2012 | Young |
| 2012/0038289 A1 | 2/2012 | Jee et al. |
| 2012/0049684 A1 | 3/2012 | Bodenstein et al. |
| 2012/0051039 A1 | 3/2012 | Chang |
| 2012/0069556 A1 | 3/2012 | Bertram et al. |
| 2012/0092856 A1 | 4/2012 | Zhang et al. |
| 2012/0113659 A1 | 5/2012 | Hermitte et al. |
| 2012/0146503 A1 | 6/2012 | Negley et al. |
| 2012/0147564 A1 | 6/2012 | Russell et al. |
| 2012/0147598 A1* | 6/2012 | Ivey ............... F21V 21/005 362/217.01 |
| 2012/0155116 A1 | 6/2012 | Gardner |
| 2012/0161666 A1 | 6/2012 | Antony et al. |
| 2012/0162965 A1 | 6/2012 | Takeuchi et al. |
| 2012/0170260 A1 | 7/2012 | Gardner et al. |
| 2012/0176784 A1 | 7/2012 | Peifer et al. |
| 2012/0181952 A1 | 7/2012 | Roeer |
| 2012/0201908 A1 | 8/2012 | Miller |
| 2012/0206433 A1 | 8/2012 | Suzuki et al. |
| 2012/0212951 A1 | 8/2012 | Lai et al. |
| 2012/0230019 A1 | 9/2012 | Peifer |

(56) References Cited

U.S. PATENT DOCUMENTS

| | | |
|---|---|---|
| 2012/0248986 A1 | 10/2012 | Gibbs |
| 2012/0248989 A1 | 10/2012 | Seishi |
| 2012/0256551 A1 | 10/2012 | Kim et al. |
| 2012/0257383 A1 | 10/2012 | Zhang |
| 2012/0293991 A1 | 11/2012 | Lin |
| 2012/0299501 A1 | 11/2012 | Kost et al. |
| 2012/0300445 A1 | 11/2012 | Chu et al. |
| 2012/0300501 A1 | 11/2012 | Kojima et al. |
| 2012/0312590 A1 | 12/2012 | Maeda et al. |
| 2012/0313265 A1 | 12/2012 | Yamanishi |
| 2012/0313540 A1 | 12/2012 | Lin et al. |
| 2012/0319150 A1 | 12/2012 | Shimomura et al. |
| 2013/0003346 A1 | 1/2013 | Letoquin et al. |
| 2013/0010453 A1 | 1/2013 | Mahowald |
| 2013/0010459 A1* | 1/2013 | Wilson .................. F21K 9/278 362/217.13 |
| 2013/0021809 A1 | 1/2013 | Dellian et al. |
| 2013/0033881 A1 | 2/2013 | Terazawa et al. |
| 2013/0033888 A1 | 2/2013 | Van Der Wel et al. |
| 2013/0048342 A1 | 2/2013 | Malstrom et al. |
| 2013/0050998 A1 | 2/2013 | Chu et al. |
| 2013/0051008 A1 | 2/2013 | Shew |
| 2013/0058080 A1 | 3/2013 | Ge et al. |
| 2013/0069538 A1 | 3/2013 | So |
| 2013/0076255 A1 | 3/2013 | Kang et al. |
| 2013/0119869 A1 | 5/2013 | Peng |
| 2013/0127327 A1 | 5/2013 | Heil et al. |
| 2013/0135852 A1 | 5/2013 | Chan et al. |
| 2013/0135857 A1 | 5/2013 | Chen et al. |
| 2013/0141890 A1 | 6/2013 | Carlin et al. |
| 2013/0147350 A1 | 6/2013 | Yang |
| 2013/0170196 A1 | 7/2013 | Huang et al. |
| 2013/0182407 A1 | 7/2013 | Wu |
| 2013/0182425 A1 | 7/2013 | Seki et al. |
| 2013/0207534 A1 | 8/2013 | Masuda et al. |
| 2013/0215609 A1 | 8/2013 | Liu et al. |
| 2013/0223053 A1 | 8/2013 | Liu et al. |
| 2013/0229104 A1 | 9/2013 | Green et al. |
| 2013/0230995 A1 | 9/2013 | Ivey et al. |
| 2013/0234620 A1 | 9/2013 | Wang et al. |
| 2013/0235570 A1 | 9/2013 | Hood et al. |
| 2013/0250565 A1 | 9/2013 | Chiang et al. |
| 2013/0256704 A1 | 10/2013 | Guofu et al. |
| 2013/0258650 A1 | 10/2013 | Sharrah |
| 2013/0258668 A1 | 10/2013 | Delian et al. |
| 2013/0293098 A1 | 11/2013 | Li et al. |
| 2013/0301255 A1 | 11/2013 | Kim et al. |
| 2013/0313983 A1 | 11/2013 | Radermacher et al. |
| 2013/0320869 A1 | 12/2013 | Jans et al. |
| 2013/0335959 A1 | 12/2013 | Hsia et al. |
| 2014/0009076 A1 | 1/2014 | Tsuda |
| 2014/0009923 A1 | 1/2014 | Wu et al. |
| 2014/0035463 A1 | 2/2014 | Miyamichi |
| 2014/0055029 A1 | 2/2014 | Jans et al. |
| 2014/0062320 A1 | 3/2014 | Urano et al. |
| 2014/0070396 A1 | 3/2014 | Kyozuka et al. |
| 2014/0078771 A1 | 3/2014 | Chen et al. |
| 2014/0084701 A1 | 3/2014 | Bae |
| 2014/0117853 A1 | 5/2014 | Miyamichi |
| 2014/0153231 A1 | 6/2014 | Bittmann |
| 2014/0084800 A1 | 7/2014 | Lee |
| 2014/0185269 A1 | 7/2014 | Li |
| 2014/0192526 A1 | 7/2014 | Qiu |
| 2014/0203717 A1 | 7/2014 | Zhang |
| 2014/0218892 A1 | 8/2014 | Edwards et al. |
| 2014/0218908 A1 | 8/2014 | Kawashima et al. |
| 2014/0225519 A1 | 8/2014 | Yu et al. |
| 2014/0226320 A1 | 8/2014 | Halliwell et al. |
| 2014/0239834 A1 | 8/2014 | Choi et al. |
| 2014/0265899 A1 | 9/2014 | Sadwick |
| 2014/0265900 A1 | 9/2014 | Sadwick et al. |
| 2014/0306599 A1 | 10/2014 | Edwards et al. |
| 2014/0328065 A1 | 11/2014 | Barnetson et al. |
| 2014/0328066 A1 | 11/2014 | Barnetson et al. |
| 2014/0331532 A1 | 11/2014 | Deppiesse |
| 2015/0021988 A1 | 1/2015 | Barnetson et al. |
| 2015/0022114 A1 | 1/2015 | Kim |
| 2015/0049473 A1 | 2/2015 | Pan et al. |
| 2015/0049490 A1 | 2/2015 | Barnetson et al. |
| 2015/0069442 A1 | 3/2015 | Liu et al. |
| 2015/0070885 A1 | 3/2015 | Petro et al. |
| 2015/0077001 A1 | 3/2015 | Takahashi et al. |
| 2015/0173138 A1 | 6/2015 | Roberts |
| 2015/0176770 A1 | 6/2015 | Wilcox et al. |
| 2015/0181661 A1 | 6/2015 | Hsia et al. |
| 2015/0195880 A1 | 7/2015 | Barnetson et al. |
| 2015/0195889 A1 | 7/2015 | Chou et al. |
| 2015/0198291 A1 | 7/2015 | Lin et al. |
| 2015/0223303 A1 | 8/2015 | Hsia et al. |
| 2015/0241000 A1 | 8/2015 | Barnetson et al. |
| 2015/0252958 A1* | 9/2015 | Barnetson ............... G02B 6/001 362/555 |
| 2015/0327368 A1 | 11/2015 | Su et al. |
| 2015/0345712 A1 | 12/2015 | Purdy |
| 2015/0345755 A1 | 12/2015 | Purdy |
| 2015/0351171 A1 | 12/2015 | Tao et al. |
| 2015/0359059 A1 | 12/2015 | Barnetson et al. |
| 2015/0366008 A1 | 12/2015 | Barnetson et al. |
| 2016/0010804 A1 | 1/2016 | Barnetson et al. |
| 2016/0018061 A1 | 1/2016 | Barnetson et al. |
| 2016/0081147 A1* | 3/2016 | Guang .................. H05B 45/345 315/123 |
| 2016/0084449 A1 | 3/2016 | Speer et al. |
| 2016/0084455 A1 | 3/2016 | Chen |
| 2016/0091147 A1 | 3/2016 | Jiang et al. |
| 2016/0091179 A1 | 3/2016 | Jiang et al. |
| 2016/0109109 A1 | 4/2016 | Yingchun |
| 2016/0113091 A1 | 4/2016 | Tao |
| 2016/0128154 A1 | 5/2016 | Barnetson et al. |
| 2016/0174307 A1 | 6/2016 | Tao |
| 2016/0174329 A1 | 6/2016 | Su et al. |
| 2016/0178137 A1 | 6/2016 | Jiang |
| 2016/0262220 A1 | 9/2016 | Barnetson et al. |
| 2016/0286621 A1 | 9/2016 | Tao et al. |
| 2016/0305641 A1 | 10/2016 | Lin et al. |
| 2016/0316533 A1 | 10/2016 | Hsia |
| 2016/0341414 A1 | 11/2016 | Jiang |
| 2016/0345394 A1 | 11/2016 | Warren et al. |
| 2016/0369952 A1 | 12/2016 | Weekamp |
| 2016/0381760 A1 | 12/2016 | Xiong et al. |
| 2017/0006672 A1 | 1/2017 | Barneston et al. |
| 2017/0059096 A1 | 3/2017 | Xu et al. |
| 2017/0089521 A1 | 3/2017 | Jiang |
| 2017/0089525 A1 | 3/2017 | Xiong et al. |
| 2017/0089530 A1 | 3/2017 | Jiang |
| 2017/0094746 A1 | 3/2017 | Xiong et al. |
| 2017/0094748 A1 | 3/2017 | Park |
| 2017/0105263 A1 | 4/2017 | Xiong et al. |
| 2017/0130911 A1 | 5/2017 | Li et al. |
| 2017/0159894 A1 | 6/2017 | Jiang |
| 2017/0167664 A1 | 6/2017 | Li et al. |
| 2017/0211753 A1 | 7/2017 | Jiang et al. |
| 2017/0219169 A1 | 8/2017 | Jiang |
| 2017/0290119 A1 | 10/2017 | Xiong et al. |
| 2017/0311398 A1 | 10/2017 | Jiang et al. |
| 2017/0318678 A1 | 11/2017 | Miao et al. |
| 2018/0063905 A1 | 3/2018 | Tao et al. |
| 2018/0209593 A1 | 7/2018 | Luo et al. |
| 2018/0310370 A1 | 10/2018 | Heilman et al. |
| 2018/0335200 A1 | 11/2018 | Jiang et al. |
| 2019/0137047 A1 | 5/2019 | Hu |
| 2019/0277484 A1 | 9/2019 | Kwisthout |
| 2020/0240594 A1 | 7/2020 | Jiang et al. |

FOREIGN PATENT DOCUMENTS

| | | |
|---|---|---|
| CN | 1292930 A | 4/2001 |
| CN | 2498692 Y | 7/2002 |
| CN | 1460165 A | 12/2003 |
| CN | 2634631 Y | 8/2004 |
| CN | 1641827 A | 7/2005 |
| CN | 1714425 A | 12/2005 |
| CN | 1783418 A | 6/2006 |
| CN | 2802892 Y | 8/2006 |

(56) References Cited

FOREIGN PATENT DOCUMENTS

| | | | |
|---|---|---|---|
| CN | 1914458 A | 2/2007 |
| CN | 2911390 Y | 6/2007 |
| CN | 200965185 Y | 10/2007 |
| CN | 200980183 Y | 11/2007 |
| CN | 101092545 A | 12/2007 |
| CN | 200996582 Y | 12/2007 |
| CN | 200997391 Y | 12/2007 |
| CN | 201014273 Y | 1/2008 |
| CN | 101200622 A | 6/2008 |
| CN | 101228393 A | 7/2008 |
| CN | 101272652 A | 9/2008 |
| CN | 101320669 A | 12/2008 |
| CN | 101352105 A | 1/2009 |
| CN | 201247758 Y | 5/2009 |
| CN | 201255393 Y | 6/2009 |
| CN | 201363601 Y | 12/2009 |
| CN | 201377712 Y | 1/2010 |
| CN | 201391776 Y | 1/2010 |
| CN | 201437914 U | 4/2010 |
| CN | 201437921 U | 4/2010 |
| CN | 101715265 A | 5/2010 |
| CN | 201515528 U | 6/2010 |
| CN | 101787255 A | 7/2010 |
| CN | 101787273 A | 7/2010 |
| CN | 101806444 A | 8/2010 |
| CN | 201555053 U | 8/2010 |
| CN | 101846063 A | 9/2010 |
| CN | 101922640 A | 12/2010 |
| CN | 201661897 U | 12/2010 |
| CN | 101968168 A | 2/2011 |
| CN | 201731327 U | 2/2011 |
| CN | 201739830 U | 2/2011 |
| CN | 102011994 A | 4/2011 |
| CN | 102016661 A | 4/2011 |
| CN | 201796567 U | 4/2011 |
| CN | 102042513 A | 5/2011 |
| CN | 102052652 A | 5/2011 |
| CN | 102109125 A | 6/2011 |
| CN | 201851921 U | 6/2011 |
| CN | 201852052 U | 6/2011 |
| CN | 201866575 U | 6/2011 |
| CN | 102116460 A | 7/2011 |
| CN | 102121690 A | 7/2011 |
| CN | 201903026 U | 7/2011 |
| CN | 201904973 U | 7/2011 |
| CN | 102155642 A | 8/2011 |
| CN | 102159867 A | 8/2011 |
| CN | 102162583 A | 8/2011 |
| CN | 201954169 U | 8/2011 |
| CN | 201954350 U | 8/2011 |
| CN | 201964162 U | 9/2011 |
| CN | 102216671 A | 10/2011 |
| CN | 102226504 A | 10/2011 |
| CN | 202008039 U | 10/2011 |
| CN | 202012753 U | 10/2011 |
| CN | 102287737 A | 12/2011 |
| CN | 202100985 U | 1/2012 |
| CN | 202100996 U | 1/2012 |
| CN | 202109255 U | 1/2012 |
| CN | 202118672 U | 1/2012 |
| CN | 202120982 U | 1/2012 |
| CN | 202125774 U | 1/2012 |
| CN | 102355780 A | 2/2012 |
| CN | 102359697 A | 2/2012 |
| CN | 202132647 U | 2/2012 |
| CN | 202152950 U | 2/2012 |
| CN | 102376843 A | 3/2012 |
| CN | 102410458 A | 4/2012 |
| CN | 202182362 U | 4/2012 |
| CN | 202215972 U | 5/2012 |
| CN | 202216003 U | 5/2012 |
| CN | 202216037 U | 5/2012 |
| CN | 202252907 U | 5/2012 |
| CN | 102518972 A | 6/2012 |
| CN | 202281101 U | 6/2012 |
| CN | 202281104 U | 6/2012 |
| CN | 202302841 U | 7/2012 |
| CN | 102635804 A | 8/2012 |
| CN | 202392485 U | 8/2012 |
| CN | 102720901 A | 10/2012 |
| CN | 102738355 A | 10/2012 |
| CN | 102748626 A | 10/2012 |
| CN | 202469638 U | 10/2012 |
| CN | 202493914 U | 10/2012 |
| CN | 102777788 A | 11/2012 |
| CN | 202521300 U | 11/2012 |
| CN | 202546288 U | 11/2012 |
| CN | 202546330 U | 11/2012 |
| CN | 202546668 U | 11/2012 |
| CN | 102818213 A | 12/2012 |
| CN | 102829364 A | 12/2012 |
| CN | 202598260 U | 12/2012 |
| CN | 202603010 U | 12/2012 |
| CN | 102889446 A | 1/2013 |
| CN | 202660350 U | 1/2013 |
| CN | 102155642 B | 2/2013 |
| CN | 102932997 A | 2/2013 |
| CN | 202721866 U | 2/2013 |
| CN | 202834951 U | 3/2013 |
| CN | 202839345 U | 3/2013 |
| CN | 103016984 A | 4/2013 |
| CN | 202852551 U | 4/2013 |
| CN | 202884537 U | 4/2013 |
| CN | 202884614 U | 4/2013 |
| CN | 103094451 A | 5/2013 |
| CN | 103096586 A | 5/2013 |
| CN | 202918541 U | 5/2013 |
| CN | 202955542 U | 5/2013 |
| CN | 202972731 U | 6/2013 |
| CN | 103195999 A | 7/2013 |
| CN | 103225749 A | 7/2013 |
| CN | 203036285 U | 7/2013 |
| CN | 203036295 U | 7/2013 |
| CN | 203068187 U | 7/2013 |
| CN | 101715265 B | 8/2013 |
| CN | 103270618 A | 8/2013 |
| CN | 203115646 U | 8/2013 |
| CN | 203131520 U | 8/2013 |
| CN | 203162690 U | 8/2013 |
| CN | 203162856 U | 8/2013 |
| CN | 103292190 A | 9/2013 |
| CN | 103313472 A | 9/2013 |
| CN | 203176871 U | 9/2013 |
| CN | 203190109 U | 9/2013 |
| CN | 203202740 U | 9/2013 |
| CN | 203202766 U | 9/2013 |
| CN | 103375714 A | 10/2013 |
| CN | 203240337 U | 10/2013 |
| CN | 203240353 U | 10/2013 |
| CN | 203240362 U | 10/2013 |
| CN | 103383099 A | 11/2013 |
| CN | 103411140 A | 11/2013 |
| CN | 203273451 U | 11/2013 |
| CN | 203322772 U | 12/2013 |
| CN | 103486552 A | 1/2014 |
| CN | 103486554 A | 1/2014 |
| CN | 103511892 A | 1/2014 |
| CN | 203375197 U | 1/2014 |
| CN | 203375312 U | 1/2014 |
| CN | 203393978 U | 1/2014 |
| CN | 103563490 A | 2/2014 |
| CN | 103574331 A | 2/2014 |
| CN | 103574343 A | 2/2014 |
| CN | 203442504 U | 2/2014 |
| CN | 103672530 A | 3/2014 |
| CN | 203464014 U | 3/2014 |
| CN | 203477954 U | 3/2014 |
| CN | 203500909 U | 3/2014 |
| CN | 103742875 A | 4/2014 |
| CN | 203517436 U | 4/2014 |
| CN | 203517629 U | 4/2014 |
| CN | 203521696 U | 4/2014 |
| CN | 203531597 U | 4/2014 |
| CN | 203533269 U | 4/2014 |

(56) References Cited

FOREIGN PATENT DOCUMENTS

| | | |
|---|---|---|
| CN | 203571498 U | 4/2014 |
| CN | 103813626 A | 5/2014 |
| CN | 103822121 A | 5/2014 |
| CN | 203615126 U | 5/2014 |
| CN | 203615157 U | 5/2014 |
| CN | 103851390 A | 6/2014 |
| CN | 103851547 A | 6/2014 |
| CN | 203628323 U | 6/2014 |
| CN | 203628340 U | 6/2014 |
| CN | 203645869 U | 6/2014 |
| CN | 203645890 U | 6/2014 |
| CN | 203656837 U | 6/2014 |
| CN | 103899939 A | 7/2014 |
| CN | 103925487 A | 7/2014 |
| CN | 103929858 A | 7/2014 |
| CN | 103939773 A | 7/2014 |
| CN | 103943752 A | 7/2014 |
| CN | 203686635 U | 7/2014 |
| CN | 203686730 U | 7/2014 |
| CN | 102932997 B | 8/2014 |
| CN | 103968272 A | 8/2014 |
| CN | 103982782 A | 8/2014 |
| CN | 203757616 U | 8/2014 |
| CN | 203771102 U | 8/2014 |
| CN | 203771135 U | 8/2014 |
| CN | 203797382 U | 8/2014 |
| CN | 203797412 U | 8/2014 |
| CN | 203801130 U | 8/2014 |
| CN | 104019378 A | 9/2014 |
| CN | 104033748 A | 9/2014 |
| CN | 104033772 A | 9/2014 |
| CN | 203848044 U | 9/2014 |
| CN | 203848055 U | 9/2014 |
| CN | 104089209 A | 10/2014 |
| CN | 203857296 U | 10/2014 |
| CN | 203859899 U | 10/2014 |
| CN | 203927469 U | 11/2014 |
| CN | 203963553 U | 11/2014 |
| CN | 204005873 U | 12/2014 |
| CN | 204026211 U | 12/2014 |
| CN | 204028258 U | 12/2014 |
| CN | 204042527 U | 12/2014 |
| CN | 204083927 U | 1/2015 |
| CN | 204084257 U | 1/2015 |
| CN | 104515014 A | 4/2015 |
| CN | 104565931 A | 4/2015 |
| CN | 204268162 U | 4/2015 |
| CN | 204291454 U | 4/2015 |
| CN | 204300737 U | 4/2015 |
| CN | 103411140 B | 5/2015 |
| CN | 104595765 A | 5/2015 |
| CN | 104633491 A | 5/2015 |
| CN | 204420636 U | 6/2015 |
| CN | 104776332 A | 7/2015 |
| CN | 204437746 U | 7/2015 |
| CN | 204442771 U | 7/2015 |
| CN | 104832813 A | 8/2015 |
| CN | 204534210 U | 8/2015 |
| CN | 204573639 U | 8/2015 |
| CN | 204573682 U | 8/2015 |
| CN | 204573684 U | 8/2015 |
| CN | 204573700 U | 8/2015 |
| CN | 104990041 A | 10/2015 |
| CN | 204693095 U | 10/2015 |
| CN | 204741593 U | 11/2015 |
| CN | 204786204 U | 11/2015 |
| CN | 204795749 U | 11/2015 |
| CN | 204879606 U | 12/2015 |
| CN | 204879985 U | 12/2015 |
| CN | 105465640 A | 4/2016 |
| CN | 205191275 U | 4/2016 |
| CN | 105605444 A | 5/2016 |
| CN | 104033772 B | 6/2016 |
| CN | 205316089 U | 6/2016 |
| CN | 205447315 U | 8/2016 |
| CN | 205447342 U | 8/2016 |
| CN | 103968285 A | 9/2016 |
| CN | 205606255 U | 9/2016 |
| CN | 205716549 U | 11/2016 |
| CN | 205716559 U | 11/2016 |
| CN | 205877791 U | 1/2017 |
| CN | 205938621 U | 2/2017 |
| CN | 206055269 U | 3/2017 |
| CN | 104470086 B | 6/2017 |
| CN | 106941746 A | 7/2017 |
| CN | 106996514 A | 8/2017 |
| CN | 206386705 U | 8/2017 |
| CN | 206439657 U | 8/2017 |
| CN | 206514107 U | 9/2017 |
| CN | 206555763 U | 10/2017 |
| CN | 206617802 U | 11/2017 |
| CN | 304350803 S | 11/2017 |
| CN | 206771275 U | 12/2017 |
| CN | 206908890 U | 1/2018 |
| CN | 206908891 U | 1/2018 |
| CN | 108802603 A | 11/2018 |
| CN | 209445322 U | 9/2019 |
| CN | 211955768 U | 11/2020 |
| CN | 212163776 U | 12/2020 |
| DE | 2608761 A1 | 9/1977 |
| DE | 202012011550 U1 | 6/2013 |
| EP | 2554899 A2 | 2/2013 |
| EP | 2615357 A2 | 7/2013 |
| EP | 2727521 A1 | 5/2014 |
| EP | 2914065 A2 | 9/2015 |
| EP | 3146803 A1 | 3/2017 |
| GB | 2519258 A | 4/2015 |
| GB | 2523275 A | 8/2015 |
| GB | 2531425 A | 4/2016 |
| GB | 2533683 A | 6/2016 |
| IN | 101182919 A | 5/2008 |
| IN | 203549435 U | 4/2014 |
| IN | 104735873 A | 6/2015 |
| JP | H01204982 A | 8/1989 |
| JP | 2005063995 A | 3/2005 |
| JP | 2005122906 A | 5/2005 |
| JP | 2008117666 A | 5/2008 |
| JP | 3147313 U | 12/2008 |
| JP | 2010129382 A | 6/2010 |
| JP | 2010153549 A | 7/2010 |
| JP | 2011061056 A | 3/2011 |
| JP | 2012155880 A | 8/2012 |
| JP | 2013243132 A | 12/2013 |
| JP | 2013254667 A | 12/2013 |
| JP | 5383939 B1 | 1/2014 |
| JP | 2014022260 A | 2/2014 |
| JP | 2014103000 A | 6/2014 |
| JP | 2014135211 A | 7/2014 |
| JP | 2014154479 A | 8/2014 |
| KR | 20090118147 A | 11/2009 |
| KR | 100949087 B1 | 3/2010 |
| KR | 20120055349 A | 5/2012 |
| KR | 20120079629 A | 7/2012 |
| KR | 101305007 B1 | 9/2013 |
| KR | 101380610 B1 | 4/2014 |
| KR | 101629750 B1 | 6/2016 |
| TW | M293393 U | 7/2006 |
| TW | 201030277 A | 8/2010 |
| TW | 201111698 A | 4/2011 |
| TW | M429824 U1 | 5/2012 |
| TW | M452292 U | 5/2013 |
| WO | 2009111098 A2 | 9/2009 |
| WO | 2009129689 A1 | 10/2009 |
| WO | 2011086906 A1 | 7/2011 |
| WO | 2012114096 A1 | 8/2012 |
| WO | 2012129301 A1 | 9/2012 |
| WO | 2012139691 A1 | 10/2012 |
| WO | 2013114485 A1 | 8/2013 |
| WO | 2013125803 A1 | 8/2013 |
| WO | 2013150417 A1 | 10/2013 |
| WO | 20130152485 A1 | 10/2013 |
| WO | 2014045523 A1 | 3/2014 |
| WO | 2014049952 A1 | 4/2014 |
| WO | 2014068335 A1 | 5/2014 |

(56) References Cited

FOREIGN PATENT DOCUMENTS

| WO | 20140115010 A1 | 7/2014 |
|---|---|---|
| WO | 2014117435 A1 | 8/2014 |
| WO | 2014118754 A1 | 8/2014 |
| WO | 2014206785 A1 | 12/2014 |
| WO | 2015028329 A1 | 3/2015 |
| WO | 2015028639 A1 | 3/2015 |
| WO | 2015066566 A1 | 5/2015 |
| WO | 2015074917 A1 | 5/2015 |
| WO | 2015081809 A1 | 6/2015 |
| WO | 2015110306 A1 | 7/2015 |
| WO | 2016086900 A2 | 6/2016 |
| WO | 2016086901 A3 | 6/2016 |
| WO | 2016187846 A1 | 12/2016 |
| WO | 2017012512 A1 | 1/2017 |
| WO | 2017042379 A1 | 3/2017 |

OTHER PUBLICATIONS

Declaration of Regan Zane, Ph.D., Nov. 18, 2019.
CV of Dr. Regan Zane, Nov. 18, 2019.
Lenk, R. et al., Practical Lighting Design with LEDs, IEEE Press, A John Wiley & Sons, Inc., 2011, pp. 103-106, Nov. 18, 2019.
Philips InstantFit LED T8 Lamps data sheet.
Keystone KT-LED18T8-48G-850-D T8 LED Lamp Data Sheet.
MaxLite LED T8—Linear Replacement Lamp DirectFit G Series Data Sheet.
Defendant Maxlite, Inc.'s Preliminary Noninfringement and Invalidity Contentions Pursuant to Court's Order, May 19, 2020.
Defendant Maxlite, Inc.'s Preliminary Noninfringement and Invalidity Contentions for Plaintiffs' 35 Elected Claims Pursuant to Court's Order, Jul. 20, 2020.
Cree announces residential-targeted LED T8, new rural outdoor, Jul. 20, 2020.
Show Colors True and Natural, Jul. 20, 2020.
Hands-on testing of popular Led T8 lamps and linear fixtures reveals promises and pitfalls (Magazine), Jul. 20, 2020.
Cree Recalls LED T8 Lamps Due to Burn Hazard; Includes T8 Lamps Provided as Replacements in Previous Recall, Jul. 20, 2020.
Cree LED T8 Replacement Lamp—General Information, Jul. 20, 2020.
LED Lighting Tube Device and Method (U.S. Appl. No. 62/065,959, filed Nov. 3, 2014; Yingchun Zhang).
Dec, 22m 2022_CurrentLighting_PreliminaryInvalidityContentions.
InfringementContentions_ExhibitC_662_patent.
IPR2020_00181Pr_7.
Declaration_Donald_Ackley_IPR202300675.
How_resistors_work.
D'AndradeInfringementReport.
IPR2023_00269_10560989_Petition.
Expert_Ackley_Declaration_10560989Patent_IPR.
Ackley_CV_10560989Patent_IPR.
IPR2023_00271_10295125_Petition.
Baker_Declaration.
CV_JacobBaker.
IPR2023_00272_10830397_Petition.
LebbyDeclaration.
Lebby_CV.
IPR2023_00270_Petition_9723662.
BakerDeclaration_662.
EX1007_IPR2020_00181Pr_1.
*Current Lighting Solutions, LLC d/b/a GE Current*, Petitioner, v. *Jiaxing Super Lighting Electric Appliance Co., Ltd*, Patent Owner, Petition Under 35 USC §312, Inter Partes Review No. IPR2023-00980, U.S. Pat. No. 9,945,520, May 31, 2023.
*Current Lighting Solutions, LLC d/b/a GE Current*, Petitioner, v. *Jiaxing Super Lighting Electric Appliance Co., Ltd*, Petition Under 35 USC §312, Inter Partes Review No. IPR2023-00980, U.S. Pat. No. 9,945,520, May 31, 2023; Declaration R. Jacob Baker PhD., PE EX1003.
*Current Lighting Solutions, LLC d/b/a GE Current*, Petitioner, v. *Jiaxing Super Lighting Electric Appliance Co., Ltd*, Petition Under 35 USC §312, Inter Partes Review No. IPR2023-00980, U.S. Pat. No. 9,945,520, May 31, 2023; CV R. Jacob Baker PhD., PE EX1004.
*Current Lighting Solutions, LLC d/b/a GE Current*, Petitioner, v. *Jiaxing Super Lighting Electric Appliance Co., Ltd*, Petition Under 35 USC §312, Inter Partes Review No. IPR2023-00979, U.S. Pat. No. 11,112,068, May 31, 2023.
*Current Lighting Solutions, LLC d/b/a GE Current*, Petitioner, v. *Jiaxing Super Lighting Electric Appliance Co., Ltd*, Petition Under 35 USC §312, Inter Partes Review No. IPR2023-00979, U.S. Pat. No. 11,112,068, May 31, 2023; CV R. Jacob Baker PhD., PE EX1003.
*Current Lighting Solutions, LLC d/b/a GE Current*, Petitioner, v. *Jiaxing Super Lighting Electric Appliance Co., Ltd*, Petition Under 35 USC §312, Inter Partes Review No. IPR2023-00979, U.S. Pat. No. 11,112,068, May 31, 2023; Declaration R. Jacob Baker PhD., PE EX1002.
*Current Lighting Solutions, LLC d/b/a GE Current*, Petitioner, v. *Jiaxing Super Lighting Electric Appliance Co., Ltd*, Petition Under 35 USC §312, Inter Partes Review No. IPR2023-00979, U.S. Pat. No. 11,112,068, May 31, 2023; Stack Exchange forum Soldering PCBs Directly Together Declaration EX1026.

* cited by examiner

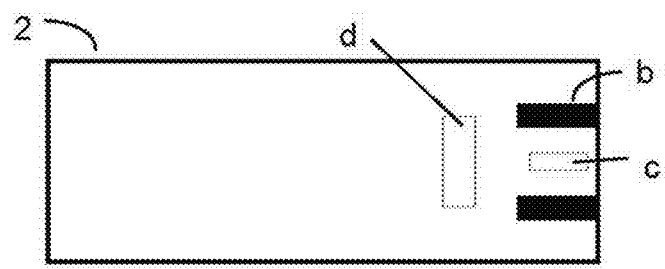
Fig. 25
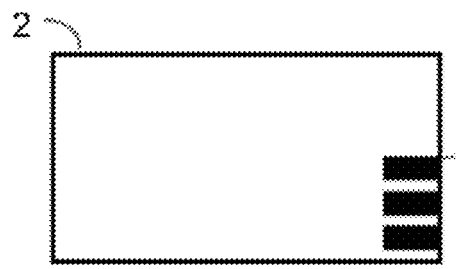 
Fig. 26  Fig. 27
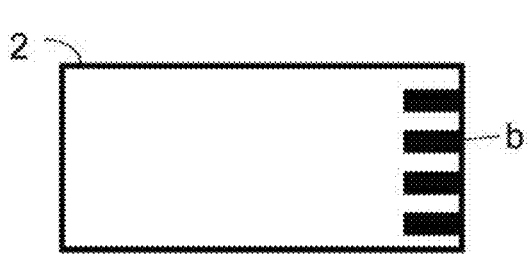 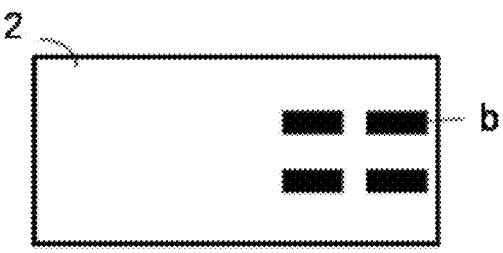
Fig. 28  Fig. 29
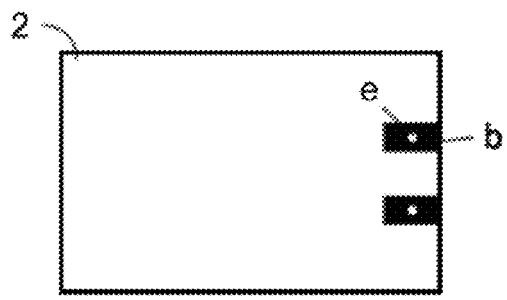
Fig. 30

LED TUBE LAMP

CROSS-REFERENCE TO RELATED APPLICATIONS

This application is a continuation application of U.S. application Ser. No. 17/149,090 filed on Jan. 14, 2021 which is a continuation application of U.S. application Ser. No. 16/743,526 filed on Jan. 15, 2020 which is a continuation application of U.S. application Ser. No. 16/373,200 filed on Apr. 2, 2019 which is a continuation application of U.S. application Ser. No. 15/888,335 filed on Feb. 5, 2018 which is a continuation application of U.S. application Ser. No. 15/643,034 filed on Jul. 6, 2017 which is a continuation-in-part application of U.S. application Ser. No. 15/298,955 filed on Oct. 20, 2016 and issued at patent no. U.S. Pat. No. 9,845,923 on Dec. 19, 2017, U.S. application Ser. No. 15/055,630 filed on Feb. 28, 2016, U.S. application Ser. No. 15/339,221 filed on Oct. 31, 2016, U.S. application Ser. No. 15/258,068 filed on Sep. 7, 2016, U.S. application Ser. No. 15/211,783 filed on Jul. 15, 2016, and U.S. application Ser. No. 15/483,368 filed on Apr. 10, 2017, wherein the Ser. No. 15/298,955 application is a continuation application of U.S. application Ser. No. 14/865,387 filed in United States on Sep. 25, 2015, which itself claims Chinese priorities under 35 U.S.C. § 119(a) of Patent Applications No. CN 201410507660.9 filed on 2014 Sep. 28; CN 201410508899.8 filed on 2014 Sep. 28; CN 201410623355.6 filed on 2014 Nov. 6; CN 201410734425.5 filed on 2014 Dec. 5; CN 201510075925.7 filed on 2015 Feb. 12; CN 201510104823.3 filed on 2015 Mar. 10; CN 201510134586.5 filed on 2015 Mar. 26; CN 201510133689.x filed on 2015 Mar. 25; CN 201510136796.8 filed on 2015 Mar. 27; CN 201510173861.4 filed on 2015 Apr. 14; CN 201510155807.7 filed on 2015 Apr. 3; CN 201510193980.6 filed on 2015 Apr. 22; CN 201510372375.5 filed on 2015 Jun. 26; CN 201510259151.3 filed on 2015 May 19; CN 201510268927.8 filed on 2015 May 22; CN 201510284720.x filed on 2015 May 29; CN 201510338027.6 filed on 2015 Jun. 17; CN 201510315636.x filed on 2015 Jun. 10; CN 201510373492.3 filed on 2015 Jun. 26; CN 201510364735.7 filed on 2015 Jun. 26; CN 201510378322.4 filed on 2015 Jun. 29; CN 201510391910.1 filed on 2015 Jul. 2; CN 201510406595.5 filed on 2015 Jul. 10; CN 201510482944.1 filed on 2015 Aug. 7; CN 201510486115.0 filed on 2015 Aug. 8; CN 201510428680.1 filed on 2015 Jul. 20; CN 201510483475.5 filed on 2015 Aug. 8; CN 201510555543.4 filed on 2015 Sep. 2; CN 201510557717.0 filed on 2015 Sep. 6; CN 201510595173.7 filed on 2015 Sep. 18; CN 201510724263.1 filed on 2015 Oct. 29; and CN 201510726365.7 filed on 2015 Oct. 30, the disclosures of which are incorporated herein in their entirety by reference. The U.S. application Ser. No. 15/888,335 is also a continuation application of U.S. application Ser. No. 15/211,783 filed on Jul. 15, 2016 which is a continuation-in-part application of U.S. application Ser. No. 14/865,387 filed on Sep. 25, 2015, the disclosures of which are incorporated herein in their entirety by reference.

FIELD OF THE INVENTION

The present disclosure relates to illumination devices, and more particularly to an LED tube lamp and its components including the light sources, electronic components, and end caps.

BACKGROUND

LED lighting technology is rapidly developing to replace traditional incandescent and fluorescent lightings. LED tube lamps are mercury-free in comparison with fluorescent tube lamps that need to be filled with inert gas and mercury. Thus, it is not surprising that LED tube lamps are becoming a highly desired illumination option among different available lighting systems used in homes and workplaces, which used to be dominated by traditional lighting options such as compact fluorescent light bulbs (CFLs) and fluorescent tube lamps. Benefits of LED tube lamps include improved durability and longevity and far less energy consumption; therefore, when taking into account all factors, they would typically be considered as a cost effective lighting option.

Typical LED tube lamps have a lamp tube, a circuit board disposed inside the lamp tube with light sources being mounted on the circuit board, and end caps accompanying a power supply provided at two ends of the lamp tube with the electricity from the power supply transmitting to the light sources through the circuit board. However, existing LED tube lamps have certain drawbacks. For example, the electrical components and fuses in the LED tube lamps may not perform properly due to increasing temperature inside the LED tube lamps during the use of the LED tube lamps. Specifically, the fuses very likely incorrectly cause open circuit in responsive to high environment temperature inside the LED tube lamps instead of high electrical current flow. The electrical components operate in unexpected ways which are different from circuit design. The circuit design of the lamp is more and more complicated, and the number of components is also increasing, so the thermal problem of the driving circuit is becoming more and more important. In addition, the electrical components usually include one or two integrated circuits which generate more heat than other components mounted on a circuit board. The power supply includes a lot of electronic components mounted on a circuit board located in an end cap, therefore heat generated by the electronic components will be trapped in the end cap and the power supply will be damaged by heat. Therefore, how to manage the thermal problem and arrange the electronic components on the circuit board, especially integrated circuits, in the proper location are current issue.

A C.N. Patent application no. CN 201110461110.4 (hereinafter "Pan"), Pan disclosed an LED light strip adhered on an inner surface of lamp tube and a plurality of LED light sources and driving module were mounted on the LED light strip. However, in Pan's device, the driving module was too close to the LED light sources that the heat generated by the drive module will affect the LED light sources.

A C.N. Patent application no. CN 201310063922.2 (hereinafter "Zhao"), Zhao disclosed an LED light strip disposed on an inner surface of lamp tube and a plurality of LED light sources and driving module were mounted on the LED light strip, too. However, in Zhao's device, the driving module was too close to the LED light sources that the heat generated by the drive module will affect the LED light sources.

A C.N. Patent application no. CN 20320657992.6 (hereinafter "Chen"), Chen disclosed LED light strip adhered on an inner surface of lamp tube and a plurality of LED light sources were mounted on the LED light strip. Chen also disclosed a driving module separated from LED light strip and disposed in an end cap. The driving module electrically connected the LED light strip by male and female terminals.

However, in Chen device, it is difficult to sleeve an end cap over an end of lam tube due to electrically connecting by male and female terminals.

A C.N. Patent application no. CN 201390000061.7 (hereinafter "Nakamura"), Nakamura disclosed an LED light strip disposed on a metal heat sink for heat dissipation. However, Nakamura only paid attention to the problem of heat dissipation of LED light source, but silenced on the problem of heat dissipation of the drive module in end cap.

A C.N. Patent application no. CN 201410135230.9 (hereinafter "Zhou"), Zhou disclosed LED light strip adhered on an inner surface of lamp tube and a plurality of LED light sources were mounted on the LED light strip. Zhou also disclosed a driving module located in an end cap. However, Zhou did not deal with the problem of heat dissipation of the drive module located in an end cap.

A C.N. Patent application no. CN 201420065135.1 (hereinafter "Lei"), Lei disclosed LED light strip adhered on an inner surface of lamp tube and a plurality of LED light sources were mounted on the LED light strip. Lei also disclosed a driving module located in an end cap. However, Lei did not deal with the problem of heat dissipation of the drive module located in an end cap.

A C.N. Patent application no. CN 201320614825.3 (hereinafter "Wang"), Wang disclosed LED light strip disposed on an inner surface of lamp tube and a plurality of LED light sources were mounted on the LED light strip. Wang also disclosed a driving module located in an end cap. However, Wang did not deal with the problem of heat dissipation of the drive module located in an end cap due to simple driving circuit and less electronic components.

A U.S. Pat. No. 8,360,599 (hereinafter "Ivey"), Ivey disclosed an LED light strip disposed in a lamp tube or disposed on a metal heat sink for heat dissipation. However, Ivey only paid attention to the problem of heat dissipation of LED light source, but silenced on the problem of heat dissipation of the drive module in end cap.

A U.S. Patent Application 2016/0109109 (hereinafter "Yingchun"), Yingchun disclosed LED light strip adhered on an inner surface of lamp tube and a plurality of LED light sources were mounted on the LED light strip. Yingchun also disclosed a driving module located in an end cap. However, Yingchun only paid attention to the problem of heat dissipation of LED light source, but silenced on the problem of heat dissipation of the drive module in end cap.

A U.S. Pat. No. 9,777,891 (hereinafter "Kawabata"), Kawabata disclosed both of light strip circuit board and power supply circuit board were disposed in a lamp tube. In Kawabata's device, heat generated by LED light source and power supply was trapped in the tube. Although the heat of the LED light sources can be dissipated by the heatsink, the heat generated by power supply cannot be dissipated, therefore, LED light sources are severely affected by heat and reduce the service life.

A U.S. Pat. No. 8,304,993 (hereinafter "Tzou"), Tzou disclosed a driving module of LED tube lamp can be independently replaced or repaired. In Tzou's device, the driving module can be located in end cap or at the back side of heatsink, however, Tzou did not deal with the problem of heat dissipation of the drive module located in an end cap and the arrangement of electronic components on a circuit board.

A U.S. Pat. No. 9,970,640 (hereinafter "Zhao"), Zhao disclosed a driving module of LED tube lamp including a base plate inside an end cap and electronic components were mounted on the base plate. Zhao's base plate was perpendicular to the light strip, therefore, an area of base plate is limited by the diameter of the tube. As the circuit design of tube lamp is becoming more and more complex and the number of components is increasing, the circuit board with a small area cannot accommodate so many components, let alone the heat dissipation of the components in end cap.

A U.S. Publication 2015/0077001 (hereinafter "TAKAHASHI"), TAKAHASHI disclosed a LED light strip and driving module were fixed on a metal base platform in a case. A metal base platform can be a heatsink to help heat dissipating but will significantly increase weight of lamp. Increasing weight will increases difficulties of manufacturing, shipping and installation, therefore, the development of LED tube lamps is lightweight and does not use metal heat sinks.

A W.O. Publication 2013/114485 (hereinafter "KAZUHIKO"), KAZUHIKO disclosed a LED light strip disposed in lamp tube by fixing two ends of LED light strip with two end caps. In KAZUHIKO's device, the LED light strip in lamp tube did not have good heat dissipating path and heat generated by LED light source was trapped in the tube. Therefore, KAZUHIKO's LED lamp would have serious thermal issue and short lifetime problems.

Grainy visual appearances are also often found in the aforementioned conventional LED tube lamp. The LED chips spatially arranged on the circuit board inside the lamp tube are considered as spot light sources, and the lights emitted from these LED chips generally do not contribute uniform illuminance for the LED tube lamp without proper optical manipulation. As a result, the entire tube lamp would exhibit a grainy or non-uniform illumination effect to a viewer of the LED tube lamp, thereby negatively affecting the visual comfort and even narrowing the viewing angles of the lights. As a result, the quality and aesthetics requirements of average consumers would not be satisfied. To address this issue, the Chinese patent application with application no. CN 201320748271.6 discloses a diffusion tube is disposed inside a glass lamp tube to avoid grainy visual effects.

However, the disposition of the diffusion tube incurs an interface on the light transmission path to increase the likelihood of total reflection and therefore decrease the light outputting efficiency. In addition, the optical rotatory absorption of the diffusion tube decreases the light outputting efficiency.

Furthermore, all of the electronic components of the power supply circuit disclosed in the Chinese patent application with application no. CN 201320748271.6 are in the end caps. The heat dissipation of the power supply circuit in the small space of the end cap illustrated in the Chinese application is insufficient, therefore the power supply circuit is easier to be damaged.

Next, the driving of an LED uses a DC driving signal. The driving signal for a fluorescent lamp is a low-frequency and low-voltage AC signal as provided by an AC powerline, a high-frequency and high-voltage AC signal provided by a ballast, or even a DC signal provided by a battery for emergency lighting applications. Since the voltages and frequency spectrums of these types of signals differ significantly, simply performing a rectification to produce the required DC driving signal in an LED tube lamp is not competent at achieving the LED tube lamp's compatibility with traditional driving systems of a fluorescent lamp.

Common main types of ballast include instant-start ballast and program-start ballast. A ballast typically includes a resonant circuit and is designed to match the loading characteristics of a fluorescent lamp in driving the fluorescent lamp. However, an LED is a nonlinear component with significantly different characteristics from a fluorescent lamp. Therefore, using an LED tube lamp with an electrical ballast impacts the resonant circuit design of the electrical ballast, causing a compatibility problem. Generally, a program-start ballast will detect the presence of a filament in a fluorescent lamp, but traditional LED driving circuits cannot support the detection and may cause a failure of the filament detection and thus failure of the starting of the LED tube lamp. Further, electrical ballast is in effect a current source, and when it acts as a power supply of a DC-to-DC converter circuit in an LED tube lamp, problems of overvoltage and overcurrent or undervoltage and undercurrent are likely to occur, resulting in damaging of electronic components in the LED tube lamp or unstable provision of lighting by the LED tube lamp.

Accordingly, the prevent disclosure and its embodiments are herein provided.

SUMMARY OF THE INVENTION

It's specially noted that the present disclosure may actually include one or more inventions claimed currently or not yet claimed, and for avoiding confusion due to unnecessarily distinguishing between those possible inventions at the stage of preparing the specification, the possible plurality of inventions herein may be collectively referred to as "the (present) invention" herein.

Various embodiments are summarized in this section, and are described with respect to the "present invention," which terminology is used to describe certain presently disclosed embodiments, whether claimed or not, and is not necessarily an exhaustive description of all possible embodiments, but rather is merely a summary of certain embodiments. Certain of the embodiments described below as various aspects of the "present invention" can be combined in different manners to form an LED tube lamp or a portion thereof.

The present invention provides a novel LED tube lamp, and aspects thereof.

According to some embodiments, an LED tube lamp comprises a glass tube having two ends; two end caps respectively attached at the two ends of the glass tube, an LED light strip attached to an inner circumferential surface of the glass tube by a glue, a plurality of LED light sources mounted on the LED light strip; and a power supply module electrically connected to the LED light strip and configured to drive the plurality of LED light sources. Each of the two end caps comprises a lateral wall and an end wall. The lateral wall is substantially coaxial with the glass tube and connected to the glass tube. The end wall is substantially perpendicular to an axial direction of the lateral wall and connected to an end of the lateral wall away from the glass tube. The end wall comprises an insulating portion made of an insulating material. At least two first connecting pads are arranged at an end of the LED light strip in one of the two end caps. The power supply module comprises a printed circuit board separated from the LED light strip. The printed circuit board comprises a first surface and a second surface opposite to and substantially parallel to the first surface, and the first surface and the second surface of the printed circuit board are substantially parallel with the axial direction of the lateral wall. The power supply module further comprises a plurality of electronic components mounted on the printed circuit board. The power supply module comprises a rectifying circuit and a filtering circuit electrically connected to the rectifying circuit. The rectifying circuit has at least two input terminals and is configured to rectify a signal received from the at least two input terminals. The power supply module comprises an integrated circuit disposed on the first surface of the printed circuit board, and at least two second connecting pads are arranged on the first surface of the printed circuit board and electrically connected to the at least two first connecting pads, respectively.

According to some embodiments, the LED light strip comprises a protective layer disposed on a surface thereof on which the plurality of LED light sources being disposed, and the other surface of the LED light strip is attached to the inner circumferential surface of the glass tube by the glue.

According to some embodiments, the printed circuit board is disposed on the end of the LED light strip.

According to some embodiments, the at least two first connecting pads are arranged on the end of the LED light strip, and the printed circuit board is disposed on the two first connecting pads.

According to some embodiments, the power supply module further comprises a resistor positioned close to an end wall of one of the two end caps and connected to one of the at least two input terminals of the rectifying circuit.

According to some embodiments, the resistor is a fuse resistor.

According to some embodiments, an outer diameter of each of the lateral walls is substantially the same as an outer diameter of the glass tube.

According to some embodiments, the rectifying circuit comprises a first full-wave bridge rectifying circuit and a second full-wave bridge rectifying circuit. The first full-wave bridge rectifying circuit has two input terminals electrically connected to two conductive pins of one of the two end caps, respectively, and the first full-wave bridge rectifying circuit has a positive output terminal and a negative output terminal. The second full-wave bridge rectifying circuit has two input terminals electrically connected to two conductive pins of the other one of the two end caps, respectively, and the second full-wave bridge rectifying circuit has a positive output terminal and a negative output terminal. The positive output terminal of the first full-wave bridge rectifying circuit and the positive output terminal of the second full-wave bridge rectifying circuit are electrically connected to each other, and the negative output terminal of the first full-wave bridge rectifying circuit and the negative output terminal of the second full-wave bridge rectifying circuit are electrically connected to each other.

According to some embodiments, the filtering circuit comprises an inductor, a first capacitor, and a second capacitor. An end of the inductor is electrically connected to the positive output terminal of the first full-wave bridge rectifying circuit and the positive output terminal of the second full-wave bridge rectifying circuit, and the other end of the inductor is regarded as one of filtering output terminals of the filtering circuit. An end of the first capacitor is electrically connected to one end of the inductor, and the other end of the first capacitor is electrically connected to the negative output terminal of the first full-wave bridge rectifying circuit and the negative output terminal of the second full-wave bridge rectifying circuit. An end of the second capacitor is electrically connected to the other end of the inductor, and the other end of the second capacitor is regarded as the other one of the filtering output terminals of the filtering circuit.

According to some embodiments, the rectifying circuit comprises a full-wave bridge rectifying circuit and a half-wave bridge rectifying circuit. The full-wave bridge rectifying circuit has two input terminals electrically connected to two conductive pins of one of the two end caps, respectively, and the full-wave bridge rectifying circuit has a positive output terminal and a negative output terminal. The half-wave bridge rectifying circuit has an input terminal electrically connected to one of two conductive pins of the other one of the two end caps, and the half-wave bridge rectifying circuit has a positive output terminal and a negative output terminal. The positive output terminal of the full-wave bridge rectifying circuit and the positive output terminal of the half-wave bridge rectifying circuit are electrically connected to each other, and the negative output terminal of the full-wave bridge rectifying circuit and the negative output terminal of the half-wave bridge rectifying circuit are electrically connected to each other.

According to some embodiments, the filtering circuit comprises a first capacitor. An end of the first capacitor is electrically connected to the positive output terminal of the full-wave bridge rectifying circuit and the positive output terminal of the half-wave bridge rectifying circuit, and the other end of the first capacitor is electrically connected to the negative output terminal of the full-wave bridge rectifying circuit and the negative output terminal of the half-wave bridge rectifying circuit.

According to some embodiments, the filtering circuit further comprises an inductor and a second capacitor. An end of the inductor is electrically connected to the end of the first capacitor, and the other end of the inductor is regarded as one of filtering output terminals of the filtering circuit. An end of the second capacitor is electrically connected to the other end of the inductor, and the other end of the second capacitor is regarded as the other one of the filtering output terminals of the filtering circuit.

According to some embodiments, the filtering circuit further comprises an EMI-reducing capacitor coupled between two conductive pins of one of the two end caps.

According to some embodiments, the power supply module further comprises a driving circuit electrically connected to filtering output terminals of the filtering circuit and has two driving output terminals respectively connected to the LED light strip. The driving circuit further comprises a controller, a diode, a switch, and an inductor. The diode has an anode electrically connected to one of the filtering output terminals and one of the two driving output terminals. The switch has a first terminal coupled to the other one of the filtering output terminals, a second terminal electrically connected to a cathode of the diode, and a control terminal coupled to the controller. The switch is turned on or off in response to a signal received from the controller. An end of the inductor is electrically connected to the second terminal of the switch, and the other end of the inductor is electrically connected to the LED light strip via the other one of the two driving output terminals.

According to some embodiments, the driving circuit further comprises a capacitor electrically connected between the two driving output terminals.

According to some embodiments, the power supply module further comprises a driving circuit electrically connected to filtering output terminals of the filtering circuit and has two driving output terminals electrically connected to the LED light strip. The driving circuit further comprises a controller, a diode, a switch, and an inductor. The diode has an anode electrically connected to one of the filtering output terminals and one of the two driving output terminals. The switch has a first terminal coupled to a cathode of the diode, a second terminal coupled to the other one of the filtering output terminals, and a control terminal coupled to the controller. The switch is turned on or off in response to a signal received from the controller. An end of the inductor is electrically connected to the first terminal of the switch and the anode of the diode, and the other end of the inductor is electrically connected to the LED light strip via the other one of the two driving output terminals.

According to some embodiments, the power supply module further comprises a first circuit electrically connected between the rectifying circuit and the filtering circuit to cause a delay before the LED tube lamp lights up.

According to some embodiments, the first circuit comprises a capacitor configured to be charged when an AC driving signal is provided to the LED tube lamp to cause the LED tube lamp to conduct when a voltage of the capacitor exceeds a threshold trigger voltage.

According to some embodiments, the LED tube lamp is delayed to light up by 0.1 to 3 seconds.

According to some embodiments, an LED tube lamp comprises a glass tube having two ends, two end caps respectively attached at the two ends of the glass tube, an LED light strip attached to an inner circumferential surface of the glass tube by a glue, a plurality of LED light sources mounted on the LED light strip, and a power supply module electrically connected to the LED light strip and configured to drive the plurality of LED light sources. Each of the two end caps comprises a lateral wall and an end wall. The lateral wall is substantially coaxial with the glass tube and connected to the glass tube. The end wall is substantially perpendicular to an axial direction of the lateral wall and connected to an end of the lateral wall away from the glass tube. The end wall comprises an insulating portion made of an insulating material. At least two first connecting pads are arranged at an end of the LED light strip in one of the two end caps. The power supply module comprises a printed circuit board separated from the LED light strip. The printed circuit board comprises a first surface and a second surface opposite to and substantially parallel to the first surface, and the first surface and the second surface of the printed circuit board are substantially parallel with the axial direction of the lateral wall. The power supply module further comprises a plurality of electronic components mounted on the printed circuit board. The power supply module comprises a rectifying circuit and a filtering circuit electrically connected to the rectifying circuit. The rectifying circuit has at least two input terminals and is configured to rectify a signal received from the at least two input terminals. The power supply module comprises an integrated circuit disposed on the first surface of the printed circuit board, and at least two second connecting pads are arranged on the second surface of the printed circuit board and electrically connected to the at least two first connecting pads, respectively.

According to some embodiments, the LED light strip comprises a protective layer disposed on a surface thereof on which the plurality of LED light sources being disposed, and the other surface of the LED light strip is attached to the inner circumferential surface of the glass tube by the glue.

According to some embodiments, the printed circuit board is disposed on the end of the LED light strip.

According to some embodiments, the at least two first connecting pads are arranged on the end of the LED light strip, and the printed circuit board is disposed on the two first connecting pads.

According to some embodiments, the power supply module further comprises a resistor positioned close to an end wall of one of the two end caps and connected to one of the at least two input terminals of the rectifying circuit.

According to some embodiments, the resistor is a fuse resistor.

According to some embodiments, an outer diameter of each of the lateral walls is substantially the same as an outer diameter of the glass tube.

According to some embodiments, the rectifying circuit comprises a first full-wave bridge rectifying circuit and a second full-wave bridge rectifying circuit. The first full-wave bridge rectifying circuit has two input terminals electrically connected to two conductive pins of one of the two end caps, respectively, and the first full-wave bridge rectifying circuit has a positive output terminal and a negative output terminal. The second full-wave bridge rectifying circuit has two input terminals electrically connected to two conductive pins of the other one of the two end caps, respectively, and the second full-wave bridge rectifying circuit has a positive output terminal and a negative output terminal. The positive output terminal of the first full-wave bridge rectifying circuit and the positive output terminal of the second full-wave bridge rectifying circuit are electrically connected to each other, and the negative output terminal of the first full-wave bridge rectifying circuit and the negative output terminal of the second full-wave bridge rectifying circuit are electrically connected to each other.

According to some embodiments, the filtering circuit comprises an inductor, a first capacitor, and a second capacitor. An end of the inductor is electrically connected to the positive output terminal of the first full-wave bridge rectifying circuit and the positive output terminal of the second full-wave bridge rectifying circuit, and the other end of the inductor is regarded as one of filtering output terminals of the filtering circuit. An end of the first capacitor is electrically connected to one end of the inductor, and the other end of the first capacitor is electrically connected to the negative output terminal of the first full-wave bridge rectifying circuit and the negative output terminal of the second full-wave bridge rectifying circuit. An end of the second capacitor is electrically connected to the other end of the inductor, and the other end of the second capacitor is regarded as the other one of the filtering output terminals of the filtering circuit.

According to some embodiments, the rectifying circuit comprises a full-wave bridge rectifying circuit and a half-wave bridge rectifying circuit. The full-wave bridge rectifying circuit has two input terminals electrically connected to two conductive pins of one of the two end caps, respectively, and the full-wave bridge rectifying circuit has a positive output terminal and a negative output terminal. The half-wave bridge rectifying circuit has an input terminal electrically connected to one of two conductive pins of the other one of the two end caps, and the half-wave bridge rectifying circuit has a positive output terminal and a negative output terminal. The positive output terminal of the full-wave bridge rectifying circuit and the positive output terminal of the half-wave bridge rectifying circuit are electrically connected to each other, and the negative output terminal of the full-wave bridge rectifying circuit and the negative output terminal of the half-wave bridge rectifying circuit are electrically connected to each other.

According to some embodiments, the filtering circuit comprises a first capacitor. An end of the first capacitor is electrically connected to the positive output terminal of the full-wave bridge rectifying circuit and the positive output terminal of the half-wave bridge rectifying circuit, and the other end of the first capacitor is electrically connected to the negative output terminal of the full-wave bridge rectifying circuit and the negative output terminal of the half-wave bridge rectifying circuit.

According to some embodiments, the filtering circuit further comprises an inductor and a second capacitor. An end of the inductor is electrically connected to the end of the first capacitor, and the other end of the inductor is regarded as one of filtering output terminals of the filtering circuit. An end of the second capacitor is electrically connected to the other end of the inductor, and the other end of the second capacitor is regarded as the other one of the filtering output terminals of the filtering circuit.

According to some embodiments, the filtering circuit further comprises an EMI-reducing capacitor coupled between two conductive pins of one of the two end caps.

According to some embodiments, the power supply module further comprises a driving circuit electrically connected to filtering output terminals of the filtering circuit and has two driving output terminals electrically connected to the LED light strip. The driving circuit further comprises a controller, a diode, a switch, and an inductor. The diode has an anode electrically connected to one of the filtering output terminals and one of the two driving output terminals. The switch has a first terminal coupled to the other one of the filtering output terminals, a second terminal electrically connected to a cathode of the diode, and a control terminal coupled to the controller. The switch is turned on or off in response to a signal received from the controller. An end of the inductor is electrically connected to the second terminal of the switch, and the other end of the inductor is electrically connected to the LED light strip via the other one of the two driving output terminals.

According to some embodiments, the driving circuit further comprises a capacitor electrically connected between the two driving output terminals.

According to some embodiments, the power supply module further comprises a driving circuit electrically connected to filtering output terminals of the filtering circuit and has two driving output terminals electrically connected to the LED light strip. The driving circuit further comprises a controller, a diode, a switch, and an inductor. The diode has an anode electrically connected to one of the filtering output terminals and one of the two driving output terminals. The switch has a first terminal coupled to a cathode of the diode, a second terminal coupled to the other one of the filtering output terminals, and a control terminal coupled to the controller. The switch is turned on or off in response to a signal received from the controller. An end of the inductor is electrically connected to the first terminal of the switch and the anode of the diode, and the other end of the inductor is electrically connected to the LED light strip via the other one of the two driving output terminals.

According to some embodiments, the power supply module further comprises a first circuit electrically connected between the rectifying circuit and the filtering circuit to cause a delay before the LED tube lamp lights up.

According to some embodiments, the first circuit comprises a capacitor configured to be charged when an AC driving signal is provided to the LED tube lamp to cause the LED tube lamp to conduct when a voltage of the capacitor exceeds a threshold trigger voltage.

According to some embodiments, the LED tube lamp is delayed to light up by 0.1 to 3 seconds.

BRIEF DESCRIPTION OF THE DRAWINGS

FIG. 25 is a plane view schematically illustrating the arrangement of the soldering pads of the bendable circuit sheet of the LED light strip of the LED tube lamp according to one embodiment of the present invention;

FIG. 26 is a plane view schematically illustrating a row of three soldering pads of the bendable circuit sheet of the LED light strip of the LED tube lamp according to another embodiment of the present invention;

FIG. 27 is a plane view schematically illustrating two rows of soldering pads of the bendable circuit sheet of the LED light strip of the LED tube lamp according to still another embodiment of the present invention;

FIG. 28 is a plane view schematically illustrating a row of four soldering pads of the bendable circuit sheet of the LED light strip of the LED tube lamp according to yet another embodiment of the present invention;

FIG. 29 is a plane view schematically illustrating two rows of two soldering pads of the bendable circuit sheet of the LED light strip of the LED tube lamp according to yet still another embodiment of the present invention;

FIG. 30 is a plane view schematically illustrating through holes are formed on the soldering pads of the bendable circuit sheet of the LED light strip of the LED tube lamp according to one embodiment of the present invention;

FIG. 62E is a schematic diagram of a ballast detection circuit according to some embodiments of the present invention;

FIG. 63A is a block diagram of an exemplary power supply module in an LED tube lamp according to some embodiments of the present invention;

FIG. 63B is a block diagram of an exemplary power supply module in an LED tube lamp according to some embodiments of the present invention;

FIG. 63C is a schematic diagram of an auxiliary power module according to an embodiment of the present invention;

FIG. 64 is a block diagram of an exemplary power supply module in an LED tube lamp according to some embodiments of the present invention;

FIG. 65 illustrates a block diagram of an exemplary power supply module in an LED tube lamp according to one embodiment of the present invention;

FIG. 66 illustrates a perspective view of an LED tube lamp according to an embodiment of the instant disclosure;

FIG. 67 illustrates an exploded view of an LED tube lamp according to an embodiment of the instant disclosure;

FIG. 68 illustrates a partial view of an LED tube lamp according to an embodiment of the instant disclosure;

FIG. 69 illustrates a part of a cross section of FIG. 3 along the line A-A';

FIG. 70 illustrates a part of a cross section of an LED tube lamp according to an embodiment of the instant disclosure;

FIG. 71 illustrates a part of a cross section of an LED tube lamp according to an embodiment of the instant disclosure;

Figure 84:
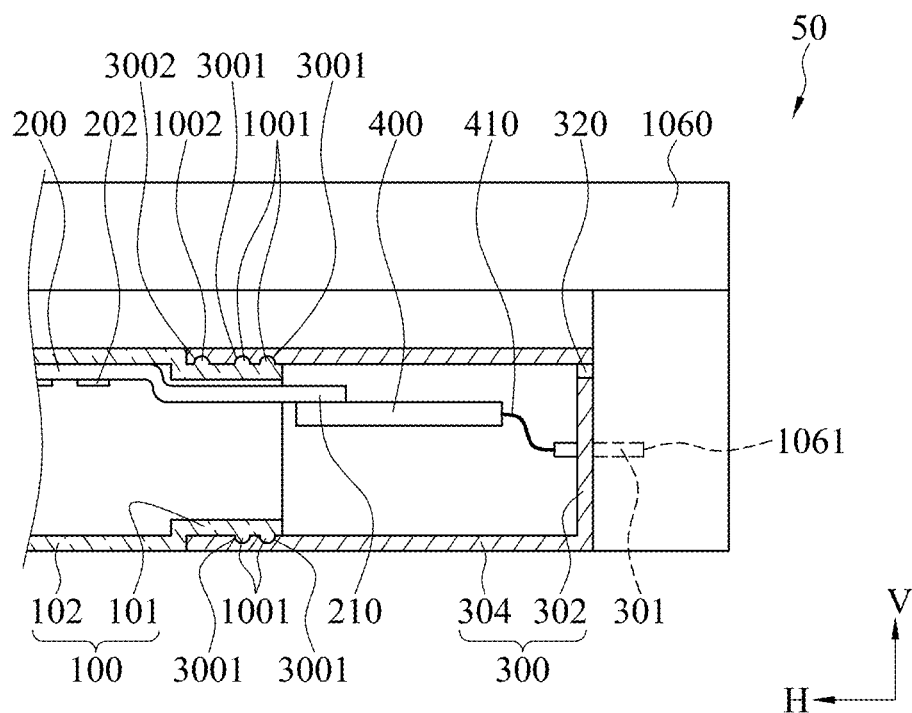
Figure 85:
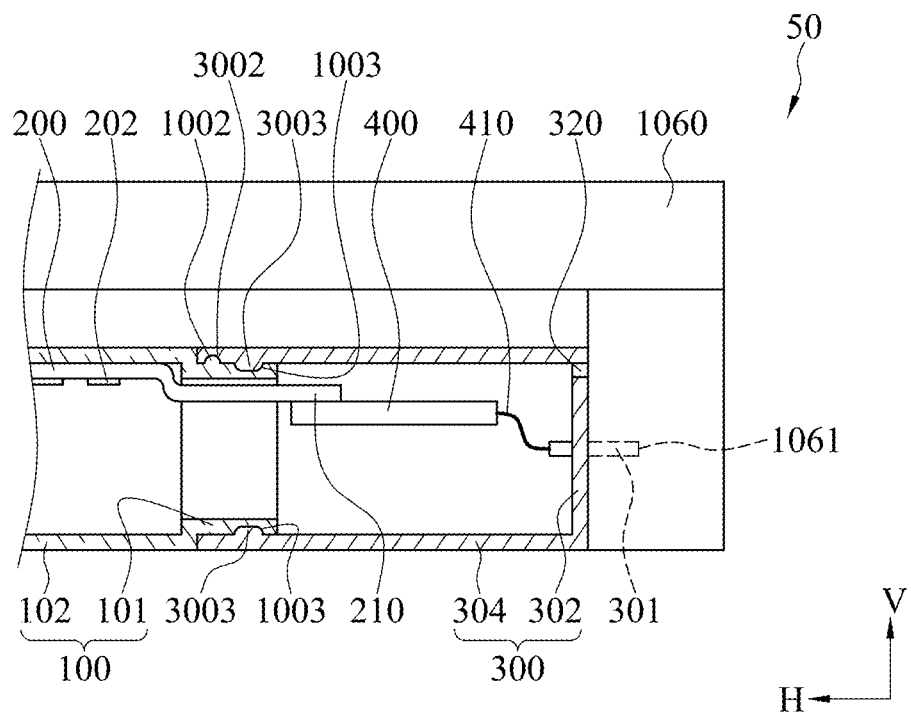
Figure 86:
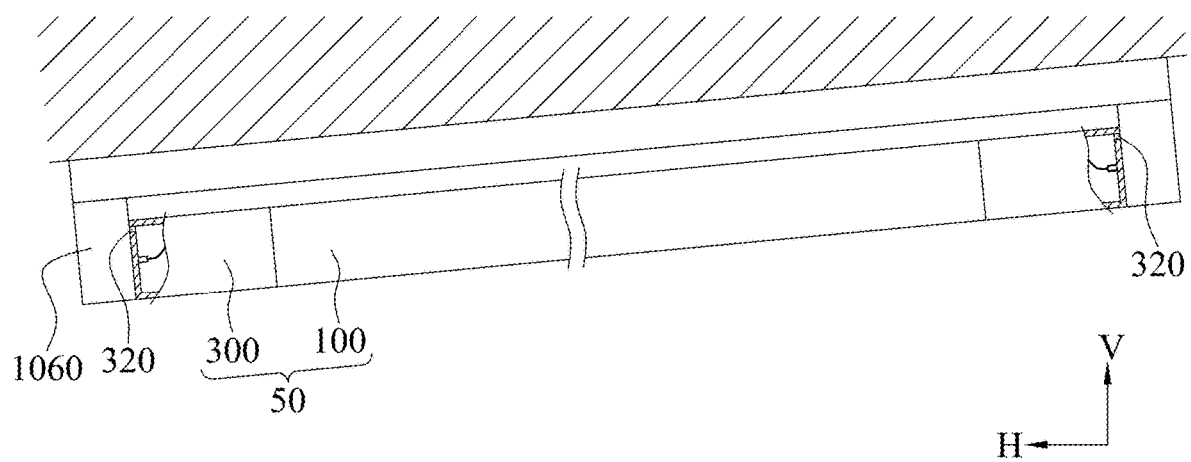
Figure 87:
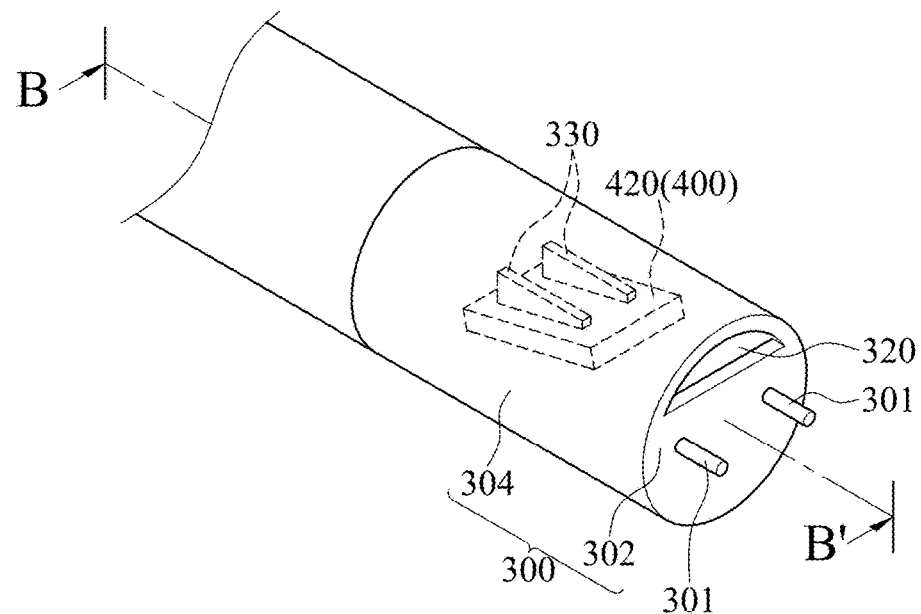
Figure 88:
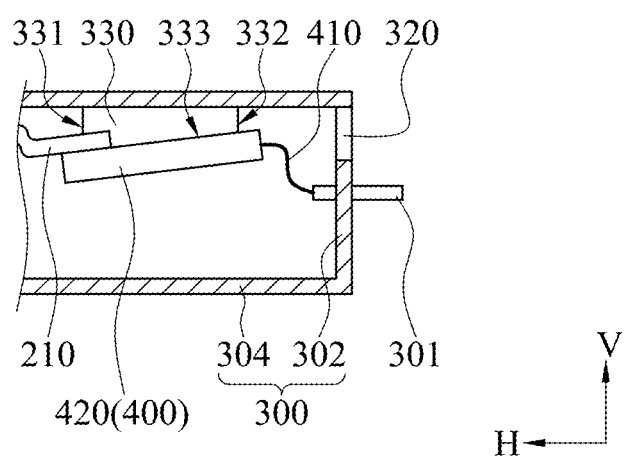
Figure 89:
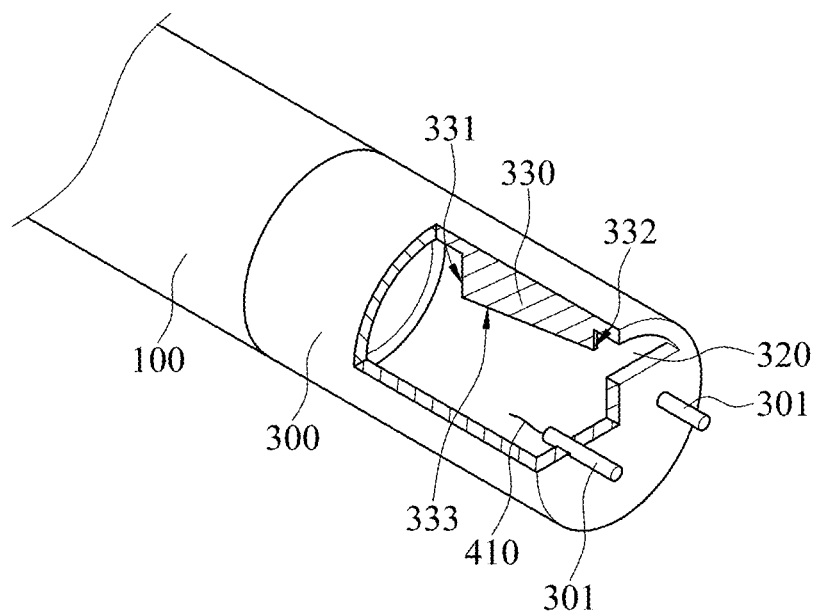
Figure 90:
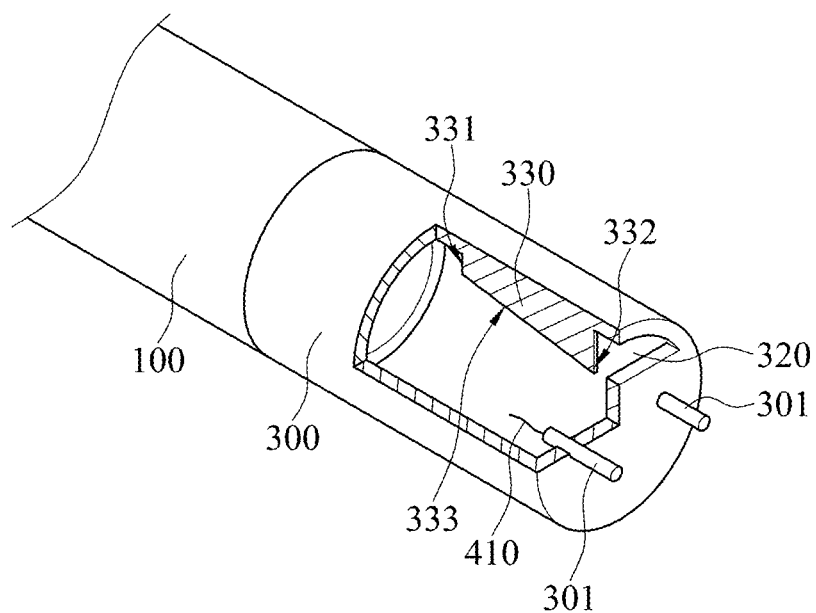
Figure 91:
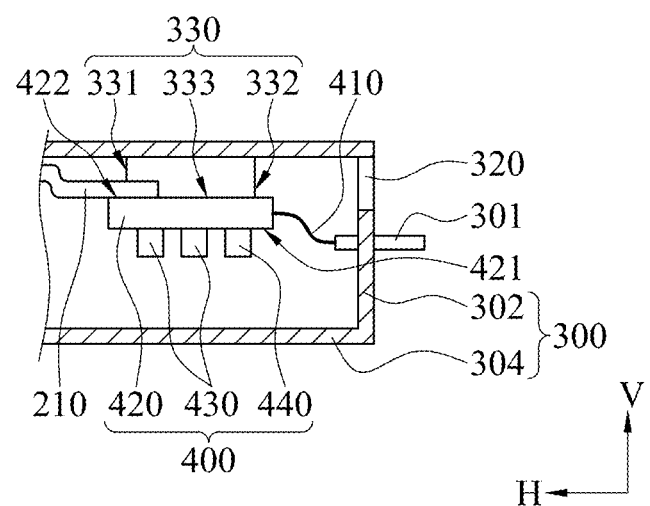
Figure 92:
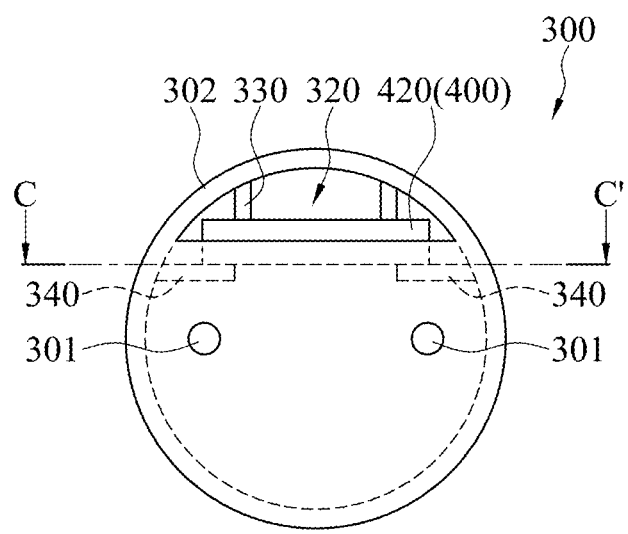
Figure 93:
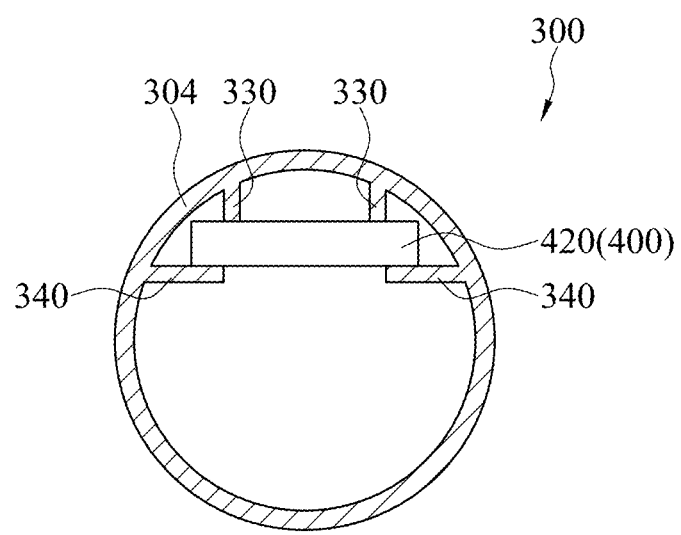
Figure 94:
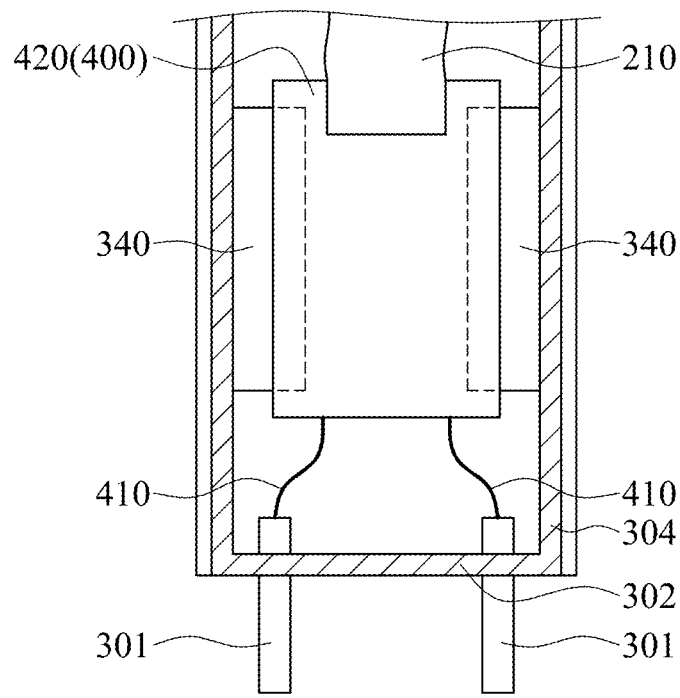
Figure 95:
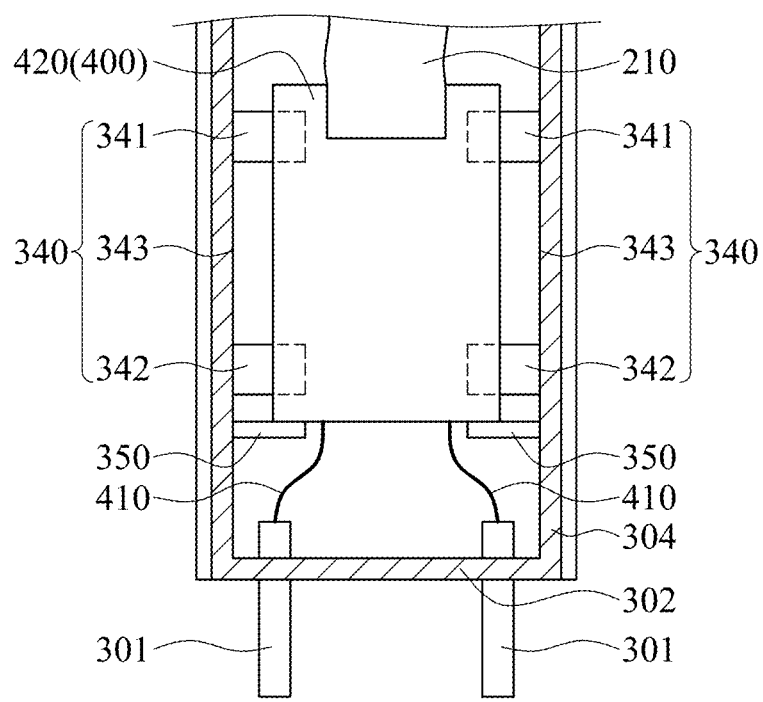
Figure 96:
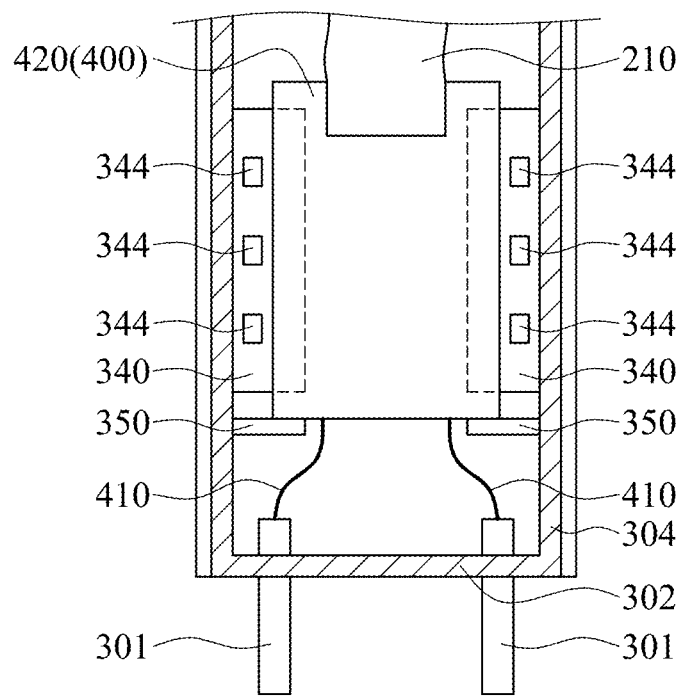
Figure 97:
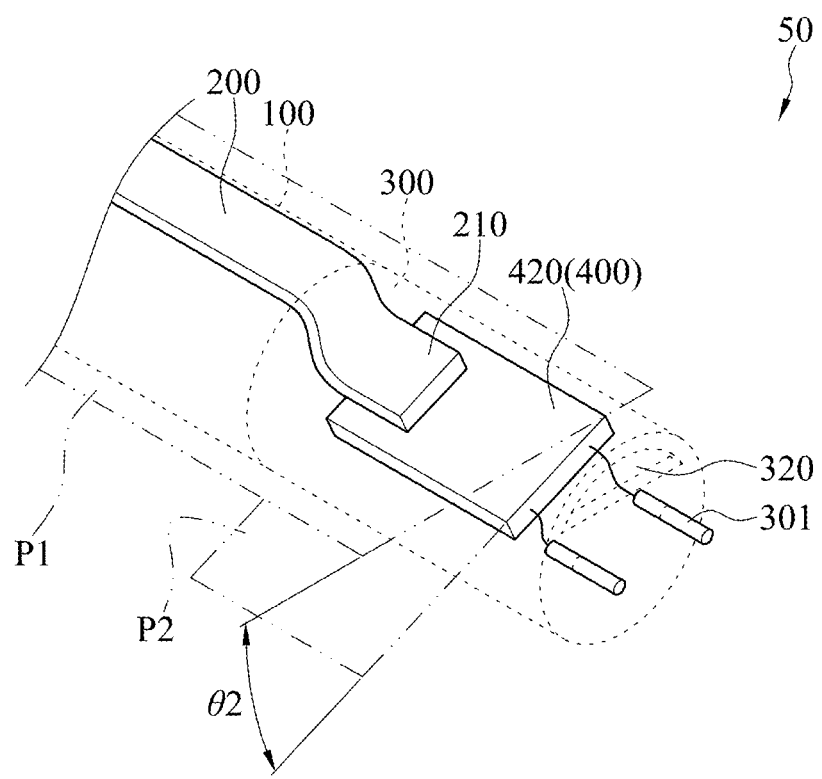
Figure 98:
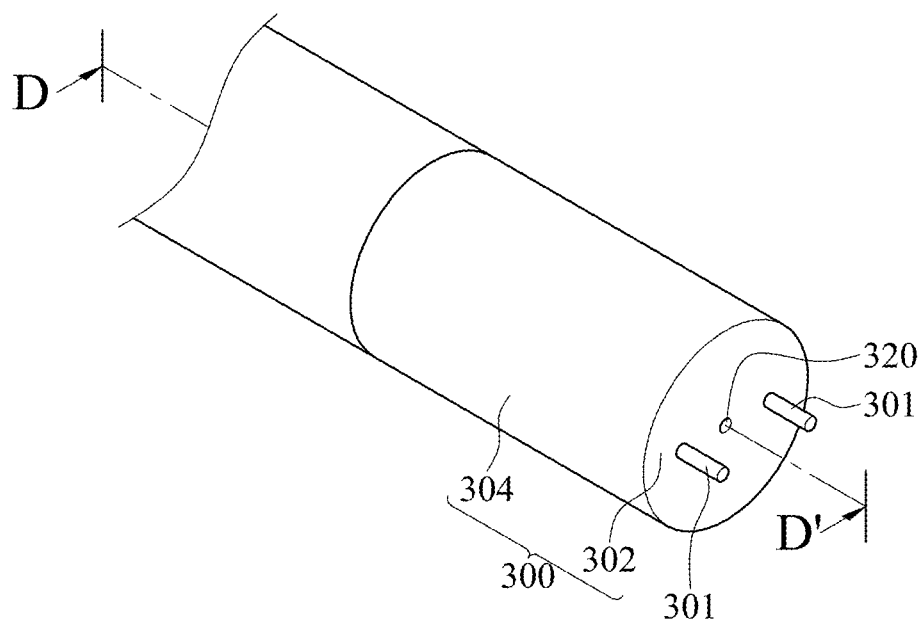
Figure 99:
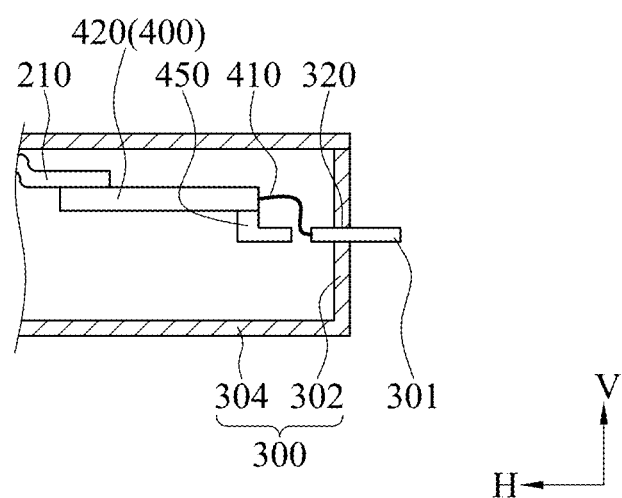
Figure 100:
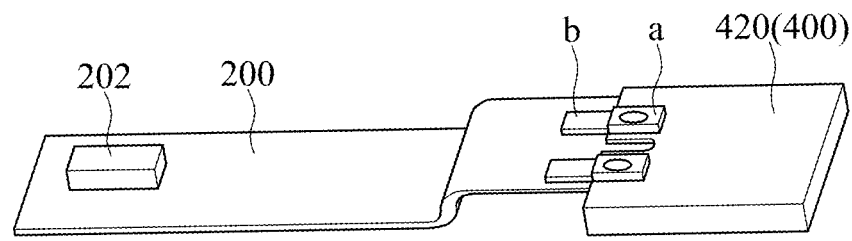
Figure 101:
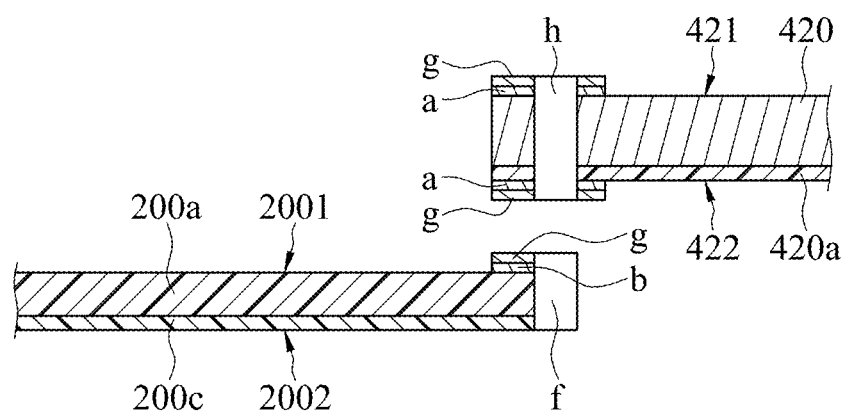
Figure 102:
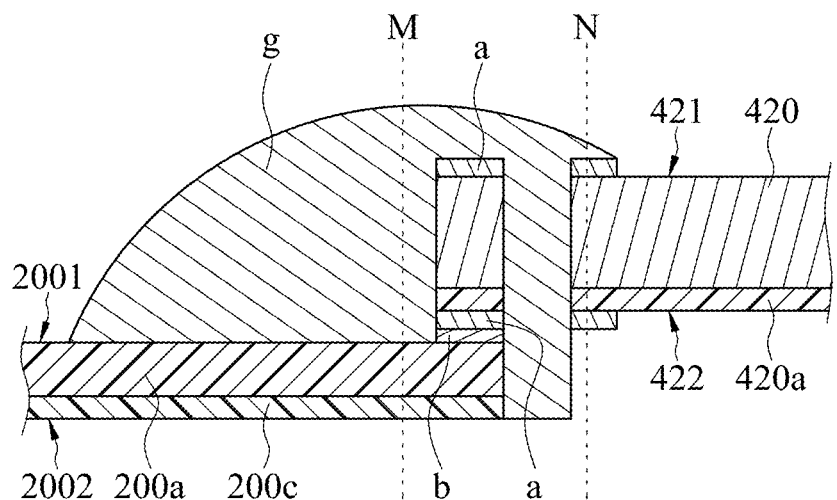
Figure 103:
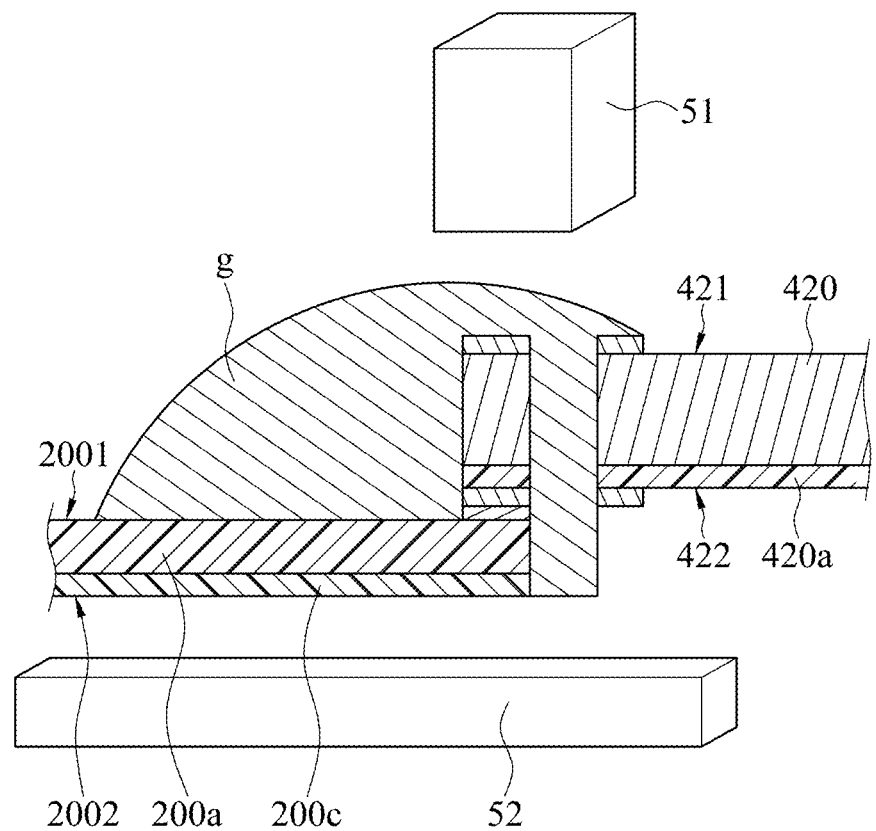

FIGS. 72 to 79 illustrate partial views of LED tube lamps according to several embodiments of the instant disclosure;

FIGS. 80 to 83 illustrate a part of cross sections of LED tube lamps according to several embodiments of the instant disclosure;

FIGS. 84 and 85 illustrate a part of cross sections of LED tube lamps installed to lamp bases according to several embodiments of the instant disclosure;

FIG. 86 illustrates a perspective view of an LED tube lamp installed to a lamp base according to an embodiment of the instant disclosure;

FIG. 87 illustrates a partial view of an LED tube lamp according to an embodiment of the instant disclosure;

FIG. 88 illustrates a part of a cross section of FIG. 87 along the line B-B';

FIG. 89 illustrates a partially steric cross section of FIG. 87;

FIG. 90 illustrates a partially steric cross section of an LED tube lamp according to an embodiment of the instant disclosure;

FIG. 91 illustrates a part of a cross section of an LED tube lamp according to an embodiment of the instant disclosure;

FIG. 92 illustrates an end view of an LED tube lamp in which the viewing angle is substantially parallel with an axle of an end cap according to an embodiment of the instant disclosure;

FIG. 93 illustrates a radial cross section of an end cap of FIG. 92;

FIG. 94 illustrates a part of an axial cross section of FIG. 92 along the line C-C';

FIGS. 95 and 96 illustrate a part of axial cross sections of LED tube lamps according to several embodiments of the instant disclosure;

FIG. 97 illustrates a partial view of an LED tube lamp according to an embodiment of the instant disclosure, and some components thereof are transparent;

FIG. 98 illustrates a partial view of an LED tube lamp according to an embodiment of the instant disclosure;

FIG. 99 illustrates a part of a cross section of FIG. 98 along the line D-D', and a light sensor is added;

FIG. 100 illustrates a partial view of a LED light strip and a power supply soldered to each other according to an embodiment of the instant disclosure; and FIGS. 101 to 103 illustrate diagrams of a soldering process of the LED light strip and the power supply according to an embodiment of the instant disclosure.

DETAILED DESCRIPTION

The present disclosure provides a novel LED tube lamp. The present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, resistors, etc. As such, directly electrically connected components do not include components electrically connected through active elements, such as transistors or diodes.

Components described as thermally connected or in thermal communication are arranged such that heat will follow a path between the components to allow the heat to transfer from the first component to the second component. Simply because two components are part of the same device or board does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to any material that provides incidental heat conduction, but are intended to refer to materials that are typically known as good heat conductors or known to have utility for transferring heat, or components having similar heat conducting properties as those materials.

Figure 1:
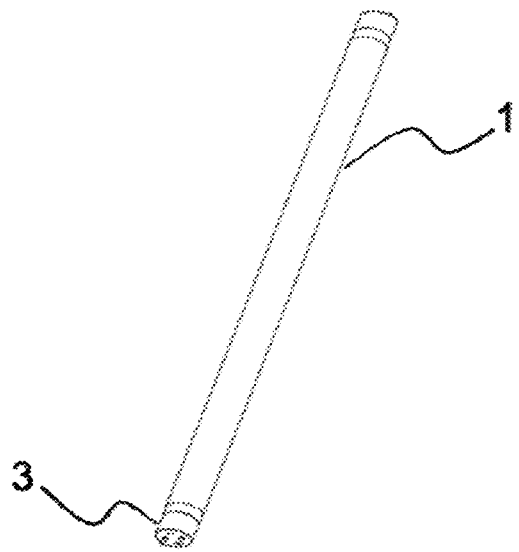
FIG. 1 is a perspective view schematically illustrating an LED tube lamp according to one embodiment of the present invention.
Figure 1A:
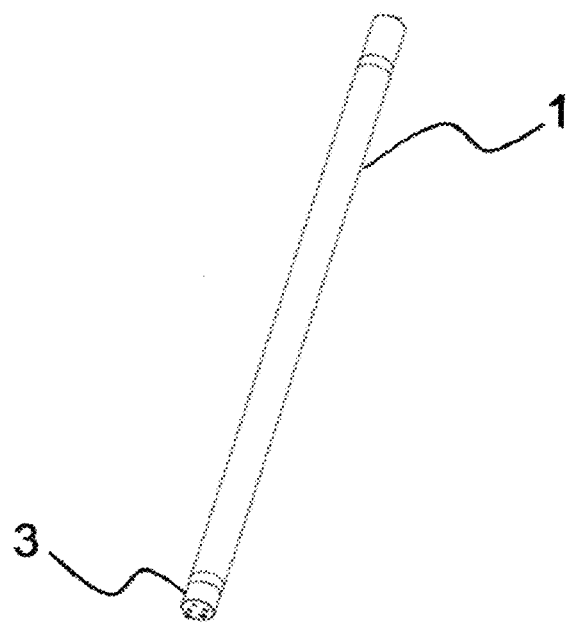
FIG. 1A is a perspective view schematically illustrating the different length end caps of an LED tube lamp according to another embodiment of the present invention to illustrate.

Referring to FIGS. 1, 1A, 1B and 2, an LED tube lamp of one embodiment of the present invention includes a lamp tube 1, an LED light strip 2 disposed inside the lamp tube 1, and two end caps 3 respectively disposed at two ends of the lamp tube 1. The lamp tube 1 may be made of plastic or glass. The lengths of the two end caps 3 may be same or different. Referring to FIG. 1A, the length of one end cap may in some embodiments be about 30% to about 80% times the length of the other end cap.

In one embodiment, the lamp tube 1 is made of glass with strengthened or tempered structure to avoid being easily broken and incurring electrical shock occurred to conventional glass made tube lamps, and to avoid the fast aging process that often occurs in plastic made tube lamps. The glass made lamp tube 1 may be additionally strengthened or tempered by a chemical tempering method or a physical tempering method in various embodiments of the present invention.

An exemplary chemical tempering method is accomplished by exchanging the Na ions or K ions on the glass surface with other alkali metal ions and therefore changes composition of the glass surface. The sodium (Na) ions or potassium (K) ions and other alkali metal ions on the glass surface are exchanged to form an ion exchange layer on the glass surface. The glass is then under tension on the inside while under compression on the outside when cooled to room temperature, so as to achieve the purpose of increased strength. The chemical tempering method includes but is not limited to the following glass tempering methods: high temperature type ion exchange method, the low temperature type ion exchange method, dealkalization, surface crystallization, and/or sodium silicate strengthening methods, further explained as follows.

An exemplary embodiment of the high temperature type ion exchange method includes the following steps: Inserting glass containing sodium oxide ($Na_2O$) or potassium oxide (K$_2$O) in the temperature range of the softening point and glass transition point into molten salt of lithium, so that the Na ions in the glass are exchanged for Li ions in the molten salt. Later, the glass is then cooled to room temperature, since the surface layer containing Li ions has a different expansion coefficient with respect to the inner layer containing Na ions or K ions, thus the surface produces residual stress and is reinforced. Meanwhile, the glass containing Al$_2$O$_3$, TiO$_2$ and other components, by performing ion exchange, can produce glass crystals having an extremely low coefficient of expansion. The crystallized glass surface after cooling produces a significant amount of pressure, up to 700 MPa, which can enhance the strength of glass.

An exemplary embodiment of the low-temperature ion exchange method includes the following steps: First, a monovalent cation (e.g., K ions) undergoes ion exchange with the alkali ions (e.g. Na ion) on the surface layer at a temperature range that is lower than the strain point temperature, so as to allow the K ions to penetrate the surface. For example, for manufacturing a Na$_2$O+CaO+SiO$_2$ system glass, the glass can be impregnated for ten hours at more than four hundred degrees in the molten salt. The low temperature ion exchange method can easily obtain glass of higher strength, and the processing method is simple, does not damage the transparent nature of the glass surface, and does not undergo shape distortion.

An exemplary embodiment of dealkalization includes treating glass using platinum (Pt) catalyst along with sulfurous acid gas and water in a high temperature atmosphere. The Na$^+$ ions are migrated out and bleed from the glass surface to be reacted with the Pt catalyst, so that the surface layer becomes a SiO$_2$ enriched layer, which results in a low expansion glass and produces compressive stress upon cooling.

The surface crystallization method and the high temperature type ion exchange method are different, but only the surface layer is treated by heat treatment to form low expansion coefficient microcrystals on the glass surface, thus reinforcing the glass.

An exemplary embodiment of the sodium silicate glass strengthening method is a tempering method using sodium silicate (water glass) in water solution at 100 degrees Celsius and several atmospheres of pressure treatment, where a stronger/higher strength glass surface that is harder to scratch is thereby produced.

An exemplary embodiment of the physical tempering method includes but is not limited to applying a coating to or changing the structure of an object such as to strengthen the easily broken position. The applied coating can be, for example, a ceramic coating, an acrylic coating, or a glass coating depending on the material used. The coating can be performed in a liquid phase or gaseous phase.

The above glass tempering methods described including physical tempering methods and chemical tempering methods can be accomplished singly or combined together in any fashion.

Figure 1B:
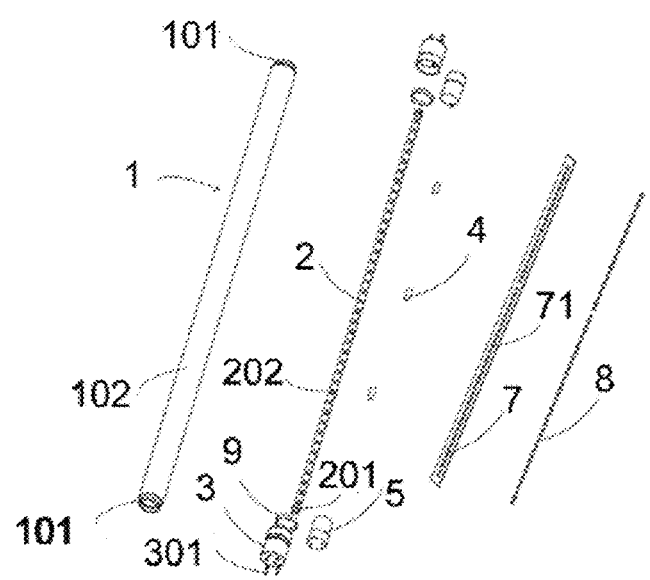
FIG. 1B is an exemplary exploded view schematically illustrating the LED tube lamp shown in FIG. 1.
Figure 15:
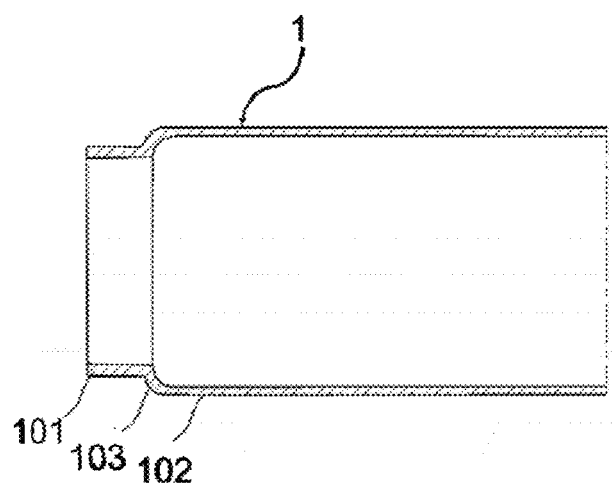
FIG. 15 is a plane cross-sectional view schematically illustrating end structure of a lamp tube of the LED tube lamp according to one embodiment of the present invention.

Referring to FIG. 1B and FIG. 15, a glass made lamp tube of an LED tube lamp according to one embodiment of the present invention has structure-strengthened end regions described as follows. The glass made lamp tube 1 includes a main body region 102, two rear end regions 101 (or just end regions 101) respectively formed at two ends of the main body region 102, and end caps 3 that respectively sleeve the rear end regions 101. The outer diameter of at least one of the rear end regions 101 is less than the outer diameter of the main body region 102. In the embodiment of FIGS. 1B and 15, the outer diameters of the two rear end regions 101 are less than the outer diameter of the main body region 102. In addition, the surface of the rear end region 101 is in parallel with the surface of the main body region 102 in a cross-sectional view. Specifically, the glass made lamp tube 1 is strengthened at both ends, such that the rear end regions 101 are formed to be strengthened structures. In certain embodiments, the rear end regions 101 with strengthened structure are respectively sleeved with the end caps 3, and the outer diameters of the end caps 3 and the main body region 102 have little or no differences. For example, the end caps 3 may have the same or substantially the same outer diameters as that of the main body region 102 such that there is no gap between the end caps 3 and the main body region 102. In this way, a supporting seat in a packing box for transportation of the LED tube lamp contacts not only the end caps 3 but also the lamp tube 1 and makes uniform the loadings on the entire LED tube lamp to avoid situations where only the end caps 3 are forced, therefore preventing breakage at the connecting portion between the end caps 3 and the rear end regions 101 due to stress concentration. The quality and the appearance of the product are therefore improved.

In one embodiment, the end caps 3 and the main body region 102 have substantially the same outer diameters. These diameters may have a tolerance for example within +/−0.2 millimeter (mm), or in some cases up to +/−1.0 millimeter (mm). Depending on the thickness of the end caps 3, the difference between an outer diameter of the rear end regions 101 and an outer diameter of the main body region 102 can be about 1 mm to about 10 mm for typical product applications. In some embodiments, the difference between the outer diameter of the rear end regions 101 and the outer diameter of the main body region 102 can be about 2 mm to about 7 mm.

Figure 2:
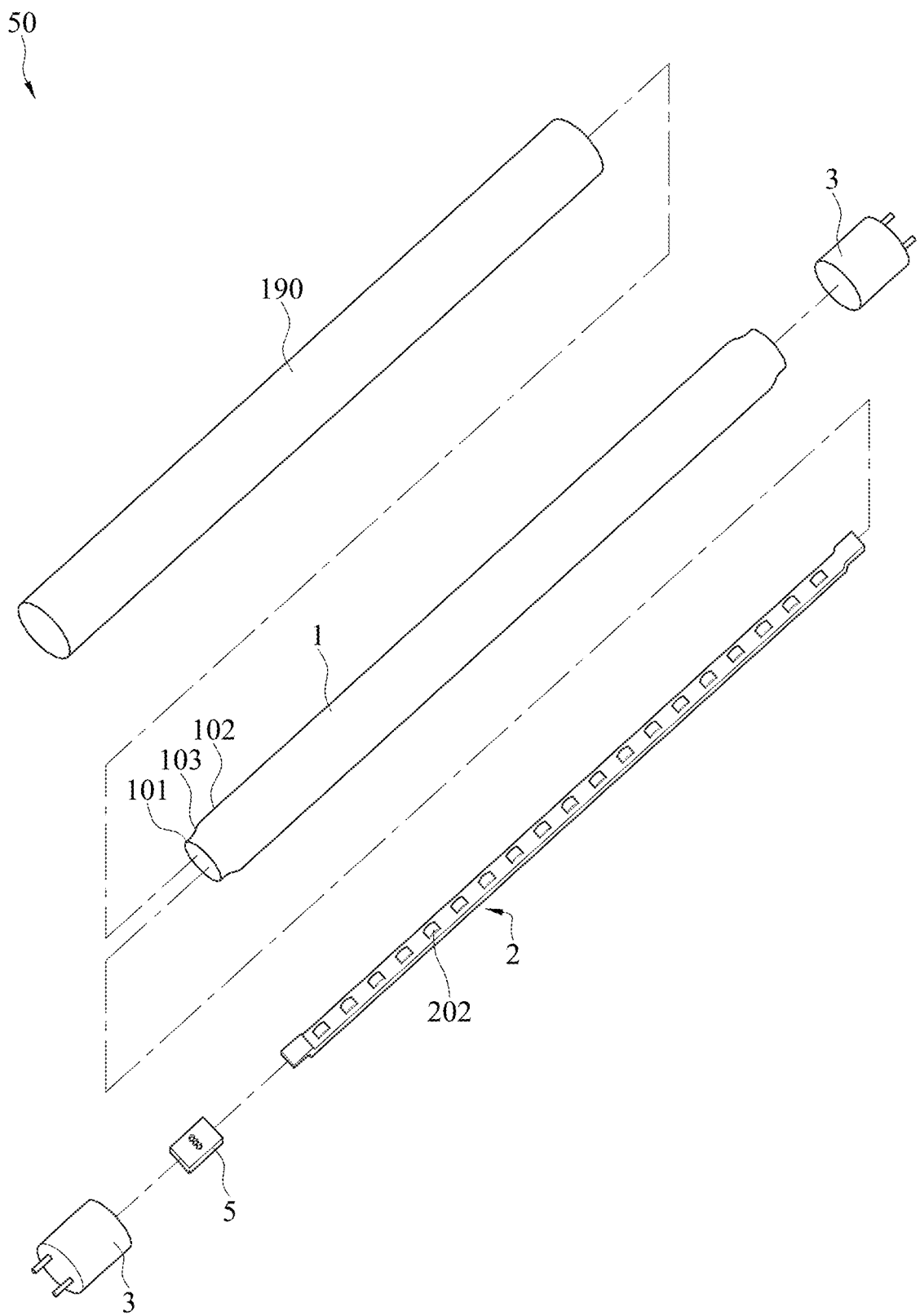
FIG. 2 illustrates an exploded view of an LED tube lamp including a heat shrink sleeve according to an embodiment of the present invention.

Referring to FIG. 2, the LED tube lamp 1 may have a heat shrink sleeve 190 covering on the outer surface of the lamp tube 1. In some embodiments, the heat shrink sleeve 190 may have a thickness ranging between 20 μm and 200 μm and is substantially transparent with respect to the wavelength of light from the LED light sources 202. In some embodiments, the heat shrink sleeve 190 may be made of PFA (perfluoroalkoxy) or PTFE (polytetrafluoroethylene). The heat shrink sleeve 190 may be slightly larger than the lamp tube 1, and may be shrunk and tightly cover the outer surface of the lamp tube 1 while being heated to an appropriate temperature (ex, 260° C. for PFA and PTFE).

Referring to FIG. 15, the lamp tube 1 is further formed with a transition region 103 between the main body region 102 and the rear end regions 101. In one embodiment, the transition region 103 is a curved region formed to have cambers at two ends to smoothly connect the main body region 102 and the rear end regions 101, respectively. For example, the two ends of the transition region 103 may be arc-shaped in a cross-section view along the axial direction of the lamp tube 1. Furthermore, one of the cambers connects the main body region 102 while the other one of the cambers connects the rear end region 101. In some embodiments, the arc angle of the cambers is greater than 90 degrees while the outer surface of the rear end region 101 is a continuous surface in parallel with the outer surface of the main body region 102 when viewed from the cross-section along the axial direction of the lamp tube. In other embodiments, the transition region 103 can be without curve or arc in shape. In certain embodiments, the length of the transition region 103 along the axial direction of the lamp tube 1 is between about 1 mm to about 4 mm. Upon experimentation, it was found that when the length of the transition region 103 along the axial direction of the lamp tube 1 is less than 1 mm, the strength of the transition region would be insufficient; when the length of the transition region 103 along the axial direction of the lamp tube 1 is more than 4 mm, the main body region 102 would be shorter and the desired illumination surface would be reduced, and the end caps 3 would be longer and the more materials for the end caps 3 would be needed.

Figure 5:
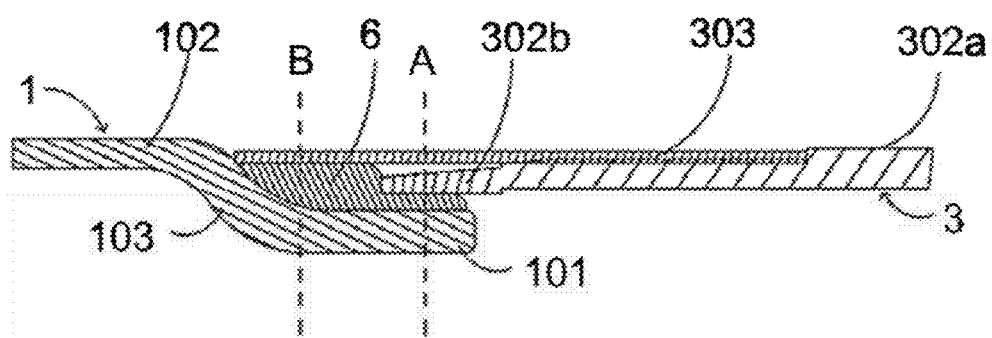
FIG. 5 is a plane cross-sectional partial view schematically illustrating a connecting region of the end cap and the lamp tube of the LED tube lamp according to one embodiment of the present invention.
Figure 16:
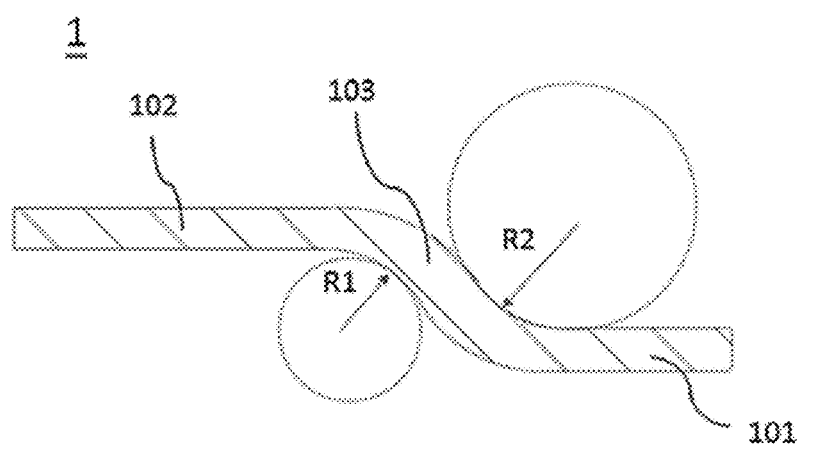
FIG. 16 is an exemplary plane cross-sectional view schematically illustrating the local structure of the transition region of the end of the lamp tube of FIG. 15.

Referring to FIG. 5 and FIG. 16, in certain embodiments, the lamp tube 1 is made of glass, and has a rear end region 101, a main body region 102, and a transition region 103. The transition region 103 has two arc-shaped cambers at both ends to from an S shape; one camber positioned near the main body region 102 is convex outwardly, while the other camber positioned near the rear end region 101 is concaved inwardly. Generally speaking, the radius of curvature, R1, of the camber/arc between the transition region 103 and the main body region 102 is smaller than the radius of curvature, R2, of the camber/arc between the transition region 103 and the rear end region 101. The ratio R1:R2 may range, for example, from about 1:1.5 to about 1:10, and in some embodiments is more effective from about 1:2.5 to about 1:5, and in some embodiments is even more effective from about 1:3 to about 1:4. In this way, the camber/arc of the transition region 103 positioned near the rear end region 101 is in compression at outer surfaces and in tension at inner surfaces, and the camber/arc of the transition region 103 positioned near the main body region 102 is in tension at outer surfaces and in compression at inner surfaces. Therefore, the goal of strengthening the transition region 103 of the lamp tube 1 is achieved.

Taking the standard specification for T8 lamp as an example, the outer diameter of the rear end region 101 is configured between 20.9 mm to 23 mm. An outer diameter of the rear end region 101 is less than 20.9 mm would be too small to fittingly insert the power supply into the lamp tube 1. The outer diameter of the main body region 102 is in some embodiments configured to be between about 25 mm to about 28 mm. An outer diameter of the main body region 102 being less than 25 mm would be inconvenient to strengthen the ends of the main body region 102 as far as the current manufacturing skills are concerned, while an outer diameter of the main body region 102 being greater than 28 mm is not compliant to the industrial standard.

Figure 3:
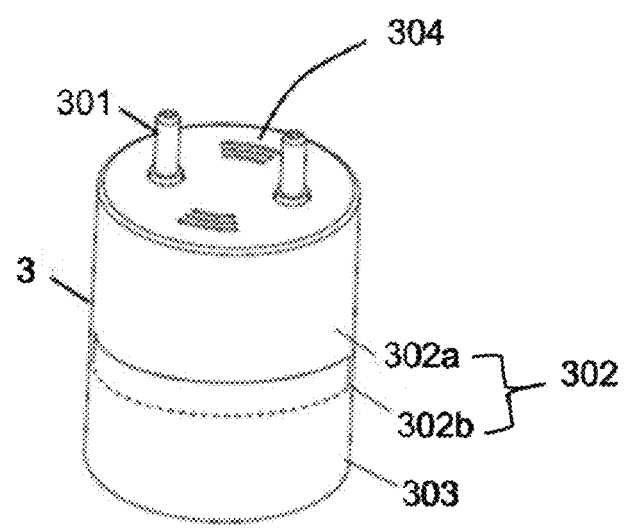
FIG. 3 is a perspective view schematically illustrating front and top of an end cap of the LED tube lamp according to one embodiment of the present invention.
Figure 4:
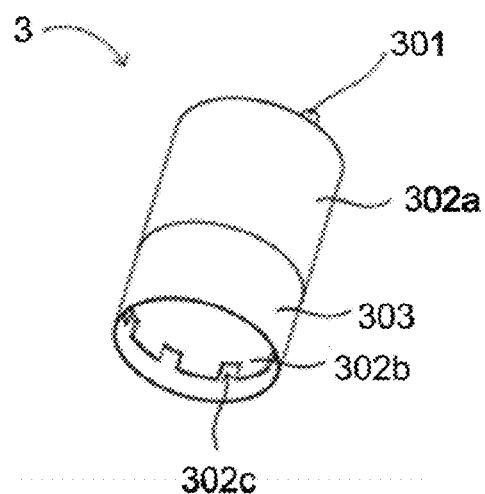
FIG. 4 is an exemplary perspective view schematically illustrating bottom of the end cap as shown in FIG. 3.

Referring to FIGS. 3 and 4, in one embodiment of the invention, each end cap 3 includes an electrically insulating tube 302, a thermal conductive member 303 sleeving over the electrically insulating tube 302, and two hollow conductive pins 301 disposed on the electrically insulating tube 302. The thermal conductive member 303 can be a metal ring that is tubular in shape.

Referring FIG. 5, in one embodiment, one end of the thermal conductive member 303 extends away from the electrically insulating tube 302 of the end cap 3 and towards one end of the lamp tube 1, and is bonded and adhered to the end of the lamp tube 1 using a hot melt adhesive 6. In this way, the end cap 3 by way of the thermal conductive member 303 extends to the transition region 103 of the lamp tube 1. In one embodiment, the thermal conductive member 303 and the transition region 103 are closely connected such that the hot melt adhesive 6 would not overflow out of the end cap 3 and remain on the main body region 102 when using the hot melt adhesive 6 to join the thermal conductive member 303 and the lamp tube 1. In addition, the electrically insulating tube 302 facing toward the lamp tube 1 does not have an end extending to the transition region 103, and that there is a gap between the electrically insulating tube 302 and the transition region 103. In one embodiment, the electrically insulating tube 302 is not limited to being made of plastic or ceramic, any material that is not a good electrical conductor can be used.

The hot melt adhesive 6 is a composite including a so-called commonly known as "welding mud powder", and in some embodiments includes one or more of phenolic resin 2127 #, shellac, rosin, calcium carbonate powder, zinc oxide, and ethanol. Rosin is a thickening agent with a feature of being dissolved in ethanol but not dissolved in water. In one embodiment, a hot melt adhesive 6 having rosin could be expanded to change its physical status to become solidified when being heated to high temperature in addition to the intrinsic viscosity. Therefore, the end cap 3 and the lamp tube1 can be adhered closely by using the hot melt adhesive to accomplish automatic manufacture for the LED tube lamps. In one embodiment, the hot melt adhesive 6 may be expansive and flowing and finally solidified after cooling. In this embodiment, the volume of the hot melt adhesive 6 expands to about 1.3 times the original size when heated from room temperature to about 200 to 250 degrees Celsius. The hot melt adhesive 6 is not limited to the materials recited herein. Alternatively, a material for the hot melt adhesive 6 to be solidified immediately when heated to a predetermined temperature can be used. The hot melt adhesive 6 provided in each embodiments of the present invention is durable with respect to high temperature inside the end caps 3 due to the heat resulted from the power supply. Therefore, the lamp tube 1 and the end caps 3 could be secured to each other without decreasing the reliability of the LED tube lamp.

Furthermore, there is formed an accommodation space between the inner surface of the thermal conductive member 303 and the outer surface of the lamp tube 1 to accommodate the hot melt adhesive 6, as indicated by the dotted line B in FIG. 5. For example, the hot melt adhesive 6 can be filled into the accommodation space at a location where a first hypothetical plane (as indicated by the dotted line B in FIG. 5) being perpendicular to the axial direction of the lamp tube 1 would pass through the thermal conductive member, the hot melt adhesive 6, and the outer surface of the lamp tube 1. The hot melt adhesive 6 may have a thickness, for example, of about 0.2 mm to about 0.5 mm. In one embodiment, the hot melt adhesive 6 will be expansive to solidify in and connect with the lamp tube 1 and the end cap 3 to secure both. The transition region 103 brings a height difference between the rear end region 101 and the main body region 102 to avoid the hot melt adhesives 6 being overflowed onto the main body region 102, and thereby saves manpower to remove the overflowed adhesive and increase the LED tube lamp productivity. The hot melt adhesive 6 is heated by receiving heat from the thermal conductive member 303 to which an electricity from an external heating equipment is applied, and then expands and finally solidifies after cooling, such that the end caps 3 are adhered to the lamp tube 1.

Referring to FIG. 5, in one embodiment, the electrically insulating tube 302 of the end cap 3 includes a first tubular part 302a and a second tubular part 302b connected along an axial direction of the lamp tube 1. The outer diameter of the second tubular part 302b is less than the outer diameter of the first tubular part 302a. In some embodiments, the outer diameter difference between the first tubular part 302a and the second tubular part 302b is between about 0.15 mm and about 0.30 mm. The thermal conductive member 303 sleeves over the outer circumferential surface of the second tubular part 302b. The outer surface of the thermal conductive member 303 is coplanar or substantially flush with respect to the outer circumferential surface of the first tubular part 302a. For example, the thermal conductive member 303 and the first tubular part 302a have substantially uniform exterior diameters from end to end. As a result, the entire end cap 3 and thus the entire LED tube lamp may be smooth with respect to the outer appearance and may have a substantially uniform tubular outer surface, such that the loading during transportation on the entire LED tube lamp is also uniform. In one embodiment, a ratio of the length of the thermal conductive member 303 along the axial direction of the end cap 3 to the axial length of the electrically insulating tube 302 ranges from about 1:2.5 to about 1:5.

In one embodiment, for sake of secure adhesion between the end cap 3 and the lamp tube 1, the second tubular part 302b is at least partially disposed around the lamp tube 1, and the accommodation space further includes a space encompassed by the inner surface of the second tubular part 302b and the outer surface of the rear end region 101 of the lamp tube 1. The hot melt adhesive 6 is at least partially filled in an overlapped region (shown by a dotted line "A" in FIG. 5) between the inner surface of the second tubular part 302b and the outer surface of the rear end region 101 of the lamp tube 1. For example, the hot melt adhesive 6 may be filled into the accommodation space at a location where a second hypothetical plane (shown by the dotted line A in FIG. 5) being perpendicular to the axial direction of the lamp tube 1 would pass through the thermal conductive member 303, the second tubular part 302b, the hot melt adhesive 6, and the rear end region 101.

The hot melt adhesive 6 is not required to completely fill the entire accommodation space as shown in FIG. 5, especially where a gap is reserved or formed between the thermal conductive member 303 and the second tubular part 302b. For example, in some embodiments, the hot melt adhesive 6 can be only partially filled into the accommodation space. During manufacturing of the LED tube lamp, the amount of the hot melt adhesive 6 coated and applied between the thermal conductive member 303 and the rear end region 101 may be appropriately increased, such that in the subsequent heating process, the hot melt adhesive 6 can be caused to expand and flow in between the second tubular part 302b and the rear end region 101, and thereby solidify after cooling to join the second tubular part 302b and the rear end region 101.

During fabrication of the LED tube lamp, the rear end region 101 of the lamp tube 1 is inserted into one of the end caps 3. In some embodiments, the axial length of the inserted portion of the rear end region 101 of the lamp tube 1 accounts for approximately one-third (⅓) to two-thirds (⅔) of the total axial length of the thermal conductive member 303. One benefit is that, there will be sufficient creepage distance between the hollow conductive pins 301 and the thermal conductive member 303, and thus it is not easy to form a short circuit leading to dangerous electric shock to individuals. On the other hand, the creepage distance between the hollow conductive pin 301 and the thermal conductive member 303 is increased due to the electrically insulating effect of the electrically insulating tube 302, and thus a high voltage test is more likely to pass without causing electrical shocks to people.

Furthermore, the presence of the second tubular part 302b interposed between the hot melt adhesive 6 and the thermal conductive member 303 may reduce the heat from the thermal conductive member 303 to the hot melt adhesive 6. To help prevent or minimize this problem, referring to FIG. 4 in one embodiment, the end of the second tubular part 302b facing the lamp tube 1 (i.e., away from the first tubular part 302a) is circumferentially provided with a plurality of notches 302c. These notches 302c help to increase the contact areas between the thermal conductive member 303 and the hot melt adhesive 6 and therefore provide rapid heat conduction from the thermal conductive member 303 to the hot melt adhesive 6 so as to accelerate the solidification of the hot melt adhesive 6. Moreover, the hot melt adhesive 6 electrically insulates the thermal conductive member 303 and the lamp tube 1 so that a user would not be electrically shocked when he touches the thermal conductive member 303 connected to a broken lamp tube 1.

The thermal conductive member 303 can be made of various heat conducting materials. The thermal conductive member 303 can be a metal sheet such as an aluminum alloy. The thermal conductive member 303 sleeves the second tubular part 302b and can be tubular or ring-shaped. The electrically insulating tube 302 may be made of electrically insulating material, but in some embodiments have low thermal conductivity so as to prevent the heat from reaching the power supply module located inside the end cap 3 and therefore negatively affecting performance of the power supply module. In one embodiment, the electrically insulating tube 302 is a plastic tube.

Alternatively, the thermal conductive member 303 may be formed by a plurality of metal plates circumferentially arranged on the tubular part 302b with either an equidistant space or a non-equidistant space.

Figures 6, 7:
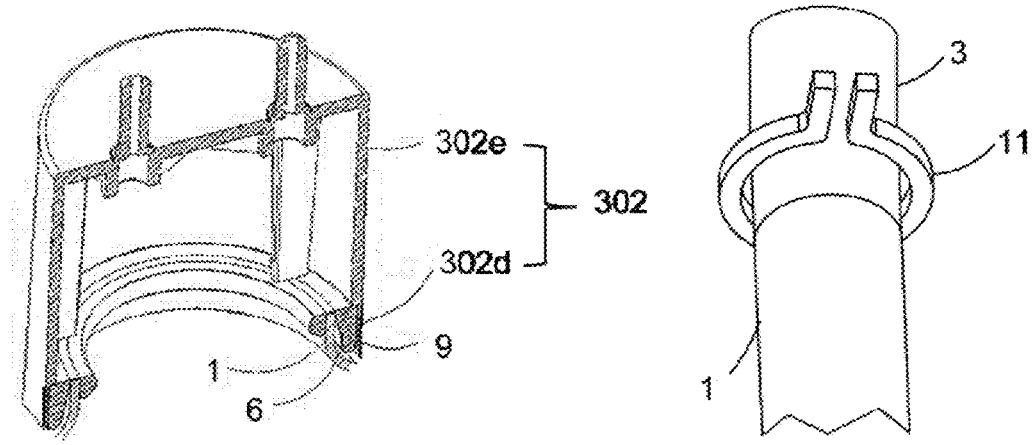
FIG. 6 is a perspective cross-sectional view schematically illustrating inner structure of an all-plastic end cap (having a magnetic metal member and hot melt adhesive inside) according to another embodiment of the present invention.
FIG. 7 is a perspective view schematically illustrating the all-plastic end cap and the lamp tube being bonded together by utilizing an induction coil according to certain embodiments of the present invention.

The end cap 3 may be designed to have other kinds of structures or include other elements. Referring to FIG. 6, the end cap 3 according to another embodiment further includes a magnetic metal member 9 within the electrically insulating tube 302 but excludes the thermal conductive member 3. The magnetic metal member 9 is fixedly arranged on the inner circumferential surface of the electrically insulating tube 302 and therefore interposed between the electrically insulating tube 302 and the lamp tube 1 such that the magnetic metal member 9 is partially overlapped with the lamp tube 1 in the radial direction. In this embodiment, the whole magnetic metal member 9 is inside the electrically insulating tube 302, and the hot melt adhesive 6 is coated on the inner surface of the magnetic metal member 9 (the surface of the magnetic metal tube member 9 facing the lamp tube 1) and adhered to the outer peripheral surface of the lamp tube 1. In some embodiments, the hot melt adhesive 6 covers the entire inner surface of the magnetic metal member 9 in order to increase the adhesion area and to improve the stability of the adhesion.

Referring to FIG. 7, when manufacturing the LED tube lamp of this embodiment, the electrically insulating tube 302 is inserted in an external heating equipment which is in some embodiments an induction coil 11, so that the induction coil 11 and the magnetic metal member 9 are disposed opposite (or adjacent) to one another along the radially extending direction of the electrically insulating tube 302. The induction coil 11 is energized and forms an electromagnetic field, and the electromagnetic field induces the magnetic metal member 9 to create an electrical current and become heated. The heat from the magnetic metal member 9 is transferred to the hot melt adhesive 6 to make the hot melt adhesive 6 expansive and flowing and then solidified after cooling, and the bonding for the end cap 3 and the lamp tube 1 can be accomplished. The induction coil 11 may be made, for example, of red copper and composed of metal wires having width of, for example, about 5 mm to about 6 mm to be a circular coil with a diameter, for example, of about 30 mm to about 35 mm, which is a bit greater than the outer diameter of the end cap 3. Since the end cap 3 and the lamp tube 1 may have the same outer diameters, the outer diameter may change depending on the outer diameter of the lamp tube 1, and therefore the diameter of the induction coil 11 used can be changed depending on the type of the lamp tube 1 used. As examples, the outer diameters of the lamp tube for T12, T10, T8, T5, T4, and T2 are 38.1 mm, 31.8 mm, 25.4 mm, 16 mm, 12.7 mm, and 6.4 mm, respectively.

Furthermore, the induction coil 11 may be provided with a power amplifying unit to increase the alternating current power to about 1 to 2 times the original. In some embodiments, it is better that the induction coil 11 and the electrically insulating tube 302 are coaxially aligned to make energy transfer more uniform. In some embodiments, a deviation value between the axes of the induction coil 11 and the electrically insulating tube 302 is not greater than about 0.05 mm. When the bonding process is complete, the end cap 3 and the lamp tube 1 are moved away from the induction coil. Then, the hot melt adhesive 6 absorbs the energy to be expansive and flowing and solidified after cooling. In one embodiment, the magnetic metal member 9 can be heated to a temperature of about 250 to about 300 degrees Celsius; the hot melt adhesive 6 can be heated to a temperature of about 200 to about 250 degrees Celsius. The material of the hot melt adhesive is not limited here, and a material of allowing the hot melt adhesive to immediately solidify when absorb heat energy can also be used.

In one embodiment, the induction coil 11 may be fixed in position to allow the end cap 3 and the lamp tube 1 to be moved into the induction coil 11 such that the hot melt adhesive 6 is heated to expand and flow and then solidify after cooling when the end cap 3 is again moved away from the induction coil 11. Alternatively, the end cap 3 and the lamp tube 1 may be fixed in position to allow the induction coil 11 to be moved to encompass the end cap 3 such that the hot melt adhesive 6 is heated to expand and flow and then solidify after cooling when the induction coil 11 is again moved away from the end cap 3. In one embodiment, the external heating equipment for heating the magnetic metal member 9 is provided with a plurality of devices the same as the induction coils 11, and the external heating equipment moves relative to the end cap 3 and the lamp tube 1 during the heating process. In this way, the external heating equipment moves away from the end cap 3 when the heating process is completed. However, the length of the lamp tube 1 is far greater than the length of the end cap 3 and may be up to above 240 cm in some special appliances, and this may cause bad connection between the end cap 3 and the lamp tube 1 during the process that the lamp tube 1 accompany with the end cap 3 to relatively enter or leave the induction coil 11 in the back and for the direction as mentioned above when a position error exists.

Figure 44:
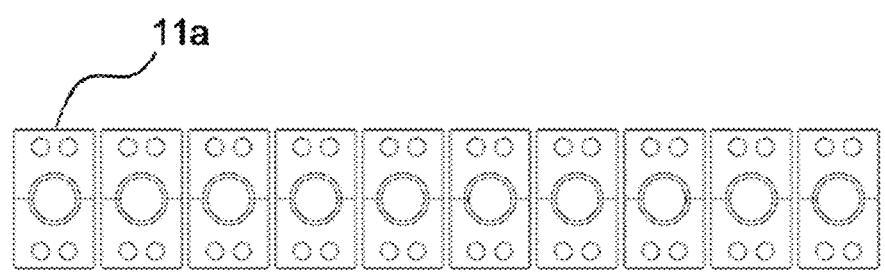
FIG. 44 is a plan view schematically illustrating an external equipment for heating the hot melt adhesive according to another embodiment of the present invention.

Referring to FIG. 44, an external heating equipment 110 having a plurality sets of upper and lower semicircular fixtures 11*a* is provided to achieve same heating effect as that brought by the induction coils 11. In this way, the above-mentioned damage risk due to the relative movement in back-and-forth direction can be reduced. The upper and lower semicircular fixtures 11*a* each has a semicircular coil made by winding a metal wire of, for example, about 5 mm to about 6 mm wide. The combination of the upper and lower semicircular fixtures form a ring with a diameter, for example, of about 30 mm to about 35 mm, and the inside semicircular coils form a closed loop to become the induction coil 11 as mentioned. In this embodiment, the end cap 3 and the lamp tube 1 do not relatively move in the back-and-forth manner, but roll into the notch of the lower semicircular fixture. Specifically, an end cap 3 accompanied with a lamp tube 1 initially roll on a production line, and then the end cap 3 rolls into the notch of a lower semicircular fixture, and then the upper and the lower semicircular fixtures are combined to form a closed loop, and the fixtures are detached when heating is completed. This method reduces the need for high position precision and yield problems in production.

Referring to FIG. 6, the electrically insulating tube 302 is further divided into two parts, namely a first tubular part 302*d* and a second tubular part 302*e*, i.e. the remaining part. In order to provide better support of the magnetic metal member 9, an inner diameter of the first tubular part 302*d* for supporting the magnetic metal member 9 is larger than the inner diameter of the second tubular part 302*e* which does not have the magnetic metal member 9, and a stepped structure is formed at the connection of the first tubular part 302*d* and the second tubular part 302*e*. In this way, an end of the magnetic metal member 9 as viewed in an axial direction is abutted against the stepped structure such that the entire inner surface of the end cap is smooth and plain. Additionally, the magnetic metal member 9 may be of various shapes, e.g., a sheet-like or tubular-like structure being circumferentially arranged or the like, where the magnetic metal member 9 is coaxially arranged with the electrically insulating tube 302.

Figures 8, 9:
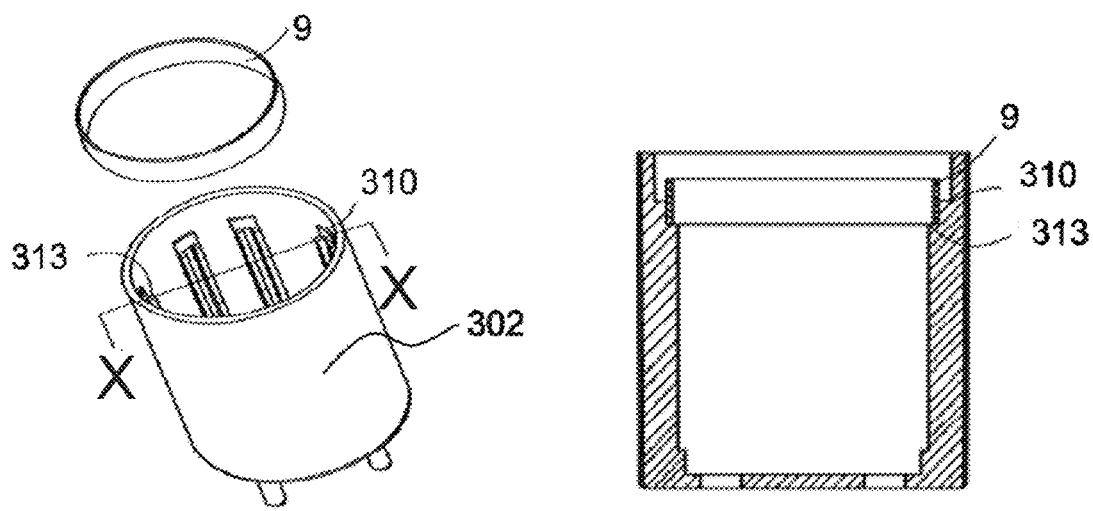
FIG. 8 is a perspective view schematically illustrating a supporting portion and a protruding portion of the electrically insulating tube of the end cap of the LED tube lamp according to the another embodiment of the present invention.
FIG. 9 is an exemplary plane cross-sectional view schematically illustrating the inner structure of the electrically insulating tube and the magnetic metal member of the end cap of FIG. 8 taken along a line X-X.

Referring to FIGS. 8 and 9, the electrically insulating tube may be further formed with a supporting portion 313 on the inner surface of the electrically insulating tube 302 to be extending inwardly such that the magnetic metal member 9 is axially abutted against the upper edge of the supporting portion 313. In some embodiments, the thickness of the supporting portion 313 along the radial direction of the electrically insulating tube 302 is between 1 mm to 2 mm. The electrically insulating tube 302 may be further formed with a protruding portion 310 on the inner surface of the electrically insulating tube 302 to be extending inwardly such that the magnetic metal member 9 is radially abutted against the side edge of the protruding portion 310 and that the outer surface of the magnetic metal member 9 and the inner surface of the electrically insulating tube 302 is spaced apart with a gap. The thickness of the protruding portion 310 along the radial direction of the electrically insulating tube 302 is less than the thickness of the supporting portion 313 along the radial direction of the electrically insulating tube 302 and in some embodiments be 0.2 mm to 1 mm in an embodiment.

Referring to FIG. 9, the protruding portion 310 and the supporting portion are connected along the axial direction, and the magnetic metal member 9 is axially abutted against the upper edge of the supporting portion 313 while radially abutted against the side edge of the protruding portion 310 such that at least part of the protruding portion 310 intervenes between the magnetic metal member 9 and the electrically insulating tube 302. The protruding portion 310 may be arranged along the circumferential direction of the electrically insulating tube 302 to have a circular configuration. Alternatively, the protruding portion 310 may be in the form of a plurality of bumps arranged on the inner surface of the electrically insulating tube 302. The bumps may be equidistantly or non-equidistantly arranged along the inner circumferential surface of the electrically insulating tube 302 as long as the outer surface of the magnetic metal member 9 and the inner surface of the electrically insulating tube 302 are in a minimum contact and simultaneously hold the hot melt adhesive 6. In other embodiments, an entirely metal made end cap 3 could be used with an insulator disposed under the hollow conductive pin to endure the high voltage.

Figure 10:
FIG. 10 is a plane view schematically illustrating the configuration of the openings on surface of the magnetic metal member of the end cap of the LED tube lamp according to the another embodiment of the present invention.

Referring to FIG. 10, in one embodiment, the magnetic metal member 9 can have one or more openings 91 that are circular. However, the openings 91 may instead be, for example, oval, square, star shaped, etc., as long as the contact area between the magnetic metal member 9 and the inner peripheral surface of the electrically insulating tube 302 can be reduced and the function of the magnetic metal member 9 to heat the hot melt adhesive 6 can be performed. In some embodiments, the openings 91 occupy about 10% to about 50% of the surface area of the magnetic metal member 9. The opening 91 can be arranged circumferentially on the magnetic metal member 9 in an equidistantly spaced or non-equidistantly spaced manner.

Figure 11:
FIG. 11 is a plane view schematically illustrating the indentation/embossment on a surface of the magnetic metal member of the end cap of the LED tube lamp according to certain embodiments of the present invention.

Referring to FIG. 11, in other embodiments, the magnetic metal member 9 has an indentation/embossment 93 on surface facing the electrically insulating tube 302. The embossment is raised from the inner surface of the magnetic metal member 9, while the indentation is depressed under the inner surface of the magnetic metal member 9. The indentation/embossment reduces the contact area between the inner peripheral surface of the electrically insulating tube 302 and the outer surface of the magnetic metal member 9 while maintaining the function of melting and curing the hot melt adhesive 6. In sum, the surface of the magnetic metal member 9 can be configured to have openings, indentations, or embossments or any combination thereof to achieve the goal of reducing the contact area between the inner peripheral surface of the electrically insulating tube 302 and the outer surface of the magnetic metal member 9. At the same time, the firm adhesion between the magnetic metal member 9 and the lamp tube 1 should be secured to accomplish the heating and solidification of the hot melt adhesive 6.

Figure 12:
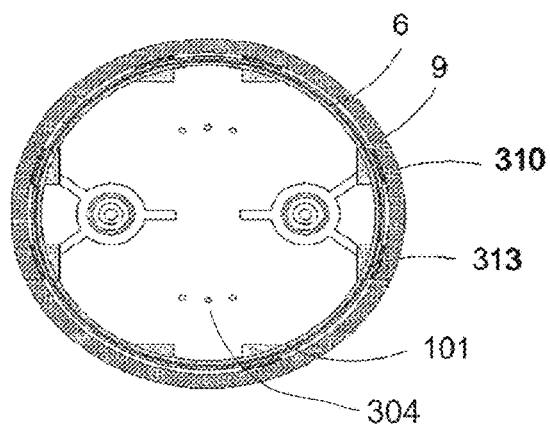
FIG. 12 is an exemplary plane cross-sectional view schematically illustrating the structure of the connection of the end cap of FIG. 8 and the lamp tube along a radial axis of the lamp tube, where the electrically insulating tube is in shape of a circular ring.
Figure 13:
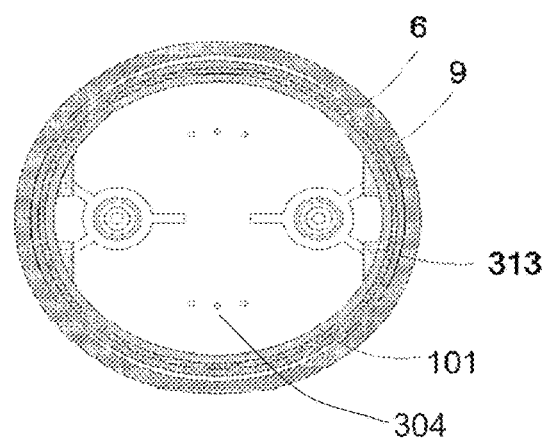
FIG. 13 is an exemplary plane cross-sectional view schematically illustrating the structure of the connection of the end cap of FIG. 8 and the lamp tube along a radial axis of the lamp tube, where the electrically insulating tube is in shape of an elliptical or oval ring.

Referring to FIG. 12, in one embodiment, the magnetic metal member 9 is a circular ring. Referring to FIG. 13, in another embodiment, the magnetic metal member 9 is a non-circular ring such as but not limited to an oval ring. When the magnetic metal member 9 is an oval ring, the minor axis of the oval ring is slightly larger than the outer diameter of the end region of the lamp tube 1 such that the contact area of the inner peripheral surface of the electrically insulating tube 302 and the outer surface of the magnetic metal member 9 is reduced and the function of melting and curing the hot melt adhesive 6 still performs properly. For example, the inner surface of the electrically insulating tube 302 may be formed with supporting portion 313 and the magnetic metal member 9 in a non-circular ring shape is seated on the supporting portion 313. Thus, the contact area of the outer surface of the magnetic metal member 9 and the inner surface of the electrically insulating tube 302 could be reduced while that the function of solidifying the hot melt adhesive 6 could be performed. In other embodiments, the magnetic metal member 9 can be disposed on the outer surface of the end cap 3 to replace the thermal conductive member 303 as shown in FIG. 5 and to perform the function of heating and solidifying the hot melt adhesive 6 via electromagnetic induction.

Figure 45:
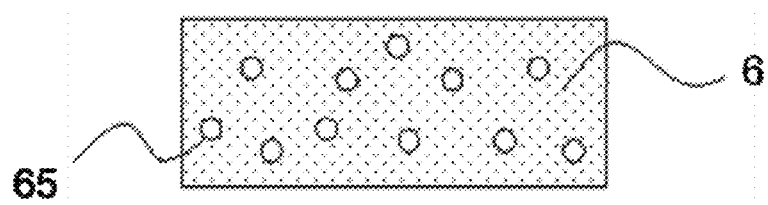
FIG. 45 is a cross-sectional view schematically illustrating the hot melt adhesive having uniformly distributed high permeability powder particles with small particle size according to one embodiment of the present invention.
Figure 46:
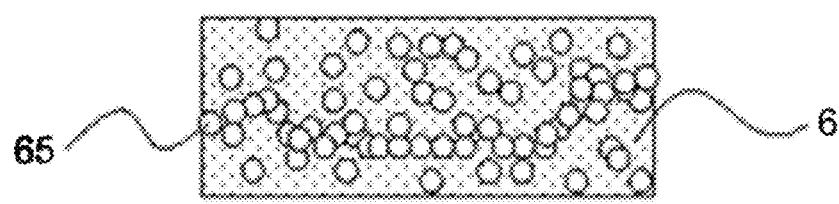
FIG. 46 is a cross-sectional view schematically illustrating the hot melt adhesive having non-uniformly distributed high permeability powder particles with small particle size according to another embodiment of the present invention, wherein the powder particles form a closed electric loop.
Figure 47:
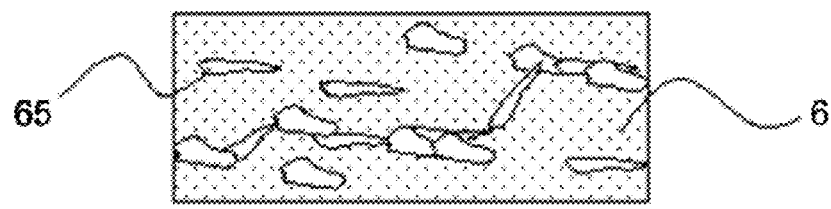
FIG. 47 is a cross-sectional view schematically illustrating the hot melt adhesive having non-uniformly distributed high permeability powder particles with large particle size according to yet another embodiment of the present invention, wherein the powder particles form a closed electric loop.

Referring to FIGS. 45 to 47, in other embodiments, the magnetic metal member 9 may be omitted. Instead, in some embodiments, the hot melt adhesive 6 has a predetermined proportion of high permeability powders 65 having relative permeability ranging, for example, from about $10^2$ to about $10^6$. The powders can be used to replace the calcite powders originally included in the hot melt adhesive 6, and in certain embodiments, a volume ratio of the high permeability powders 65 to the calcite powders may be about 1:3~1:1. In some embodiments, the material of the high permeability powders 65 is one of iron, nickel, cobalt, alloy thereof, or any combination thereof; the weight percentage of the high permeability powders 65 with respect to the hot melt adhesive is about 10% to about 50%; and/or the powders may have mean particle size of about 1 to about 30 micrometers. Such a hot melt adhesive 6 allows the end cap 3 and the lamp tube 1 to adhere together and be qualified in a destruction test, a torque test, and a bending test. Generally speaking, the bending test standard for the end cap of the LED tube lamp is greater than 5 newton-meters (Nt-m), while the torque test standard is greater than 1.5 newton-meters (Nt-m). In one embodiment, upon the ratio of the high permeability powders 65 to the hot melt adhesive 6 and the magnetic flux applied, the end cap 3 and the end of the lamp tube 1 secured by using the hot melt adhesive 6 are qualified in a torque test of 1.5 to 5 newton-meters (Nt-m) and a bending test of 5 to 10 newton-meters (Nt-m). The induction coil 11 is first switched on and allow the high permeability powders uniformly distributed in the hot melt adhesive 6 to be charged, and therefore allow the hot melt adhesive 6 to be heated to be expansive and flowing and then solidified after cooling. Thereby, the goal of adhering the end cap 3 onto the lamp tube 1 is achieved.

Referring to FIGS. 45 to 47, the high permeability powders 65 may have different distribution manners in the hot melt adhesive 6. As shown in FIG. 45, the high permeability powders 65 have mean particle size of about 1 to about 5 micrometers, and are distributed uniformly in the hot melt adhesive 6. When such a hot melt adhesive 6 is coated on the inner surface of the end cap 3, though the high permeability powders 65 cannot form a closed loop due to the uniform distribution, they can still be heated due to magnetic hysteresis in the electromagnetic field, so as to heat the hot melt adhesive 6. As shown in FIG. 46, the high permeability powders 65 have mean particle size of about 1 to about 5 micrometers, and are distributed randomly in the hot melt adhesive 6. When such a hot melt adhesive 6 is coated on the inner surface of the end cap 3, the high permeability powders 65 form a closed loop due to the random distribution; they can be heated due to magnetic hysteresis or the closed loop in the electromagnetic field, so as to heat the hot melt adhesive 6. As shown in FIG. 47, the high permeability powders 65 have mean particle size of about 5 to about 30 micrometers, and are distributed randomly in the hot melt adhesive 6. When such a hot melt adhesive 6 is coated on the inner surface of the end cap 3, the high permeability powders 65 form a closed loop due to the random distribution; they can be heated due to magnetic hysteresis or the closed loop in the electromagnetic field, so as to heat the hot melt adhesive 6. Accordingly, depending on the adjustment of the particle size, the distribution density and the distribution manner of the high permeability powders 65, and the electromagnetic flux applied to the end cap 3, the heating temperature of the hot melt adhesive 6 can be controlled. In one embodiment, the hot melt adhesive 6 is flowing and solidified after cooling from a temperature of about 200 to about 250 degrees Celsius. In another embodiment, the hot melt adhesive 6 is immediately solidified at a temperature of about 200 to about 250 degrees Celsius.

Figure 14:
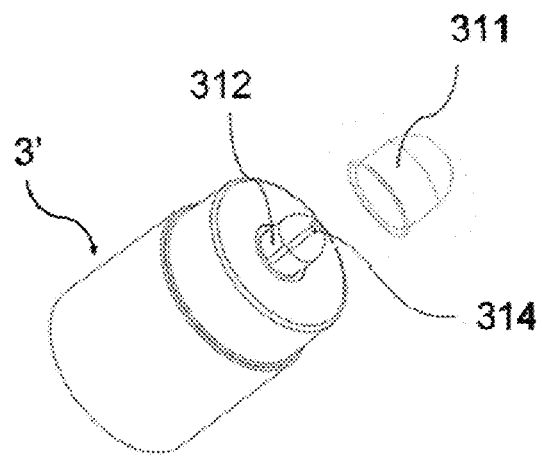
FIG. 14 is a perspective view schematically illustrating still another end cap of an LED tube lamp according to still another embodiment of the prevent invention.
Figure 39:
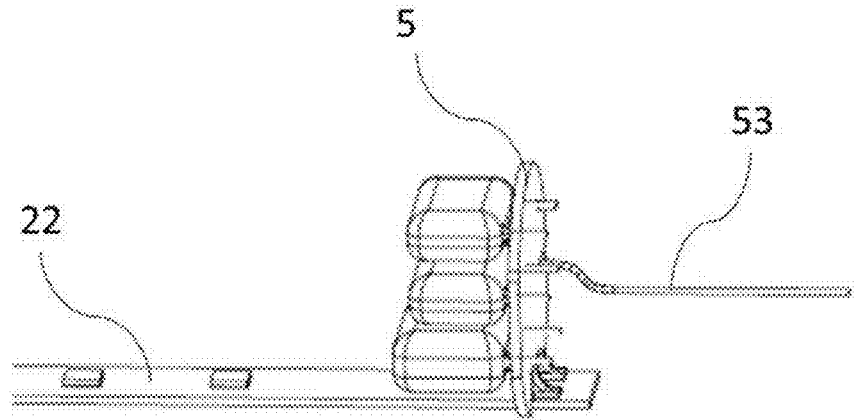
FIG. 39 is a perspective view schematically illustrating the printed circuit board of the power supply, which is perpendicularly adhered to a hard circuit board made of aluminum via soldering according to another embodiment of the present invention.

Referring to FIGS. 14 and 39, in one embodiment, an end cap 3' has a pillar 312 at one end, the top end of the pillar 312 is provided with an opening having a groove 314 of, for example 0.1±1% mm depth at the periphery thereof for positioning a conductive lead 53 as shown in FIG. 39. The conductive lead 53 passes through the opening on top of the pillar 312 and has its end bent to be disposed in the groove 314. After that, a conductive metallic cap 311 covers the pillar 312 such that the conductive lead 53 is fixed between the pillar 312 and the conductive metallic cap 311. In some embodiments, the inner diameter of the conductive metallic cap 311 is 7.56±5% mm, the outer diameter of the pillar 312 is 7.23±5% mm, and the outer diameter of the conductive lead 53 is 0.5±1% mm. Nevertheless, the mentioned sizes are not limited here once that the conductive metallic cap 311 closely covers the pillar 312 without using extra adhesives and therefore completes the electrical connection between the power supply 5 and the conductive metallic cap 311.

Referring to FIGS. 1B, 3, 12, and 13, in one embodiment, the end cap 3 may have openings 304 to dissipate heat generated by the power supply modules inside the end cap 3 so as to prevent a high temperature condition inside the end cap 3 that might reduce reliability. In some embodiments, the openings are in a shape of an arc; especially in a shape of three arcs with different length. In one embodiment, the openings are in a shape of three arcs with gradually varying length. The openings on the end cap 3 can be in any one of the above-mentioned shape or any combination thereof.

In other embodiments, the end cap 3 is provided with a socket (not shown) for installing the power supply module.

Figures 17, 18:
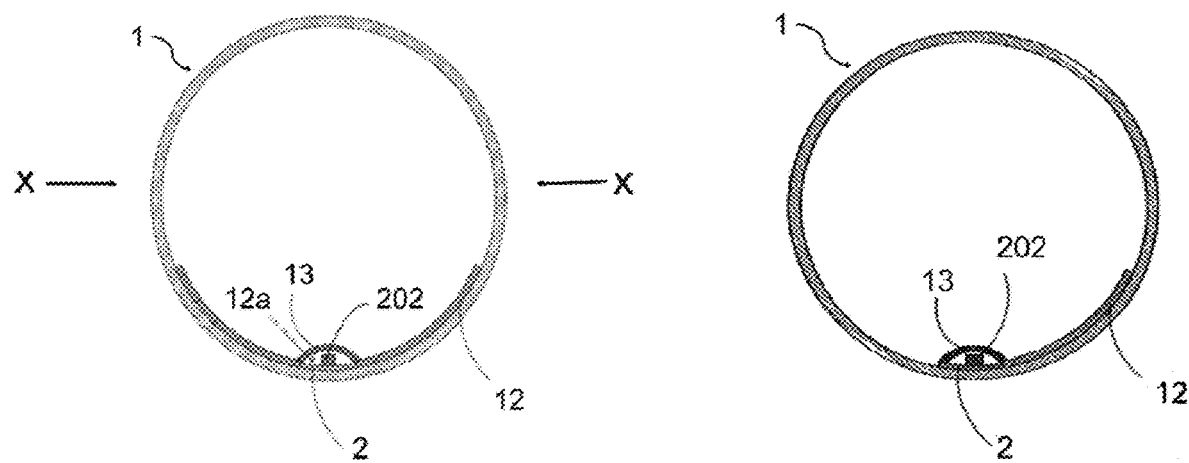
FIG. 17 is a plane cross-sectional view schematically illustrating inside structure of the lamp tube of the LED tube lamp according to one embodiment of the present invention, wherein two reflective films are respectively adjacent to two sides of the LED light strip along the circumferential direction of the lamp tube.
FIG. 18 is a plane cross-sectional view schematically illustrating inside structure of the lamp tube of the LED tube lamp according to another embodiment of the present invention, wherein only a reflective film is disposed on one side of the LED light strip along the circumferential direction of the lamp tube.

Referring to FIG. 17, in one embodiment, the lamp tube 1 further has a diffusion film 13 coated and bonded to the inner surface thereof so that the light outputted or emitted from the LED light sources 202 is diffused by the diffusion film 13 and then pass through the lamp tube 1. The diffusion film 13 can be in form of various types, such as a coating onto the inner surface or outer wall of the lamp tube 1, or a diffusion coating layer (not shown) coated at the surface of each LED light source 202, or a separate membrane covering the LED light source 202.

Referring again to FIG. 17, in one embodiment, when the diffusion film 13 is in the form of a sheet, it covers but is not in contact with the LED light sources 202. The diffusion film 13 in the form of a sheet is usually called an optical diffusion sheet or board, usually a composite made of mixing diffusion particles into polystyrene (PS), polymethyl methacrylate (PMMA), polyethylene terephthalate (PET), and/or polycarbonate (PC), and/or any combination thereof. The light passing through such composite is diffused to expand in a wide range of space such as a light emitted from a plane source, and therefore makes the brightness of the LED tube lamp uniform.

In alternative embodiments, the diffusion film 13 is in form of an optical diffusion coating, which is composed of any one of calcium carbonate, halogen calcium phosphate and aluminum oxide, or any combination thereof. When the optical diffusion coating is made from a calcium carbonate with suitable solution, an excellent light diffusion effect and transmittance to exceed 90% can be obtained. Furthermore, the diffusion film 13 in form of an optical diffusion coating may be applied to an outer surface of the rear end region 101 having the hot melt adhesive 6 to produce increased friction resistance between the end cap 3 and the rear end region 101. Compared with an example without any optical diffusion coating, the rear end region 101 having the diffusion film 13 is beneficial, for example for preventing accidental detachment of the end cap 3 from the lamp tube 1.

In one embodiment, the composition of the diffusion film 13 in form of the optical diffusion coating includes calcium carbonate, strontium phosphate (e.g., CMS-5000, white powder), thickener, and a ceramic activated carbon (e.g., ceramic activated carbon SW-C, which is a colorless liquid). Specifically, in one example, such an optical diffusion coating on the inner circumferential surface of the glass tube has an average thickness ranging between about 20 and about 30 μm. A light transmittance of the diffusion film 13 using this optical diffusion coating is about 90%. Generally speaking, the light transmittance of the diffusion film 13 ranges from 85% to 96%. In addition, this diffusion film 13 can also provide electrical isolation for reducing risk of electric shock to a user upon breakage of the lamp tube 1. Furthermore, the diffusion film 13 provides an improved illumination distribution uniformity of the light outputted by the LED light sources 202 such that the light can illuminate the back of the light sources 202 and the side edges of the bendable circuit sheet so as to avoid the formation of dark regions inside the lamp tube 1 and improve the illumination comfort. In another possible embodiment, the light transmittance of the diffusion film can be 92% to 94% while the thickness ranges from about 200 to about 300 μm.

In another embodiment, the optical diffusion coating can also be made of a mixture including a calcium carbonate-based substance, some reflective substances like strontium phosphate or barium sulfate, a thickening agent, ceramic activated carbon, and deionized water. The mixture is coated on the inner circumferential surface of the glass tube and has an average thickness ranging between about 20 and about 30 μm. In view of the diffusion phenomena in microscopic terms, light is reflected by particles. The particle size of the reflective substance such as strontium phosphate or barium sulfate will be much larger than the particle size of the calcium carbonate. Therefore, adding a small amount of reflective substance in the optical diffusion coating can effectively increase the diffusion effect of light.

In other embodiments, halogen calcium phosphate or aluminum oxide can also serve as the main material for forming the diffusion film 13. The particle size of the calcium carbonate is, for example, about 2 to 4 μm, while the particle size of the halogen calcium phosphate and aluminum oxide are about 4 to 6 μm and 1 to 2 μm, respectively. When the light transmittance is required to be 85% to 92%, the average thickness for the optical diffusion coating mainly having the calcium carbonate may be about 20 to about 30 μm, while the average thickness for the optical diffusion coating mainly having the halogen calcium phosphate may be about 25 to about 35 μm, and/or the average thickness for the optical diffusion coating mainly having the aluminum oxide may be about 10 to about 15 μm. However, when the required light transmittance is up to 92% and even higher, the optical diffusion coating mainly having the calcium carbonate, the halogen calcium phosphate, or the aluminum oxide should be even thinner.

The main material and the corresponding thickness of the optical diffusion coating can be decided according to the place for which the lamp tube 1 is used and the light transmittance required. It is noted that the higher the light transmittance of the diffusion film is required, the more apparent the grainy visual of the light sources is.

Referring to FIG. 17, the inner circumferential surface of the lamp tube 1 may also be provided or bonded with a reflective film 12. The reflective film 12 is provided around the LED light sources 202, and occupies a portion of an area of the inner circumferential surface of the lamp tube 1 arranged along the circumferential direction thereof. As shown in FIG. 17, the reflective film 12 is disposed at two sides of the LED light strip 2 extending along a circumferential direction of the lamp tube 1. The LED light strip 2 is basically in a middle position of the lamp tube 1 and between the two reflective films 12. The reflective film 12, when viewed by a person looking at the lamp tube from the side (in the X-direction shown in FIG. 17), serves to block the LED light sources 202, so that the person does not directly see the LED light sources 202, thereby reducing the visual graininess effect. On the other hand, that the lights emitted from the LED light sources 202 are reflected by the reflective film 12 facilitates the divergence angle control of the LED tube lamp, so that more lights illuminate toward directions without the reflective film 12, such that the LED tube lamp has higher energy efficiency when providing the same level of illumination performance.

Specifically, the reflective film 12 is provided on the inner peripheral surface of the lamp tube 1, and has an opening 12a configured to accommodate the LED light strip 2. The size of the opening 12a is the same or slightly larger than the size of the LED light strip 2. During assembly, the LED light sources 202 are mounted on the LED light strip 2 (a bendable circuit sheet) provided on the inner surface of the lamp tube 1, and then the reflective film 12 is adhered to the inner surface of the lamp tube 1, so that the opening 12a of the reflective film 12 correspondingly matches the LED light strip 2 in a one-to-one relationship, and the LED light strip 2 is exposed to the outside of the reflective film 12.

Figure 19:
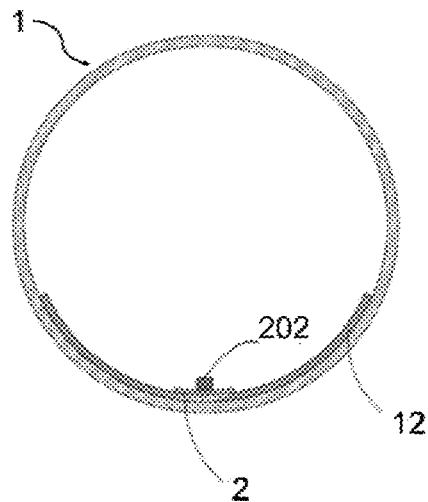
FIG. 19 is a plane cross-sectional view schematically illustrating inside structure of the lamp tube of the LED tube lamp according to still another embodiment of the present invention, wherein the reflective film is under the LED light strip and extends at both sides along the circumferential direction of the lamp tube.
Figure 20:
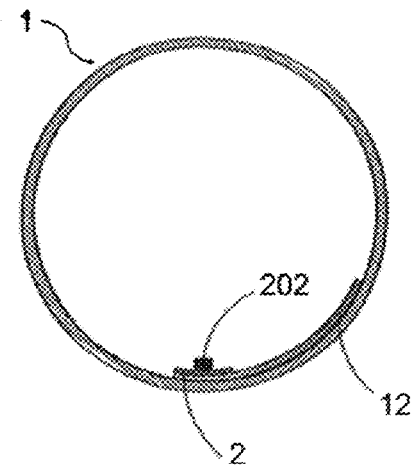
FIG. 20 is a plane cross-sectional view schematically illustrating inside structure of the lamp tube of the LED tube lamp according to yet another embodiment of the present invention, wherein the reflective film is under the LED light strip and extends at only one side along the circumferential direction of the lamp tube.

In one embodiment, the reflectance of the reflective film 12 is generally at least greater than 85%, in some embodiments greater than 90%, and in some embodiments greater than 95%, to be most effective. In one embodiment, the reflective film 12 extends circumferentially along the length of the lamp tube 1 occupying about 30% to 50% of the inner surface area of the lamp tube 1. In other words, a ratio of a circumferential length of the reflective film 12 along the inner circumferential surface of the lamp tube 1 to a circumferential length of the lamp tube 1 is about 0.3 to 0.5. In the illustrated embodiment of FIG. 17, the reflective film 12 is disposed substantially in the middle along a circumferential direction of the lamp tube 1, so that the two distinct portions or sections of the reflective film 12 disposed on the two sides of the LED light strip 2 are substantially equal in area. The reflective film 12 may be made of PET with some reflective materials such as strontium phosphate or barium sulfate or any combination thereof, with a thickness between about 140 μm and about 350 μm or between about 150 μm and about 220 μm for a more preferred effect in some embodiments. As shown in FIG. 18, in other embodiments, the reflective film 12 may be provided along the circumferential direction of the lamp tube 1 on only one side of the LED light strip 2 while occupying the same percentage of the inner surface area of the lamp tube 1 (e.g., 15% to 25% for the one side). Alternatively, as shown in FIGS. 19 and 20, the reflective film 12 may be provided without any opening, and the reflective film 12 is directly adhered or mounted to the inner surface of the lamp tube 1 and followed by mounting or fixing the LED light strip 2 on the reflective film 12 such that the reflective film 12 positioned on one side or two sides of the LED light strip 2.

Figure 21:
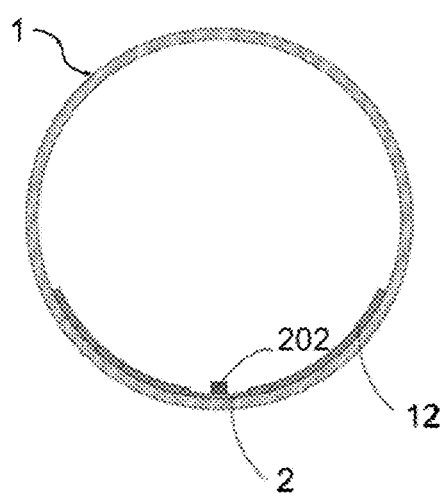
FIG. 21 is a plane cross-sectional view schematically illustrating inside structure of the lamp tube of the LED tube lamp according to still yet another embodiment of the present invention, wherein two reflective films are respectively adjacent to two sides of the LED light strip and extending along the circumferential direction of the lamp tube.

In the above mentioned embodiments, various types of the reflective film 12 and the diffusion film 13 can be adopted to accomplish optical effects including single reflection, single diffusion, and/or combined reflection-diffusion. For example, the lamp tube 1 may be provided with only the reflective film 12, and no diffusion film 13 is disposed inside the lamp tube 1, such as shown in FIGS. 19, 20, and 21.

In other embodiments, the width of the LED light strip 2 (along the circumferential direction of the lamp tube) can be widened to occupy a circumference area of the inner circumferential surface of the lamp tube 1. Since the LED light strip 2 has on its surface a circuit protective layer made of an ink which can reflect lights, the widened part of the LED light strip 2 functions like the reflective film 12 as mentioned above. In some embodiments, a ratio of the length of the LED light strip 2 along the circumferential direction to the circumferential length of the lamp tube 1 is about 0.3 to 0.5. The light emitted from the light sources could be concentrated by the reflection of the widened part of the LED light strip 2.

In other embodiments, the inner surface of the glass made lamp tube may be coated totally with the optical diffusion coating, or partially with the optical diffusion coating (where the reflective film 12 is coated have no optical diffusion coating). No matter in what coating manner, in some embodiments, it is more desirable that the optical diffusion coating be coated on the outer surface of the rear end region of the lamp tube 1 so as to firmly secure the end cap 3 with the lamp tube 1.

In the present invention, the light emitted from the light sources may be processed with the abovementioned diffusion film, reflective film, other kinds of diffusion layer sheets, adhesive film, or any combination thereof.

Referring again to FIG. 1B, the LED tube lamp according to some embodiments of present invention also includes an adhesive sheet 4, an insulation adhesive sheet 7, and an optical adhesive sheet 8. The LED light strip 2 is fixed by the adhesive sheet 4 to an inner circumferential surface of the lamp tube 1. The adhesive sheet 4 may be but is not limited to a silicone adhesive. The adhesive sheet 4 may be in form of several short pieces or a long piece. Various kinds of the adhesive sheet 4, the insulation adhesive sheet 7, and the optical adhesive sheet 8 can be combined to constitute various embodiments of the present invention.

The insulation adhesive sheet 7 is coated on the surface of the LED light strip 2 that faces the LED light sources 202 so that the LED light strip 2 is not exposed and thus electrically insulated from the outside environment. In application of the insulation adhesive sheet 7, a plurality of through holes 71 on the insulation adhesive sheet 7 are reserved to correspondingly accommodate the LED light sources 202 such that the LED light sources 202 are mounted in the through holes 701. The material composition of the insulation adhesive sheet 7 may include, for example vinyl silicone, hydrogen polysiloxane and aluminum oxide. The insulation adhesive sheet 7 has a thickness, for example, ranging from about 100 μm to about 140 μm (micrometers). The insulation adhesive sheet 7 having a thickness less than 100 μm typically does not produce sufficient insulating effect, while the insulation adhesive sheet 7 having a thickness more than 140 μm may result in material waste.

Figure 37:
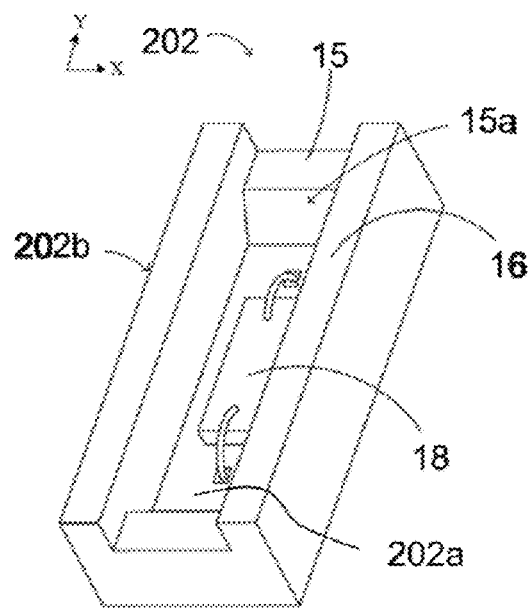
FIG. 37 is a perspective view schematically illustrating an LED lead frame for the LED light sources of the LED tube lamp according to one embodiment of the present invention.

The optical adhesive sheet 8, which is a clear or transparent material, is applied or coated on the surface of the LED light source 202 in order to ensure optimal light transmittance. After being applied to the LED light sources 202, the optical adhesive sheet 8 may have a granular, strip-like or sheet-like shape. The performance of the optical adhesive sheet 8 depends on its refractive index and thickness. The refractive index of the optical adhesive sheet 8 is in some embodiments between 1.22 and 1.6. In some embodiments, it is better for the optical adhesive sheet 8 to have a refractive index being a square root of the refractive index of the housing or casing of the LED light source 202, or the square root of the refractive index of the housing or casing of the LED light source 202 plus or minus 15%, to contribute better light transmittance. The housing/casing of the LED light sources 202 is a structure to accommodate and carry the LED dies (or chips) such as a LED lead frame 202b as shown in FIG. 37. The refractive index of the optical adhesive sheet 8 may range from 1.225 to 1.253. In some embodiments, the thickness of the optical adhesive sheet 8 may range from 1.1 mm to 1.3 mm. The optical adhesive sheet 8 having a thickness less than 1.1 mm may not be able to cover the LED light sources 202, while the optical adhesive sheet 8 having a thickness more than 1.3 mm may reduce light transmittance and increases material cost.

Figure 22:
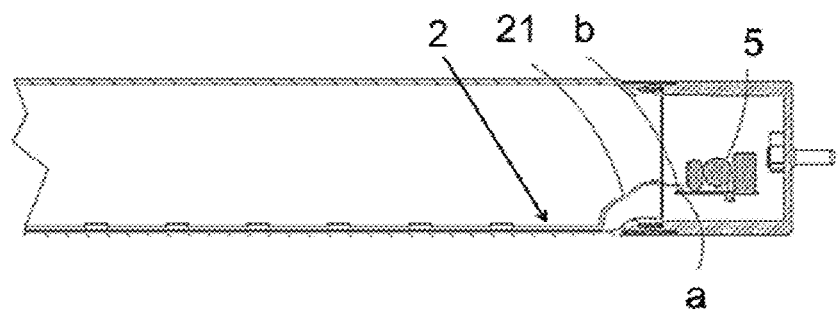
FIG. 22 is a plane sectional view schematically illustrating the LED light strip is a bendable circuit sheet with ends thereof passing across the transition region of the lamp tube of the LED tube lamp to be soldering bonded to the output terminals of the power supply according to one embodiment of the present invention.

In some embodiments, in the process of assembling the LED light sources to the LED light strip, the optical adhesive sheet 8 is first applied on the LED light sources 202; then the insulation adhesive sheet 7 is coated on one side of the LED light strip 2; then the LED light sources 202 are fixed or mounted on the LED light strip 2; the other side of the LED light strip 2 being opposite to the side of mounting the LED light sources 202 is bonded and affixed to the inner surface of the lamp tube 1 by the adhesive sheet 4; finally, the end cap 3 is fixed to the end portion of the lamp tube 1, and the LED light sources 202 and the power supply 5 are electrically connected by the LED light strip 2. As shown in the embodiment of FIG. 22, the bendable circuit sheet 2 passes the transition region 103 to be soldered or traditionally wire-bonded with the power supply 5, and then the end cap 3 having the structure as shown in FIG. 3 or 4 or FIG. 6 is adhered to the strengthened transition region 103 via methods as shown in FIG. 5 or FIG. 7, respectively to form a complete LED tube lamp.

In this embodiment, the LED light strip 2 is fixed by the adhesive sheet 4 to an inner circumferential surface of the lamp tube 1, so as to increase the light illumination angle of the LED tube lamp and broaden the viewing angle to be greater than 330 degrees. By means of applying the insulation adhesive sheet 7 and the optical adhesive sheet 8, electrical insulation of the entire light strip 2 is accomplished such that electrical shock would not occur even when the lamp tube 1 is broken and therefore safety could be improved.

Furthermore, the inner peripheral surface or the outer circumferential surface of the glass made lamp tube 1 may be covered or coated with an adhesive film (not shown) to isolate the inside from the outside of the glass made lamp tube 1 when the glass made lamp tube 1 is broken. In this embodiment, the adhesive film is coated on the inner peripheral surface of the lamp tube 1. The material for the coated adhesive film includes, for example, methyl vinyl silicone oil, hydro silicone oil, xylene, and calcium carbonate, wherein xylene is used as an auxiliary material. The xylene will be volatilized and removed when the coated adhesive film on the inner surface of the lamp tube 1 solidifies or hardens. The xylene is mainly used to adjust the capability of adhesion and therefore to control the thickness of the coated adhesive film.

In one embodiment, the thickness of the coated adhesive film is preferably between about 100 and about 140 micrometers (μm). The adhesive film having a thickness being less than 100 micrometers may not have sufficient shatterproof capability for the glass tube, and the glass tube is thus prone to crack or shatter. The adhesive film having a thickness being larger than 140 micrometers may reduce the light transmittance and also increase material cost. The thickness of the coated adhesive film may be between about 10 and about 800 micrometers (μm) when the shatterproof capability and the light transmittance are not strictly demanded.

In one embodiment, the inner peripheral surface or the outer circumferential surface of the glass made lamp tube 1 is coated with an adhesive film such that the broken pieces are adhered to the adhesive film when the glass made lamp tube is broken. Therefore, the lamp tube 1 would not be penetrated to form a through hole connecting the inside and outside of the lamp tube 1 and thus prevents a user from touching any charged object inside the lamp tube 1 to avoid electrical shock. In addition, the adhesive film is able to diffuse light and allows the light to transmit such that the light uniformity and the light transmittance of the entire LED tube lamp increases. The adhesive film can be used in combination with the adhesive sheet 4, the insulation adhesive sheet 7 and the optical adhesive sheet 8 to constitute various embodiments of the present invention. As the LED light strip 2 is configured to be a bendable circuit sheet, no coated adhesive film is thereby required.

Furthermore, the light strip 2 may be an elongated aluminum plate, FR 4 board, or a bendable circuit sheet. When the lamp tube 1 is made of glass, adopting a rigid aluminum plate or FR4 board would make a broken lamp tube, e.g., broken into two parts, remain a straight shape so that a user may be under a false impression that the LED tube lamp is still usable and fully functional, and it is easy for him to incur electric shock upon handling or installation of the LED tube lamp. Because of added flexibility and bendability of the flexible substrate for the LED light strip 2, the problem faced by the aluminum plate, FR4 board, or conventional 3-layered flexible board having inadequate flexibility and bendability, are thereby addressed. In certain embodiments, a bendable circuit sheet is adopted as the LED light strip 2 for that such a LED light strip 2 would not allow a ruptured or broken lamp tube to maintain a straight shape and therefore instantly inform the user of the disability of the LED tube lamp and avoid possibly incurred electrical shock. The following are further descriptions of the bendable circuit sheet used as the LED light strip 2.

Figure 23:
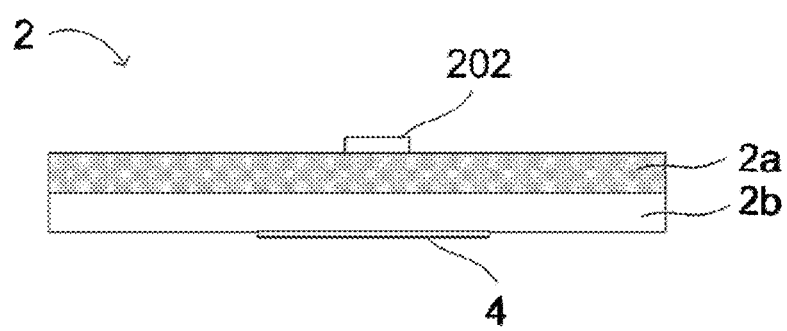
FIG. 23 is a plane cross-sectional view schematically illustrating a bi-layered structure of the bendable circuit sheet of the LED light strip of the LED tube lamp according to an embodiment of the present invention.

Referring to FIG. 23, in one embodiment, the LED light strip 2 includes a bendable circuit sheet having a conductive wiring layer 2a and a dielectric layer 2b that are arranged in a stacked manner, wherein the wiring layer 2a and the dielectric layer 2b have same areas. The LED light source 202 is disposed on one surface of the wiring layer 2a, the dielectric layer 2b is disposed on the other surface of the wiring layer 2a that is away from the LED light sources 202. The wiring layer 2a is electrically connected to the power supply 5 to carry direct current (DC) signals. Meanwhile, the surface of the dielectric layer 2b away from the wiring layer 2a is fixed to the inner circumferential surface of the lamp tube 1 by means of the adhesive sheet 4. The wiring layer 2a can be a metal layer or a power supply layer including wires such as copper wires.

In another embodiment, the outer surface of the wiring layer 2a or the dielectric layer 2b may be covered with a circuit protective layer made of an ink with function of resisting soldering and increasing reflectivity. Alternatively, the dielectric layer can be omitted and the wiring layer can be directly bonded to the inner circumferential surface of the lamp tube, and the outer surface of the wiring layer 2a is coated with the circuit protective layer. Whether the wiring layer 2a has a one-layered, or two-layered structure, the circuit protective layer can be adopted. In some embodiments, the circuit protective layer is disposed only on one side/surface of the LED light strip 2, such as the surface having the LED light source 202. In some embodiments, the bendable circuit sheet is a one-layered structure made of just one wiring layer 2a, or a two-layered structure made of one wiring layer 2a and one dielectric layer 2b, and thus is more bendable or flexible to curl when compared with the conventional three-layered flexible substrate (one dielectric layer sandwiched with two wiring layers). As a result, the bendable circuit sheet of the LED light strip 2 can be installed in a lamp tube with a customized shape or non-tubular shape, and fitly mounted to the inner surface of the lamp tube. The bendable circuit sheet closely mounted to the inner surface of the lamp tube is preferable in some cases. In addition, using fewer layers of the bendable circuit sheet improves the heat dissipation and lowers the material cost.

Nevertheless, the bendable circuit sheet is not limited to being one-layered or two-layered; in other embodiments, the bendable circuit sheet may include multiple layers of the wiring layers 2a and multiple layers of the dielectric layers 2b, in which the dielectric layers 2b and the wiring layers 2a are sequentially stacked in a staggered manner, respectively. These stacked layers are away from the surface of the outermost wiring layer 2a which has the LED light source 202 disposed thereon and is electrically connected to the power supply 5. Moreover, the length of the bendable circuit sheet is greater than the length of the lamp tube.

Figure 48:
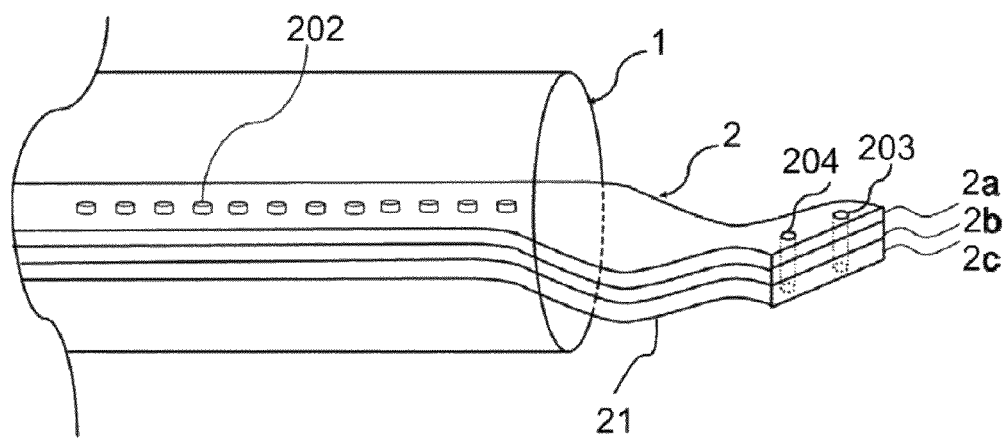
FIG. 48 is a perspective view schematically illustrating the bendable circuit sheet of the LED light strip is formed with two conductive wiring layers according to another embodiment of the present invention.

Referring to FIG. 48, in one embodiment, the LED light strip 2 includes a bendable circuit sheet having in sequence a first wiring layer 2a, a dielectric layer 2b, and a second wiring layer 2c. The thickness of the second wiring layer 2c is greater than that of the first wiring layer 2a, and the length of the LED light strip 2 is greater than that of the lamp tube 1. The end region of the light strip 2 extending beyond the end portion of the lamp tube 1 without disposition of the light source 202 is formed with two separate through holes 203 and 204 to respectively electrically communicate the first wiring layer 2a and the second wiring layer 2c. The through holes 203 and 204 are not communicated to each other to avoid short.

In this way, the greater thickness of the second wiring layer 2c allows the second wiring layer 2c to support the first wiring layer 2a and the dielectric layer 2b, and meanwhile allow the LED light strip 2 to be mounted onto the inner circumferential surface without being liable to shift or deform, and thus the yield rate of product can be improved. In addition, the first wiring layer 2a and the second wiring layer 2c are in electrical communication such that the circuit layout of the first wiring later 2a can be extended downward to the second wiring layer 2c to reach the circuit layout of the entire LED light strip 2. Moreover, since the land for the circuit layout becomes two-layered, the area of each single layer and therefore the width of the LED light strip 2 can be reduced such that more LED light strips 2 can be put on a production line to increase productivity.

Furthermore, the first wiring layer 2a and the second wiring layer 2c of the end region of the LED light strip 2 that extends beyond the end portion of the lamp tube 1 without disposition of the light source 202 can be used to accomplish the circuit layout of a power supply module so that the power supply module can be directly disposed on the bendable circuit sheet of the LED light strip 2.

Referring to FIG. 1B, in one embodiment, the LED light strip 2 has a plurality of LED light sources 202 mounted thereon, and the end cap 3 has a power supply 5 installed therein. The LED light sources 202 and the power supply 5 are electrically connected by the LED light strip 2. The power supply 5 may be a single integrated unit (i.e., all of the power supply components are integrated into one module unit) installed in one end cap 3. Alternatively, the power supply 5 may be divided into two separate units (i.e. the power supply components are divided into two parts) installed in two end caps 3, respectively. When only one end of the lamp tube 1 is strengthened by a glass tempering process, it may be preferable that the power supply 5 is a single integrated unit and installed in the end cap 3 corresponding to the strengthened end of the lamp tube 1.

The power supply 5 can be fabricated by various ways. For example, the power supply 5 may be an encapsulation body formed by injection molding a silica gel with high thermal conductivity such as being greater than 0.7 w/m·k. This kind of power supply has advantages of high electrical insulation, high heat dissipation, and regular shape to match other components in an assembly. Alternatively, the power supply 5 in the end caps may be a printed circuit board having components that are directly exposed or packaged by a heat shrink sleeve. The power supply 5 according to some embodiments of the present invention can be a single printed circuit board provided with a power supply module as shown in FIG. 23 or a single integrated unit as shown in FIG. 38.

Figure 38:
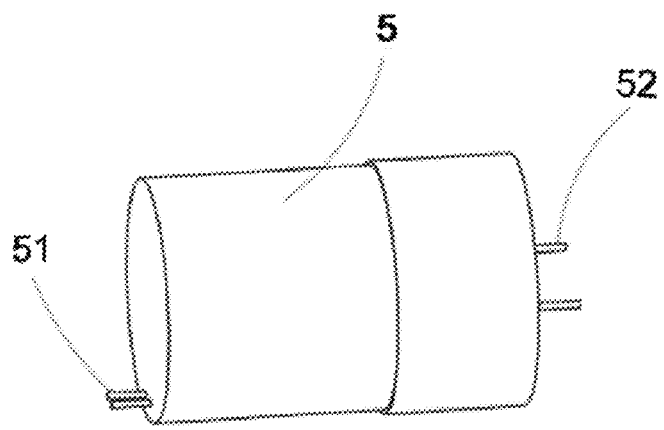
FIG. 38 is a perspective view schematically illustrating a power supply of the LED tube lamp according to one embodiment of the present invention.

Referring to FIGS. 1B and 38, in one embodiment of the present invention, the power supply 5 is provided with a male plug 51 at one end and a metal pin 52 at the other end, one end of the LED light strip 2 is correspondingly provided with a female plug 201, and the end cap 3 is provided with a hollow conductive pin 301 to be connected with an outer electrical power source. Specifically, the male plug 51 is fittingly inserted into the female plug 201 of the LED light strip 2, while the metal pins 52 are fittingly inserted into the hollow conductive pins 301 of the end cap 3. The male plug 51 and the female plug 201 function as a connector between the power supply 5 and the LED light strip 2. Upon insertion of the metal pin 502, the hollow conductive pin 301 is punched with an external punching tool to slightly deform such that the metal pin 502 of the power supply 5 is secured and electrically connected to the hollow conductive pin 301. Upon turning on the electrical power, the electrical current passes in sequence through the hollow conductive pin 301, the metal pin 502, the male plug 501, and the female plug 201 to reach the LED light strip 2 and go to the LED light sources 202. However, the power supply 5 of the present invention is not limited to the modular type as shown in FIG. 38. The power supply 5 may be a printed circuit board provided with a power supply module and electrically connected to the LED light strip 2 via the abovementioned the male plug 51 and female plug 52 combination.

In another embodiment, a traditional wire bonding technique can be used instead of the male plug 51 and the female plug 52 for connecting any kind of the power supply 5 and the light strip 2. Furthermore, the wires may be wrapped with an electrically insulating tube to protect a user from being electrically shocked. However, the bonded wires tend to be easily broken during transportation and can therefore cause quality issues.

In still another embodiment, the connection between the power supply 5 and the LED light strip 2 may be accomplished via tin soldering, rivet bonding, or welding. One way to secure the LED light strip 2 is to provide the adhesive sheet 4 at one side thereof and adhere the LED light strip 2 to the inner surface of the lamp tube 1 via the adhesive sheet 4. Two ends of the LED light strip 2 can be either fixed to or detached from the inner surface of the lamp tube 1.

In case that two ends of the LED light strip 2 are fixed to the inner surface of the lamp tube 1, it may be preferable that the bendable circuit sheet of the LED light strip 2 is provided with the female plug 201 and the power supply is provided with the male plug 51 to accomplish the connection between the LED light strip 2 and the power supply 5. In this case, the male plug 51 of the power supply 5 is inserted into the female plug 201 to establish electrical connection.

In case that two ends of the LED light strip 2 are detached from the inner surface of the lamp tube and that the LED light strip 2 is connected to the power supply 5 via wire-bonding, any movement in subsequent transportation is likely to cause the bonded wires to break. Therefore, a preferable option for the connection between the light strip 2 and the power supply 5 could be soldering. Specifically, referring to FIG. 22, the ends of the LED light strip 2 including the bendable circuit sheet are arranged to pass over the strengthened transition region 103 and directly soldering bonded to an output terminal of the power supply 5 such that the product quality is improved without using wires. In this way, the female plug 201 and the male plug 51 respectively provided for the LED light strip 2 and the power supply 5 are no longer needed.

Figure 24:
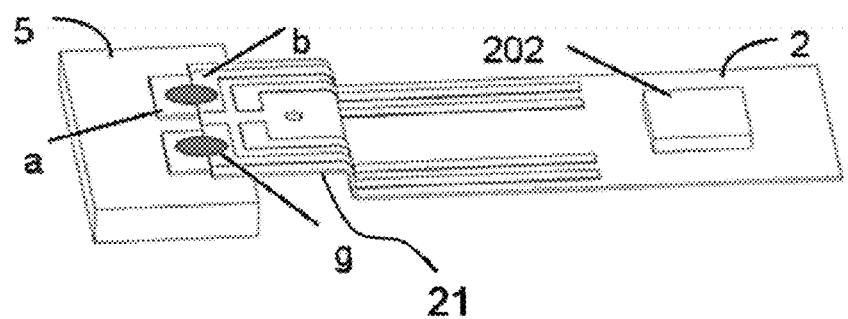
FIG. 24 is a perspective view schematically illustrating the soldering pad of the bendable circuit sheet of the LED light strip for soldering connection with the printed circuit board of the power supply of the LED tube lamp according to one embodiment of the present invention.

Referring to FIG. 24, an output terminal of the printed circuit board of the power supply 5 may have soldering pads "a" provided with an amount of tin solder with a thickness sufficient to later form a solder joint. Correspondingly, the ends of the LED light strip 2 may have soldering pads "b". The soldering pads "a" on the output terminal of the printed circuit board of the power supply 5 are soldered to the soldering pads "b" on the LED light strip 2 via the tin solder on the soldering pads "a". The soldering pads "a" and the soldering pads "b" may be face to face during soldering such that the connection between the LED light strip 2 and the printed circuit board of the power supply 5 is the most firm. However, this kind of soldering typically includes that a thermo-compression head presses on the rear surface of the LED light strip 2 and heats the tine solder, i.e. the LED light strip 2 intervenes between the thermo-compression head and the tin solder, and therefore may easily cause reliability problems. Referring to FIG. 30, a through hole may be formed in each of the soldering pads "b" on the LED light strip 2 to allow the soldering pads "b" overlay the soldering pads "b" without face-to-face and the thermo-compression head directly presses tin solders on the soldering pads "a" on surface of the printed circuit board of the power supply 5 when the soldering pads "a" and the soldering pads "b" are vertically aligned. This is an easy way to accomplish in practice.

Referring again to FIG. 24, two ends of the LED light strip 2 detached from the inner surface of the lamp tube 1 are formed as freely extending portions 21, while most of the LED light strip 2 is attached and secured to the inner surface of the lamp tube 1. One of the freely extending portions 21 has the soldering pads "b" as mentioned above. Upon assembling of the LED tube lamp, the freely extending end portions 21 along with the soldered connection of the printed circuit board of the power supply 5 and the LED light strip 2 would be coiled, curled up or deformed to be fittingly accommodated inside the lamp tube 1. When the bendable circuit sheet of the LED light strip 2 includes in sequence the first wiring layer 2a, the dielectric layer 2b, and the second wiring layer 2c as shown in FIG. 48, the freely extending end portions 21 can be used to accomplish the connection between the first wiring layer 2a and the second wiring layer 2c and arrange the circuit layout of the power supply 5.

In this embodiment, during the connection of the LED light strip 2 and the power supply 5, the soldering pads "b" and the soldering pads "a" and the LED light sources 202 are on surfaces facing toward the same direction and the soldering pads "b" on the LED light strip 2 are each formed with a through hole "e" as shown in FIG. 30 such that the soldering pads "b" and the soldering pads "a" communicate with each other via the through holes "e". When the freely extending end portions 21 are deformed due to contraction or curling up, the soldered connection of the printed circuit board of the power supply 5 and the LED light strip 2 exerts a lateral tension on the power supply 5. Furthermore, the soldered connection of the printed circuit board of the power supply 5 and the LED light strip 2 also exerts a downward tension on the power supply 5 when compared with the situation where the soldering pads "a" of the power supply 5 and the soldering pads "b" of the LED light strip 2 are face to face. This downward tension on the power supply 5 comes from the tin solders inside the through holes "e" and forms a stronger and more secure electrical connection between the LED light strip 2 and the power supply 5.

Referring to FIG. 25, in one embodiment, the soldering pads "b" of the LED light strip 2 are two separate pads to electrically connect the positive and negative electrodes of the bendable circuit sheet of the LED light strip 2, respectively. The size of the soldering pads "b" may be, for example, about 3.5×2 mm². The printed circuit board of the power supply 5 is correspondingly provided with soldering pads "a" having reserved tin solders, and the height of the tin solders suitable for subsequent automatic soldering bonding process is generally, for example, about 0.1 to 0.7 mm, in some preferable embodiments about 0.3 to about 0.5 mm, and in some even more preferable embodiments about 0.4 mm. An electrically insulating through hole "c" may be formed between the two soldering pads "b" to isolate and prevent the two soldering pads from electrically short during soldering. Furthermore, an extra positioning opening "d" may also be provided behind the electrically insulating through hole "c" to allow an automatic soldering machine to quickly recognize the position of the soldering pads "b".

For the sake of achieving scalability and compatibility, the amount of the soldering pads "b" on each end of the LED light strip 2 may be more than one such as two, three, four, or more than four. When there is only one soldering pad "b" provided at each end of the LED light strip 2, the two ends of the LED light strip 2 are electrically connected to the power supply 5 to form a loop, and various electrical components can be used. For example, a capacitance may be replaced by an inductance to perform current regulation. Referring to FIGS. 26 to 28, when each end of the LED light strip 2 has three soldering pads, the third soldering pad can be grounded; when each end of the LED light strip 2 has four soldering pads, the fourth soldering pad can be used as a signal input terminal. Correspondingly, in some embodiments, the power supply 5 should have same amount of soldering pads "a" as that of the soldering pads "b" on the LED light strip 2. In some embodiments, as long as electrical short between the soldering pads "b" can be prevented, the soldering pads "b" should be arranged according to the dimension of the actual area for disposition, for example, three soldering pads can be arranged in a row or two rows. In other embodiments, the amount of the soldering pads "b" on the bendable circuit sheet of the LED light strip 2 may be reduced by rearranging the circuits on the bendable circuit sheet of the LED light strip 2. The lesser the amount of the soldering pads, the easier the fabrication process becomes. On the other hand, a greater number of soldering pads may improve and secure the electrical connection between the LED light strip 2 and the output terminal of the power supply 5.

Referring to FIG. 30, in another embodiment, the soldering pads "b" each is formed with a through hole "e" having a diameter generally of about 1 to 2 mm, in some preferred embodiments of about 1.2 to 1.8 mm, and in yet further preferred embodiments of about 1.5 mm. The through hole "e" communicates the soldering pad "a" with the soldering pad "b" so that the tin solder on the soldering pads "a" passes through the through holes "e" and finally reach the soldering pads "b". A smaller through hole "e" would make it difficult for the tin solder to pass. The tin solder accumulates around the through holes "e" upon exiting the through holes "e" and condense to form a solder ball "g" with a larger diameter than that of the through holes "e" upon condensing. Such a solder ball "g" functions as a rivet to further increase the stability of the electrical connection between the soldering pads "a" on the power supply 5 and the soldering pads "b" on the LED light strip 2.

Figure 31:
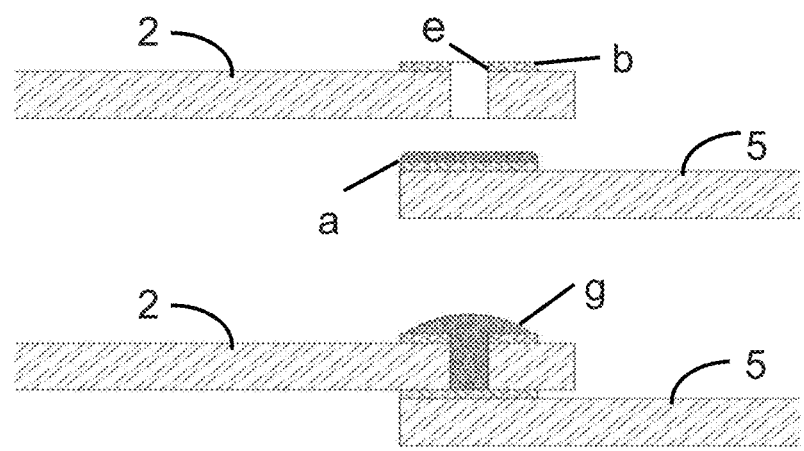
FIG. 31 is a plane cross-sectional view schematically illustrating soldering bonding process utilizing the soldering pads of the bendable circuit sheet of the LED light strip of FIG. 30 taken from side view and the printed circuit board of the power supply according to one embodiment of the present invention.
Figure 32:
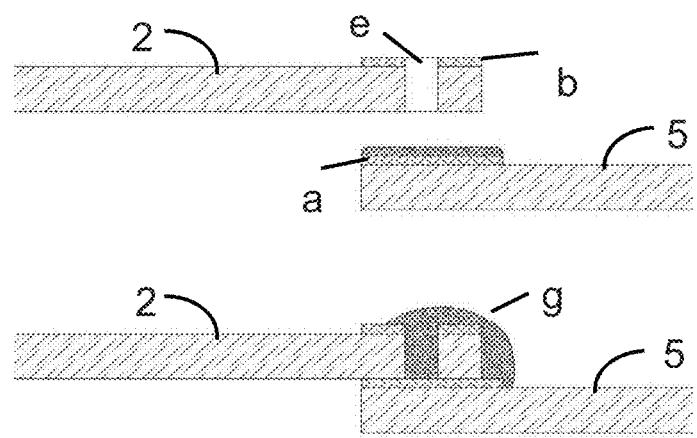
FIG. 32 is a plane cross-sectional view schematically illustrating soldering bonding process utilizing the soldering pads of the bendable circuit sheet of the LED light strip of FIG. 30 taken from side view and the printed circuit board of the power supply according to another embodiment of the present invention, wherein the through hole of the soldering pads is near the edge of the bendable circuit sheet.
Figure 33:
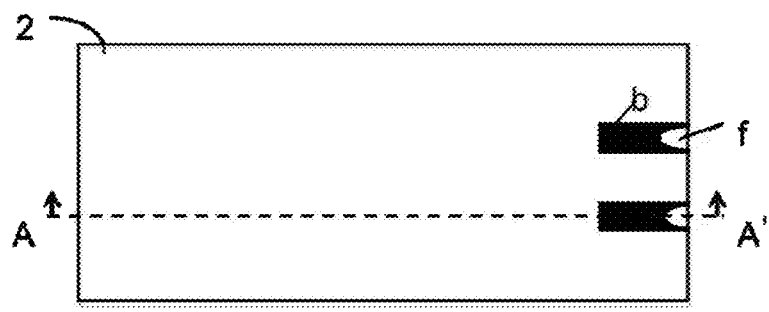
FIG. 33 is a plane view schematically illustrating notches formed on the soldering pads of the bendable circuit sheet of the LED light strip of the LED tube lamp according to one embodiment of the present invention.
Figure 34:
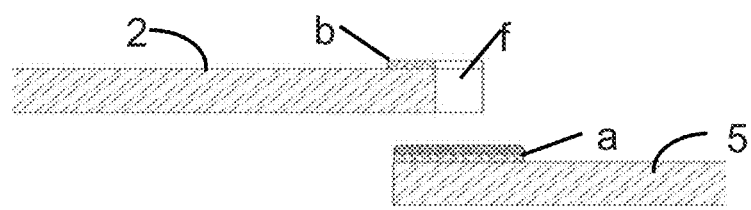
FIG. 34 is an exemplary plane cross-sectional view of FIG. 33 taken along a line A-A'.
Figure 34:
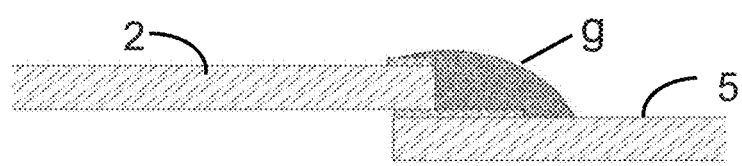

Referring to FIGS. 31 to 32, in other embodiments, when a distance from the through hole "e" to the side edge of the LED light strip 2 is less than 1 mm, the tin solder may pass through the through hole "e" to accumulate on the periphery of the through hole "e", and extra tin solder may spill over the soldering pads "b" to reflow along the side edge of the LED light strip 2 and join the tin solder on the soldering pads "a" of the power supply 5. The tin solder then condenses to form a structure like a rivet to firmly secure the LED light strip 2 onto the printed circuit board of the power supply 5 such that reliable electric connection is achieved. Referring to FIGS. 33 and 34, in another embodiment, the through hole "e" can be replaced by a notch "f" formed at the side edge of the soldering pads "b" for the tin solder to easily pass through the notch "f" and accumulate on the periphery of the notch "f" and to form a solder ball with a larger diameter than that of the notch "e" upon condensing. Such a solder ball may be formed like a C-shape rivet to enhance the secure capability of the electrically connecting structure.

Figure 40:
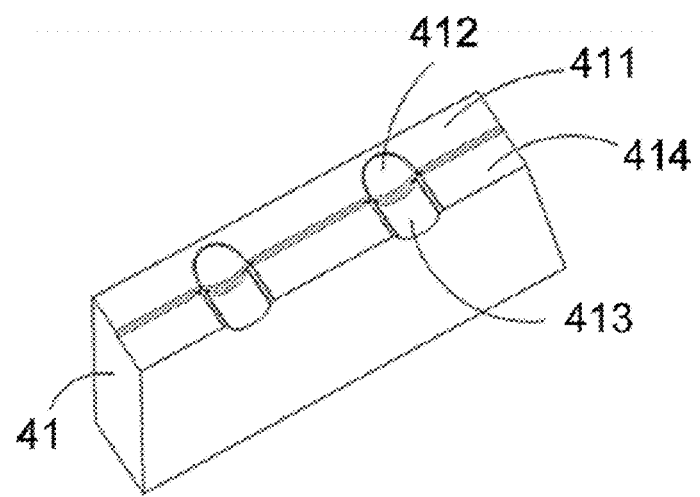
FIG. 40 is a perspective view illustrating a thermos-compression head used in soldering the bendable circuit sheet of the LED light strip and the printed circuit board of the power supply according to one embodiment of the present invention.

The abovementioned through hole "e" or notch "f" might be formed in advance of soldering or formed by direct punching with a thermo-compression head, as shown in FIG. 40, during soldering. The portion of the thermo-compression head for touching the tin solder may be flat, concave, or convex, or any combination thereof. The portion of the thermo-compression head for restraining the object to be soldered such as the LED light strip 2 may be strip-like or grid-like. The portion of the thermo-compression head for touching the tin solder does not completely cover the through hole "e" or the notch "f" to make sure that the tin solder is able to pass through the through hole "e" or the notch "f". The portion of the thermo-compression head being concave may function as a room to receive the solder ball.

Referring to FIG. 40, a thermo-compression head 41 used for bonding the soldering pads "a" on the power supply 5 and the soldering pads "b" on the light strip 2 is mainly composed of four sections: a bonding plane 411, a plurality of concave guiding tanks 412, a plurality of concave molding tanks 413, and a restraining plane 414. The bonding plane 411 is a portion actually touching, pressing and heating the tin solder to perform soldering bonding. The bonding plane 411 may be flat, concave, convex or any combination thereof. The concave guiding tanks 412 are formed on the bonding plane 411 and opened near an edge of the bonding plane 411 to guide the heated and melted tin solder to flow into the through holes or notches formed on the soldering pads. For example, the guiding tanks 412 may function to guide and stop the melted tin solders. The concave molding tanks 413 are positioned beside the guiding tanks 412 and have a concave portion more depressed than that of the guiding tanks 412 such that the concave molding tanks 413 each form a housing to receive the solder ball. The restraining plane 414 is a portion next to the bonding plane 411 and formed with the concave molding tanks 413. The restraining plane 414 is lower than the bonding plane 411 such that the restraining plane 414 firmly presses the LED light strip 2 on the printed circuit board of the power supply 5 while the bonding plane 411 presses against the soldering pads "b" during the soldering bonding. The restraining plane 414 may be strip-like or grid-like on surface. The difference of height of the bonding plane 411 and the restraining plane 414 is the thickness of the LED light strip 2.

Figure 41:
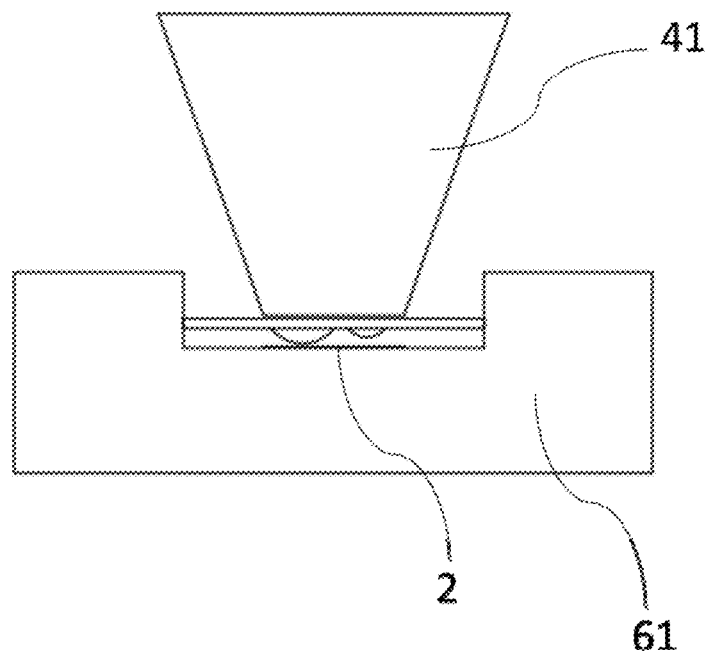
FIG. 41 is a plane view schematically illustrating the thickness difference between two solders on the pads of the bendable circuit sheet of the LED light strip or the printed circuit board of the power supply according to one embodiment of the invention.

Referring to FIGS. 41, 25, and 40, soldering pads corresponding to the soldering pads of the LED light strip are formed on the printed circuit board of the power supply 5 and tin solder is reserved on the soldering pads on the printed circuit board of the power supply 5 for subsequent soldering bonding performed by an automatic soldering bonding machine. The tin solder in some embodiments has a thickness of about 0.3 mm to about 0.5 mm such that the LED light strip 2 can be firmly soldered to the printed circuit board of the power supply 5. As shown in FIG. 41, in case of having height difference between two tin solders respectively reserved on two soldering pads on the printed circuit board of the power supply 5, the higher one will be touched first and melted by the thermo-compression head 41 while the other one will be touched and start to melt until the higher one is melted to a height the same as the height of the other one. This usually incurs unsecured soldering bonding for the reserved tin solder with smaller height, and therefore affects the electrical connection between the LED light strip 2 and the printed circuit board of the power supply 5. To alleviate this problem, in one embodiment, the present invention applies the kinetic equilibrium principal and installs a linkage mechanism on the thermo-compression head 41 to allow rotation of the thermo-compression head 41 during a soldering bonding such that the thermo-compression head 41 starts to heat and melt the two reserved tin solders only when the thermo-compression head 41 detects that the pressure on the two reserved tin solders are the same.

Figure 42:
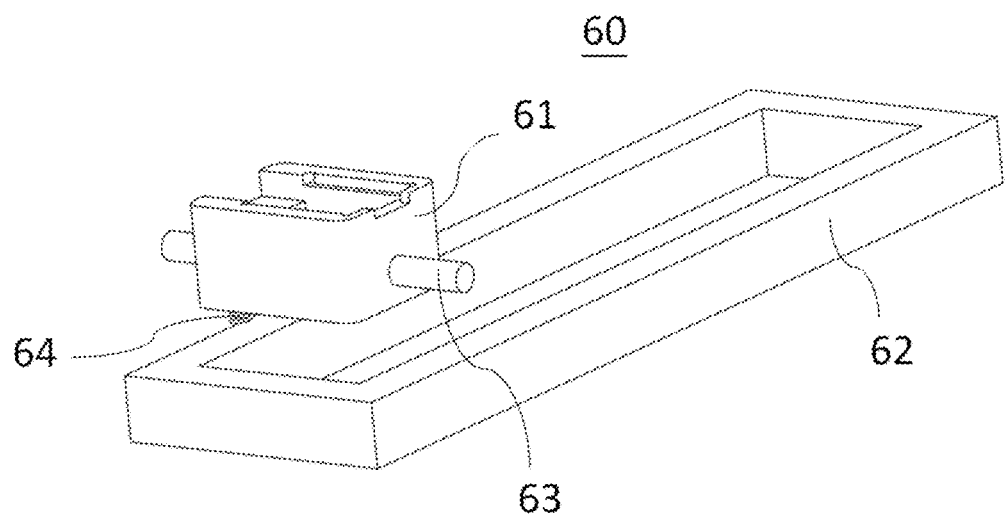
FIG. 42 is a perspective view schematically illustrating the soldering vehicle for soldering the bendable circuit sheet of the LED light strip and the printed circuit board of the power supply according to one embodiment of the invention.
Figure 43:
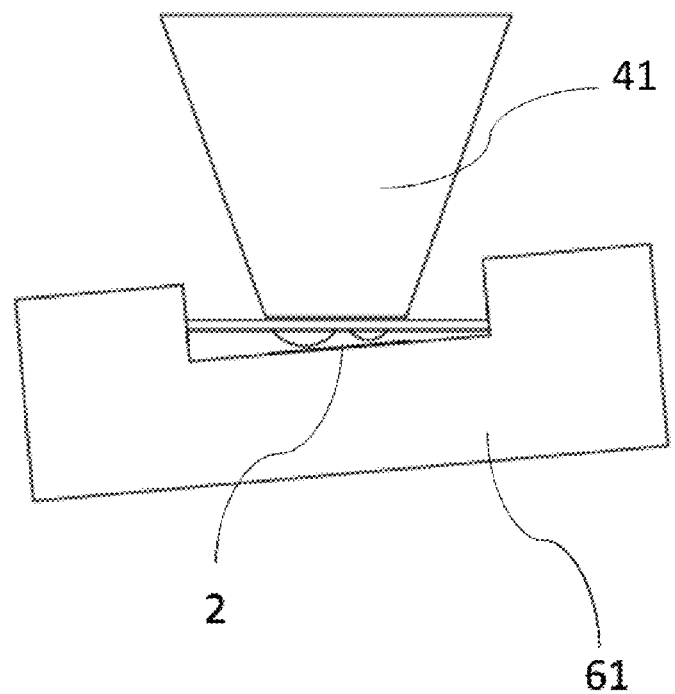
FIG. 43 is an exemplary plan view schematically illustrating a rotation status of the rotary platform of the soldering vehicle in FIG. 41.

In the abovementioned embodiment, the thermo-compression head 41 is rotatable while the LED light strip 2 and the printed circuit board of the power supply 5 remain unmoved. Referring to FIG. 42, in another embodiment, the thermo-compression head 41 is unmoved while the LED light strip is allowed to rotate. In this embodiment, the LED light strip 2 and the printed circuit board of the power supply 5 are loaded on a soldering vehicle 60 including a rotary platform 61, a vehicle holder 62, a rotating shaft 63, and two elastic members 64. The rotary platform 61 functions to carry the LED light strip 2 and the printed circuit board of the power supply 5. The rotary platform 61 is movably mounted to the vehicle holder 62 via the rotating shaft 63 so that the rotary platform 61 is able to rotate with respect to the vehicle holder 62 while the vehicle holder 62 bears and holds the rotary platform 61. The two elastic members 64 are disposed on two sides of the rotating shaft 63, respectively, such that the rotary platform 61 in connection with the rotating shaft 63 always remains at the horizontal level when the rotary platform 61 is not loaded. In this embodiment, the elastic members 64 are springs for example, and the ends thereof are disposed corresponding to two sides of the rotating shaft 63 so as to function as two pivots on the vehicle holder 62. As shown in FIG. 42, when two tin solders reserved on the LED light strip 2 pressed by the thermo-compression head 41 are not at the same height level, the rotary platform 61 carrying the LED light strip 2 and the printed circuit board of the power supply 5 will be driven by the a rotating shaft 63 to rotate until the thermo-compression head 41 detects the same pressure on the two reserved tin solders, and then starts a soldering bonding. Referring to FIG. 43, when the rotary platform 61 rotates, the elastic members 64 at two sides of the rotating shaft 63 are compressed or pulled; and the driving force of the rotating shaft 63 releases and the rotary platform 61 returns to the original height level by the resilience of the elastic members 64 when the soldering bonding is completed.

In other embodiments, the rotary platform 61 may be designed to have mechanisms without using the rotating shaft 63 and the elastic members 64. For example, the rotary platform 61 may be designed to have driving motors and active rotary mechanisms, and therefore the vehicle holder 62 is saved. Accordingly, other embodiments utilizing the kinetic equilibrium principle to drive the LED light strip 2 and the printed circuit board of the power supply 5 to move in order to complete the soldering bonding process are within the spirit of the present invention.

Figure 35:
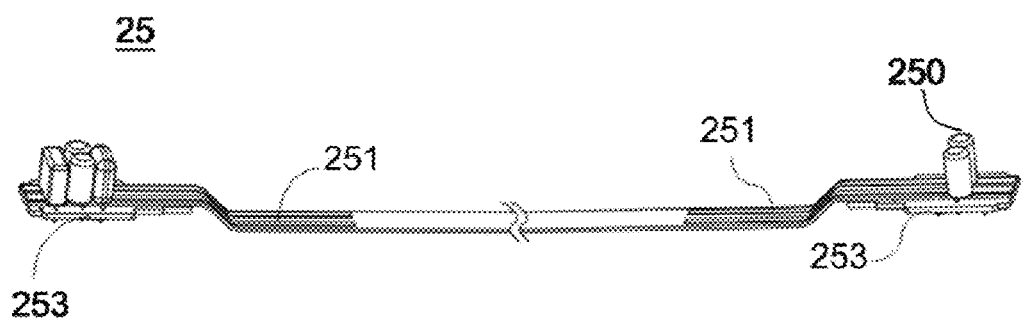
FIG. 35 is a perspective view schematically illustrating a circuit board assembly composed of the bendable circuit sheet of the LED light strip and the printed circuit board of the power supply according to another embodiment of the present invention.
Figure 36:
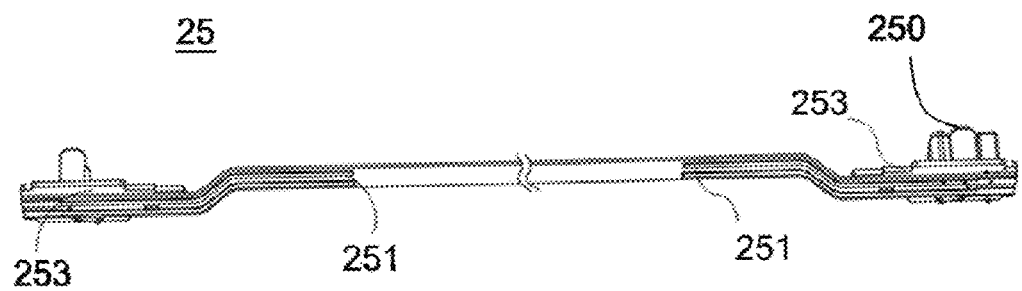
FIG. 36 is a perspective view schematically illustrating another arrangement of the circuit board assembly of FIG. 35.

Referring to FIGS. 35 and 36, in another embodiment, the LED light strip 2 and the power supply 5 may be connected by utilizing a circuit board assembly 25 instead of soldering bonding. The circuit board assembly 25 has a long circuit sheet 251 and a short circuit board 253 that are adhered to each other with the short circuit board 253 being adjacent to the side edge of the long circuit sheet 251. The short circuit board 253 may be provided with power supply module 250 to form the power supply 5. The short circuit board 253 is stiffer or more rigid than the long circuit sheet 251 to be able to support the power supply module 250.

The long circuit sheet 251 may be the bendable circuit sheet of the LED light strip including a wiring layer 2a as shown in FIG. 23. The wiring layer 2a of the long circuit sheet 251 and the power supply module 250 may be electrically connected in various manners depending on the demand in practice. As shown in FIG. 35, the power supply module 250 and the long circuit sheet 251 having the wiring layer 2a on surface are on the same side of the short circuit board 253 such that the power supply module 250 is directly connected to the long circuit sheet 251. As shown in FIG. 36, alternatively, the power supply module 250 and the long circuit sheet 251 including the wiring layer 2a on surface are on opposite sides of the short circuit board 253 such that the power supply module 250 is directly connected to the short circuit board 253 and indirectly connected to the wiring layer 2a of the LED light strip 2 by way of the short circuit board 253.

As shown in FIG. 35, in one embodiment, the long circuit sheet 251 and the short circuit board 253 are adhered together first, and the power supply module 250 is subsequently mounted on the wiring layer 2a of the long circuit sheet 251 serving as the LED light strip 2. The long circuit sheet 251 of the LED light strip 2 herein is not limited to include only one wiring layer 2a and may further include another wiring layer such as the wiring layer 2c shown in FIG. 48. The light sources 202 are disposed on the wiring layer 2a of the LED light strip 2 and electrically connected to the power supply 5 by way of the wiring layer 2a. As shown in FIG. 36, in another embodiment, the long circuit sheet 251 of the LED light strip 2 may include a wiring layer 2a and a dielectric layer 2b. The dielectric layer 2b may be adhered to the short circuit board 253 first and the wiring layer 2a is subsequently adhered to the dielectric layer 2b and extends to the short circuit board 253. All these embodiments are within the scope of applying the circuit board assembly concept of the present invention.

In the above-mentioned embodiments, the short circuit board 253 may have a length generally of about 15 mm to about 40 mm and in some preferable embodiments about 19 mm to about 36 mm, while the long circuit sheet 251 may have a length generally of about 800 mm to about 2800 mm and in some embodiments of about 1200 mm to about 2400 mm. A ratio of the length of the short circuit board 253 to the length of the long circuit sheet 251 ranges from, for example, about 1:20 to about 1:200.

When the ends of the LED light strip 2 are not fixed on the inner surface of the lamp tube 1, the connection between the LED light strip 2 and the power supply 5 via soldering bonding could not firmly support the power supply 5, and it may be necessary to dispose the power supply 5 inside the end cap 3. For example, a longer end cap to have enough space for receiving the power supply 5 would be needed. However, this will reduce the length of the lamp tube under the prerequisite that the total length of the LED tube lamp is fixed according to the product standard, and may therefore decrease the effective illuminating areas.

Referring to FIG. 39, in one embodiment, a hard circuit board 22 made of aluminum is used instead of the bendable circuit sheet, such that the ends or terminals of the hard circuit board 22 can be mounted at ends of the lamp tube 1, and the power supply 5 is solder bonded to one of the ends or terminals of the hard circuit board 22 in a manner such that the printed circuit board of the power supply 5 is not parallel but may be perpendicular to the hard circuit board 22 to save space in the longitudinal direction used for the end cap. This solder bonding technique may be more convenient to accomplish and the effective illuminating areas of the LED tube lamp could also remain. Moreover, a conductive lead 53 for electrical connection with the end cap 3 could be formed directly on the power supply 5 without soldering other metal wires between the power supply 5 and the hollow conductive pin 301 as shown in FIG. 3, and which facilitates the manufacturing of the LED tube lamp.

Next, examples of the circuit design and using of the power supply module 250 are described as follows.

Figure 49A:
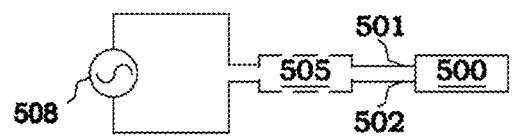
FIG. 49A is a block diagram of an exemplary power supply module 250 in an LED tube lamp according to some embodiments of the present invention.

FIG. 49A is a block diagram of a power supply module 250 in an LED tube lamp according to an embodiment of the present invention. Referring to FIG. 49A, an AC power supply 508 is used to supply an AC supply signal, and may be an AC powerline with a voltage rating, for example, in 100-277 volts and a frequency rating, for example, of 50 or 60 Hz. A lamp driving circuit 505 receives and then converts the AC supply signal into an AC driving signal as an external driving signal. Lamp driving circuit 505 may be for example an electronic ballast used to convert the AC powerline into a high-frequency high-voltage AC driving signal. Common types of electronic ballast include instant-start ballast, program-start or rapid-start ballast, etc., which may all be applicable to the LED tube lamp of the present invention. The voltage of the AC driving signal is likely higher than 300 volts, and is in some embodiments in the range of about 400-700 volts. The frequency of the AC driving signal is likely higher than 10 k Hz, and is in some embodiments in the range of about 20 k-50 k Hz. The LED tube lamp 500 receives an external driving signal and is thus driven to emit light. In one embodiment, the external driving signal comprises the AC driving signal from lamp driving circuit 505. In one embodiment, LED tube lamp 500 is in a driving environment in which it is power-supplied at its one end cap having two conductive pins 501 and 502, which are coupled to lamp driving circuit 505 to receive the AC driving signal. The two conductive pins 501 and 502 may be electrically connected to, either directly or indirectly, the lamp driving circuit 505.

It is worth noting that lamp driving circuit 505 may be omitted and is therefore depicted by a dotted line. In one embodiment, if lamp driving circuit 505 is omitted, AC power supply 508 is directly connected to pins 501 and 502, which then receive the AC supply signal as an external driving signal.

Figure 49B:
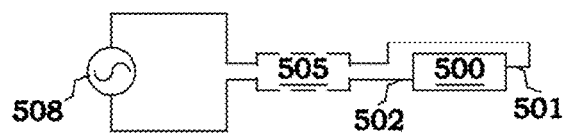
FIG. 49B is a block diagram of an exemplary power supply module 250 in an LED tube lamp according to some embodiments of the present invention.

In addition to the above use with a single-end power supply, LED tube lamp 500 may instead be used with a dual-end power supply to one pin at each of the two ends of an LED lamp tube. FIG. 49B is a block diagram of a power supply module 250 in an LED tube lamp according to one embodiment of the present invention. Referring to FIG. 49B, compared to that shown in FIG. 49A, pins 501 and 502 are respectively disposed at the two opposite end caps of LED tube lamp 500, forming a single pin at each end of LED tube lamp 500, with other components and their functions being the same as those in FIG. 49A.

Figure 49C:
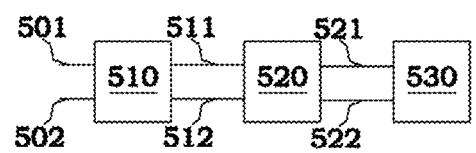
FIG. 49C is a block diagram of an exemplary LED lamp according to some embodiments of the present invention.

FIG. 49C is a block diagram of an LED lamp according to one embodiment of the present invention. Referring to FIG. 49C, the power supply module of the LED lamp summarily includes a rectifying circuit 510, a filtering circuit 520, and an LED driving module 530. Rectifying circuit 510 is coupled to pins 501 and 502 to receive and then rectify an external driving signal, so as to output a rectified signal at output terminals 511 and 512. The external driving signal may be the AC driving signal or the AC supply signal described with reference to FIGS. 49A and 49B, or may even be a DC signal, which embodiments do not alter the LED lamp of the present invention. Filtering circuit 520 is coupled to the first rectifying circuit for filtering the rectified signal to produce a filtered signal, as recited in the claims. For instance, filtering circuit 520 is coupled to terminals 511 and 512 to receive and then filter the rectified signal, so as to output a filtered signal at output terminals 521 and 522. LED driving module 530 is coupled to filtering circuit 520, to receive the filtered signal for emitting light. For instance, LED driving module 530 may be a circuit coupled to terminals 521 and 522 to receive the filtered signal and thereby to drive an LED unit (not shown) in LED driving module 530 to emit light. Details of these operations are described in below descriptions of certain embodiments.

It is worth noting that although there are two output terminals 511 and 512 and two output terminals 521 and 522 in embodiments of these Figs., in practice the number of ports or terminals for coupling between rectifying circuit 510, filtering circuit 520, and LED driving module 530 may be one or more depending on the needs of signal transmission between the circuits or devices.

In addition, the power supply module of the LED lamp described in FIG. 49C, and embodiments of the power supply module of an LED lamp described below, may each be used in the LED tube lamp 500 in FIGS. 49A and 49B, and may instead be used in any other type of LED lighting structure having two conductive pins used to conduct power, such as LED light bulbs, personal area lights (PAL), plug-in LED lamps with different types of bases (such as types of PL-S, PL-D, PL-T, PL-L, etc.), etc.

Figure 49D:
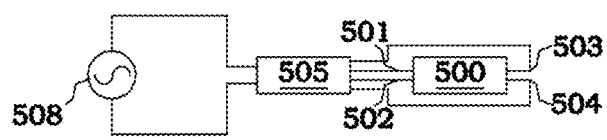
FIG. 49D is a block diagram of an exemplary power supply module 250 in an LED tube lamp according to some embodiments of the present invention.

FIG. 49D is a block diagram of a power supply module 250 in an LED tube lamp according to an embodiment of the present invention. Referring to FIG. 49D, an AC power supply 508 is used to supply an AC supply signal. A lamp driving circuit 505 receives and then converts the AC supply signal into an AC driving signal. An LED tube lamp 500 receives an AC driving signal from lamp driving circuit 505 and is thus driven to emit light. In this embodiment, LED tube lamp 500 is power-supplied at its both end caps respectively having two pins 501 and 502 and two pins 503 and 504, which are coupled to lamp driving circuit 505 to concurrently receive the AC driving signal to drive an LED unit (not shown) in LED tube lamp 500 to emit light. AC power supply 508 may be e.g. the AC powerline, and lamp driving circuit 505 may be a stabilizer or an electronic ballast.

Figure 49E:
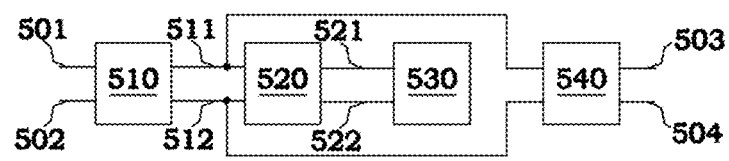
FIG. 49E is a block diagram of an LED lamp according to some embodiments of the present invention.

FIG. 49E is a block diagram of an LED lamp according to an embodiment of the present invention. Referring to FIG. 49E, the power supply module of the LED lamp summarily includes a rectifying circuit 510, a filtering circuit 520, an LED driving module 530, and a filtering circuit 540. Rectifying circuit 510 is coupled to pins 501 and 502 to receive and then rectify an external driving signal conducted by pins 501 and 502. Rectifying circuit 540 is coupled to pins 503 and 504 to receive and then rectify an external driving signal conducted by pins 503 and 504. Therefore, the power supply module of the LED lamp may include two rectifying circuits 510 and 540 configured to output a rectified signal at output terminals 511 and 512. Filtering circuit 520 is coupled to terminals 511 and 512 to receive and then filter the rectified signal, so as to output a filtered signal at output terminals 521 and 522. LED driving module 530 is coupled to terminals 521 and 522 to receive the filtered signal and thereby to drive an LED unit (not shown) in LED driving module 530 to emit light.

The power supply module of the LED lamp in this embodiment of FIG. 49E may be used in LED tube lamp 500 with a dual-end power supply in FIG. 49D. It is worth noting that since the power supply module of the LED lamp comprises rectifying circuits 510 and 540, the power supply module of the LED lamp may be used in LED tube lamp 500 with a single-end power supply in FIGS. 49A and 49B, to receive an external driving signal (such as the AC supply signal or the AC driving signal described above). The power supply module of an LED lamp in this embodiment and other embodiments herein may also be used with a DC driving signal.

Figure 50A:
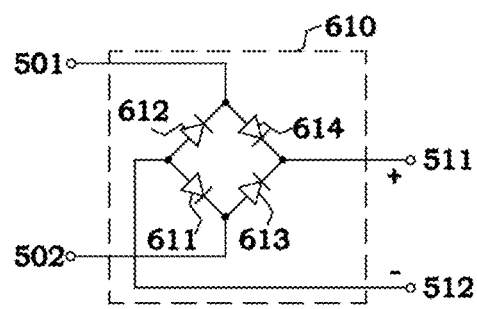
FIG. 50A is a schematic diagram of a rectifying circuit according to some embodiments of the present invention.

FIG. 50A is a schematic diagram of a rectifying circuit according to an embodiment of the present invention. Referring to FIG. 50A, rectifying circuit 610 includes rectifying diodes 611, 612, 613, and 614, configured to full-wave rectify a received signal. Diode 611 has an anode connected to output terminal 512, and a cathode connected to pin 502. Diode 612 has an anode connected to output terminal 512, and a cathode connected to pin 501. Diode 613 has an anode connected to pin 502, and a cathode connected to output terminal 511. Diode 614 has an anode connected to pin 501, and a cathode connected to output terminal 511.

When pins 501 and 502 receive an AC signal, rectifying circuit 610 operates as follows. During the connected AC signal's positive half cycle, the AC signal is input through pin 501, diode 614, and output terminal 511 in sequence, and later output through output terminal 512, diode 611, and pin 502 in sequence. During the connected AC signal's negative half cycle, the AC signal is input through pin 502, diode 613, and output terminal 511 in sequence, and later output through output terminal 512, diode 612, and pin 501 in sequence. Therefore, during the connected AC signal's full cycle, the positive pole of the rectified signal produced by rectifying circuit 610 remains at output terminal 511, and the negative pole of the rectified signal remains at output terminal 512. Accordingly, the rectified signal produced or output by rectifying circuit 610 is a full-wave rectified signal.

When pins 501 and 502 are coupled to a DC power supply to receive a DC signal, rectifying circuit 610 operates as follows. When pin 501 is coupled to the anode of the DC supply and pin 502 to the cathode of the DC supply, the DC signal is input through pin 501, diode 614, and output terminal 511 in sequence, and later output through output terminal 512, diode 611, and pin 502 in sequence. When pin 501 is coupled to the cathode of the DC supply and pin 502 to the anode of the DC supply, the DC signal is input through pin 502, diode 613, and output terminal 511 in sequence, and later output through output terminal 512, diode 612, and pin 501 in sequence. Therefore, no matter what the electrical polarity of the DC signal is between pins 501 and 502, the positive pole of the rectified signal produced by rectifying circuit 610 remains at output terminal 511, and the negative pole of the rectified signal remains at output terminal 512.

Therefore, rectifying circuit 610 in this embodiment can output or produce a proper rectified signal regardless of whether the received input signal is an AC or DC signal.

Figure 50B:
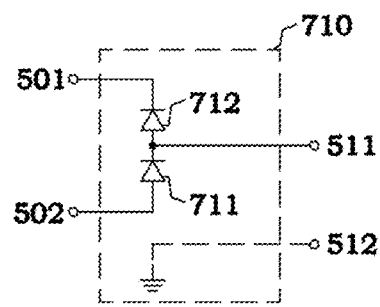
FIG. 50B is a schematic diagram of a rectifying circuit according to some embodiments of the present invention.

FIG. 50B is a schematic diagram of a rectifying circuit according to an embodiment of the present invention. Referring to FIG. 50B, rectifying circuit 710 includes rectifying diodes 711 and 712, configured to half-wave rectify a received signal. Diode 711 has an anode connected to pin 502, and a cathode connected to output terminal 511. Diode 712 has an anode connected to output terminal 511, and a cathode connected to pin 501. Output terminal 512 may be omitted or grounded depending on actual applications.

Next, exemplary operation(s) of rectifying circuit 710 is described as follows.

In one embodiment, during a received AC signal's positive half cycle, the electrical potential at pin 501 is higher than that at pin 502, so diodes 711 and 712 are both in a cutoff state as being reverse-biased, making rectifying circuit 710 not outputting a rectified signal. During a received AC signal's negative half cycle, the electrical potential at pin 501 is lower than that at pin 502, so diodes 711 and 712 are both in a conducting state as being forward-biased, allowing the AC signal to be input through diode 711 and output terminal 511, and later output through output terminal 512, a ground terminal, or another end of the LED tube lamp not directly connected to rectifying circuit 710. Accordingly, the rectified signal produced or output by rectifying circuit 710 is a half-wave rectified signal.

Figure 50C:
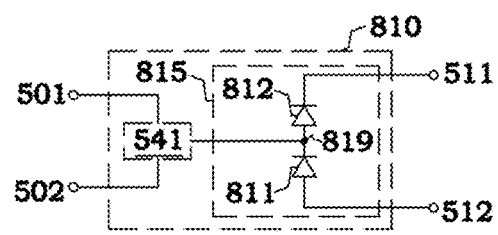
FIG. 50C is a schematic diagram of a rectifying circuit according to some embodiments of the present invention.

FIG. 50C is a schematic diagram of a rectifying circuit according to an embodiment of the present invention. Referring to FIG. 50C, rectifying circuit 810 includes a rectifying unit 815 and a terminal adapter circuit 541. In this embodiment, rectifying unit 815 comprises a half-wave rectifier circuit including diodes 811 and 812 and configured to half-wave rectify. Diode 811 has an anode connected to an output terminal 512, and a cathode connected to a half-wave node 819. Diode 812 has an anode connected to half-wave node 819, and a cathode connected to an output terminal 511. Terminal adapter circuit 541 is coupled to half-wave node 819 and pins 501 and 502, to transmit a signal received at pin 501 and/or pin 502 to half-wave node 819. By means of the terminal adapting function of terminal adapter circuit 541, rectifying circuit 810 allows of two input terminals (connected to pins 501 and 502) and two output terminals 511 and 512.

Next, in certain embodiments, rectifying circuit 810 operates as follows.

During a received AC signal's positive half cycle, the AC signal may be input through pin 501 or 502, terminal adapter circuit 541, half-wave node 819, diode 812, and output terminal 511 in sequence, and later output through another end or circuit of the LED tube lamp. During a received AC signal's negative half cycle, the AC signal may be input through another end or circuit of the LED tube lamp, and later output through output terminal 512, diode 811, half-wave node 819, terminal adapter circuit 541, and pin 501 or 502 in sequence.

It's worth noting that terminal adapter circuit 541 may comprise a resistor, a capacitor, an inductor, or any combination thereof, for performing functions of voltage/current regulation or limiting, types of protection, current/voltage regulation, etc. Descriptions of these functions are presented below.

Figure 50D:
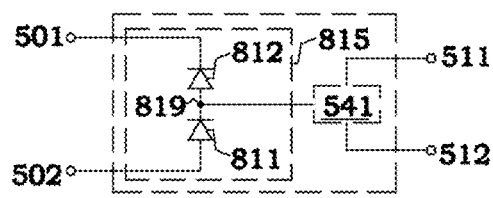
FIG. 50D is a schematic diagram of a rectifying circuit according to some embodiments of the present invention.

In practice, rectifying unit 815 and terminal adapter circuit 541 may be interchanged in position (as shown in FIG. 50D), without altering the function of half-wave rectification. FIG. 50D is a schematic diagram of a rectifying circuit according to an embodiment of the present invention. Referring to FIG. 50D, diode 811 has an anode connected to pin 502 and diode 812 has a cathode connected to pin 501. A cathode of diode 811 and an anode of diode 812 are connected to half-wave node 819. Terminal adapter circuit 541 is coupled to half-wave node 819 and output terminals 511 and 512. During a received AC signal's positive half cycle, the AC signal may be input through another end or circuit of the LED tube lamp, and later output through output terminal 512 or 512, terminal adapter circuit 541, half-wave node 819, diode 812, and pin 501 in sequence. During a received AC signal's negative half cycle, the AC signal may be input through pin 502, diode 811, half-wave node 819, terminal adapter circuit 541, and output node 511 or 512 in sequence, and later output through another end or circuit of the LED tube lamp.

It is worth noting that terminal adapter circuit 541 in embodiments shown in FIGS. 50C and 50D may be omitted and is therefore depicted by a dotted line. If terminal adapter circuit 541 of FIG. 50C is omitted, pins 501 and 502 will be coupled to half-wave node 819. If terminal adapter circuit 541 of FIG. 50D is omitted, output terminals 511 and 512 will be coupled to half-wave node 819.

Rectifying circuit 510 as shown and explained in FIGS. 50A-D can constitute or be the rectifying circuit 540 shown in FIG. 49E, as having pins 503 and 504 for conducting instead of pins 501 and 502.

Next, an explanation follows as to choosing embodiments and their combinations of rectifying circuits 510 and 540, with reference to FIGS. 49C and 49E.

Rectifying circuit 510 in embodiments shown in FIG. 49C may comprise the rectifying circuit 610 in FIG. 50A.

Rectifying circuits 510 and 540 in embodiments shown in FIG. 49E may each comprise any one of the rectifying circuits in FIGS. 50A-D, and terminal adapter circuit 541 in FIGS. 50C-D may be omitted without altering the rectification function needed in an LED tube lamp. When rectifying circuits 510 and 540 each comprise a half-wave rectifier circuit described in FIGS. 50B-D, during a received AC signal's positive or negative half cycle, the AC signal may be input from one of rectifying circuits 510 and 540, and later output from the other rectifying circuit 510 or 540. Further, when rectifying circuits 510 and 540 each comprise the rectifying circuit described in FIG. 50C or 50D, or when they comprise the rectifying circuits in FIGS. 50C and 50D respectively, only one terminal adapter circuit 541 may be needed for functions of voltage/current regulation or limiting, types of protection, current/voltage regulation, etc. within rectifying circuits 510 and 540, omitting another terminal adapter circuit 541 within rectifying circuit 510 or 540.

Figure 51A:
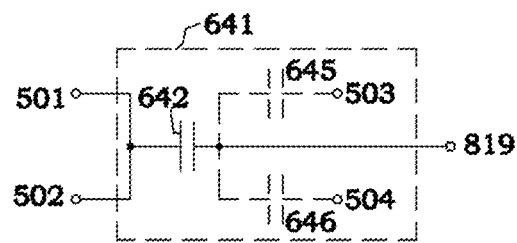
FIG. 51A is a schematic diagram of a terminal adapter circuit according to some embodiments of the present invention.

FIG. 51A is a schematic diagram of the terminal adapter circuit according to an embodiment of the present invention. Referring to FIG. 51A, terminal adapter circuit 641 comprises a capacitor 642 having an end connected to pins 501 and 502, and another end connected to half-wave node 819. Capacitor 642 has an equivalent impedance to an AC signal, which impedance increases as the frequency of the AC signal decreases, and decreases as the frequency increases. Therefore, capacitor 642 in terminal adapter circuit 641 in this embodiment works as a high-pass filter. Further, terminal adapter circuit 641 is connected in series to an LED unit in the LED tube lamp, producing an equivalent impedance of terminal adapter circuit 641 to perform a current/voltage limiting function on the LED unit, thereby preventing damaging of the LED unit by an excessive voltage across and/or current in the LED unit. In addition, choosing the value of capacitor 642 according to the frequency of the AC signal can further enhance voltage/current regulation.

It's worth noting that terminal adapter circuit 641 may further include a capacitor 645 and/or capacitor 646. Capacitor 645 has an end connected to half-wave node 819, and another end connected to pin 503. Capacitor 646 has an end connected to half-wave node 819, and another end connected to pin 504. For example, half-wave node 819 may be a common connective node between capacitors 645 and 646. And capacitor 642 acting as a current regulating capacitor is coupled to the common connective node and pins 501 and 502. In such a structure, series-connected capacitors 642 and 645 exist between one of pins 501 and 502 and pin 503, and/or series-connected capacitors 642 and 646 exist between one of pins 501 and 502 and pin 504. Through equivalent impedances of series-connected capacitors, voltages from the AC signal are divided. Referring to FIGS. 49E and 51A, according to ratios between equivalent impedances of the series-connected capacitors, the voltages respectively across capacitor 642 in rectifying circuit 510, filtering circuit 520, and LED driving module 530 can be controlled, making the current flowing through an LED module in LED driving module 530 being limited within a current rating, and then protecting/preventing filtering circuit 520 and LED driving module 530 from being damaged by excessive voltages.

Figure 51B:
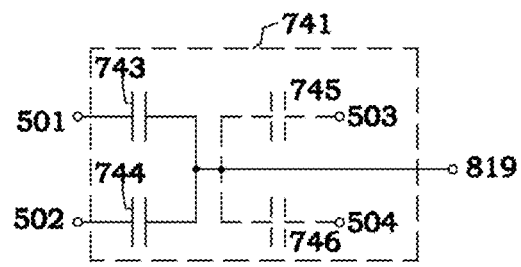
FIG. 51B is a schematic diagram of a terminal adapter circuit according to some embodiments of the present invention.

FIG. 51B is a schematic diagram of the terminal adapter circuit according to an embodiment of the present invention. Referring to FIG. 51B, terminal adapter circuit 741 comprises capacitors 743 and 744. Capacitor 743 has an end connected to pin 501, and another end connected to half-wave node 819. Capacitor 744 has an end connected to pin 502, and another end connected to half-wave node 819. Compared to terminal adapter circuit 641 in FIG. 51A, terminal adapter circuit 741 has capacitors 743 and 744 in place of capacitor 642. Capacitance values of capacitors 743 and 744 may be the same as each other, or may differ from each other depending on the magnitudes of signals to be received at pins 501 and 502.

Similarly, terminal adapter circuit 741 may further comprise a capacitor 745 and/or a capacitor 746, respectively connected to pins 503 and 504. Thus, each of pins 501 and 502 and each of pins 503 and 504 may be connected in series to a capacitor, to achieve the functions of voltage division and other protections.

Figure 51C:
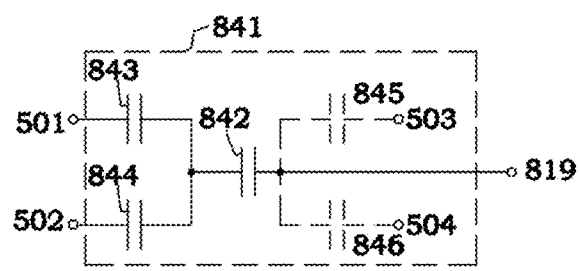
FIG. 51C is a schematic diagram of a terminal adapter circuit according to some embodiments of the present invention.

FIG. 51C is a schematic diagram of the terminal adapter circuit according to an embodiment of the present invention. Referring to FIG. 51C, terminal adapter circuit 841 comprises capacitors 842, 843, and 844. Capacitors 842 and 843 are connected in series between pin 501 and half-wave node 819. Capacitors 842 and 844 are connected in series between pin 502 and half-wave node 819. In such a circuit structure, if any one of capacitors 842, 843, and 844 is shorted, there is still at least one capacitor (of the other two capacitors) between pin 501 and half-wave node 819 and between pin 502 and half-wave node 819, which performs a current-limiting function. Therefore, in the event that a user accidentally gets an electric shock, this circuit structure will prevent an excessive current flowing through and then seriously hurting the body of the user.

Similarly, terminal adapter circuit 841 may further comprise a capacitor 845 and/or a capacitor 846, respectively connected to pins 503 and 504. Thus, each of pins 501 and 502 and each of pins 503 and 504 may be connected in series to a capacitor, to achieve the functions of voltage division and other protections.

Figure 51D:
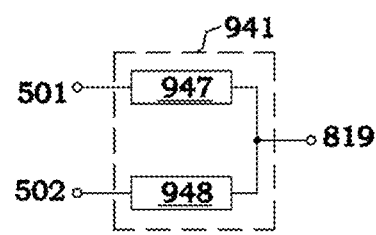
FIG. 51D is a schematic diagram of a terminal adapter circuit according to some embodiments of the present invention.

FIG. 51D is a schematic diagram of the terminal adapter circuit according to an embodiment of the present invention. Referring to FIG. 51D, terminal adapter circuit 941 comprises fuses 947 and 948. Fuse 947 has an end connected to pin 501, and another end connected to half-wave node 819. Fuse 948 has an end connected to pin 502, and another end connected to half-wave node 819. With the fuses 947 and 948, when the current through each of pins 501 and 502 exceeds a current rating of a corresponding connected fuse 947 or 948, the corresponding fuse 947 or 948 will accordingly melt and then break the circuit to achieve overcurrent protection.

Each of the embodiments of the terminal adapter circuits as in rectifying circuits 510 and 810 coupled to pins 501 and 502 and shown and explained above can be used or included in the rectifying circuit 540 shown in FIG. 49E, as when conductive pins 503 and 504 and conductive pins 501 and 502 are interchanged in position.

Capacitance values of the capacitors in the embodiments of the terminal adapter circuits shown and described above are in some embodiments in the range, for example, of about 100 pF-100 nF. Also, a capacitor used in embodiments may be equivalently replaced by two or more capacitors connected in series or parallel. For example, each of capacitors 642 and 842 may be replaced by two series-connected capacitors, one having a capacitance value chosen from the range, for example of about 1.0 nF to about 2.5 nF and which may be in some embodiments preferably 1.5 nF, and the other having a capacitance value chosen from the range, for example of about 1.5 nF to about 3.0 nF, and which is in some embodiments about 2.2 nF.

Figure 52A:
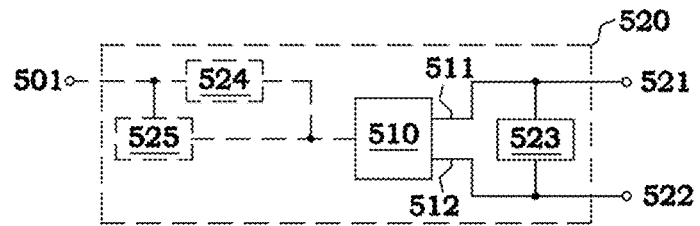
FIG. 52A is a block diagram of a filtering circuit according to some embodiments of the present invention.

FIG. 52A is a block diagram of the filtering circuit according to an embodiment of the present invention. Rectifying circuit 510 is shown in FIG. 52A for illustrating its connection with other components, without intending filtering circuit 520 to include rectifying circuit 510. Referring to FIG. 52A, filtering circuit 520 includes a filtering unit 523 coupled to rectifying output terminals 511 and 512 to receive, and to filter out ripples of, a rectified signal from rectifying circuit 510, thereby outputting a filtered signal whose waveform is smoother than the rectified signal. Filtering circuit 520 may further comprise another filtering unit 524 coupled between a rectifying circuit and a pin, which are for example rectifying circuit 510 and pin 501, rectifying circuit 510 and pin 502, rectifying circuit 540 and pin 503, or rectifying circuit 540 and pin 504. Filtering unit 524 is for filtering of a specific frequency, in order to filter out a specific frequency component of an external driving signal. In this embodiment of FIG. 52A, filtering unit 524 is coupled between rectifying circuit 510 and pin 501. Filtering circuit 520 may further comprise another filtering unit 525 coupled between one of pins 501 and 502 and a diode of rectifying circuit 510, or between one of pins 503 and 504 and a diode of rectifying circuit 540, for reducing or filtering out electromagnetic interference (EMI). In this embodiment, filtering unit 525 is coupled between pin 501 and a diode (not shown in FIG. 52A) of rectifying circuit 510. Since filtering units 524 and 525 may be present or omitted depending on actual circumstances of their uses, they are depicted by a dotted line in FIG. 52A.

Figure 52B:
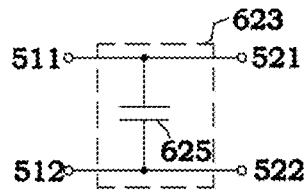
FIG. 52B is a schematic diagram of a filtering unit according to some embodiments of the present invention.

FIG. 52B is a schematic diagram of the filtering unit according to an embodiment of the present invention. Referring to FIG. 52B, filtering unit 623 includes a capacitor 625 having an end coupled to output terminal 511 and a filtering output terminal 521 and another end coupled to output terminal 512 and a filtering output terminal 522, and is configured to low-pass filter a rectified signal from output terminals 511 and 512, so as to filter out high-frequency components of the rectified signal and thereby output a filtered signal at output terminals 521 and 522.

Figure 52C:
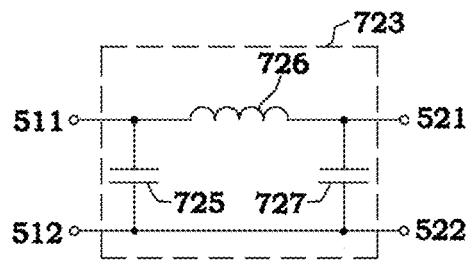
FIG. 52C is a schematic diagram of a filtering unit according to some embodiments of the present invention.

FIG. 52C is a schematic diagram of the filtering unit according to an embodiment of the present invention. Referring to FIG. 52C, filtering unit 723 comprises a pi filter circuit including a capacitor 725, an inductor 726, and a capacitor 727. As is well known, a pi filter circuit looks like the symbol it in its shape or structure. Capacitor 725 has an end connected to output terminal 511 and coupled to output terminal 521 through inductor 726, and has another end connected to output terminals 512 and 522. Inductor 726 is coupled between output terminals 511 and 521. Capacitor 727 has an end connected to output terminal 521 and coupled to output terminal 511 through inductor 726, and has another end connected to output terminals 512 and 522.

As seen between output terminals 511 and 512 and output terminals 521 and 522, filtering unit 723 compared to filtering unit 623 in FIG. 52B additionally has inductor 726 and capacitor 727, which are like capacitor 725 in performing low-pass filtering. Therefore, filtering unit 723 in this embodiment compared to filtering unit 623 in FIG. 52B has a better ability to filter out high-frequency components to output a filtered signal with a smoother waveform.

Inductance values of inductor 726 in the embodiment described above are chosen in some embodiments in the range of about 10 nH to about 10 mH. And capacitance values of capacitors 625, 725, and 727 in the embodiments described above are chosen in some embodiments in the range, for example, of about 100 pF to about 1 uF.

Figure 52D:
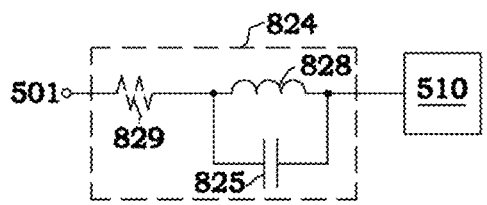
FIG. 52D is a schematic diagram of a filtering unit according to some embodiments of the present invention.

FIG. 52D is a schematic diagram of the filtering unit according to an embodiment of the present invention. Referring to FIG. 52D, filtering unit 824 includes a capacitor 825 and an inductor 828 connected in parallel. Capacitor 825 has an end coupled to pin 501, and another end coupled to rectifying output terminal 511, and is configured to high-pass filter an external driving signal input at pin 501, so as to filter out low-frequency components of the external driving signal. Inductor 828 has an end coupled to pin 501 and another end coupled to rectifying output terminal 511, and is configured to low-pass filter an external driving signal input at pin 501, so as to filter out high-frequency components of the external driving signal. Therefore, the combination of capacitor 825 and inductor 828 works to present high impedance to an external driving signal at one or more specific frequencies. Thus, the parallel-connected capacitor and inductor work to present a peak equivalent impedance to the external driving signal at a specific frequency.

Through appropriately choosing a capacitance value of capacitor 825 and an inductance value of inductor 828, a center frequency f on the high-impedance band may be set at a specific value given by $$f = \frac{1}{2\pi\sqrt{LC}},$$

where L denotes inductance of inductor 828 and C denotes capacitance of capacitor 825. The center frequency is in some embodiments in the range of about 20-30 kHz, and may be preferably about 25 kHz. And an LED lamp with filtering unit 824 is able to be certified under safety standards, for a specific center frequency, as provided by Underwriters Laboratories (UL).

It's worth noting that filtering unit 824 may further comprise a resistor 829, coupled between pin 501 and filtering output terminal 511. In FIG. 52D, resistor 829 is connected in series to the parallel-connected capacitor 825 and inductor 828. For example, resistor 829 may be coupled between pin 501 and parallel-connected capacitor 825 and inductor 828, or may be coupled between filtering output terminal 511 and parallel-connected capacitor 825 and inductor 828. In this embodiment, resistor 829 is coupled between pin 501 and parallel-connected capacitor 825 and inductor 828. Further, resistor 829 is configured for adjusting the quality factor (Q) of the LC circuit comprising capacitor 825 and inductor 828, to better adapt filtering unit 824 to application environments with different quality factor requirements. Since resistor 829 is an optional component, it is depicted in a dotted line in FIG. 52D.

Capacitance values of capacitor 825 are in some embodiments in the range of about 10 nF-2 uF. Inductance values of inductor 828 are in some embodiments smaller than 2 mH, and may be preferably smaller than 1 mH. Resistance values of resistor 829 are in some embodiments larger than 50 ohms, and are may be preferably larger than 500 ohms.

Besides the filtering circuits shown and described in the above embodiments, traditional low-pass or band-pass filters can be used as the filtering unit in the filtering circuit in the present invention.

Figure 52E:
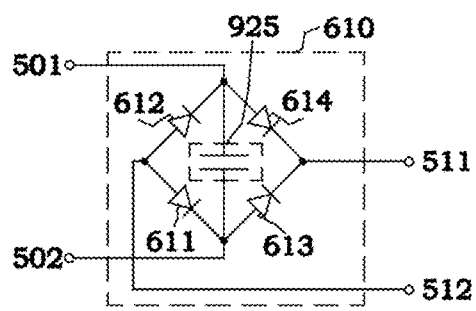
FIG. 52E is a schematic diagram of a filtering unit according to some embodiments of the present invention.

FIG. 52E is a schematic diagram of the filtering unit according to an embodiment of the present invention. Referring to FIG. 52E, in this embodiment filtering unit 925 is disposed in rectifying circuit 610 as shown in FIG. 50A, and is configured for reducing the EMI (Electromagnetic interference) caused by rectifying circuit 610 and/or other circuits. In this embodiment, filtering unit 925 includes an EMI-reducing capacitor coupled between pin 501 and the anode of rectifying diode 613, and also between pin 502 and the anode of rectifying diode 614, to reduce the EMI associated with the positive half cycle of the AC driving signal received at pins 501 and 502. The EMI-reducing capacitor of filtering unit 925 is also coupled between pin 501 and the cathode of rectifying diode 611, and between pin 502 and the cathode of rectifying diode 612, to reduce the EMI associated with the negative half cycle of the AC driving signal received at pins 501 and 502. In some embodiments, rectifying circuit 610 comprises a full-wave bridge rectifier circuit including four rectifying diodes 611, 612, 613, and 614. The full-wave bridge rectifier circuit has a first filtering node connecting an anode and a cathode respectively of two diodes 613 and 611 of the four rectifying diodes 611, 612, 613, and 614, and a second filtering node connecting an anode and a cathode respectively of the other two diodes 614 and 612 of the four rectifying diodes 611, 612, 613, and 614. And the EMI-reducing capacitor of the filtering unit 925 is coupled between the first filtering node and the second filtering node.

Similarly, with reference to FIGS. 50C, and 51A-51C, any capacitor in each of the circuits in FIGS. 51A-51C is coupled between pins 501 and 502 (or pins 503 and 504) and any diode in FIG. 50C, so any or each capacitor in FIGS. 51A-51C can work as an EMI-reducing capacitor to achieve the function of reducing EMI. For example, rectifying circuit 510 in FIGS. 49C and 49E may comprise a half-wave rectifier circuit including two rectifying diodes and having a half-wave node connecting an anode and a cathode respectively of the two rectifying diodes, and any or each capacitor in FIGS. 51A-51C may be coupled between the half-wave node and at least one of the first pin and the second pin. And rectifying circuit 540 in FIG. 49E may comprise a half-wave rectifier circuit including two rectifying diodes and having a half-wave node connecting an anode and a cathode respectively of the two rectifying diodes, and any or each capacitor in FIGS. 51A-51C may be coupled between the half-wave node and at least one of the third pin and the fourth pin.

It's worth noting that the EMI-reducing capacitor in the embodiment of FIG. 52E may also act as capacitor 825 in filtering unit 824, so that in combination with inductor 828 and the capacitor 825 performs the functions of reducing EMI and presenting high impedance to an external driving signal at specific frequencies. For example, when the rectifying circuit comprises a full-wave bridge rectifier circuit, capacitor 825 of filtering unit 824 may be coupled between the first filtering node and the second filtering node of the full-wave bridge rectifier circuit. When the rectifying circuit comprises a half-wave rectifier circuit, capacitor 825 of filtering unit 824 may be coupled between the half-wave node of the half-wave rectifier circuit and at least one of the first pin and the second pin.

Figure 53A:
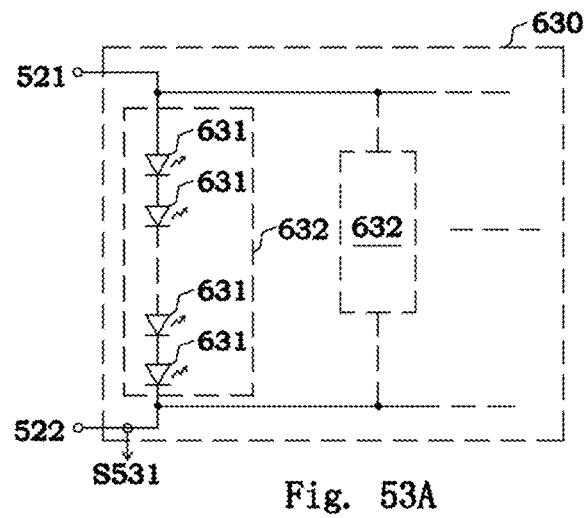
FIG. 53A is a schematic diagram of an LED module according to some embodiments of the present invention.

FIG. 53A is a schematic diagram of an LED module according to an embodiment of the present invention. Referring to FIG. 53A, LED module 630 has an anode connected to the filtering output terminal 521, has a cathode connected to the filtering output terminal 522, and comprises at least one LED unit 632. When two or more LED units are included, they are connected in parallel. The anode of each LED unit 632 is connected to the anode of LED module 630 and thus output terminal 521, and the cathode of each LED unit 632 is connected to the cathode of LED module 630 and thus output terminal 522. Each LED unit 632 includes at least one LED 631. When multiple LEDs 631 are included in an LED unit 632, they are connected in series, with the anode of the first LED 631 connected to the anode of this LED unit 632, and the cathode of the first LED 631 connected to the next or second LED 631. And the anode of the last LED 631 in this LED unit 632 is connected to the cathode of a previous LED 631, with the cathode of the last LED 631 connected to the cathode of this LED unit 632.

It's worth noting that LED module 630 may produce a current detection signal S531 reflecting a magnitude of current through LED module 630 and used for controlling or detecting on the LED module 630.

Figure 53B:
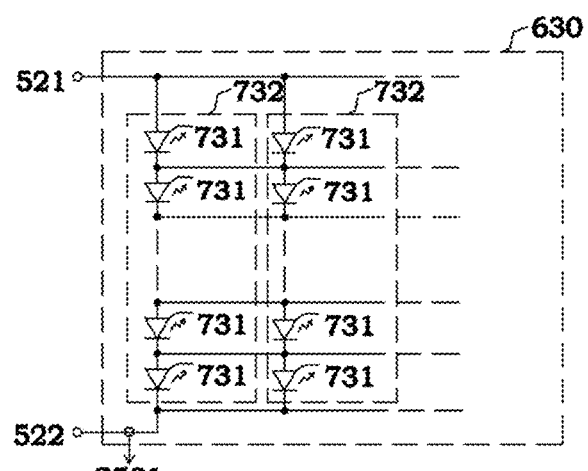
FIG. 53B is a schematic diagram of an LED module according to some embodiments of the present invention.

FIG. 53B is a schematic diagram of an LED module according to an embodiment of the present invention. Referring to FIG. 53B, LED module 630 has an anode connected to the filtering output terminal 521, has a cathode connected to the filtering output terminal 522, and comprises at least two LED units 732, with the anode of each LED unit 732 connected to the anode of LED module 630, and the cathode of each LED unit 732 connected to the cathode of LED module 630. Each LED unit 732 includes at least two LEDs 731 connected in the same way as described in FIG. 53A. For example, the anode of the first LED 731 in an LED unit 732 is connected to the anode of this LED unit 732, the cathode of the first LED 731 is connected to the anode of the next or second LED 731, and the cathode of the last LED 731 is connected to the cathode of this LED unit 732. Further, LED units 732 in an LED module 630 are connected to each other in this embodiment. All of the n-th LEDs 731 respectively of the LED units 732 are connected by every anode of every n-th LED 731 in the LED units 732, and by every cathode of every n-th LED 731, where n is a positive integer. In this way, the LEDs in LED module 630 in this embodiment are connected in the form of a mesh.

Compared to the embodiments of FIGS. 54A-54G, LED driving module 530 of the above embodiments includes LED module 630, but doesn't include a driving circuit for the LED module 630.

Similarly, LED module 630 in this embodiment may produce a current detection signal S531 reflecting a magnitude of current through LED module 630 and used for controlling or detecting on the LED module 630.

In actual practice, the number of LEDs 731 included by an LED unit 732 is in some embodiments in the range of 15-25, and is may be preferably in the range of 18-22.

Figure 53C:
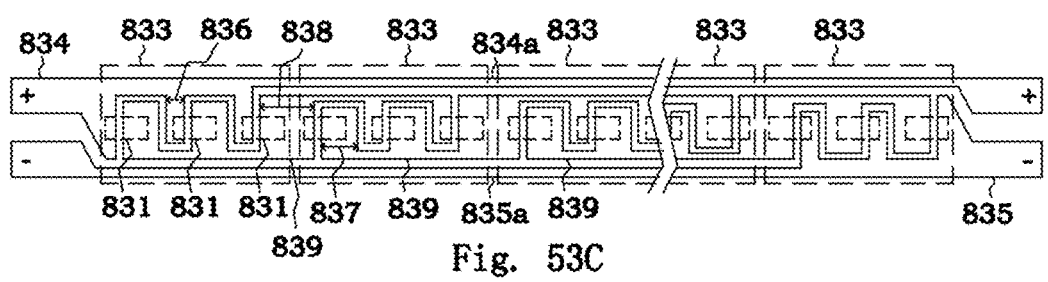
FIG. 53C is a plan view of a circuit layout of the LED module according to some embodiments of the present invention.

FIG. 53C is a plan view of a circuit layout of the LED module according to an embodiment of the present invention. Referring to FIG. 53C, in this embodiment LEDs 831 are connected in the same way as described in FIG. 53B, and three LED units are assumed in LED module 630 and described as follows for illustration. A positive conductive line 834 and a negative conductive line 835 are to receive a driving signal, for supplying power to the LEDs 831. For example, positive conductive line 834 may be coupled to the filtering output terminal 521 of the filtering circuit 520 described above, and negative conductive line 835 coupled to the filtering output terminal 522 of the filtering circuit 520, to receive a filtered signal. For the convenience of illustration, all three of the n-th LEDs 831 respectively of the three LED units are grouped as an LED set 833 in FIG. 53C.

Positive conductive line 834 connects the three first LEDs 831 respectively of the leftmost three LED units, at the anodes on the left sides of the three first LEDs 831 as shown in the leftmost LED set 833 of FIG. 53C. Negative conductive line 835 connects the three last LEDs 831 respectively of the leftmost three LED units, at the cathodes on the right sides of the three last LEDs 831 as shown in the rightmost LED set 833 of FIG. 53C. And of the three LED units, the cathodes of the three first LEDs 831, the anodes of the three last LEDs 831, and the anodes and cathodes of all the remaining LEDs 831 are connected by conductive lines or parts 839.

For example, the anodes of the three LEDs 831 in the leftmost LED set 833 may be connected together by positive conductive line 834, and their cathodes may be connected together by a leftmost conductive part 839. The anodes of the three LEDs 831 in the second leftmost LED set 833 are also connected together by the leftmost conductive part 839, whereas their cathodes are connected together by a second leftmost conductive part 839. Since the cathodes of the three LEDs 831 in the leftmost LED set 833 and the anodes of the three LEDs 831 in the second leftmost LED set 833 are connected together by the same leftmost conductive part 839, in each of the three LED units the cathode of the first LED 831 is connected to the anode of the next or second LED 831, with the remaining LEDs 831 also being connected in the same way. Accordingly, all the LEDs 831 of the three LED units are connected to form the mesh as shown in FIG. 53B.

It's worth noting that in this embodiment the length 836 of a portion of each conductive part 839 that immediately connects to the anode of an LED 831 is smaller than the length 837 of another portion of each conductive part 839 that immediately connects to the cathode of an LED 831, making the area of the latter portion immediately connecting to the cathode larger than that of the former portion immediately connecting to the anode. The length 837 may be smaller than a length 838 of a portion of each conductive part 839 that immediately connects the cathode of an LED 831 and the anode of the next LED 831, making the area of the portion of each conductive part 839 that immediately connects a cathode and an anode larger than the area of any other portion of each conductive part 839 that immediately connects to only a cathode or an anode of an LED 831. Due to the length differences and area differences, this layout structure improves heat dissipation of the LEDs 831.

In some embodiments, positive conductive line 834 includes a lengthwise portion 834a, and negative conductive line 835 includes a lengthwise portion 835a, which are conducive to making the LED module have a positive "+" connective portion and a negative "−" connective portion at each of the two ends of the LED module, as shown in FIG. 53C. Such a layout structure allows for coupling any of other circuits of the power supply module of the LED lamp, including e.g. filtering circuit 520 and rectifying circuits 510 and 540, to the LED module through the positive connective portion and/or the negative connective portion at each or both ends of the LED lamp. Thus the layout structure increases the flexibility in arranging actual circuits in the LED lamp.

Figure 53D:
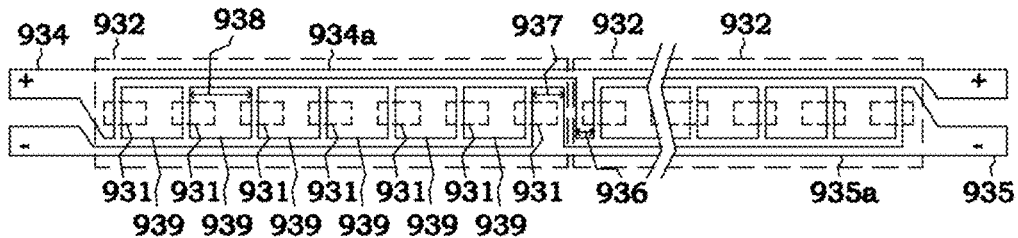
FIG. 53D is a plan view of a circuit layout of the LED module according to some embodiments of the present invention.

FIG. 53D is a plan view of a circuit layout of the LED module according to another embodiment of the present invention. Referring to FIG. 53D, in this embodiment LEDs 931 are connected in the same way as described in FIG. 53A, and three LED units each including 7 LEDs 931 are assumed in LED module 630 and described as follows for illustration. A positive conductive line 934 and a negative conductive line 935 are to receive a driving signal, for supplying power to the LEDs 931. For example, positive conductive line 934 may be coupled to the filtering output terminal 521 of the filtering circuit 520 described above, and negative conductive line 935 coupled to the filtering output terminal 522 of the filtering circuit 520, to receive a filtered signal. For the convenience of illustration, all seven LEDs 931 of each of the three LED units are grouped as an LED set 932 in FIG. 53D. Thus there are three LED sets 932 corresponding to the three LED units.

Positive conductive line 934 connects to the anode on the left side of the first or leftmost LED 931 of each of the three LED sets 932. Negative conductive line 935 connects to the cathode on the right side of the last or rightmost LED 931 of each of the three LED sets 932. In each LED set 932, of two consecutive LEDs 931 the LED 931 on the left has a cathode connected by a conductive part 939 to an anode of the LED 931 on the right. By such a layout, the LEDs 931 of each LED set 932 are connected in series.

It's also worth noting that a conductive part 939 may be used to connect an anode and a cathode respectively of two consecutive LEDs 931. Negative conductive line 935 connects to the cathode of the last or rightmost LED 931 of each of the three LED sets 932. And positive conductive line 934 connects to the anode of the first or leftmost LED 931 of each of the three LED sets 932. Therefore, as shown in FIG. 53D, the length (and thus area) of the conductive part 939 is larger than that of the portion of negative conductive line 935 immediately connecting to a cathode, which length (and thus area) is then larger than that of the portion of positive conductive line 934 immediately connecting to an anode. For example, the length 938 of the conductive part 939 may be larger than the length 937 of the portion of negative conductive line 935 immediately connecting to a cathode of an LED 931, which length 937 is then larger than the length 936 of the portion of positive conductive line 934 immediately connecting to an anode of an LED 931. Such a layout structure improves heat dissipation of the LEDs 931 in LED module 630.

Positive conductive line 934 may include a lengthwise portion 934a, and negative conductive line 935 may include a lengthwise portion 935a, which are conducive to making the LED module have a positive "+" connective portion and a negative "−" connective portion at each of the two ends of the LED module, as shown in FIG. 53D. Such a layout structure allows for coupling any of other circuits of the power supply module of the LED lamp, including e.g. filtering circuit 520 and rectifying circuits 510 and 540, to the LED module through the positive connective portion 934a and/or the negative connective portion 935a at each or both ends of the LED lamp. Thus the layout structure increases the flexibility in arranging actual circuits in the LED lamp.

Further, the circuit layouts as shown in FIGS. 53C and 53D may be implemented with a bendable circuit sheet or substrate, which may even be called flexible circuit board depending on its specific definition used. For example, the bendable circuit sheet may comprise one conductive layer where positive conductive line 834, positive lengthwise portion 834a, negative conductive line 835, negative lengthwise portion 835a, and conductive parts 839 shown in FIG. 53C, and positive conductive line 934, positive lengthwise portion 934a, negative conductive line 935, negative lengthwise portion 935a, and conductive parts 939 shown in FIG. 53D are formed by the method of etching.

Figure 53E:
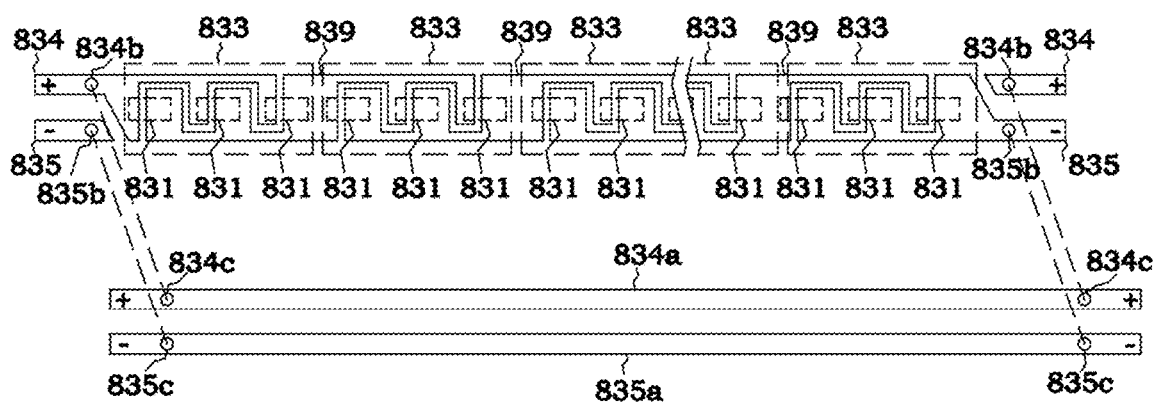
FIG. 53E is a plan view of a circuit layout of the LED module according to some embodiments of the present invention.

FIG. 53E is a plan view of a circuit layout of the LED module according to another embodiment of the present invention. The layout structures of the LED module in FIGS. 53E and 53C each correspond to the same way of connecting LEDs 831 as that shown in FIG. 53B, but the layout structure in FIG. 53E comprises two conductive layers, instead of only one conductive layer for forming the circuit layout as shown in FIG. 53C. Referring to FIG. 53E, the main difference from the layout in FIG. 53C is that positive conductive line 834 and negative conductive line 835 have a lengthwise portion 834a and a lengthwise portion 835a, respectively, that are formed in a second conductive layer instead. The difference is elaborated as follows.

Referring to FIG. 53E, the bendable circuit sheet of the LED module comprises a first conductive layer 2a and a second conductive layer 2c electrically insulated from each other by a dielectric layer 2b (not shown). Of the two conductive layers, positive conductive line 834, negative conductive line 835, and conductive parts 839 in FIG. 53E are formed in first conductive layer 2a by the method of etching for electrically connecting the plurality of LED components 831 e.g. in a form of a mesh, whereas positive lengthwise portion 834a and negative lengthwise portion 835a are formed in second conductive layer 2c by etching for electrically connecting to (the filtering output terminal of) the filtering circuit. Further, positive conductive line 834 and negative conductive line 835 in first conductive layer 2a have via points 834b and via points 835b, respectively, for connecting to second conductive layer 2c. And positive lengthwise portion 834a and negative lengthwise portion 835a in second conductive layer 2c have via points 834c and via points 835c, respectively. Via points 834b are positioned corresponding to via points 834c, for connecting positive conductive line 834 and positive lengthwise portion 834a. Via points 835b are positioned corresponding to via points 835c, for connecting negative conductive line 835 and negative lengthwise portion 835a. A preferable way of connecting the two conductive layers is to form a hole connecting each via point 834b and a corresponding via point 834c, and to form a hole connecting each via point 835b and a corresponding via point 835c, with the holes extending through the two conductive layers and the dielectric layer in-between. And positive conductive line 834 and positive lengthwise portion 834a can be electrically connected by welding metallic part(s) through the connecting hole(s), and negative conductive line 835 and negative lengthwise portion 835a can be electrically connected by welding metallic part(s) through the connecting hole(s).

Similarly, the layout structure of the LED module in FIG. 53D may alternatively have positive lengthwise portion 934a and negative lengthwise portion 935a disposed in a second conductive layer, to constitute a two-layer layout structure.

It's worth noting that the thickness of the second conductive layer of a two-layer bendable circuit sheet is in some embodiments larger than that of the first conductive layer, in order to reduce the voltage drop or loss along each of the positive lengthwise portion and the negative lengthwise portion disposed in the second conductive layer. Compared to a one-layer bendable circuit sheet, since a positive lengthwise portion and a negative lengthwise portion are disposed in a second conductive layer in a two-layer bendable circuit sheet, the width (between two lengthwise sides) of the two-layer bendable circuit sheet is or can be reduced. On the same fixture or plate in a production process, the number of bendable circuit sheets each with a shorter width that can be laid together at most is larger than the number of bendable circuit sheets each with a longer width that can be laid together at most. Thus adopting a bendable circuit sheet with a shorter width can increase the efficiency of production of the LED module. And reliability in the production process, such as the accuracy of welding position when welding (materials on) the LED components, can also be improved, because a two-layer bendable circuit sheet can better maintain its shape.

As a variant of the above embodiments, a type of LED tube lamp is provided that has at least some of the electronic components of its power supply module disposed on a light strip of the LED tube lamp. For example, the technique of printed electronic circuit (PEC) can be used to print, insert, or embed at least some of the electronic components onto the light strip.

In one embodiment, all electronic components of the power supply module are disposed on the light strip. The production process may include or proceed with the following steps: preparation of the circuit substrate (e.g. preparation of a flexible printed circuit board); ink jet printing of metallic nano-ink; ink jet printing of active and passive components (as of the power supply module); drying/sintering; ink jet printing of interlayer bumps; spraying of insulating ink; ink jet printing of metallic nano-ink; ink jet printing of active and passive components (to sequentially form the included layers); spraying of surface bond pad(s); and spraying of solder resist against LED components.

In certain embodiments, if all electronic components of the power supply module are disposed on the light strip, electrical connection between terminal pins of the LED tube lamp and the light strip may be achieved by connecting the pins to conductive lines which are welded with ends of the light strip. In this case, another substrate for supporting the power supply module is not required, thereby allowing of an improved design or arrangement in the end cap(s) of the LED tube lamp. In some embodiments, (components of) the power supply module are disposed at two ends of the light strip, in order to significantly reduce the impact of heat generated from the power supply module's operations on the LED components. Since no substrate other than the light strip is used to support the power supply module in this case, the total amount of welding or soldering can be significantly reduced, improving the general reliability of the power supply module.

Another case is that some of all electronic components of the power supply module, such as some resistors and/or smaller size capacitors, are printed onto the light strip, and some bigger size components, such as some inductors and/or electrolytic capacitors, are disposed in the end cap(s). The production process of the light strip in this case may be the same as that described above. And in this case disposing some of all electronic components on the light strip is conducive to achieving a reasonable layout of the power supply module in the LED tube lamp, which may allow of an improved design in the end cap(s).

As a variant embodiment of the above, electronic components of the power supply module may be disposed on the light strip by a method of embedding or inserting, e.g. by embedding the components onto a bendable or flexible light strip. In some embodiments, this embedding may be realized by a method using copper-clad laminates (CCL) for forming a resistor or capacitor; a method using ink related to silkscreen printing; or a method of ink jet printing to embed passive components, wherein an ink jet printer is used to directly print inks to constitute passive components and related functionalities to intended positions on the light strip. Then through treatment by ultraviolet (UV) light or drying/sintering, the light strip is formed where passive components are embedded. The electronic components embedded onto the light strip include for example resistors, capacitors, and inductors. In other embodiments, active components also may be embedded. Through embedding some components onto the light strip, a reasonable layout of the power supply module can be achieved to allow of an improved design in the end cap(s), because the surface area on a printed circuit board used for carrying components of the power supply module is reduced or smaller, and as a result the size, weight, and thickness of the resulting printed circuit board for carrying components of the power supply module is also smaller or reduced. Also in this situation since welding points on the printed circuit board for welding resistors and/or capacitors if they were not to be disposed on the light strip are no longer used, the reliability of the power supply module is improved, in view of the fact that these welding points are most liable to (cause or incur) faults, malfunctions, or failures. Further, the length of conductive lines needed for connecting components on the printed circuit board is therefore also reduced, which allows of a more compact layout of components on the printed circuit board and thus improving the functionalities of these components.

Next, methods to produce embedded capacitors and resistors are explained as follows.

Usually, methods for manufacturing embedded capacitors employ or involve a concept called distributed or planar capacitance. The manufacturing process may include the following step(s). On a substrate of a copper layer a very thin insulation layer is applied or pressed, which is then generally disposed between a pair of layers including a power conductive layer and a ground layer. The very thin insulation layer makes the distance between the power conductive layer and the ground layer very short. A capacitance resulting from this structure can also be realized by a conventional technique of a plated-through hole. Basically, this step is used to create this structure comprising a big parallel-plate capacitor on a circuit substrate.

Of products of high electrical capacity, certain types of products employ distributed capacitances, and other types of products employ separate embedded capacitances. Through putting or adding a high dielectric-constant material such as barium titanate into the insulation layer, the high electrical capacity is achieved.

A usual method for manufacturing embedded resistors employ conductive or resistive adhesive. This may include, for example, a resin to which conductive carbon or graphite is added, which may be used as an additive or filler. The additive resin is silkscreen printed to an object location, and is then after treatment laminated inside the circuit board. The resulting resistor is connected to other electronic components through plated-through holes or microvias. Another method is called Ohmega-Ply, by which a two metallic layer structure of a copper layer and a thin nickel alloy layer constitutes a layer resistor relative to a substrate. Then through etching the copper layer and nickel alloy layer, different types of nickel alloy resistors with copper terminals can be formed. These types of resistor are each laminated inside the circuit board.

In an embodiment, conductive wires/lines are directly printed in a linear layout on an inner surface of the LED glass lamp tube, with LED components directly attached on the inner surface and electrically connected by the conductive wires. In some embodiments, the LED components in the form of chips are directly attached over the conductive wires on the inner surface, and connective points are at terminals of the wires for connecting the LED components and the power supply module. After being attached, the LED chips may have fluorescent powder applied or dropped thereon, for producing white light or light of other color by the operating LED tube lamp.

In some embodiments, luminous efficacy of the LED or LED component is 80 lm/W or above, and in some embodiments, it may be preferably 120 lm/W or above. Certain more optimal embodiments may include a luminous efficacy of the LED or LED component of 160 lm/W or above. White light emitted by an LED component in the invention may be produced by mixing fluorescent powder with the monochromatic light emitted by a monochromatic LED chip. The white light in its spectrum has major wavelength ranges of 430-460 nm and 550-560 nm, or major wavelength ranges of 430-460 nm, 540-560 nm, and 620-640 nm.

Figure 54A:
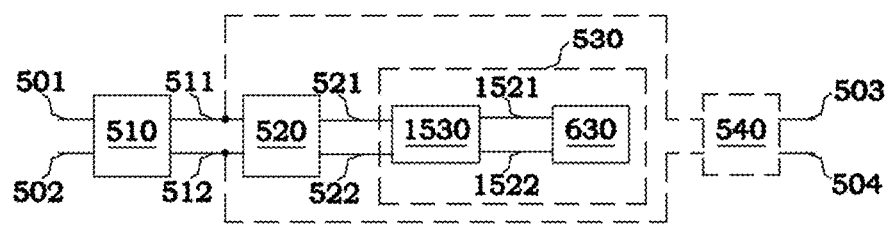
FIG. 54A is a block diagram of an exemplary power supply module in an LED lamp according to some embodiments of the present invention.

FIG. 54A is a block diagram of a power supply module in an LED lamp according to an embodiment of the present invention. As shown in FIG. 54A, the power supply module of the LED lamp includes rectifying circuits 510 and 540, a filtering circuit 520, and an LED driving module 530. LED driving module 530 in this embodiment comprises a driving circuit 1530 and an LED module 630. According to the above description in FIG. 49E, driving circuit 1530 in FIG. 54A comprises a DC-to-DC converter circuit, and is coupled to filtering output terminals 521 and 522 to receive a filtered signal and then perform power conversion for converting the filtered signal into a driving signal at driving output terminals 1521 and 1522. The LED module 630 is coupled to driving output terminals 1521 and 1522 to receive the driving signal for emitting light. In some embodiments, the current of LED module 630 is stabilized at an objective current value. Descriptions of this LED module 630 are the same as those provided above with reference to FIGS. 53A-53D.

It's worth noting that rectifying circuit 540 is an optional element and therefore can be omitted, so it is depicted in a dotted line in FIG. 54A. Accordingly, LED driving module 530 in embodiments of FIGS. 54A, 54C, and 54E may comprise a driving circuit 1530 and an LED module 630. Therefore, the power supply module of the LED lamp in this embodiment can be used with a single-end power supply coupled to one end of the LED lamp, and can be used with a dual-end power supply coupled to two ends of the LED lamp. With a single-end power supply, examples of the LED lamp include an LED light bulb, a personal area light (PAL), etc.

Figure 54B:
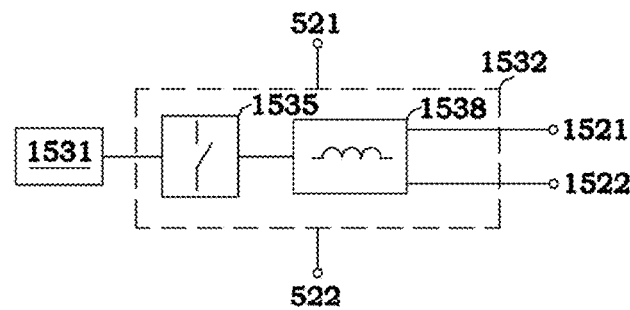
FIG. 54B is a block diagram of a driving circuit according to some embodiments of the present invention.

FIG. 54B is a block diagram of the driving circuit according to an embodiment of the present invention. Referring to FIG. 54B, the driving circuit includes a controller 1531, and a conversion circuit 1532 for power conversion based on a current source, for driving the LED module to emit light. Conversion circuit 1532 includes a switching circuit 1535 and an energy storage circuit 1538. And conversion circuit 1532 is coupled to filtering output terminals 521 and 522 to receive and then convert a filtered signal, under the control by controller 1531, into a driving signal at driving output terminals 1521 and 1522 for driving the LED module. Under the control by controller 1531, the driving signal output by conversion circuit 1532 comprises a steady current, making the LED module emitting steady light.

Figure 54C:
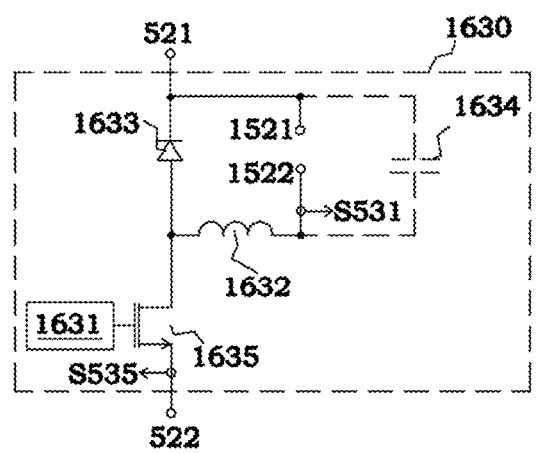
FIG. 54C is a schematic diagram of a driving circuit according to some embodiments of the present invention.

FIG. 54C is a schematic diagram of the driving circuit according to an embodiment of the present invention. Referring to FIG. 54C, a driving circuit 1630 in this embodiment comprises a buck DC-to-DC converter circuit having a controller 1631 and a converter circuit. The converter circuit includes an inductor 1632, a diode 1633 for "freewheeling" of current, a capacitor 1634, and a switch 1635. Driving circuit 1630 is coupled to filtering output terminals 521 and 522 to receive and then convert a filtered signal into a driving signal for driving an LED module connected between driving output terminals 1521 and 1522.

In this embodiment, switch 1635 comprises a metal-oxide-semiconductor field-effect transistor (MOSFET) and has a first terminal coupled to the anode of freewheeling diode 1633, a second terminal coupled to filtering output terminal 522, and a control terminal coupled to controller 1631 used for controlling current conduction or cutoff between the first and second terminals of switch 1635. Driving output terminal 1521 is connected to filtering output terminal 521, and driving output terminal 1522 is connected to an end of inductor 1632, which has another end connected to the first terminal of switch 1635. Capacitor 1634 is coupled between driving output terminals 1521 and 1522, to stabilize the voltage between driving output terminals 1521 and 1522. Freewheeling diode 1633 has a cathode connected to driving output terminal 1521.

Next, a description follows as to an exemplary operation of driving circuit 1630.

Controller 1631 is configured for determining when to turn switch 1635 on (in a conducting state) or off (in a cutoff state), according to a current detection signal S535 and/or a current detection signal S531. For example, in some embodiments, controller 1631 is configured to control the duty cycle of switch 1635 being on and switch 1635 being off, in order to adjust the size or magnitude of the driving signal. Current detection signal S535 represents the magnitude of current through switch 1635. Current detection signal S531 represents the magnitude of current through the LED module coupled between driving output terminals 1521 and 1522. According to any of current detection signal S535 and current detection signal S531, controller 1631 can obtain information on the magnitude of power converted by the converter circuit. When switch 1635 is switched on, a current of a filtered signal is input through filtering output terminal 521, and then flows through capacitor 1634, driving output terminal 1521, the LED module, inductor 1632, and switch 1635, and then flows out from filtering output terminal 522. During this flowing of current, capacitor 1634 and inductor 1632 are performing storing of energy. On the other hand, when switch 1635 is switched off, capacitor 1634 and inductor 1632 perform releasing of stored energy by a current flowing from freewheeling capacitor 1633 to driving output terminal 1521 to make the LED module continuing to emit light.

It's worth noting that capacitor 1634 is an optional element, so it can be omitted and is thus depicted in a dotted line in FIG. 54C. In some application environments, the natural characteristic of an inductor to oppose instantaneous change in electric current passing through the inductor may be used to achieve the effect of stabilizing the current through the LED module, thus omitting capacitor 1634.

Figure 54D:
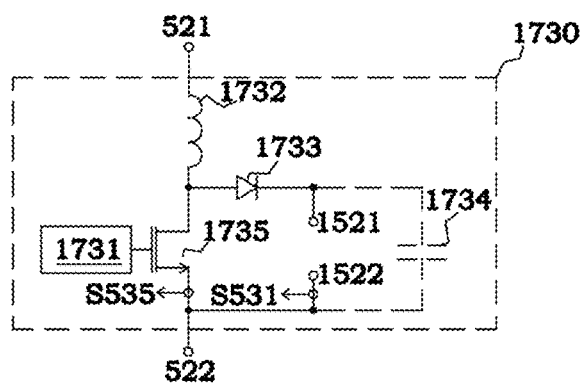
FIG. 54D is a schematic diagram of a driving circuit according to some embodiments of the present invention.

FIG. 54D is a schematic diagram of the driving circuit according to an embodiment of the present invention. Referring to FIG. 54D, a driving circuit 1730 in this embodiment comprises a boost DC-to-DC converter circuit having a controller 1731 and a converter circuit. The converter circuit includes an inductor 1732, a diode 1733 for "freewheeling" of current, a capacitor 1734, and a switch 1735. Driving circuit 1730 is configured to receive and then convert a filtered signal from filtering output terminals 521 and 522 into a driving signal for driving an LED module coupled between driving output terminals 1521 and 1522.

Inductor 1732 has an end connected to filtering output terminal 521, and another end connected to the anode of freewheeling diode 1733 and a first terminal of switch 1735, which has a second terminal connected to filtering output terminal 522 and driving output terminal 1522. Freewheeling diode 1733 has a cathode connected to driving output terminal 1521. And capacitor 1734 is coupled between driving output terminals 1521 and 1522.

Controller 1731 is coupled to a control terminal of switch 1735, and is configured for determining when to turn switch 1735 on (in a conducting state) or off (in a cutoff state), according to a current detection signal S535 and/or a current detection signal S531. When switch 1735 is switched on, a current of a filtered signal is input through filtering output terminal 521, and then flows through inductor 1732 and switch 1735, and then flows out from filtering output terminal 522. During this flowing of current, the current through inductor 1732 increases with time, with inductor 1732 being in a state of storing energy, while capacitor 1734 enters a state of releasing energy, making the LED module continuing to emit light. On the other hand, when switch 1735 is switched off, inductor 1732 enters a state of releasing energy as the current through inductor 1732 decreases with time. In this state, the current through inductor 1732 then flows through freewheeling diode 1733, capacitor 1734, and the LED module, while capacitor 1734 enters a state of storing energy.

It's worth noting that capacitor 1734 is an optional element, so it can be omitted and is thus depicted in a dotted line in FIG. 54D. When capacitor 1734 is omitted and switch 1735 is switched on, the current of inductor 1732 does not flow through the LED module, making the LED module not emit light; but when switch 1735 is switched off, the current of inductor 1732 flows through freewheeling diode 1733 to reach the LED module, making the LED module emit light. Therefore, by controlling the time that the LED module emits light, and the magnitude of current through the LED module, the average luminance of the LED module can be stabilized to be above a defined value, thus also achieving the effect of emitting a steady light.

Figure 54E:
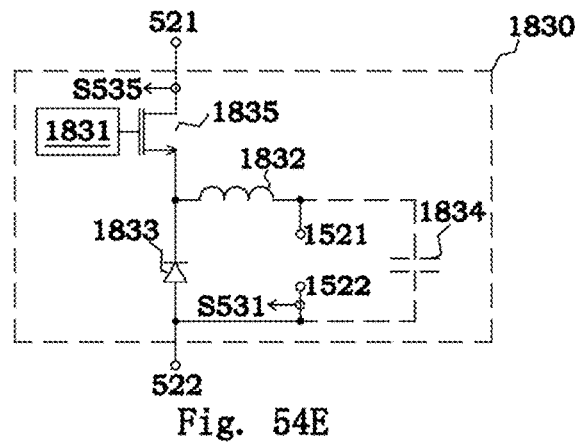
FIG. 54E is a schematic diagram of a driving circuit according to some embodiments of the present invention.

FIG. 54E is a schematic diagram of the driving circuit according to an embodiment of the present invention. Referring to FIG. 54E, a driving circuit 1830 in this embodiment comprises a buck DC-to-DC converter circuit having a controller 1831 and a converter circuit. The converter circuit includes an inductor 1832, a diode 1833 for "freewheeling" of current, a capacitor 1834, and a switch 1835. Driving circuit 1830 is coupled to filtering output terminals 521 and 522 to receive and then convert a filtered signal into a driving signal for driving an LED module connected between driving output terminals 1521 and 1522.

Switch 1835 has a first terminal coupled to filtering output terminal 521, a second terminal coupled to the cathode of freewheeling diode 1833, and a control terminal coupled to controller 1831 to receive a control signal from controller 1831 for controlling current conduction or cutoff between the first and second terminals of switch 1835. The anode of freewheeling diode 1833 is connected to filtering output terminal 522 and driving output terminal 1522. Inductor 1832 has an end connected to the second terminal of switch 1835, and another end connected to driving output terminal 1521. Capacitor 1834 is coupled between driving output terminals 1521 and 1522, to stabilize the voltage between driving output terminals 1521 and 1522.

Controller 1831 is configured for controlling when to turn switch 1835 on (in a conducting state) or off (in a cutoff state), according to a current detection signal S535 and/or a current detection signal S531. When switch 1835 is switched on, a current of a filtered signal is input through filtering output terminal 521, and then flows through switch 1835, inductor 1832, and driving output terminals 1521 and 1522, and then flows out from filtering output terminal 522. During this flowing of current, the current through inductor 1832 and the voltage of capacitor 1834 both increase with time, so inductor 1832 and capacitor 1834 are in a state of storing energy. On the other hand, when switch 1835 is switched off, inductor 1832 is in a state of releasing energy and thus the current through it decreases with time. In this case, the current through inductor 1832 circulates through driving output terminals 1521 and 1522, freewheeling diode 1833, and back to inductor 1832.

It's worth noting that capacitor 1834 is an optional element, so it can be omitted and is thus depicted in a dotted line in FIG. 54E. When capacitor 1834 is omitted, no matter whether switch 1835 is turned on or off, the current through inductor 1832 will flow through driving output terminals 1521 and 1522 to drive the LED module to continue emitting light.

Figure 54F:
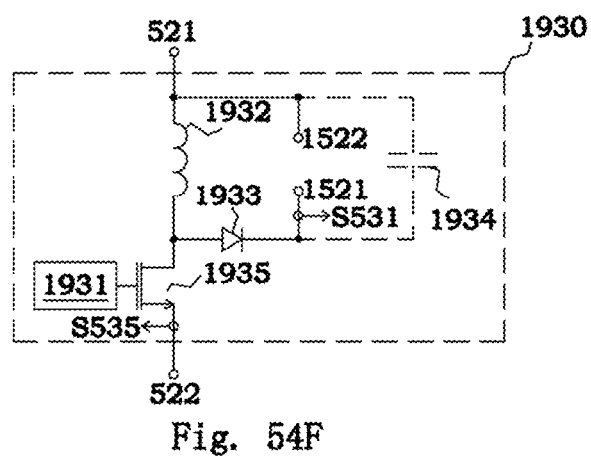
FIG. 54F is a schematic diagram of a driving circuit according to some embodiments of the present invention.

FIG. 54F is a schematic diagram of the driving circuit according to an embodiment of the present invention. Referring to FIG. 54F, a driving circuit 1930 in this embodiment comprises a buck DC-to-DC converter circuit having a controller 1931 and a converter circuit. The converter circuit includes an inductor 1932, a diode 1933 for "freewheeling" of current, a capacitor 1934, and a switch 1935. Driving circuit 1930 is coupled to filtering output terminals 521 and 522 to receive and then convert a filtered signal into a driving signal for driving an LED module connected between driving output terminals 1521 and 1522.

Inductor 1932 has an end connected to filtering output terminal 521 and driving output terminal 1522, and another end connected to a first end of switch 1935. Switch 1935 has a second end connected to filtering output terminal 522, and a control terminal connected to controller 1931 to receive a control signal from controller 1931 for controlling current conduction or cutoff of switch 1935. Freewheeling diode 1933 has an anode coupled to a node connecting inductor 1932 and switch 1935, and a cathode coupled to driving output terminal 1521. Capacitor 1934 is coupled to driving output terminals 1521 and 1522, to stabilize the driving of the LED module coupled between driving output terminals 1521 and 1522.

Controller 1931 is configured for controlling when to turn switch 1935 on (in a conducting state) or off (in a cutoff state), according to a current detection signal S531 and/or a current detection signal S535. When switch 1935 is turned on, a current is input through filtering output terminal 521, and then flows through inductor 1932 and switch 1935, and then flows out from filtering output terminal 522. During this flowing of current, the current through inductor 1932 increases with time, so inductor 1932 is in a state of storing energy; but the voltage of capacitor 1934 decreases with time, so capacitor 1934 is in a state of releasing energy to keep the LED module continuing to emit light. On the other hand, when switch 1935 is turned off, inductor 1932 is in a state of releasing energy and its current decreases with time. In this case, the current through inductor 1932 circulates through freewheeling diode 1933, driving output terminals 1521 and 1522, and back to inductor 1932. During this circulation, capacitor 1934 is in a state of storing energy and its voltage increases with time.

It's worth noting that capacitor 1934 is an optional element, so it can be omitted and is thus depicted in a dotted line in FIG. 54F. When capacitor 1934 is omitted and switch 1935 is turned on, the current through inductor 1932 doesn't flow through driving output terminals 1521 and 1522, thereby making the LED module not emit light. On the other hand, when switch 1935 is turned off, the current through inductor 1932 flows through freewheeling diode 1933 and then the LED module to make the LED module emit light. Therefore, by controlling the time that the LED module emits light, and the magnitude of current through the LED module, the average luminance of the LED module can be stabilized to be above a defined value, thus also achieving the effect of emitting a steady light.

Figure 54G:
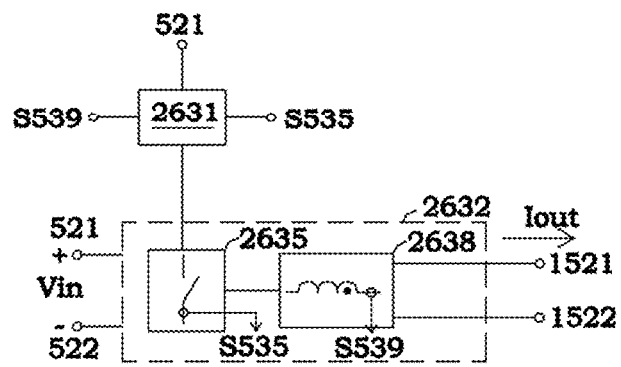
FIG. 54G is a block diagram of a driving circuit according to some embodiments of the present invention.

FIG. 54G is a block diagram of the driving circuit according to an embodiment of the present invention. Referring to FIG. 54G, the driving circuit includes a controller 2631, and a conversion circuit 2632 for power conversion based on an adjustable current source, for driving the LED module to emit light. Conversion circuit 2632 includes a switching circuit 2635 and an energy storage circuit 2638. And conversion circuit 2632 is coupled to filtering output terminals 521 and 522 to receive and then convert a filtered signal, under the control by controller 2631, into a driving signal at driving output terminals 1521 and 1522 for driving the LED module. Controller 2631 is configured to receive a current detection signal S535 and/or a current detection signal S539, for controlling or stabilizing the driving signal output by conversion circuit 2632 to be above an objective current value. Current detection signal S535 represents the magnitude of current through switching circuit 2635. Current detection signal S539 represents the magnitude of current through energy storage circuit 2638, which current may be e.g. an inductor current in energy storage circuit 2638 or a current output at driving output terminal 1521. Any of current detection signal S535 and current detection signal S539 can represent the magnitude of current Iout provided by the driving circuit from driving output terminals 1521 and 1522 to the LED module. Controller 2631 is coupled to filtering output terminal 521 for setting the objective current value according to the voltage Vin at filtering output terminal 521. Therefore, the current Iout provided by the driving circuit or the objective current value can be adjusted corresponding to the magnitude of the voltage Vin of a filtered signal output by a filtering circuit.

It's worth noting that current detection signals S535 and S539 can be generated by measuring current through a resistor or induced by an inductor. For example, a current can be measured according to a voltage drop across a resistor in conversion circuit 2632 the current flows through, or which arises from a mutual induction between an inductor in conversion circuit 2632 and another inductor in its energy storage circuit 2638.

The above driving circuit structures are especially suitable for an application environment in which the external driving circuit for the LED tube lamp includes electronic ballast. An electronic ballast is equivalent to a current source whose output power is not constant. In an internal driving circuit as shown in each of FIGS. 54C-54F, power consumed by the internal driving circuit relates to or depends on the number of LEDs in the LED module, and could be regarded as constant. When the output power of the electronic ballast is higher than power consumed by the LED module driven by the driving circuit, the output voltage of the ballast will increase continually, causing the level of an AC driving signal received by the power supply module of the LED lamp to continually increase, so as to risk damaging the ballast and/or components of the power supply module due to their voltage ratings being exceeded. On the other hand, when the output power of the electronic ballast is lower than power consumed by the LED module driven by the driving circuit, the output voltage of the ballast and the level of the AC driving signal will decrease continually so that the LED tube lamp fail to normally operate.

It's worth noting that the power needed for an LED lamp to work is already lower than that needed for a fluorescent lamp to work. If a conventional control mechanism of e.g. using a backlight module to control the LED luminance is used with a conventional driving system of e.g. a ballast, a problem will probably arise of mismatch or incompatibility between the output power of the external driving system and the power needed by the LED lamp. This problem may even cause damaging of the driving system and/or the LED lamp. To prevent this problem, using e.g. the power/current adjustment method described above in FIG. 54G enables the LED (tube) lamp to be better compatible with traditional fluorescent lighting system.

Figure 54H:
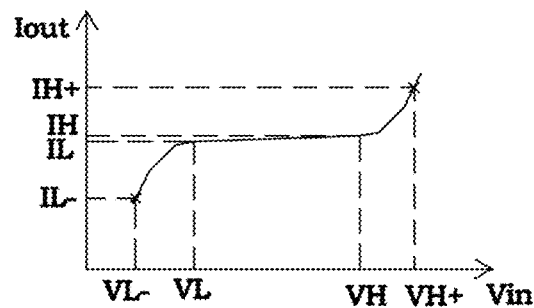
FIG. 54H is a graph illustrating the relationship between the voltage Vin and the objective current Iout according to certain embodiments of the present invention.

FIG. 54H is a graph illustrating the relationship between the voltage Vin and the objective current value Iout according to an embodiment of the present invention. In FIG. 54H, the variable Vin is on the horizontal axis, and the variable Iout is on the vertical axis. In some cases, when the level of the voltage Vin of a filtered signal is between the upper voltage limit VH and the lower voltage limit VL, the objective current value Iout will be about an initial objective current value. The upper voltage limit VH is higher than the lower voltage limit VL. When the voltage Vin increases to be higher than the upper voltage limit VH, the objective current value Iout will increase with the increasing of the voltage Vin. During this stage, a situation that may be preferable is that the slope of the relationship curve increase with the increasing of the voltage Vin. When the voltage Vin of a filtered signal decreases to be below the lower voltage limit VL, the objective current value Iout will decrease with the decreasing of the voltage Vin. During this stage, a situation that may be preferable is that the slope of the relationship curve decrease with the decreasing of the voltage Vin. For example, during the stage when the voltage Vin is higher than the upper voltage limit VH or lower than the lower voltage limit VL, the objective current value Iout is in some embodiments a function of the voltage Vin to the power of 2 or above, in order to make the rate of increase/ decrease of the consumed power higher than the rate of increase/decrease of the output power of the external driving system. Thus, adjustment of the objective current value Iout is in some embodiments a function of the filtered voltage Vin to the power of 2 or above.

In another case, when the voltage Vin of a filtered signal is between the upper voltage limit VH and the lower voltage limit VL, the objective current value Iout of the LED lamp will vary, increase or decrease, linearly with the voltage Vin. During this stage, when the voltage Vin is at the upper voltage limit VH, the objective current value Iout will be at the upper current limit IH. When the voltage Vin is at the lower voltage limit VL, the objective current value Iout will be at the lower current limit IL. The upper current limit IH is larger than the lower current limit IL. And when the voltage Vin is between the upper voltage limit VH and the lower voltage limit VL, the objective current value Iout will be a function of the voltage Vin to the power of 1.

With the designed relationship in FIG. 54H, when the output power of the ballast is higher than the power consumed by the LED module driven by the driving circuit, the voltage Vin will increase with time to exceed the upper voltage limit VH. When the voltage Vin is higher than the upper voltage limit VH, the rate of increase of the consumed power of the LED module is higher than that of the output power of the electronic ballast, and the output power and the consumed power will be balanced or equal when the voltage Vin is at a high balance voltage value VH+ and the current Iout is at a high balance current value IH+. In this case, the high balance voltage value VH+ is larger than the upper voltage limit VH, and the high balance current value IH+ is larger than the upper current limit IH. On the other hand, when the output power of the ballast is lower than the power consumed by the LED module driven by the driving circuit, the voltage Vin will decrease to be below the lower voltage limit VL. When the voltage Vin is lower than the lower voltage limit VL, the rate of decrease of the consumed power of the LED module is higher than that of the output power of the electronic ballast, and the output power and the consumed power will be balanced or equal when the voltage Vin is at a low balance voltage value VL− and the objective current value Iout is at a low balance current value IL−. In this case, the low balance voltage value VL− is smaller than the lower voltage limit VL, and the low balance current value IL− is smaller than the lower current limit IL.

In some embodiments, the lower voltage limit VL is defined to be around 90% of the lowest output power of the electronic ballast, and the upper voltage limit VH is defined to be around 110% of its highest output power. Taking a common AC powerline with a voltage range of 100-277 volts and a frequency of 60 Hz as an example, the lower voltage limit VL may be set at 90 volts (=100*90%), and the upper voltage limit VH may be set at 305 volts (=277*110%).

With reference to FIGS. 35 and 36, a short circuit board 253 includes a first short circuit substrate and a second short circuit substrate respectively connected to two terminal portions of a long circuit sheet 251, and electronic components of the power supply module are respectively disposed on the first short circuit substrate and the second short circuit substrate. The first short circuit substrate and the second short circuit substrate may have roughly the same length, or different lengths. In general, the first short circuit substrate (i.e. the right circuit substrate of short circuit board 253 in FIG. 35 and the left circuit substrate of short circuit board 253 in FIG. 36) has a length that is about 30%-80% of the length of the second short circuit substrate (i.e. the left circuit substrate of short circuit board 253 in FIG. 35 and the right circuit substrate of short circuit board 253 in FIG. 36). In some embodiments the length of the first short circuit substrate is about ⅓~⅔ of the length of the second short circuit substrate. For example, in one embodiment, the length of the first short circuit substrate may be about half the length of the second short circuit substrate. The length of the second short circuit substrate may be, for example in the range of about 15 mm to about 65 mm, depending on actual application occasions. In certain embodiments, the first short circuit substrate is disposed in an end cap at an end of the LED tube lamp, and the second short circuit substrate is disposed in another end cap at the opposite end of the LED tube lamp.

For example, capacitors of the driving circuit, such as capacitors 1634, 1734, 1834, and 1934 in FIGS. 54C-54F, in practical use may include two or more capacitors connected in parallel. Some or all capacitors of the driving circuit in the power supply module may be arranged on the first short circuit substrate of short circuit board 253, while other components such as the rectifying circuit, filtering circuit, inductor(s) of the driving circuit, controller(s), switch(es), diodes, etc. are arranged on the second short circuit substrate of short circuit board 253. Since inductors, controllers, switches, etc. are electronic components with higher temperature, arranging some or all capacitors on a circuit substrate separate or away from the circuit substrate(s) of high-temperature components helps prevent the working life of capacitors (especially electrolytic capacitors) from being negatively affected by the high-temperature components, thus improving the reliability of the capacitors. Further, the physical separation between the capacitors and both the rectifying circuit and filtering circuit also contributes to reducing the problem of EMI.

In some embodiments, the driving circuit has power conversion efficiency of 80% or above, which may preferably be 90% or above, and may even more preferably be 92% or above. Therefore, without the driving circuit, luminous efficacy of the LED lamp according to some embodiments may preferably be 120 lm/W or above, and may even more preferably be 160 lm/W or above. On the other hand, with the driving circuit in combination with the LED component(s), luminous efficacy of the LED lamp in the invention may preferably be, in some embodiments, 120 lm/W*90%=108 lm/W or above, and may even more preferably be, in some embodiments 160 lm/W*92%=147.2 lm/W or above.

In view of the fact that the diffusion film or layer in an LED tube lamp has light transmittance of 85% or above, luminous efficacy of the LED tube lamp of the invention is in some embodiments 108 lm/W*85%=91.8 lm/W or above, and may be, in some more effective embodiments, 147.2 lm/W*85%=125.12 lm/W.

Figure 55A:
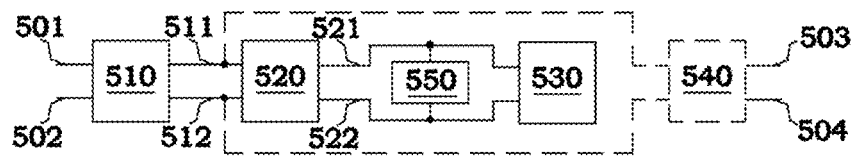
FIG. 55A is a block diagram of an exemplary power supply module in an LED lamp according to some embodiments of the present invention.

FIG. 55A is a block diagram of using a power supply module in an LED lamp according to an embodiment of the present invention. Compared to FIG. 54A, the embodiment of FIG. 55A includes rectifying circuits 510 and 540, a filtering circuit 520, and an LED driving module 530, and further includes an anti-flickering circuit 550 coupled between filtering circuit 520 and LED driving module 530. It's noted that rectifying circuit 540 may be omitted and is thus depicted in a dotted line in FIG. 55A.

Anti-flickering circuit 550 is coupled to filtering output terminals 521 and 522, to receive a filtered signal, and under specific circumstances to consume partial energy of the filtered signal so as to reduce (the incidence of) ripples of the filtered signal disrupting or interrupting the light emission of the LED driving module 530. In general, filtering circuit 520 has such filtering components as resistor(s) and/or inductor(s), and/or parasitic capacitors and inductors, which may form resonant circuits. Upon breakoff or stop of an AC power signal, as when the power supply of the LED lamp is turned off by a user, the amplitude(s) of resonant signals in the resonant circuits will decrease with time. But LEDs in the LED module of the LED lamp are unidirectional conduction devices and require a minimum conduction voltage for the LED module. When a resonant signal's trough value is lower than the minimum conduction voltage of the LED module, but its peak value is still higher than the minimum conduction voltage, the flickering phenomenon will occur in light emission of the LED module. In this case anti-flickering circuit 550 works by allowing a current matching a defined flickering current value of the LED component to flow through, consuming partial energy of the filtered signal which should be higher than the energy difference of the resonant signal between its peak and trough values, so as to reduce the flickering phenomenon. In certain embodiments, a preferred occasion for anti-flickering circuit 550 to work is when the filtered signal's voltage approaches (and is still higher than) the minimum conduction voltage.

It's worth noting that anti-flickering circuit 550 may be more suitable for the situation in which LED driving module 530 doesn't include driving circuit 1530, for example, when LED module 630 of LED driving module 530 is (directly) driven to emit light by a filtered signal from a filtering circuit. In this case, the light emission of LED module 630 will directly reflect variation in the filtered signal due to its ripples. In this situation, the introduction of anti-flickering circuit 550 will prevent the flickering phenomenon from occurring in the LED lamp upon the breakoff of power supply to the LED lamp.

Figure 55B:
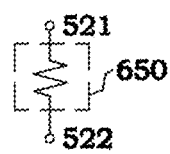
FIG. 55B is a schematic diagram of an anti-flickering circuit according to some embodiments of the present invention.

FIG. 55B is a schematic diagram of the anti-flickering circuit according to an embodiment of the present invention. Referring to FIG. 55B, anti-flickering circuit 650 includes at least a resistor, such as two resistors connected in series between filtering output terminals 521 and 522. In this embodiment, anti-flickering circuit 650 in use consumes partial energy of a filtered signal continually. When in normal operation of the LED lamp, this partial energy is far lower than the energy consumed by LED driving module 530. But upon a breakoff or stop of the power supply, when the voltage level of the filtered signal decreases to approach the minimum conduction voltage of LED module 630, this partial energy is still consumed by anti-flickering circuit 650 in order to offset the impact of the resonant signals which may cause the flickering of light emission of LED module 630. In some embodiments, a current equal to or larger than an anti-flickering current level may be set to flow through anti-flickering circuit 650 when LED module 630 is supplied by the minimum conduction voltage, and then an equivalent anti-flickering resistance of anti-flickering circuit 650 can be determined based on the set current.

Figure 56A:
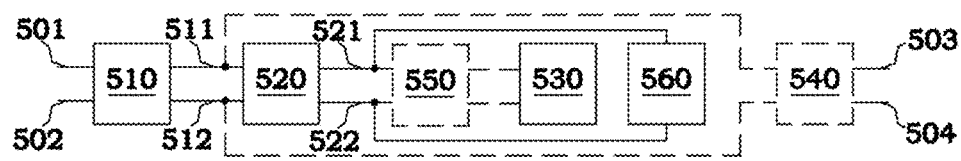
FIG. 56A is a block diagram of an exemplary power supply module in an LED lamp according to some embodiments of the present invention.

FIG. 56A is a block diagram of using a power supply module in an LED lamp according to an embodiment of the present invention. Compared to FIG. 55A, the embodiment of FIG. 56A includes rectifying circuits 510 and 540, a filtering circuit 520, an LED driving module 530, and an anti-flickering circuit 550, and further includes a protection circuit 560. Protection circuit 560 is coupled to filtering output terminals 521 and 522, to detect the filtered signal from filtering circuit 520 for determining whether to enter a protection state. Upon entering a protection state, protection circuit 560 works to limit, restrain, or clamp down on the level of the filtered signal, preventing damaging of components in LED driving module 530. And rectifying circuit 540 and anti-flickering circuit 550 may be omitted and are thus depicted in a dotted line in FIG. 56A.

Figure 56B:
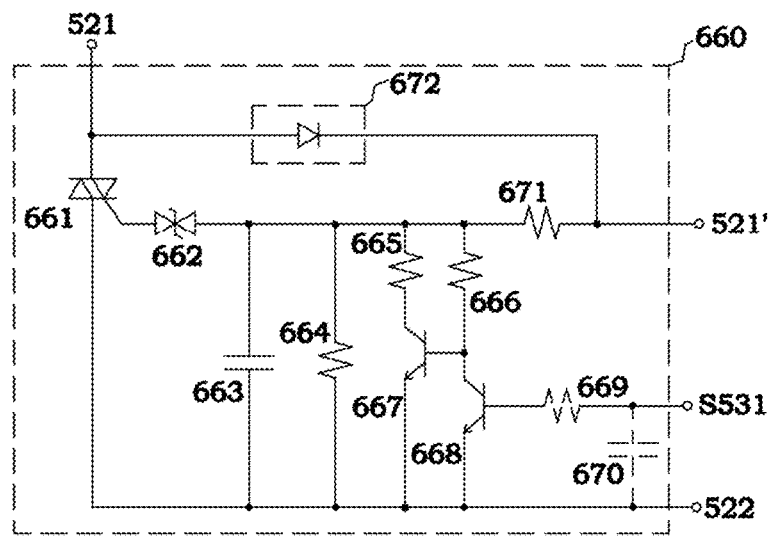
FIG. 56B is a schematic diagram of a protection circuit according to some embodiments of the present invention.

FIG. 56B is a schematic diagram of the protection circuit according to an embodiment of the present invention. Referring to FIG. 56B, a protection circuit 660 includes a voltage clamping circuit, a voltage division circuit, capacitors 663 and 670, resistor 669, and a diode 672, for entering a protection state when a current and/or voltage of the LED module is/are or might be excessively high, thus preventing damaging of the LED module. The voltage clamping circuit includes a bidirectional triode thyristor (TRIAC) 661 and a DIAC or symmetrical trigger diode 662. The voltage division circuit includes bipolar junction transistors (BJT) 667 and 668 and resistors 664, 665, 666, and 671.

Bidirectional triode thyristor 661 has a first terminal connected to filtering output terminal 521, a second terminal connected to filtering output terminal 522, and a control terminal connected to a first terminal of symmetrical trigger diode 662, which has a second terminal connected to an end of capacitor 663, which has another end connected to filtering output terminal 522. Resistor 664 is in parallel to capacitor 663, and has an end connected to the second terminal of symmetrical trigger diode 662 and another end connected to filtering output terminal 522. Resistor 665 has an end connected to the second terminal of symmetrical trigger diode 662 and another end connected to the collector terminal of BJT 667, whose emitter terminal is connected to filtering output terminal 522. Resistor 666 has an end connected to the second terminal of symmetrical trigger diode 662 and another end connected to the collector terminal of BJT 668 and the base terminal of BJT 667. The emitter terminal of BJT 668 is connected to filtering output terminal 522. Resistor 669 has an end connected to the base terminal of BJT 668 and another end connected to an end of capacitor 670, which has another end connected to filtering output terminal 522. Resistor 671 has an end connected to the second terminal of symmetrical trigger diode 662 and another end connected to the cathode of diode 672, whose anode is connected to filtering output terminal 521.

It's worth noting that according to some embodiments, the resistance of resistor 665 should be smaller than that of resistor 666.

Next, an exemplary operation of protection circuit 660 in overcurrent protection is described as follows.

The node connecting resistor 669 and capacitor 670 is to receive a current detection signal S531, which represents the magnitude of current through the LED module. The other end of resistor 671 is a voltage terminal 521'. In this embodiment concerning overcurrent protection, voltage terminal 521' may be coupled to a biasing voltage source, or be connected through diode 672 to filtering output terminal 521, as shown in FIG. 56B, to take a filtered signal as a biasing voltage source. If voltage terminal 521' is coupled to an external biasing voltage source, diode 672 may be omitted, so it is depicted in a dotted line in FIG. 56B. The combination of resistor 669 and capacitor 670 can work to filter out high frequency components of the current detection signal S531, and then input the filtered current detection signal S531 to the base terminal of BJT 668 for controlling current conduction and cutoff of BJT 668. The filtering function of resistor 669 and capacitor 670 can prevent misoperation of BJT 668 due to noises. In practical use, resistor 669 and capacitor 670 may be omitted, so they are each depicted in a dotted line in FIG. 56B. When they are omitted, current detection signal S531 is input directly to the base terminal of BJT 668.

When the LED lamp is operating normally and the current of the LED module is within a normal range, BJT 668 is in a cutoff state, and resistor 66 works to pull up the base voltage of BJT 667, which therefore enters a conducting state. In this state, the electric potential at the second terminal of symmetrical trigger diode 662 is determined based on the voltage at voltage terminal 521' of the biasing voltage source and voltage division ratios between resistor 671 and parallel-connected resistors 664 and 665. Since the resistance of resistor 665 is relatively small, voltage share for resistor 665 is smaller and the electric potential at the second terminal of symmetrical trigger diode 662 is therefore pulled down. Then, the electric potential at the control terminal of bidirectional triode thyristor 661 is in turn pulled down by symmetrical trigger diode 662, causing bidirectional triode thyristor 661 to enter a cutoff state, which cutoff state makes protection circuit 660 not being in a protection state.

When the current of the LED module exceeds an overcurrent value, the level of current detection signal S531 will increase significantly to cause BJT 668 to enter a conducting state and then pull down the base voltage of BJT 667, which thereby enters a cutoff state. In this case, the electric potential at the second terminal of symmetrical trigger diode 662 is determined based on the voltage at voltage terminal 521' of the biasing voltage source and voltage division ratios between resistor 671 and parallel-connected resistors 664 and 666. Since the resistance of resistor 666 is relatively high, voltage share for resistor 666 is larger and the electric potential at the second terminal of symmetrical trigger diode 662 is therefore higher. Then the electric potential at the control terminal of bidirectional triode thyristor 661 is in turn pulled up by symmetrical trigger diode 662, causing bidirectional triode thyristor 661 to enter a conducting state, which conducting state works to restrain or clamp down on the voltage between filtering output terminals 521 and 522 and thus makes protection circuit 660 being in a protection state.

In this embodiment, the voltage at voltage terminal 521' of the biasing voltage source is determined based on the trigger voltage of bidirectional triode thyristor 661, and voltage division ratio between resistor 671 and parallel-connected resistors 664 and 665, or voltage division ratio between resistor 671 and parallel-connected resistors 664 and 666. Through voltage division between resistor 671 and parallel-connected resistors 664 and 665, the voltage from voltage terminal 521' at symmetrical trigger diode 662 will be lower than the trigger voltage of bidirectional triode thyristor 661. Otherwise, through voltage division between resistor 671 and parallel-connected resistors 664 and 666, the voltage from voltage terminal 521' at symmetrical trigger diode 662 will be higher than the trigger voltage of bidirectional triode thyristor 661. For example, in some embodiments, when the current of the LED module exceeds an overcurrent value, the voltage division circuit is adjusted to the voltage division ratio between resistor 671 and parallel-connected resistors 664 and 666, causing a higher portion of the voltage at voltage terminal 521' to result at symmetrical trigger diode 662, achieving a hysteresis function. Specifically, BJTs 667 and 668 as switches are respectively connected in series to resistors 665 and 666 which determine the voltage division ratios. The voltage division circuit is configured to control turning on which one of BJTs 667 and 668 and leaving the other off for determining the relevant voltage division ratio, according to whether the current of the LED module exceeds an overcurrent value. And the clamping circuit determines whether to restrain or clamp down on the voltage of the LED module according to the applying voltage division ratio.

Next, an exemplary operation of protection circuit 660 in overvoltage protection is described as follows.

The node connecting resistor 669 and capacitor 670 is to receive a current detection signal S531, which represents the magnitude of current through the LED module. As described above, protection circuit 660 still works to provide overcurrent protection. The other end of resistor 671 is a voltage terminal 521'. In this embodiment concerning overvoltage protection, voltage terminal 521' is coupled to the positive terminal of the LED module to detect the voltage of the LED module. Taking previously described embodiments for example, in embodiments of FIGS. 53A and 53B, LED driving module 530 doesn't include driving circuit 1530, and the voltage terminal 521' would be coupled to filtering output terminal 521. Whereas in embodiments of FIGS. 54A-54G, LED driving module 530 includes driving circuit 1530, and the voltage terminal 521' would be coupled to driving output terminal 1521. In this embodiment, voltage division ratios between resistor 671 and parallel-connected resistors 664 and 665, and voltage division ratios between resistor 671 and parallel-connected resistors 664 and 666 will be adjusted according to the voltage at voltage terminal 521', for example, the voltage at driving output terminal 1521 or filtering output terminal 521. Therefore, normal overcurrent protection can still be provided by protection circuit 660.

In some embodiments, when the LED lamp is operating normally, assuming overcurrent condition doesn't occur, the electric potential at the second terminal of symmetrical trigger diode 662 is determined based on the voltage at voltage terminal 521' and voltage division ratios between resistor 671 and parallel-connected resistors 664 and 665, and is insufficient to trigger bidirectional triode thyristor 661. Then bidirectional triode thyristor 661 is in a cutoff state, making protection circuit 660 not being in a protection state. On the other hand, when the LED module is operating abnormally with the voltage at the positive terminal of the LED module exceeding an overvoltage value, the electric potential at the second terminal of symmetrical trigger diode 662 is sufficiently high to trigger bidirectional triode thyristor 661 when the voltage at the first terminal of symmetrical trigger diode 662 is larger than the trigger voltage of bidirectional triode thyristor 661. Then bidirectional triode thyristor 661 enters a conducting state, making protection circuit 660 being in a protection state to restrain or clamp down on the level of the filtered signal.

As described above, protection circuit 660 provides one or two of the functions of overcurrent protection and overvoltage protection.

In some embodiments, protection circuit 660 may further include a zener diode connected to resistor 664 in parallel, which zener diode is used to limit or restrain the voltage across resistor 664. The breakdown voltage of the zener diode is in some embodiments in the range of about 25~50 volts, and is may preferably be about 36 volts.

Further, a silicon controlled rectifier may be substituted for bidirectional triode thyristor 661, without negatively affecting the protection functions. Using a silicon controlled rectifier instead of a bidirectional triode thyristor 661 has a lower voltage drop across itself in conduction than that across bidirectional triode thyristor 661 in conduction.

In one embodiment, values of the parameters of protection circuit 660 may be set as follows. Resistance of resistor 669 may be about 10 ohms. Capacitance of capacitor 670 may be about 1 nF. Capacitance of capacitor 633 may be about 10 nF. The (breakover) voltage of symmetrical trigger diode 662 may be in the range of about 26~36 volts. Resistance of resistor 671 may be in the range of about 300 k~600 k ohms, and may preferably be, in some embodiments, about 540 k ohms. Resistance of resistor 666 is in some embodiments in the range of about 100 k~300 k ohms, and may preferably be, in some embodiments, about 220 k ohms. Resistance of resistor 665 is in some embodiments in the range of about 30 k~100 k ohms, and may preferably be, in some embodiments about 40 k ohms. Resistance of resistor 664 is in some embodiments in the range of about 100 k~300 k ohms, and may preferably be, in some embodiments about 220 k ohms.

Figure 57A:
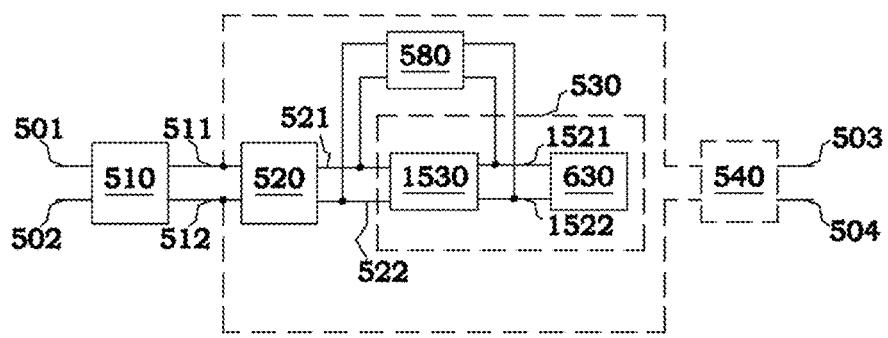
FIG. 57A is a block diagram of an exemplary power supply module in an LED lamp according to some embodiments of the present invention.

FIG. 57A is a block diagram of a power supply module in an LED lamp according to an embodiment of the present invention. Compared to FIG. 54A, the embodiment of FIG. 57A includes rectifying circuits 510 and 540, a filtering circuit 520, and an LED driving module 530 including a driving circuit 1530 and an LED module 630, and further includes a mode switching circuit 580. Mode switching circuit 580 is coupled to at least one of filtering output terminals 521 and 522 and at least one of driving output terminals 1521 and 1522, for determining whether to perform a first driving mode or a second driving mode, as according to a frequency of the external driving signal. In the first driving mode, a filtered signal from filtering circuit 520 is input into driving circuit 1530, while in the second driving mode the filtered signal bypasses at least a component of driving circuit 1530, making driving circuit 1530 stop working in conducting the filtered signal, allowing the filtered signal to (directly) reach and drive LED module 630. The bypassed component(s) of driving circuit 1530 may include an inductor or a switch, which when bypassed makes driving circuit 1530 unable to transfer and/or convert power, and then stop working in conducting the filtered signal. If driving circuit 1530 includes a capacitor, the capacitor can still be used to filter out ripples of the filtered signal in order to stabilize the voltage across the LED module. When mode switching circuit 580 determines on performing the first driving mode, allowing the filtered signal to be input to driving circuit 1530, driving circuit 1530 then transforms the filtered signal into a driving signal for driving LED module 630 to emit light. On the other hand, when mode switching circuit 580 determines on performing the second driving mode, allowing the filtered signal to bypass driving circuit 1530 to reach LED module 630, filtering circuit 520 becomes in effect a driving circuit for LED module 630. Then filtering circuit 520 provides the filtered signal as a driving signal for the LED module for driving the LED module to emit light.

It's worth noting that mode switching circuit 580 can determine whether to perform the first driving mode or the second driving mode based on a user's instruction or a detected signal received by the LED lamp through pins 501, 502, 503, and 504. With the mode switching circuit, the power supply module of the LED lamp can adapt to or perform one of appropriate driving modes corresponding to different application environments or driving systems, thus improving the compatibility of the LED lamp. In some embodiments, rectifying circuit 540 may be omitted, and is thus depicted in a dotted line in FIG. 57A.

Figure 57B:
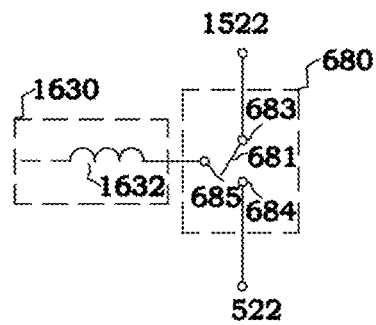
FIG. 57B is a schematic diagram of a mode switching circuit in an LED lamp according to some embodiments of the present invention.

FIG. 57B is a schematic diagram of the mode switching circuit in an LED lamp according to an embodiment of the present invention. Referring to FIG. 57B, a mode switching circuit 680 includes a mode switch 681 suitable for use with the driving circuit 1630 in FIG. 54C. Referring to FIGS. 57B and 54C, mode switch 681 has three terminals 683, 684, and 685, wherein terminal 683 is coupled to driving output terminal 1522, terminal 684 is coupled to filtering output terminal 522, and terminal 685 is coupled to the inductor 1632 in driving circuit 1630.

When mode switching circuit 680 determines on performing a first driving mode, mode switch 681 conducts current in a first conductive path through terminals 683 and 685 and a second conductive path through terminals 683 and 684 is in a cutoff state. In this case, driving output terminal 1522 is coupled to inductor 1632, and therefore driving circuit 1630 is working normally, which working includes receiving a filtered signal from filtering output terminals 521 and 522 and then transforming the filtered signal into a driving signal, output at driving output terminals 1521 and 1522 for driving the LED module.

When mode switching circuit 680 determines on performing a second driving mode, mode switch 681 conducts current in the second conductive path through terminals 683 and 684 and the first conductive path through terminals 683 and 685 is in a cutoff state. In this case, driving output terminal 1522 is coupled to filtering output terminal 522, and therefore driving circuit 1630 stops working, and a filtered signal is input through filtering output terminals 521 and 522 to driving output terminals 1521 and 1522 for driving the LED module, while bypassing inductor 1632 and switch 1635 in driving circuit 1630.

Figure 57C:
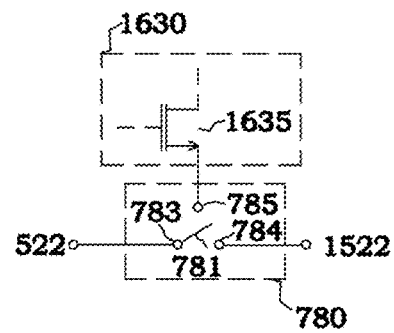
FIG. 57C is a schematic diagram of a mode switching circuit in an LED lamp according to some embodiments of the present invention.

FIG. 57C is a schematic diagram of the mode switching circuit in an LED lamp according to an embodiment of the present invention. Referring to FIG. 57C, a mode switching circuit 780 includes a mode switch 781 suitable for use with the driving circuit 1630 in FIG. 54C. Referring to FIGS. 57C and 54C, mode switch 781 has three terminals 783, 784, and 785, wherein terminal 783 is coupled to filtering output terminal 522, terminal 784 is coupled to driving output terminal 1522, and terminal 785 is coupled to switch 1635 in driving circuit 1630.

When mode switching circuit 780 determines on performing a first driving mode, mode switch 781 conducts current in a first conductive path through terminals 783 and 785 and a second conductive path through terminals 783 and 784 is in a cutoff state. In this case, filtering output terminal 522 is coupled to switch 1635, and therefore driving circuit 1630 is working normally, which working includes receiving a filtered signal from filtering output terminals 521 and 522 and then transforming the filtered signal into a driving signal, output at driving output terminals 1521 and 1522 for driving the LED module.

When mode switching circuit 780 determines on performing a second driving mode, mode switch 781 conducts current in the second conductive path through terminals 783 and 784 and the first conductive path through terminals 783 and 785 is in a cutoff state. In this case, driving output terminal 1522 is coupled to filtering output terminal 522, and therefore driving circuit 1630 stops working, and a filtered signal is input through filtering output terminals 521 and 522 to driving output terminals 1521 and 1522 for driving the LED module, while bypassing inductor 1632 and switch 1635 in driving circuit 1630.

Figure 57D:
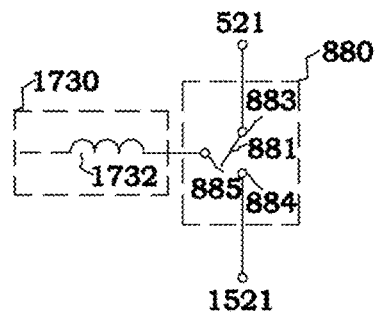
FIG. 57D is a schematic diagram of a mode switching circuit in an LED lamp according to some embodiments of the present invention.

FIG. 57D is a schematic diagram of the mode switching circuit in an LED lamp according to an embodiment of the present invention. Referring to FIG. 57D, a mode switching circuit 880 includes a mode switch 881 suitable for use with the driving circuit 1730 in FIG. 54D. Referring to FIGS. 57D and 54D, mode switch 881 has three terminals 883, 884, and 885, wherein terminal 883 is coupled to filtering output terminal 521, terminal 884 is coupled to driving output terminal 1521, and terminal 885 is coupled to inductor 1732 in driving circuit 1730.

When mode switching circuit 880 determines on performing a first driving mode, mode switch 881 conducts current in a first conductive path through terminals 883 and 885 and a second conductive path through terminals 883 and 884 is in a cutoff state. In this case, filtering output terminal 521 is coupled to inductor 1732, and therefore driving circuit 1730 is working normally, which working includes receiving a filtered signal from filtering output terminals 521 and 522 and then transforming the filtered signal into a driving signal, output at driving output terminals 1521 and 1522 for driving the LED module.

When mode switching circuit 880 determines on performing a second driving mode, mode switch 881 conducts current in the second conductive path through terminals 883 and 884 and the first conductive path through terminals 883 and 885 is in a cutoff state. In this case, driving output terminal 1521 is coupled to filtering output terminal 521, and therefore driving circuit 1730 stops working, and a filtered signal is input through filtering output terminals 521 and 522 to driving output terminals 1521 and 1522 for driving the LED module, while bypassing inductor 1732 and freewheeling diode 1733 in driving circuit 1730.

Figure 57E:
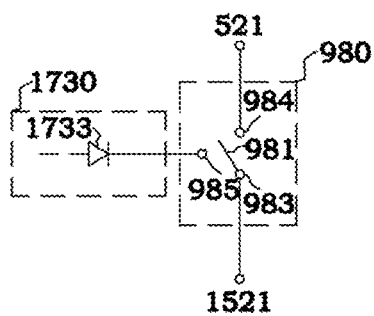
FIG. 57E is a schematic diagram of a mode switching circuit in an LED lamp according to some embodiments of the present invention.

FIG. 57E is a schematic diagram of the mode switching circuit in an LED lamp according to an embodiment of the present invention. Referring to FIG. 57E, a mode switching circuit 980 includes a mode switch 981 suitable for use with the driving circuit 1730 in FIG. 54D. Referring to FIGS. 57E and 54D, mode switch 981 has three terminals 983, 984, and 985, wherein terminal 983 is coupled to driving output terminal 1521, terminal 984 is coupled to filtering output terminal 521, and terminal 985 is coupled to the cathode of diode 1733 in driving circuit 1730.

When mode switching circuit 980 determines on performing a first driving mode, mode switch 981 conducts current in a first conductive path through terminals 983 and 985 and a second conductive path through terminals 983 and 984 is in a cutoff state. In this case, filtering output terminal 521 is coupled to the cathode of diode 1733, and therefore driving circuit 1730 is working normally, which working includes receiving a filtered signal from filtering output terminals 521 and 522 and then transforming the filtered signal into a driving signal, output at driving output terminals 1521 and 1522 for driving the LED module.

When mode switching circuit 980 determines on performing a second driving mode, mode switch 981 conducts current in the second conductive path through terminals 983 and 984 and the first conductive path through terminals 983 and 985 is in a cutoff state. In this case, driving output terminal 1521 is coupled to filtering output terminal 521, and therefore driving circuit 1730 stops working, and a filtered signal is input through filtering output terminals 521 and 522 to driving output terminals 1521 and 1522 for driving the LED module, while bypassing inductor 1732 and freewheeling diode 1733 in driving circuit 1730.

Figure 57F:
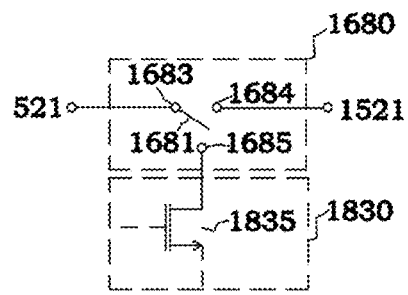
FIG. 57F is a schematic diagram of a mode switching circuit in an LED lamp according to some embodiments of the present invention.

FIG. 57F is a schematic diagram of the mode switching circuit in an LED lamp according to an embodiment of the present invention. Referring to FIG. 57F, a mode switching circuit 1680 includes a mode switch 1681 suitable for use with the driving circuit 1830 in FIG. 54E. Referring to FIGS. 57F and 54E, mode switch 1681 has three terminals 1683, 1684, and 1685, wherein terminal 1683 is coupled to filtering output terminal 521, terminal 1684 is coupled to driving output terminal 1521, and terminal 1685 is coupled to switch 1835 in driving circuit 1830.

When mode switching circuit 1680 determines on performing a first driving mode, mode switch 1681 conducts current in a first conductive path through terminals 1683 and 1685 and a second conductive path through terminals 1683 and 1684 is in a cutoff state. In this case, filtering output terminal 521 is coupled to switch 1835, and therefore driving circuit 1830 is working normally, which working includes receiving a filtered signal from filtering output terminals 521 and 522 and then transforming the filtered signal into a driving signal, output at driving output terminals 1521 and 1522 for driving the LED module.

When mode switching circuit 1680 determines on performing a second driving mode, mode switch 1681 conducts current in the second conductive path through terminals 1683 and 1684 and the first conductive path through terminals 1683 and 1685 is in a cutoff state. In this case, driving output terminal 1521 is coupled to filtering output terminal 521, and therefore driving circuit 1830 stops working, and a filtered signal is input through filtering output terminals 521 and 522 to driving output terminals 1521 and 1522 for driving the LED module, while bypassing inductor 1832 and switch 1835 in driving circuit 1830.

Figure 57G:
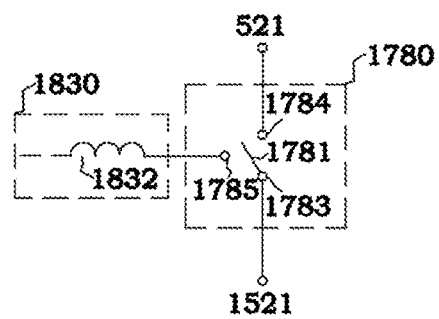
FIG. 57G is a schematic diagram of a mode switching circuit in an LED lamp according to some embodiments of the present invention.

FIG. 57G is a schematic diagram of the mode switching circuit in an LED lamp according to an embodiment of the present invention. Referring to FIG. 57G, a mode switching circuit 1780 includes a mode switch 1781 suitable for use with the driving circuit 1830 in FIG. 54E. Referring to FIGS. 57G and 54E, mode switch 1781 has three terminals 1783, 1784, and 1785, wherein terminal 1783 is coupled to filtering output terminal 521, terminal 1784 is coupled to driving output terminal 1521, and terminal 1785 is coupled to inductor 1832 in driving circuit 1830.

When mode switching circuit 1780 determines on performing a first driving mode, mode switch 1781 conducts current in a first conductive path through terminals 1783 and 1785 and a second conductive path through terminals 1783 and 1784 is in a cutoff state. In this case, filtering output terminal 521 is coupled to inductor 1832, and therefore driving circuit 1830 is working normally, which working includes receiving a filtered signal from filtering output terminals 521 and 522 and then transforming the filtered signal into a driving signal, output at driving output terminals 1521 and 1522 for driving the LED module.

When mode switching circuit 1780 determines on performing a second driving mode, mode switch 1781 conducts current in the second conductive path through terminals 1783 and 1784 and the first conductive path through terminals 1783 and 1785 is in a cutoff state. In this case, driving output terminal 1521 is coupled to filtering output terminal 521, and therefore driving circuit 1830 stops working, and a filtered signal is input through filtering output terminals 521 and 522 to driving output terminals 1521 and 1522 for driving the LED module, while bypassing inductor 1832 and switch 1835 in driving circuit 1830.

Figure 57H:
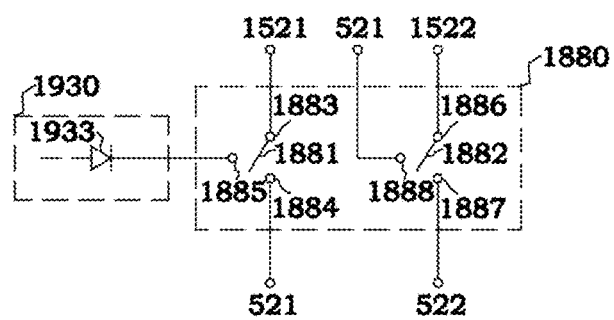
FIG. 57H is a schematic diagram of a mode switching circuit in an LED lamp according to some embodiments of the present invention.

FIG. 57H is a schematic diagram of the mode switching circuit in an LED lamp according to an embodiment of the present invention. Referring to FIG. 57H, a mode switching circuit 1880 includes mode switches 1881 and 1882 suitable for use with the driving circuit 1930 in FIG. 54F. Referring to FIGS. 57H and 54F, mode switch 1881 has three terminals 1883, 1884, and 1885, wherein terminal 1883 is coupled to driving output terminal 1521, terminal 1884 is coupled to filtering output terminal 521, and terminal 1885 is coupled to freewheeling diode 1933 in driving circuit 1930. And mode switch 1882 has three terminals 1886, 1887, and 1888, wherein terminal 1886 is coupled to driving output terminal 1522, terminal 1887 is coupled to filtering output terminal 522, and terminal 1888 is coupled to filtering output terminal 521.

When mode switching circuit 1880 determines on performing a first driving mode, mode switch 1881 conducts current in a first conductive path through terminals 1883 and 1885 and a second conductive path through terminals 1883 and 1884 is in a cutoff state, and mode switch 1882 conducts current in a third conductive path through terminals 1886 and 1888 and a fourth conductive path through terminals 1886 and 1887 is in a cutoff state. In this case, driving output terminal 1521 is coupled to freewheeling diode 1933, and filtering output terminal 521 is coupled to driving output terminal 1522. Therefore driving circuit 1930 is working normally, which working includes receiving a filtered signal from filtering output terminals 521 and 522 and then transforming the filtered signal into a driving signal, output at driving output terminals 1521 and 1522 for driving the LED module.

When mode switching circuit 1880 determines on performing a second driving mode, mode switch 1881 conducts current in the second conductive path through terminals 1883 and 1884 and the first conductive path through terminals 1883 and 1885 is in a cutoff state, and mode switch 1882 conducts current in the fourth conductive path through terminals 1886 and 1887 and the third conductive path through terminals 1886 and 1888 is in a cutoff state. In this case, driving output terminal 1521 is coupled to filtering output terminal 521, and filtering output terminal 522 is coupled to driving output terminal 1522. Therefore driving circuit 1930 stops working, and a filtered signal is input through filtering output terminals 521 and 522 to driving output terminals 1521 and 1522 for driving the LED module, while bypassing freewheeling diode 1933 and switch 1935 in driving circuit 1930.

Figure 57I:
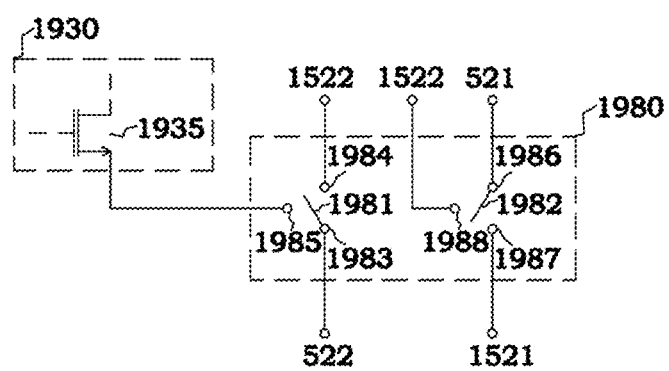
FIG. 57I is a schematic diagram of a mode switching circuit in an LED lamp according to some embodiment of the present invention.

FIG. 57I is a schematic diagram of the mode switching circuit in an LED lamp according to an embodiment of the present invention. Referring to FIG. 57I, a mode switching circuit 1980 includes mode switches 1981 and 1982 suitable for use with the driving circuit 1930 in FIG. 54F. Referring to FIGS. 57I and 54F, mode switch 1981 has three terminals 1983, 1984, and 1985, wherein terminal 1983 is coupled to filtering output terminal 522, terminal 1984 is coupled to driving output terminal 1522, and terminal 1985 is coupled to switch 1935 in driving circuit 1930. And mode switch 1982 has three terminals 1986, 1987, and 1988, wherein terminal 1986 is coupled to filtering output terminal 521, terminal 1987 is coupled to driving output terminal 1521, and terminal 1988 is coupled to driving output terminal 1522.

When mode switching circuit 1980 determines on performing a first driving mode, mode switch 1981 conducts current in a first conductive path through terminals 1983 and 1985 and a second conductive path through terminals 1983 and 1984 is in a cutoff state, and mode switch 1982 conducts current in a third conductive path through terminals 1986 and 1988 and a fourth conductive path through terminals 1986 and 1987 is in a cutoff state. In this case, driving output terminal 1522 is coupled to filtering output terminal 521, and filtering output terminal 522 is coupled to switch 1935. Therefore driving circuit 1930 is working normally, which working includes receiving a filtered signal from filtering output terminals 521 and 522 and then transforming the filtered signal into a driving signal, output at driving output terminals 1521 and 1522 for driving the LED module.

When mode switching circuit 1980 determines on performing a second driving mode, mode switch 1981 conducts current in the second conductive path through terminals 1983 and 1984 and the first conductive path through terminals 1983 and 1985 is in a cutoff state, and mode switch 1982 conducts current in the fourth conductive path through terminals 1986 and 1987 and the third conductive path through terminals 1986 and 1988 is in a cutoff state. In this case, driving output terminal 1521 is coupled to filtering output terminal 521, and filtering output terminal 522 is coupled to driving output terminal 1522. Therefore driving circuit 1930 stops working, and a filtered signal is input through filtering output terminals 521 and 522 to driving output terminals 1521 and 1522 for driving the LED module, while bypassing freewheeling diode 1933 and switch 1935 in driving circuit 1930.

It's worth noting that the mode switches in the above embodiments may each comprise, for example, a single-pole double-throw switch, or comprise two semiconductor switches (such as metal oxide semiconductor transistors), for switching a conductive path on to conduct current while leaving the other conductive path cutoff. Each of the two conductive paths provides a path for conducting the filtered signal, allowing the current of the filtered signal to flow through one of the two paths, thereby achieving the function of mode switching or selection. For example, with reference to FIGS. 49A, 49B, and 49D in addition, when the lamp driving circuit 505 is not present and the LED tube lamp 500 is directly supplied by the AC power supply 508, the mode switching circuit may determine on performing a first driving mode in which the driving circuit (such as driving circuit 1530, 1630, 1730, 1830, or 1930) transforms the filtered signal into a driving signal of a level meeting a required level to properly drive the LED module to emit light. On the other hand, when the lamp driving circuit 505 is present, the mode switching circuit may determine on performing a second driving mode in which the filtered signal is (almost) directly used to drive the LED module to emit light; or alternatively the mode switching circuit may determine on performing the first driving mode to drive the LED module to emit light.

Figure 58A:
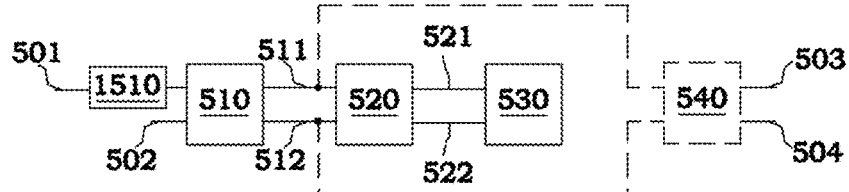
FIG. 58A is a block diagram of an exemplary power supply module in an LED lamp according to some embodiments of the present invention.

FIG. 58A is a block diagram of a power supply module in an LED lamp according to an embodiment of the present invention. Compared to FIG. 49E, the embodiment of FIG. 58A includes rectifying circuits 510 and 540, a filtering circuit 520, and an LED driving module 530, and further includes a ballast-compatible circuit 1510. The ballast-compatible circuit 1510 may be coupled between pin 501 and/or pin 502 and rectifying circuit 510. This embodiment is explained assuming the ballast-compatible circuit 1510 to be coupled between pin 501 and rectifying circuit 510. With reference to FIGS. 49A, 49B, and 49D in addition to FIG. 58A, lamp driving circuit 505 comprises a ballast configured to provide an AC driving signal to drive the LED lamp in this embodiment.

In an initial stage upon the activation of the driving system of lamp driving circuit 505, lamp driving circuit 505's ability to output relevant signal(s) has not risen to a standard state. However, in the initial stage the power supply module of the LED lamp instantly or rapidly receives or conducts the AC driving signal provided by lamp driving circuit 505, which initial conduction is likely to fail the starting of the LED lamp by lamp driving circuit 505 as lamp driving circuit 505 is initially loaded by the LED lamp in this stage. For example, internal components of lamp driving circuit 505 may need to retrieve power from a transformed output in lamp driving circuit 505, in order to maintain their operation upon the activation. In this case, the activation of lamp driving circuit 505 may end up failing as its output voltage could not normally rise to a required level in this initial stage; or the quality factor (Q) of a resonant circuit in lamp driving circuit 505 may vary as a result of the initial loading from the LED lamp, so as to cause the failure of the activation.

In this embodiment, in the initial stage upon activation, ballast-compatible circuit 1510 will be in an open-circuit state, preventing the energy of the AC driving signal from reaching the LED module. After a defined delay upon the AC driving signal as an external driving signal being input to the LED tube lamp, ballast-compatible circuit 1510 switches from a cutoff state during the delay to a conducting state, allowing the energy of the AC driving signal to start to reach the LED module. By means of the delayed conduction of ballast-compatible circuit 1510, operation of the LED lamp simulates the lamp-starting characteristics of a fluorescent lamp, that is, internal gases of the fluorescent lamp will normally discharge for light emission after a delay upon activation of a driving power supply. Therefore, ballast-compatible circuit 1510 further improves the compatibility of the LED lamp with lamp driving circuits 505 such as an electronic ballast.

In this embodiment, rectifying circuit 540 may be omitted and is therefore depicted by a dotted line in FIG. 58A.

Figure 58B:
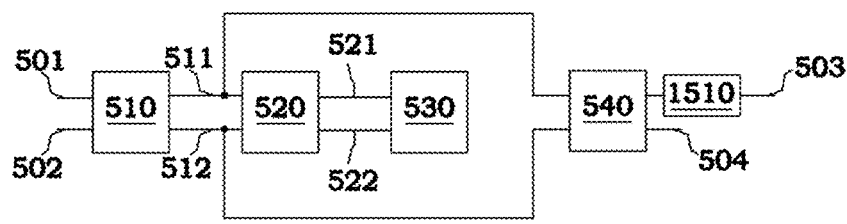
FIG. 58B is a block diagram of an exemplary power supply module in an LED lamp according to some embodiments of the present invention.

FIG. 58B is a block diagram of a power supply module in an LED lamp according to an embodiment of the present invention. Compared to FIG. 58A, ballast-compatible circuit 1510 in the embodiment of FIG. 58B is coupled between pin 503 and/or pin 504 and rectifying circuit 540. As explained regarding ballast-compatible circuit 1510 in FIG. 58A, ballast-compatible circuit 1510 in FIG. 58B performs the function of delaying the starting of the LED lamp, or causing the input of the AC driving signal to be delayed for a predefined time, in order to prevent the failure of starting by lamp driving circuits 505 such as an electronic ballast.

Figure 58C:
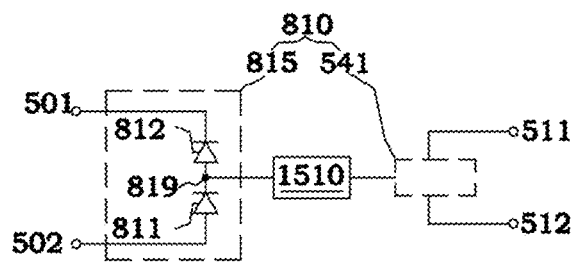
FIG. 58C illustrates an arrangement with a ballast-compatible circuit in an LED lamp according to some embodiments of the present invention.

Apart from coupling ballast-compatible circuit 1510 between terminal pin(s) and rectifying circuit in the above embodiments, ballast-compatible circuit 1510 may alternatively be included within a rectifying circuit with a different structure. FIG. 58C illustrates an arrangement with a ballast-compatible circuit in an LED lamp according to a preferred embodiment of the present invention. Referring to FIG. 58C, the rectifying circuit assumes the circuit structure of rectifying circuit 810 in FIG. 50C. Rectifying circuit 810 includes rectifying unit 815 and terminal adapter circuit 541. Rectifying unit 815 is coupled to pins 501 and 502, terminal adapter circuit 541 is coupled to filtering output terminals 511 and 512, and the ballast-compatible circuit 1510 in FIG. 58C is coupled between rectifying unit 815 and terminal adapter circuit 541. In this case, in the initial stage upon activation of the ballast, an AC driving signal as an external driving signal is input to the LED tube lamp, where the AC driving signal can only reach rectifying unit 815, but cannot reach other circuits such as terminal adapter circuit 541, other internal filter circuitry, and the LED driving module. Moreover, parasitic capacitors associated with rectifying diodes 811 and 812 within rectifying unit 815 are quite small in capacitance and thus can be ignored. Accordingly, lamp driving circuit 505 in the initial stage isn't loaded with or effectively connected to the equivalent capacitor or inductor of the power supply module of the LED lamp, and the quality factor (Q) of lamp driving circuit 505 is therefore not adversely affected in this stage, resulting in a successful starting of the LED lamp by lamp driving circuit 505.

It's worth noting that under the condition that terminal adapter circuit 541 doesn't include components such as capacitors or inductors, interchanging rectifying unit 815 and terminal adapter circuit 541 in position, meaning rectifying unit 815 is connected to filtering output terminals 511 and 512 and terminal adapter circuit 541 is connected to pins 501 and 502, doesn't affect or alter the function of ballast-compatible circuit 1510.

Further, as explained in FIGS. 50A~50D, when a rectifying circuit is connected to pins 503 and 504 instead of pins 501 and 502, this rectifying circuit may constitute the rectifying circuit 540. That is, the circuit arrangement with a ballast-compatible circuit 1510 in FIG. 58C may be alternatively included in rectifying circuit 540 instead of rectifying circuit 810, without affecting the function of ballast-compatible circuit 1510.

In some embodiments, as described above terminal adapter circuit 541 doesn't include components such as capacitors or inductors. Or when rectifying circuit 610 in FIG. 50A constitutes the rectifying circuit 510 or 540, parasitic capacitances in the rectifying circuit 510 or 540 are quite small and thus can be ignored. These conditions contribute to not affecting the quality factor of lamp driving circuit 505.

Figure 58D:
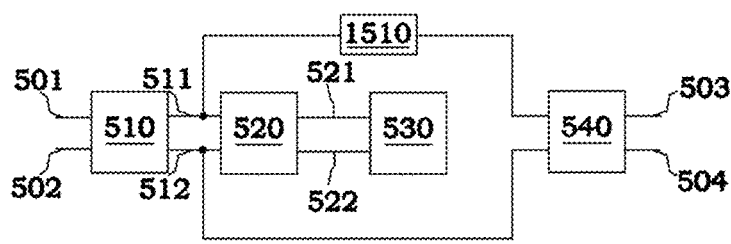
FIG. 58D is a block diagram of an exemplary power supply module in an LED lamp according to some embodiments of the present invention.

FIG. 58D is a block diagram of a power supply module in an LED lamp according to an embodiment of the present invention. Compared to the embodiment of FIG. 58A, ballast-compatible circuit 1510 in the embodiment of FIG. 58D is coupled between rectifying circuit 540 and filtering circuit 520. Since rectifying circuit 540 also doesn't include components such as capacitors or inductors, the function of ballast-compatible circuit 1510 in the embodiment of FIG. 58D will not be affected.

Figure 58E:
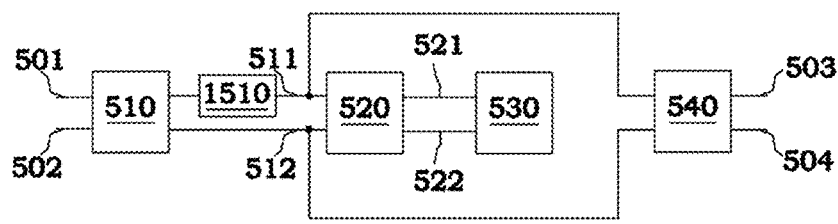
FIG. 58E is a block diagram of an exemplary power supply module in an LED lamp according to some embodiments of the present invention.

FIG. 58E is a block diagram of a power supply module in an LED lamp according to an embodiment of the present invention. Compared to the embodiment of FIG. 58A, ballast-compatible circuit 1510 in the embodiment of FIG. 58E is coupled between rectifying circuit 510 and filtering circuit 520. Similarly, since rectifying circuit 510 doesn't include components such as capacitors or inductors, the function of ballast-compatible circuit 1510 in the embodiment of FIG. 58E will not be affected.

Figure 58F:
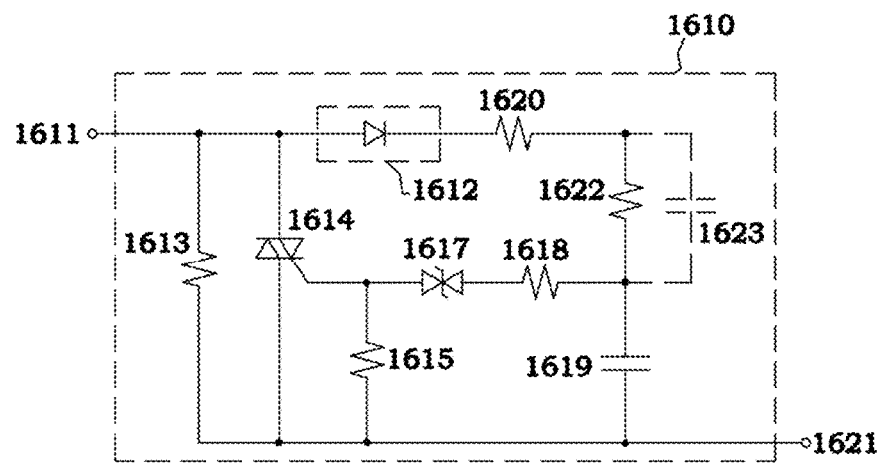
FIG. 58F is a schematic diagram of a ballast-compatible circuit according to some embodiments of the present invention.

FIG. 58F is a schematic diagram of the ballast-compatible circuit according to an embodiment of the present invention. Referring to FIG. 58F, a ballast-compatible circuit 1610 has an initial state in which an equivalent open-circuit is obtained at ballast-compatible circuit input and output terminals 1611 and 1621. Upon receiving an input signal at ballast-compatible circuit input terminal 1611, a delay will pass until a current conduction occurs through and between ballast-compatible circuit input and output terminals 1611 and 1621, transmitting the input signal to ballast-compatible circuit output terminal 1621.

Ballast-compatible circuit 1610 includes a diode 1612, resistors 1613, 1615, 1618, 1620, and 1622, a bidirectional triode thyristor (TRIAC) 1614, a DIAC or symmetrical trigger diode 1617, a capacitor 1619, and ballast-compatible circuit input and output terminals 1611 and 1621. It's noted that the resistance of resistor 1613 should be quite large so that when bidirectional triode thyristor 1614 is cutoff in an open-circuit state, an equivalent open-circuit is obtained at ballast-compatible circuit input and output terminals 1611 and 1621.

Bidirectional triode thyristor 1614 is coupled between ballast-compatible circuit input and output terminals 1611 and 1621, and resistor 1613 is also coupled between ballast-compatible circuit input and output terminals 1611 and 1621 and in parallel to bidirectional triode thyristor 1614. Diode 1612, resistors 1620 and 1622, and capacitor 1619 are series-connected in sequence between ballast-compatible circuit input and output terminals 1611 and 1621, and are connected in parallel to bidirectional triode thyristor 1614. Diode 1612 has an anode connected to bidirectional triode thyristor 1614, and has a cathode connected to an end of resistor 1620. Bidirectional triode thyristor 1614 has a control terminal connected to a terminal of symmetrical trigger diode 1617, which has another terminal connected to an end of resistor 1618, which has another end connected to a node connecting capacitor 1619 and resistor 1622. Resistor 1615 is connected between the control terminal of bidirectional triode thyristor 1614 and a node connecting resistor 1613 and capacitor 1619.

When an AC driving signal (such as a high-frequency high-voltage AC signal output by an electronic ballast) is initially input to ballast-compatible circuit input terminal 1611, bidirectional triode thyristor 1614 will be in an open-circuit state, not allowing the AC driving signal to pass through and the LED lamp is therefore also in an open-circuit state. In this state, the AC driving signal is charging capacitor 1619 through diode 1612 and resistors 1620 and 1622, gradually increasing the voltage of capacitor 1619. Upon continually charging for a period of time, the voltage of capacitor 1619 increases to be above the trigger voltage value of symmetrical trigger diode 1617 so that symmetrical trigger diode 1617 is turned on in a conducting state. Then the conducting symmetrical trigger diode 1617 will in turn trigger bidirectional triode thyristor 1614 on in a conducting state. In this situation, the conducting bidirectional triode thyristor 1614 electrically connects ballast-compatible circuit input and output terminals 1611 and 1621, allowing the AC driving signal to flow through ballast-compatible circuit input and output terminals 1611 and 1621, thus starting the operation of the power supply module of the LED lamp. In this case the energy stored by capacitor 1619 will maintain the conducting state of bidirectional triode thyristor 1614, to prevent the AC variation of the AC driving signal from causing bidirectional triode thyristor 1614 and therefore ballast-compatible circuit 1610 to be cutoff again, or to prevent the problem of bidirectional triode thyristor 1614 alternating or switching between its conducting and cutoff states.

In general, in hundreds of milliseconds upon activation of a lamp driving circuit 505 such as an electronic ballast, the output voltage of the ballast has risen above a certain voltage value as the output voltage hasn't been adversely affected by the sudden initial loading from the LED lamp. A detection mechanism to detect whether lighting of a fluorescent lamp is achieved may be disposed in lamp driving circuits 505 such as an electronic ballast. In this detection mechanism, if a fluorescent lamp fails to be lit up for a defined period of time, an abnormal state of the fluorescent lamp is detected, causing the fluorescent lamp to enter a protection state. In view of these facts, in certain embodiments, the delay provided by ballast-compatible circuit 1610 until conduction of ballast-compatible circuit 1610 and then the LED lamp should be and may preferably be in the range of about 0.1~3 seconds.

It's worth noting that an additional capacitor 1623 may be coupled in parallel to resistor 1622. Capacitor 1623 works to reflect or support instantaneous change in the voltage between ballast-compatible circuit input and output terminals 1611 and 1621, and will not affect the function of delayed conduction performed by ballast-compatible circuit 1610.

Figure 58G:
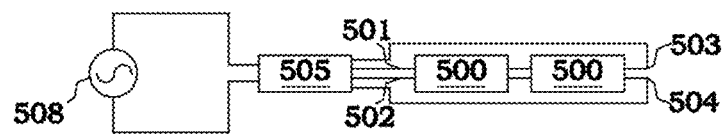
FIG. 58G is a block diagram of an exemplary power supply module in an LED lamp according to some embodiments of the present invention.

FIG. 58G is a block diagram of a power supply module in an LED lamp according to an embodiment of the present invention. Compared to the embodiment of FIG. 49D, lamp driving circuit 505 in the embodiment of FIG. 58G drives a plurality of LED tube lamps 500 connected in series, wherein a ballast-compatible circuit 1610 is disposed in each of the LED tube lamps 500. For the convenience of illustration, two series-connected LED tube lamps 500 are assumed for example and explained as follows.

Because the two ballast-compatible circuits 1610 respectively of the two LED tube lamps 500 can actually have different delays until conduction of the LED tube lamps 500, due to various factors such as errors occurring in production processes of some components, the actual timing of conduction of each of the ballast-compatible circuits 1610 is different. Upon activation of a lamp driving circuit 505, the voltage of the AC driving signal provided by lamp driving circuit 505 will be shared out by the two LED tube lamps 500 roughly equally. Subsequently when only one of the two LED tube lamps 500 first enters a conducting state, the voltage of the AC driving signal then will be borne mostly or entirely by the other LED tube lamp 500. This situation will cause the voltage across the ballast-compatible circuits 1610 in the other LED tube lamp 500 that's not conducting to suddenly increase or be doubled, meaning the voltage between ballast-compatible circuit input and output terminals 1611 and 1621 might even be suddenly doubled. In view of this, if capacitor 1623 is included, the voltage division effect between capacitors 1619 and 1623 will instantaneously increase the voltage of capacitor 1619, making symmetrical trigger diode 1617 triggering bidirectional triode thyristor 1614 into a conducting state, thus causing the two ballast-compatible circuits 1610 respectively of the two LED tube lamps 500 to become conducting almost at the same time. Therefore, by introducing capacitor 1623, the situation, where one of the two ballast-compatible circuits 1610 respectively of the two series-connected LED tube lamps 500 that is first conducting has its bidirectional triode thyristor 1614 then suddenly cutoff as having insufficient current passing through due to the discrepancy between the delays provided by the two ballast-compatible circuits 1610 until their respective conductions, can be avoided. Therefore, using each ballast-compatible circuit 1610 with capacitor 1623 further improves the compatibility of the series-connected LED tube lamps with each of lamp driving circuits 505 such as an electronic ballast.

In practical use, a suggested range of the capacitance of capacitor 1623 is about 10 pF to about 1 nF, which may preferably be in the range of about 10 pF to about 100 pF, and may be even more desirable at about 47 pF.

It's worth noting that diode 1612 is used or configured to rectify the signal for charging capacitor 1619. Therefore, with reference to FIGS. 58C, 58D, and 58E, in the case when ballast-compatible circuit 1610 is arranged following a rectifying unit or circuit, diode 1612 may be omitted. Thus diode 1612 is depicted in a dotted line in FIG. 58F.

Figure 58H:
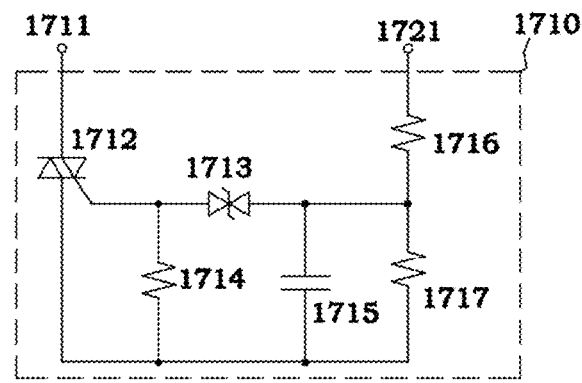
FIG. 58H is a schematic diagram of a ballast-compatible circuit according to some embodiments of the present invention.

FIG. 58H is a schematic diagram of the ballast-compatible circuit according to another embodiment of the present invention. Referring to FIG. 58H, a ballast-compatible circuit 1710 has an initial state in which an equivalent open-circuit is obtained at ballast-compatible circuit input and output terminals 1711 and 1721. Upon receiving an input signal at ballast-compatible circuit input terminal 1711, ballast-compatible circuit 1710 will be in a cutoff state when the level of the input external driving signal is below a defined value corresponding to a conduction delay of ballast-compatible circuit 1710; and ballast-compatible circuit 1710 will enter a conducting state upon the level of the input external driving signal reaching the defined value, thus transmitting the input signal to ballast-compatible circuit output terminal 1721.

Ballast-compatible circuit 1710 includes a bidirectional triode thyristor (TRIAC) 1712, a DIAC or symmetrical trigger diode 1713, resistors 1714, 1716, and 1717, and a capacitor 1715. Bidirectional triode thyristor 1712 has a first terminal connected to ballast-compatible circuit input terminal 1711; a control terminal connected to a terminal of symmetrical trigger diode 1713 and an end of resistor 1714; and a second terminal connected to another end of resistor 1714. Capacitor 1715 has an end connected to another terminal of symmetrical trigger diode 1713, and has another end connected to the second terminal of bidirectional triode thyristor 1712. Resistor 1717 is in parallel connection with capacitor 1715, and is therefore also connected to said another terminal of symmetrical trigger diode 1713 and the second terminal of bidirectional triode thyristor 1712. And resistor 1716 has an end connected to the node connecting capacitor 1715 and symmetrical trigger diode 1713, and has another end connected to ballast-compatible circuit output terminal 1721.

When an AC driving signal (such as a high-frequency high-voltage AC signal output by an electronic ballast) is initially input to ballast-compatible circuit input terminal 1711, bidirectional triode thyristor 1712 will be in an open-circuit state, not allowing the AC driving signal to pass through and the LED lamp is therefore also in an open-circuit state. The input of the AC driving signal causes a potential difference between ballast-compatible circuit input terminal 1711 and ballast-compatible circuit output terminal 1721. When the AC driving signal increases with time to eventually reach a sufficient amplitude (which is a defined level after the delay) after a period of time, the signal level at ballast-compatible circuit output terminal 1721 has a reflected voltage at the control terminal of bidirectional triode thyristor 1712 after passing through resistor 1716, parallel-connected capacitor 1715 and resistor 1717, and resistor 1714, wherein the reflected voltage then triggers bidirectional triode thyristor 1712 into a conducting state. This conducting state makes ballast-compatible circuit 1710 entering a conducting state which causes the LED lamp to operate normally. Upon bidirectional triode thyristor 1712 conducting, a current flows through resistor 1716 and then charges capacitor 1715 to store a specific voltage on capacitor 1715. In this case, the energy stored by capacitor 1715 will maintain the conducting state of bidirectional triode thyristor 1712, to prevent the AC variation of the AC driving signal from causing bidirectional triode thyristor 1712 and therefore ballast-compatible circuit 1710 to be cutoff again, or to prevent the situation of bidirectional triode thyristor 1712 alternating or switching between its conducting and cutoff states.

Figure 58I:
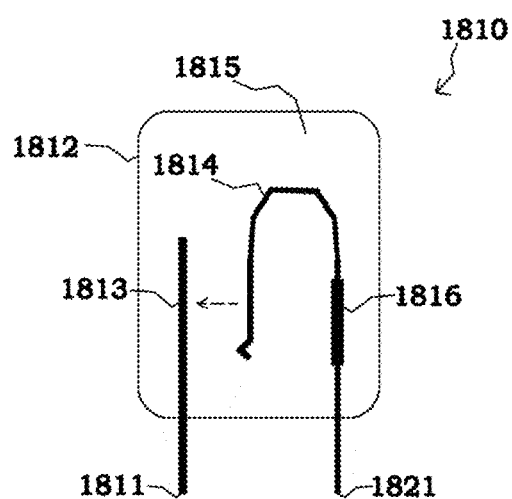
FIG. 58I illustrates a ballast-compatible circuit according to some embodiments of the present invention.

FIG. 58I illustrates the ballast-compatible circuit according to an embodiment of the present invention. Referring to FIG. 58I, a ballast-compatible circuit 1810 includes a housing 1812, a metallic electrode 1813, a bimetallic strip 1814, and a heating filament 1816. Metallic electrode 1813 and heating filament 1816 protrude from the housing 1812, so that they each have a portion inside the housing 1812 and a portion outside of the housing 1812. Metallic electrode 1813's outside portion has a ballast-compatible circuit input terminal 1811, and heating filament 1816's outside portion has a ballast-compatible circuit output terminal 1821. Housing 1812 is hermetic or tightly sealed and contains inertial gas 1815 such as helium gas. Bimetallic strip 1814 is inside housing 1812 and is physically and electrically connected to the portion of heating filament 1816 that is inside the housing 1812. And there is a spacing between bimetallic strip 1814 and metallic electrode 1813, so that ballast-compatible circuit input terminal 1811 and ballast-compatible circuit output terminal 1821 are not electrically connected in the initial state of ballast-compatible circuit 1810. Bimetallic strip 1814 may include two metallic strips with different temperature coefficients, wherein the metallic strip closer to metallic electrode 1813 has a smaller temperature coefficient, and the metallic strip more away from metallic electrode 1813 has a larger temperature coefficient.

When an AC driving signal (such as a high-frequency high-voltage AC signal output by an electronic ballast) is initially input at ballast-compatible circuit input terminal 1811 and ballast-compatible circuit output terminal 1821, a potential difference between metallic electrode 1813 and heating filament 1816 is formed. When the potential difference increases enough to cause electric arc or arc discharge through inertial gas 1815, meaning when the AC driving signal increases with time to eventually reach the defined level after a delay, then inertial gas 1815 is then heated to cause bimetallic strip 1814 to swell toward metallic electrode 1813 (as in the direction of the broken-line arrow in FIG. 58I), with this swelling eventually causing bimetallic strip 1814 to bear against metallic electrode 1813, forming the physical and electrical connections between them. In this situation, there is electrical conduction between ballast-compatible circuit input terminal 1811 and ballast-compatible circuit output terminal 1821. Then the AC driving signal flows through and thus heats heating filament 1816. In this heating process, heating filament 1816 allows a current to flow through when electrical conduction exists between metallic electrode 1813 and bimetallic strip 1814, causing the temperature of bimetallic strip 1814 to be above a defined conduction temperature. As a result, since the respective temperature of the two metallic strips of bimetallic strip 1814 with different temperature coefficients are maintained above the defined conduction temperature, bimetallic strip 1814 will bend against or toward metallic electrode 1813, thus maintaining or supporting the physical joining or connection between bimetallic strip 1814 and metallic electrode 1813.

Therefore, upon receiving an input signal at ballast-compatible circuit input and output terminals 1811 and 1821, a delay will pass until an electrical/current conduction occurs through and between ballast-compatible circuit input and output terminals 1811 and 1821.

Therefore, an exemplary ballast-compatible circuit such as described herein may be coupled between any pin and any rectifying circuit described above in the invention, wherein the ballast-compatible circuit will be in a cutoff state in a defined delay upon an external driving signal being input to the LED tube lamp, and will enter a conducting state after the delay. Otherwise, the ballast-compatible circuit will be in a cutoff state when the level of the input external driving signal is below a defined value corresponding to a conduction delay of the ballast-compatible circuit; and ballast-compatible circuit will enter a conducting state upon the level of the input external driving signal reaching the defined value. Accordingly, the compatibility of the LED tube lamp described herein with lamp driving circuits 505 such as an electronic ballast is further improved by using such a ballast-compatible circuit.

Figure 59A:
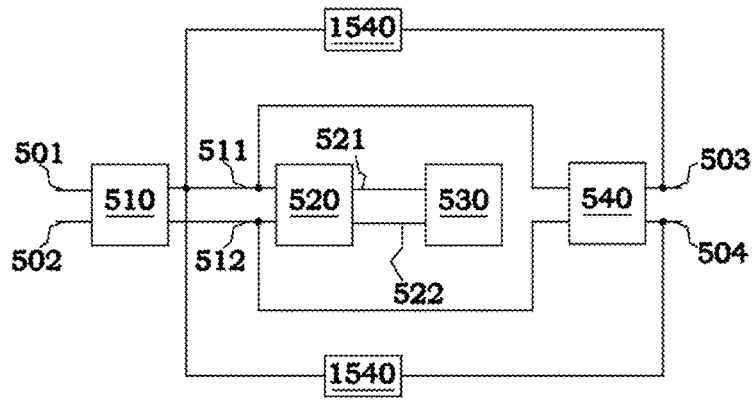
FIG. 59A is a block diagram of an exemplary power supply module in an LED tube lamp according to some embodiments of the present invention.

FIG. 59A is a block diagram of a power supply module in an LED tube lamp according to an embodiment of the present invention. Compared to that shown in FIG. 49E, the present embodiment comprises the rectifying circuits 510 and 540, the filtering circuit 520, and the LED driving module 530, and further comprises two ballast-compatible circuits 1540. The two ballast-compatible circuits 1540 are coupled respectively between the pin 503 and the rectifying output terminal 511 and between the pin 504 and the rectifying output terminal 511. Referring to FIG. 49A, FIG. 49B and FIG. 49D, the lamp driving circuit 505 is an electronic ballast for supplying an AC driving signal to drive the LED lamp of the present invention.

Two ballast-compatible circuits 1540 are initially in conducting states, and then enter into cutoff states in a delay. Therefore, in an initial stage upon activation of the lamp driving circuit 505, the AC driving signal is transmitted through the pin 503, the corresponding ballast-compatible circuit 1540, the rectifying output terminal 511 and the rectifying circuit 510, or through the pin 504, the corresponding ballast-compatible circuit 1540, the rectifying output terminal 511 and the rectifying circuit 510 of the LED lamp, and the filtering circuit 520 and LED driving module 530 of the LED lamp are bypassed. Thereby, the LED lamp presents almost no load and does not affect the quality factor of the lamp driving circuit 505 at the beginning, and so the lamp driving circuit can be activated successfully. The two ballast-compatible circuits 1540 are cut off after a time period while the lamp driving circuit 505 has been activated successfully. After that, the lamp driving circuit 505 has a sufficient drive capability for driving the LED lamp to emit light.

Figure 59B:
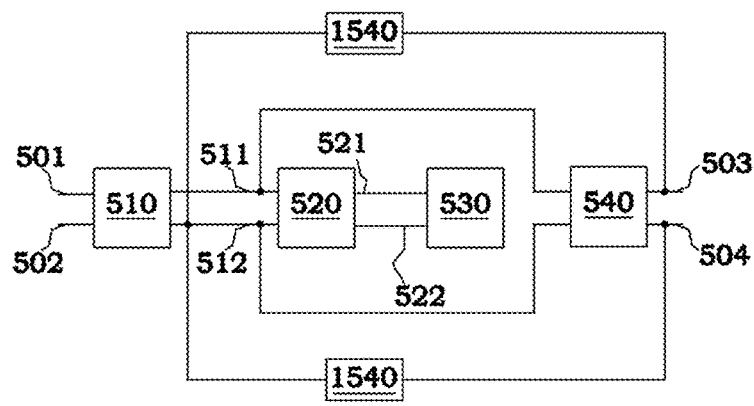
FIG. 59B is a block diagram of an exemplary power supply module in an LED tube lamp according to some embodiments of the present invention.

FIG. 59B is a block diagram of a power supply module in an LED tube lamp according to an embodiment of the present invention. Compared to that shown in FIG. 59A, the two ballast-compatible circuits 1540 are changed to be coupled respectively between the pin 503 and the rectifying output terminal 512 and between the pin 504 and the rectifying output terminal 512. Similarly, two ballast-compatible circuits 1540 are initially in conducting states, and then changed to cutoff states after an objective delay. Thereby, the lamp driving circuit 505 drives the LED lamp to emit light after the lamp driving circuit 505 has activated.

It is worth noting that the arrangement of the two ballast-compatible circuits 1540 may be changed to be coupled between the pin 501 and the rectifying terminal 511 and between the pin 501 and the rectifying terminal 511, or between the pin 501 and the rectifying terminal 512 and between the pin 501 and the rectifying terminal 512, for having the lamp driving circuit 505 drive the LED lamp to emit light after being activated.

Figure 59C:
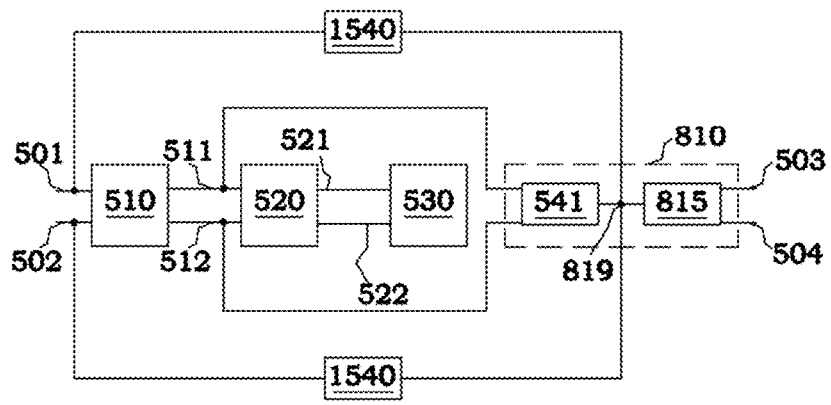
FIG. 59C is a block diagram of an exemplary power supply module in an LED tube lamp according to some embodiments of the present invention.

FIG. 59C is a block diagram of a power supply module in an LED tube lamp according to an embodiment of the present invention. Compared to that shown in FIGS. 59A and 59B, the rectifying circuit 810 shown in FIG. 50C replaces the rectifying circuit 540, and the rectifying unit 815 of the rectifying circuit 810 is coupled to the pins 503 and 504 and the terminal adapter circuit 541 thereof is coupled to the rectifying output terminals 511 and 512. The arrangement of the two ballast-compatible circuits 1540 is also changed to be coupled respectively between the pin 501 and the half-wave node 819 and between the pin 502 and the half-wave node 819.

In an initial stage upon activation of the lamp driving circuit 505, two ballast-compatible circuits 1540 are initially in conducting states. At this moment, the AC driving signal is transmitted through the pin 501, the corresponding ballast-compatible circuit 1540, the half-wave node 819 and the rectifying unit 815 or the pin 502, the corresponding ballast-compatible circuit 1540, the half-wave node 819 and the rectifying unit 815 of the LED lamp, and the terminal adapter circuit 541, the filtering circuit 520 and LED driving module 530 of the LED lamp are bypassed. Thereby, the LED lamp presents almost no load and does not affect the quality factor of the lamp driving circuit 505 at the beginning, and so the lamp driving circuit can be activated successfully. The two ballast-compatible circuits 1540 are cut off after a time period while the lamp driving circuit 505 has been activated successfully. After that, the lamp driving circuit 505 has a sufficient drive capability for driving the LED lamp to emit light.

It is worth noting that the rectifying circuit 810 shown in FIG. 50C may replace the rectifying circuit 510 of the present embodiment shown in FIG. 59C instead of the rectifying circuit 540. Wherein, the rectifying unit 815 of the rectifying circuit 810 is coupled to the pins 501 and 502 and the terminal adapter circuit 541 thereof is coupled to the rectifying output terminals 511 and 512. The arrangement of the two ballast-compatible circuits 1540 is also changed to be coupled respectively between the pin 503 and the half-wave node 819 and between the pin 504 and the half-wave node 819.

Figure 59D:
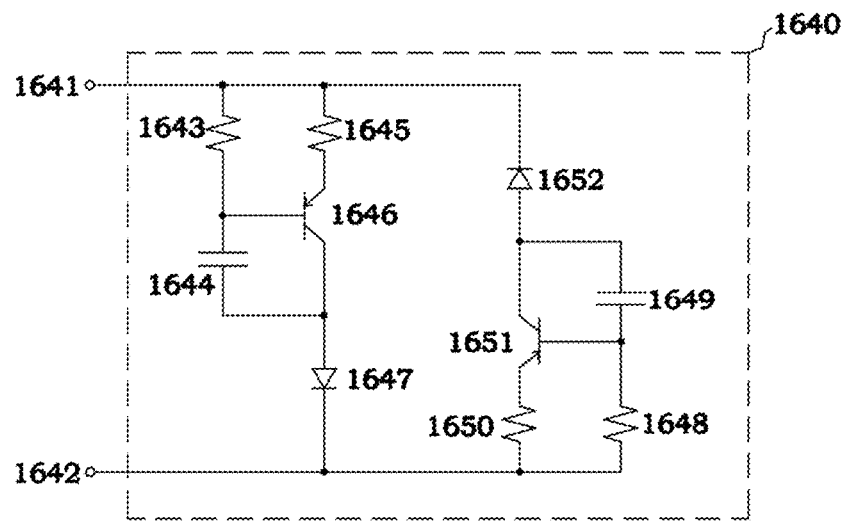
FIG. 59D is a schematic diagram of a ballast-compatible circuit according to some embodiments of the present invention, which is applicable to the embodiments shown in FIGS. 59A and 59B and the described modification thereof.

FIG. 59D is a schematic diagram of a ballast-compatible circuit according to an embodiment of the present invention, which is applicable to the embodiments shown in FIGS. 59A and 59B and the described modification thereof.

A ballast-compatible circuit 1640 comprises resistors 1643, 1645, 1648 and 1650, capacitors 1644 and 1649, diodes 1647 and 1652, bipolar junction transistors (BJT) 1646 and 1651, a ballast-compatible circuit terminal 1641 and a ballast-compatible circuit terminal 1642. One end of the resistor 1645 is coupled to the ballast-compatible circuit terminal 1641, and the other end is coupled to an emitter of the BJT 1646. A collector of the BJT 1646 is coupled to a positive end of the diode 1647, and a negative end thereof is coupled to the ballast-compatible circuit terminal 1642. The resistor 1643 and the capacitor 1644 are connected in series with each other and coupled between the emitter and the collector of the BJT 1646, and the connection node of the resistor 1643 and the capacitor 1644 is coupled to a base of the BJT 1646. One end of the resistor 1650 is coupled to the ballast-compatible circuit terminal 1642, and the other end is coupled to an emitter of the BJT 1651. A collector of the BJT 1651 is coupled to a positive end of the diode 1652, and a negative end thereof is coupled to the ballast-compatible circuit terminal 1641. The resistor 1648 and the capacitor 1649 are connected in series with each other and coupled between the emitter and the collector of the BJT 1651, and the connection node of the resistor 1648 and the capacitor 1649 is coupled to a base of the BJT 1651.

In an initial stage upon the lamp driving circuit 505, e.g. electronic ballast, being activated, voltages across the capacitors 1644 and 1649 are about zero. At this time, the BJTs 1646 and 1651 are in conducting state and the bases thereof allow currents to flow through. Therefore, in an initial stage upon activation of the lamp driving circuit 505, the ballast-compatible circuits 1640 are in conducting state. The AC driving signal charges the capacitor 1644 through the resistor 1643 and the diode 1647, and charges the capacitor 1649 through the resistor 1648 and the diode 1652. After a time period, the voltages across the capacitors 1644 and 1649 reach certain voltages so as to reduce the voltages of the resistors 1643 and 1648, thereby cutting off the BJTs 1646 and 1651, i.e., the states of the BJTs 1646 and 1651 are cutoff states. At this time, the state of the ballast-compatible circuit 1640 is changed to the cutoff state. Thereby, the internal capacitor(s) and inductor(s) do not affect in Q-factor of the lamp driving circuit 505 at the beginning for ensuring the lamp driving circuit activating. Hence, the ballast-compatible circuit 1640 improves the compatibility of LED lamp with the electronic ballast.

In summary, the two ballast-compatible circuits of the present invention are respectively coupled between a connection node of the rectifying circuit and the filtering circuit (i.e., the rectifying output terminal 511 or 512) and the pin 501 and between the connection node and the pin 502, or coupled between the connection node and the pin 503 and the connection node and the pin 504. The two ballast-compatible circuits conduct for an objective delay upon the external driving signal being input into the LED tube lamp, and then are cut off for enhancing the compatibility of the LED lamp with the electronic ballast.

Figure 60A:
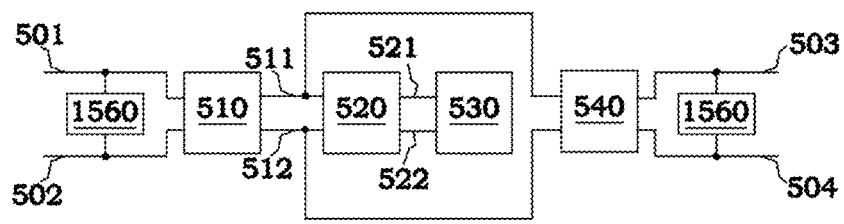
FIG. 60A is a block diagram of an exemplary power supply module in an LED tube lamp according to some embodiments of the present invention.

FIG. 60A is a block diagram of a power supply module in an LED tube lamp according to an embodiment of the present invention. Compared to that shown in FIG. 49E, the present embodiment comprises the rectifying circuits 510 and 540, the filtering circuit 520, and the LED driving module 530, and further comprises two filament-simulating circuits 1560. The filament-simulating circuits 1560 are respectively coupled between the pins 501 and 502 and coupled between the pins 503 and 504, for improving a compatibility with a lamp driving circuit having filament detection function, e.g.: program-start ballast.

In an initial stage upon the lamp driving circuit having filament detection function being activated, the lamp driving circuit will determine whether the filaments of the lamp operate normally or are in an abnormal condition of short-circuit or open-circuit. When determining the abnormal condition of the filaments, the lamp driving circuit stops operating and enters a protection state. In order to avoid that the lamp driving circuit erroneously determines the LED tube lamp to be abnormal due to the LED tube lamp having no filament, the two filament-simulating circuits 1560 simulate the operation of actual filaments of a fluorescent tube to have the lamp driving circuit enter into a normal state to start the LED lamp normally.

Figure 60B:
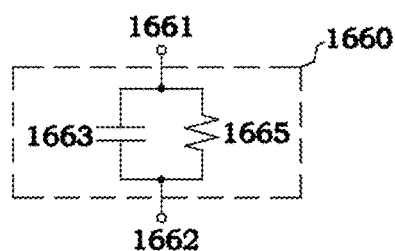
FIG. 60B is a schematic diagram of a filament-simulating circuit according to some embodiments of the present invention.

FIG. 60B is a schematic diagram of a filament-simulating circuit according to an embodiment of the present invention. The filament-simulating circuit comprises a capacitor 1663 and a resistor 1665 connected in parallel, and two ends of the capacitor 1663 and two ends of the resistor 1665 are respectively coupled to filament simulating terminals 1661 and 1662. Referring to FIG. 60A, the filament simulating terminals 1661 and 1662 of the two filament simulating 1660 are respectively coupled to the pins 501 and 502 and the pins 503 and 504. During the filament detection process, the lamp driving circuit outputs a detection signal to detect the state of the filaments. The detection signal passes the capacitor 1663 and the resistor 1665 and so the lamp driving circuit determines that the filaments of the LED lamp are normal.

In addition, a capacitance value of the capacitor 1663 is low and so a capacitive reactance (equivalent impedance) of the capacitor 1663 is far lower than an impedance of the resistor 1665 due to the lamp driving circuit outputting a high-frequency alternative current (AC) signal to drive LED lamp. Therefore, the filament-simulating circuit 1660 consumes fairly low power when the LED lamp operates normally, and so it almost does not affect the luminous efficiency of the LED lamp.

Figure 60C:
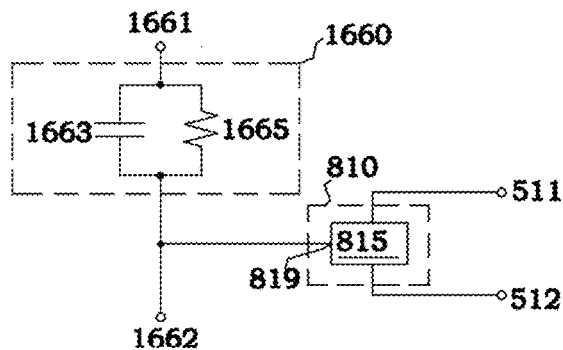
FIG. 60C is a schematic block diagram including a filament-simulating circuit according to some embodiments of the present invention.

FIG. 60C is a schematic block diagram including a filament-simulating circuit according to an embodiment of the present invention. In the present embodiment, the filament-simulating circuit 1660 replaces the terminal adapter circuit 541 of the rectifying circuit 810 shown in FIG. 50C, which is adopted as the rectifying circuit 510 or/and 540 in the LED lamp. For example, the filament-simulating circuit 1660 of the present embodiment has both of filament simulating and terminal adapting functions. Referring to FIG. 60A, the filament simulating terminals 1661 and 1662 of the filament-simulating circuit 1660 are respectively coupled to the pins 501 and 502 or/and pins 503 and 504. The half-wave node 819 of rectifying unit 815 in the rectifying circuit 810 is coupled to the filament simulating terminal 1662.

Figure 60D:
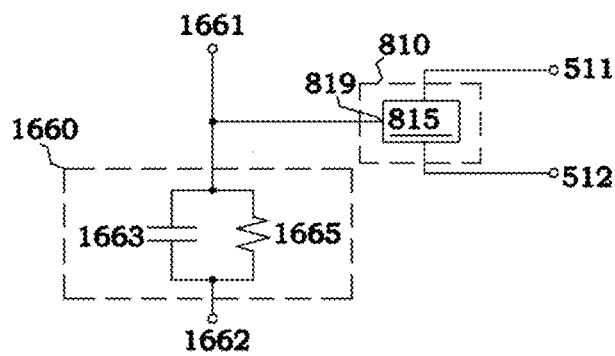
FIG. 60D is a schematic block diagram including a filament-simulating circuit according to some embodiments of the present invention.

FIG. 60D is a schematic block diagram including a filament-simulating circuit according to another embodiment of the present invention. Compared to that shown in FIG. 60C, the half-wave node is changed to be coupled to the filament simulating terminal 1661, and the filament-simulating circuit 1660 in the present embodiment still has both of filament simulating and terminal adapting functions.

Figure 60E:
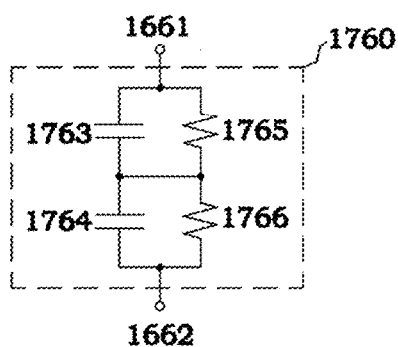
FIG. 60E is a schematic diagram of a filament-simulating circuit according to some embodiments of the present invention.

FIG. 60E is a schematic diagram of a filament-simulating circuit according to another embodiment of the present invention. A filament-simulating circuit 1760 comprises capacitors 1763 and 1764, and the resistors 1765 and 1766. The capacitors 1763 and 1764 are connected in series and coupled between the filament simulating terminals 1661 and 1662. The resistors 1765 and 1766 are connected in series and coupled between the filament simulating terminals 1661 and 1662. Furthermore, the connection node of capacitors 1763 and 1764 is coupled to that of the resistors 1765 and 1766. Referring to FIG. 60A, the filament simulating terminals 1661 and 1662 of the filament-simulating circuit 1760 are respectively coupled to the pins 501 and 502 and the pins 503 and 504. When the lamp driving circuit outputs the detection signal for detecting the state of the filament, the detection signal passes the capacitors 1763 and 1764 and the resistors 1765 and 1766 so that the lamp driving circuit determines that the filaments of the LED lamp are normal.

It is worth noting that in some embodiments, capacitance values of the capacitors 1763 and 1764 are low and so a capacitive reactance of the serially connected capacitors 1763 and 1764 is far lower than an impedance of the serially connected resistors 1765 and 1766 due to the lamp driving circuit outputting the high-frequency AC signal to drive LED lamp. Therefore, the filament-simulating circuit 1760 consumes fairly low power when the LED lamp operates normally, and so it almost does not affect the luminous efficiency of the LED lamp. Moreover, any one of the capacitor 1763 and the resistor 1765 is short circuited or is an open circuit, or any one of the capacitor 1764 and the resistor 1766 is short circuited or is an open circuit, the detection signal still passes through the filament-simulating circuit 1760 between the filament simulating terminals 1661 and 1662. Therefore, the filament-simulating circuit 1760 still operates normally when any one of the capacitor 1763 and the resistor 1765 is short circuited or is an open circuit or any one of the capacitor 1764 and the resistor 1766 is short circuited or is an open circuit, and so it has quite high fault tolerance.

Figure 60F:
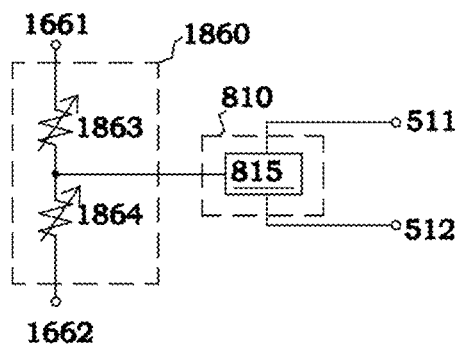
FIG. 60F is a schematic block diagram including a filament-simulating circuit according to some embodiments of the present invention.

FIG. 60F is a schematic block diagram including a filament-simulating circuit according to an embodiment of the present invention. In the present embodiment, the filament-simulating circuit 1860 replaces the terminal adapter circuit 541 of the rectifying circuit 810 shown in FIG. 50C, which is adopted as the rectifying circuit 510 or/and 540 in the LED lamp. For example, the filament-simulating circuit 1860 of the present embodiment has both of filament simulating and terminal adapting functions. An impedance of the filament-simulating circuit 1860 has a negative temperature coefficient (NTC), i.e., the impedance at a higher temperature is lower than that at a lower temperature. In the present embodiment, the filament-simulating circuit 1860 comprises two NTC resistors 1863 and 1864 connected in series and coupled to the filament simulating terminals 1661 and 1662. Referring to FIG. 60A, the filament simulating terminals 1661 and 1662 are respectively coupled to the pins 501 and 502 or/and the pins 503 and 504. The half-wave node 819 of the rectifying unit 815 in the rectifying circuit 810 is coupled to a connection node of the NTC resistors 1863 and 1864.

When the lamp driving circuit outputs the detection signal for detecting the state of the filament, the detection signal passes the NTC resistors 1863 and 1864 so that the lamp driving circuit determines that the filaments of the LED lamp are normal. The impedance of the serially connected NTC resistors 1863 and 1864 is gradually decreased with the gradually increasing of temperature due to the detection signal or a preheat process. When the lamp driving circuit enters into the normal state to start the LED lamp normally, the impedance of the serially connected NTC resistors 1863 and 1864 is decreased to a relative low value and so the power consumption of the filament simulation circuit 1860 is lower.

An exemplary impedance of the filament-simulating circuit 1860 can be 10 ohms or more at room temperature (25 degrees Celsius) and may be decreased to a range of about 2-10 ohms when the lamp driving circuit enters into the normal state. It may be preferred that the impedance of the filament-simulating circuit 1860 is decreased to a range of about 3-6 ohms when the lamp driving circuit enters into the normal state.

Figure 61A:
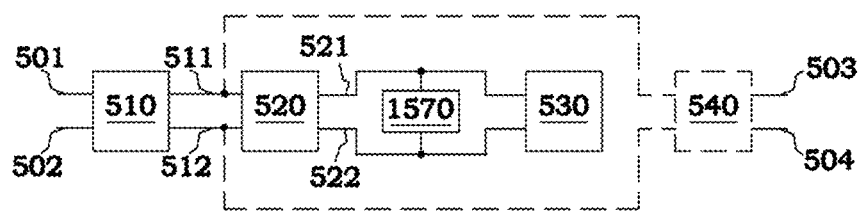
FIG. 61A is a block diagram of an exemplary power supply module in an LED tube lamp according to some embodiments of the present invention.

FIG. 61A is a block diagram of a power supply module in an LED tube lamp according to an embodiment of the present invention. Compared to that shown in FIG. 49E, the present embodiment comprises the rectifying circuits 510 and 540, the filtering circuit 520, and the LED driving module 530, and further comprises an over voltage protection (OVP) circuit 1570. The OVP circuit 1570 is coupled to the filtering output terminals 521 and 522 for detecting the filtered signal. The OVP circuit 1570 clamps the level of the filtered signal when determining the level thereof higher than a defined OVP value. Hence, the OVP circuit 1570 protects the LED driving module 530 from damage due to an OVP condition. The rectifying circuit 540 may be omitted and is therefore depicted by a dotted line.

Figure 61B:
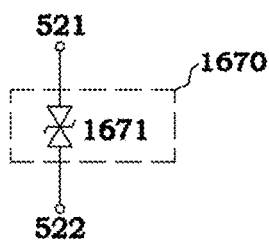
FIG. 61B is a schematic diagram of an OVP circuit according to an embodiment of the present invention.

FIG. 61B is a schematic diagram of an overvoltage protection (OVP) circuit according to an embodiment of the present invention. The OVP circuit 1670 comprises a voltage clamping diode 1671, such as zener diode, coupled to the filtering output terminals 521 and 522. The voltage clamping diode 1671 is conducted to clamp a voltage difference at a breakdown voltage when the voltage difference of the filtering output terminals 521 and 522 (i.e., the level of the filtered signal) reaches the breakdown voltage. The breakdown voltage may be preferred in a range of about 40 V to about 100 V, and more preferred in a range of about 55 V to about 75V.

Figure 62A:
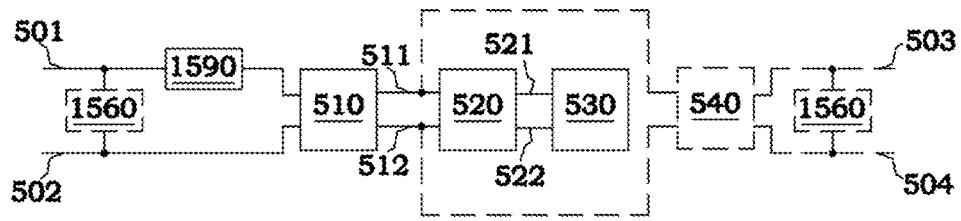
FIG. 62A is a block diagram of an exemplary power supply module in an LED tube lamp according to some embodiments of the present invention.

FIG. 62A is a block diagram of a power supply module in an LED tube lamp according to an embodiment of the present invention. Compared to that shown in FIG. 60A, the present embodiment comprises the rectifying circuits 510 and 540, the filtering circuit 520, the LED driving module 530 and the two filament-simulating circuits 1560, and further comprises a ballast detection circuit 1590. The ballast detection circuit 1590 may be coupled to any one of the pins 501, 502, 503 and 504 and a corresponding rectifying circuit of the rectifying circuits 510 and 540. In the present embodiment, the ballast detection circuit 1590 is coupled between the pin 501 and the rectifying circuit 510.

The ballast detection circuit 1590 detects the AC driving signal or a signal input through the pins 501, 502, 503 and 504, and determines whether the input signal is provided by an electric ballast based on the detected result.

Figure 62B:
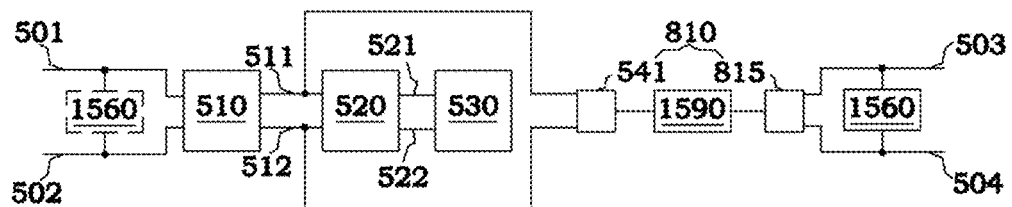
FIG. 62B is a block diagram of an exemplary power supply module in an LED tube lamp according to some embodiments of the present invention.

FIG. 62B is a block diagram of a power supply module in an LED tube lamp according to an embodiment of the present invention. Compared to that shown in FIG. 62A, the rectifying circuit 810 shown in FIG. 50C replaces the rectifying circuit 510. The ballast detection circuit 1590 is coupled between the rectifying unit 815 and the terminal adapter circuit 541. One of the rectifying unit 815 and the terminal adapter circuit 541 is coupled to the pines 503 and 504, and the other one is coupled to the rectifying output terminal 511 and 512. In the present embodiment, the rectifying unit 815 is coupled to the pins 503 and 504, and the terminal adapter circuit 541 is coupled to the rectifying output terminal 511 and 512. Similarly, the ballast detection circuit 1590 detects the signal input through the pins 503 and 504 for determining the input signal whether provided by an electric ballast according to the frequency of the input signal.

In addition, the rectifying circuit 810 may replace the rectifying circuit 510 instead of the rectifying circuit 540, and the ballast detection circuit 1590 is coupled between the rectifying unit 815 and the terminal adapter circuit 541 in the rectifying circuit 510.

Figure 62C:
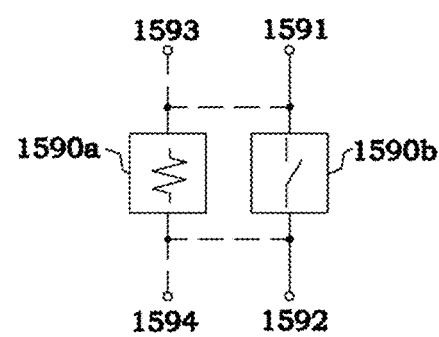
FIG. 62C is a block diagram of a ballast detection circuit according to some embodiments of the present invention.

FIG. 62C is a block diagram of a ballast detection circuit according to an embodiment of the present invention. The ballast detection circuit 1590 comprises a detection circuit 1590*a* and a switch circuit 1590*b*. The switch circuit 1590*b* is coupled to switch terminals 1591 and 1592. The detection circuit 1590*a* is coupled to the detection terminals 1593 and 1594 for detecting a signal transmitted through the detection terminals 1593 and 1594. Alternatively, the switch terminals 1591 and 1592 serves as the detection terminals and the detection terminals 1593 and 1594 are omitted. For example, in certain embodiments, the switch circuit 1590*b* and the detection circuit 1590*a* are commonly coupled to the switch terminals 1591 and 1592, and the detection circuit 1590*a* detects a signal transmitted through the switch terminals 1591 and 1592. Hence, the detection terminals 1593 and 1594 are depicted by dotted lines.

Figure 62D:
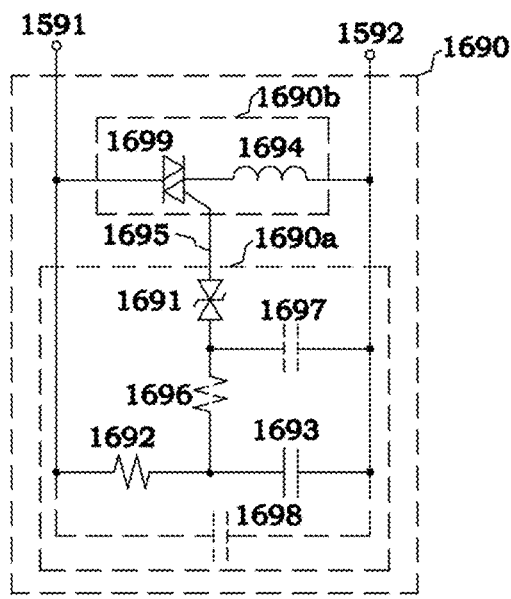
FIG. 62D is a schematic diagram of a ballast detection circuit according to some embodiments of the present invention.

FIG. 62D is a schematic diagram of a ballast detection circuit according to an embodiment of the present invention. The ballast detection circuit 1690 comprises a detection circuit 1690*a* and a switch circuit 1690*b*, and is coupled between the switch terminals 1591 and 1592. The detection circuit 1690*a* comprises a symmetrical trigger diode 1691, resistors 1692 and 1696 and capacitors 1693, 1697 and 1698. The switch circuit 1690*b* comprises a TRIAC 1699 and an inductor 1694.

The capacitor 1698 is coupled between the switch terminals 1591 and 1592 for generating a detection voltage in response to a signal transmitted through the switch terminals 1591 and 1592. When the signal is a high frequency signal, the capacitive reactance of the capacitor 1698 is fairly low and so the detection voltage generated thereby is quite high. The resistor 1692 and the capacitor 1693 are connected in series and coupled between two ends of the capacitor 1698. The serially connected resistor 1692 and the capacitor 1693 is used to filter the detection signal generated by the capacitor 1698 and generates a filtered detection signal at a connection node thereof. The filter function of the resistor 1692 and the capacitor 1693 is used to filter high frequency noise in the detection signal for preventing the switch circuit 1690*b* from misoperation due to the high frequency noise. The resistor 1696 and the capacitor 1697 are connected in series and coupled between two ends of the capacitor 1693, and transmit the filtered detection signal to one end of the symmetrical trigger diode 1691. The serially connected resistor 1696 and capacitor 1697 performs second filtering of the filtered detection signal to enhance the filter effect of the detection circuit 1690*a*. Based on requirement for filtering level of different application, the capacitor 1697 may be omitted and the end of the symmetrical trigger diode 1691 is coupled to the connection node of the resistor 1692 and the capacitor 1693 through the resistor 1696. Alternatively, both of the resistor 1696 and the capacitor 1697 are omitted and the end of the symmetrical trigger diode 1691 is directly coupled to the connection node of the resistor 1692 and the capacitor 1693. Therefore, the resistor 1696 and the capacitor 1697 are depicted by dotted lines. The other end of the symmetrical trigger diode 1691 is coupled to a control end of the TRIAC 1699 of the switch circuit 1690*b*. The symmetrical trigger diode 1691 determines whether to generate a control signal 1695 to trigger the TRIAC 1699 on according to a level of a received signal. A first end of the TRIAC 1699 is coupled to the switch terminal 1591 and a second end thereof is coupled to the switch terminal through the inductor 1694. The inductor 1694 is used to protect the TRIAC 1699 from damage due to a situation where the signal transmitted into the switch terminals 1591 and 1592 is over a maximum rate of rise of Commutation Voltage, a peak repetitive forward (off-state) voltage or a maximum rate of change of current.

When the switch terminals 1591 and 1592 receive a low frequency signal or a DC signal, the detection signal generated by the capacitor 1698 is high enough to make the symmetrical trigger diode 1691 generate the control signal 1695 to trigger the TRIAC 1699 on. At this time, the switch terminals 1591 and 1592 are shorted to bypass the circuit(s) connected in parallel with the switch circuit 1690*b*, such as a circuit coupled between the switch terminals 1591 and 1592, the detection circuit 1690*a* and the capacitor 1698.

In some embodiments, when the switch terminals 1591 and 1592 receive a high frequency AC signal, the detection signal generated by the capacitor 1698 is not high enough to make the symmetrical trigger diode 1691 generate the control signal 1695 to trigger the TRIAC 1699 on. At this time, the TRIAC 1699 is cut off and so the high frequency AC signal is mainly transmitted through external circuit or the detection circuit 1690*a*.

Hence, the ballast detection circuit 1690 can determine whether the input signal is a high frequency AC signal provided by an electric ballast. If yes, the high frequency AC signal is transmitted through the external circuit or the detection circuit 1690*a*; if no, the input signal is transmitted through the switch circuit 1690*b*, bypassing the external circuit and the detection circuit 1690*a*.

It is worth noting that the capacitor 1698 may be replaced by external capacitor(s), such as at least one capacitor in the terminal adapter circuits shown in FIG. 51A-C. Therefore, the capacitor 1698 may be omitted and be therefore depicted by a dotted line.

Figure 62E:
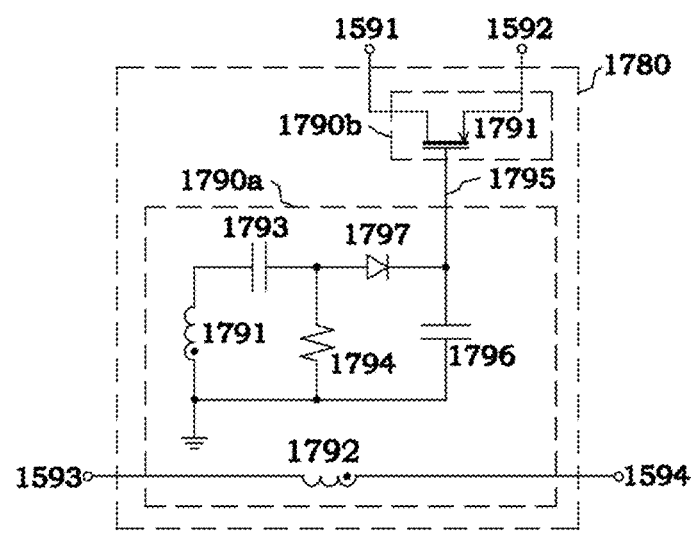

FIG. 62E is a schematic diagram of a ballast detection circuit according to an embodiment of the present invention. The ballast detection circuit 1790 comprises a detection circuit 1790*a* and a switch circuit 1790*b*. The switch circuit 1790*b* is coupled between the switch terminals 1591 and 1592. The detection circuit 1790*a* is coupled between the detection terminals 1593 and 1594. The detection circuit 1790*a* comprises inductors 1791 and 1792 with mutual induction, capacitor 1793 and 1796, a resistor 1794 and a diode 1797. The switch circuit 1790*b* comprises a switch 1799. In the present embodiment, the switch 1799 is a P-type Depletion Mode MOSFET, which is cut off when the gate voltage is higher than a threshold voltage and conducted when the gate voltage is lower than the threshold voltage.

The inductor 1792 is coupled between the detection terminals 1593 and 1594 and induces a detection voltage in the inductor 1791 based on a current signal flowing through the detection terminals 1593 and 1594. The level of the detection voltage is varied with the frequency of the current signal, and may be increased with the increasing of that frequency and reduced with the decreasing of that frequency.

In some embodiments, when the signal is a high frequency signal, the inductive reactance of the inductor 1792 is quite high and so the inductor 1791 induces the detection voltage with a quite high level. When the signal is a low frequency signal or a DC signal, the inductive reactance of the inductor 1792 is quite low and so the inductor 1791 induces the detection voltage with a quite high level. One end of the inductor 1791 is grounded. The serially connected capacitor 1793 and resistor 1794 is connected in parallel with the inductor 1791. The capacitor 1793 and resistor 1794 receive the detection voltage generated by the inductor 1791 and filter a high frequency component of the detection voltage to generate a filtered detection voltage. The filtered detection voltage charges the capacitor 1796 through the diode 1797 to generate a control signal 1795. Due to the diode 1797 providing a one-way charge for the capacitor 1796, the level of control signal generated by the capacitor 1796 is the maximum value of the detection voltage. The capacitor 1796 is coupled to the control end of the switch 1799. First and second ends of the switch 1799 are respectively coupled to the switch terminals 1591 and 1592.

When the signal received by the detection terminal 1593 and 1594 is a low frequency signal or a DC signal, the control signal 1795 generated by the capacitor 1796 is lower than the threshold voltage of the switch 1799 and so the switch 1799 are conducted. At this time, the switch terminals 1591 and 1592 are shorted to bypass the external circuit(s) connected in parallel with the switch circuit 1790*b*, such as the least one capacitor in the terminal adapter circuits show in FIG. 51A-c.

When the signal received by the detection terminal 1593 and 1594 is a high frequency signal, the control signal 1795 generated by the capacitor 1796 is higher than the threshold voltage of the switch 1799 and so the switch 1799 are cut off. At this time, the high frequency signal is transmitted by the external circuit(s).

Hence, the ballast detection circuit 1790 can determine whether the input signal is a high frequency AC signal provided by an electric ballast. If yes, the high frequency AC signal is transmitted through the external circuit(s); if no, the input signal is transmitted through the switch circuit 1790*b*, bypassing the external circuit.

Next, exemplary embodiments of the conduction (bypass) and cut off (not bypass) operations of the switch circuit in the ballast detection circuit of an LED lamp will be illustrated. For example, the switch terminals 1591 and 1592 are coupled to a capacitor connected in series with the LED lamp, e.g., a signal for driving the LED lamp also flows through the capacitor. The capacitor may be disposed inside the LED lamp to be connected in series with internal circuit(s) or outside the LED lamp to be connected in series with the LED lamp. Referring to FIG. 49A, 49B, or 49D, the AC power supply 508 provides a low voltage and low frequency AC driving signal as an external driving signal to drive the LED tube lamp 500 while the lamp driving circuit 505 does not exist. At this moment, the switch circuit of the ballast detection circuit is conducted, and so the alternative driving signal is provided to directly drive the internal circuits of the LED tube lamp 500. When the lamp driving circuit 505 exists, the lamp driving circuit 505 provides a high voltage and high frequency AC driving signal as an external driving signal to drive the LED tube lamp 500. At this moment, the switch circuit of the ballast detection circuit is cut off, and so the capacitor is connected in series with an equivalent capacitor of the internal circuit(s) of the LED tube lamp for forming a capacitive voltage divider network. Thereby, a division voltage applied in the internal circuit(s) of the LED tube lamp is lower than the high voltage and high frequency AC driving signal, e.g.: the division voltage is in a range of 100-270V, and so no over voltage causes the internal circuit(s) damage. Alternatively, the switch terminals 1591 and 1592 is coupled to the capacitor(s) of the terminal adapter circuit shown in FIG. 51A to FIG. 51C to have the signal flowing through the half-wave node as well as the capacitor(s), e.g., the capacitor 642 in FIG. 51A, or the capacitor 842 in FIG. 51C. When the high voltage and high frequency AC signal generated by the lamp driving circuit 505 is input, the switch circuit is cut off and so the capacitive voltage divider is performed; and when the low frequency AC signal of the commercial power or the direct current of battery is input, the switch circuit bypasses the capacitor(s).

It is worth noting that the switch circuit may have plural switch unit to have two or more switch terminal for being connected in parallel with plural capacitors, (e.g., the capacitors 645 and 645 in FIG. 51A, the capacitors 643, 645 and 646 in FIG. 51A, the capacitors 743 and 744 or/and the capacitors 745 and 746 in FIG. 50B, the capacitors 843 and 844 in FIG. 51C, the capacitors 845 and 846 in FIG. 51C, the capacitors 842, 843 and 844 in FIG. 51C, the capacitors 842, 845 and 846 in FIG. 51C, and the capacitors 842, 843, 844, 845 and 846 in FIG. 51C) for bypassing the plural capacitor.

In addition, the ballast detection circuit of the present invention can be used in conjunction with the mode switching circuits shown in FIG. 57A-57I. The switch circuit of the ballast detection circuit is replaced with the mode switching circuit. The detection circuit of the ballast detection circuit is coupled to one of the pins 501, 502, 503 and 504 for detecting the signal input into the LED lamp through the pins 501, 502, 503 and 504. The detection circuit generates a control signal to control the mode switching circuit being at the first mode or the second mode according to whether the signal is a high frequency, low frequency or DC signal, i.e., the frequency of the signal.

For example, when the signal is a high frequency signal and higher than a defined mode switch frequency, such as the signal provided by the lamp driving circuit 505, the control signal generated by the detection circuit makes the mode switching circuit be at the second mode for directly inputting the filtered signal into the LED module. When the signal is a low frequency signal or a direct signal and lower than the defined mode switch frequency, such as the signal provided by the commercial power or the battery, the control signal generated by the detection circuit makes the mode switching circuit be at the first mode for directly inputting the filtered signal into the driving circuit.

Figure 63A:
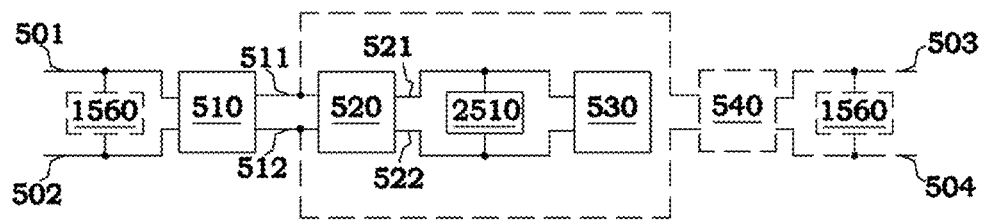

FIG. 63A is a block diagram of a power supply module in an LED tube lamp according to an embodiment of the present invention. Compared to that shown in FIG. 60A, the present embodiment comprises the rectifying circuits 510 and 540, the filtering circuit 520, the LED driving module 530, the two filament-simulating circuits 1560, and further comprises an auxiliary power module 2510. The auxiliary power module 2510 is coupled between the filtering output terminal 521 and 522. The auxiliary power module 2510 detects the filtered signal in the filtering output terminals 521 and 522, and determines whether providing an auxiliary power to the filtering output terminals 521 and 522 based on the detected result. When the supply of the filtered signal is stopped or a level thereof is insufficient, i.e., when a drive voltage for the LED module is below a defined voltage, the auxiliary power module provides auxiliary power to keep the LED driving module 530 continuing to emit light. The defined voltage is determined according to an auxiliary power voltage of the auxiliary power module 2510. The rectifying circuit 540 and the filament-simulating circuit 1560 may be omitted and are therefore depicted by dotted lines.

Figure 63B:
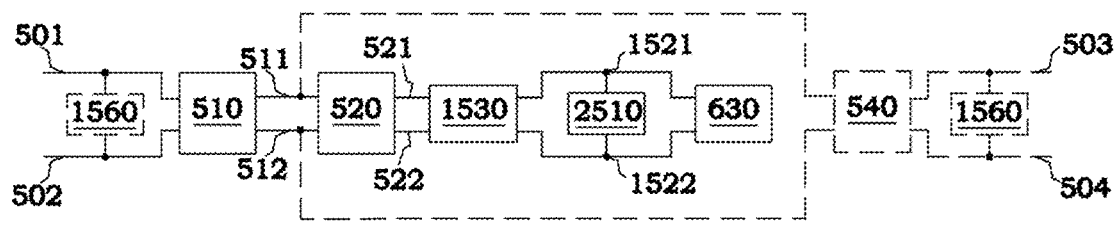

FIG. 63B is a block diagram of a power supply module in an LED tube lamp according to an embodiment of the present invention. Compared to that shown in FIG. 63A, the present embodiment comprises the rectifying circuits 510 and 540, the filtering circuit 520, the LED driving module 530, the two filament-simulating circuits 1560, and the LED driving module 530 further comprises the driving circuit 1530 and the LED module 630. The auxiliary power module 2510 is coupled between the driving output terminals 1521 and 1522.

The auxiliary power module 2510 detects the driving signal in the driving output terminals 1521 and 1522, and determines whether to provide an auxiliary power to the driving output terminals 1521 and 1522 based on the detected result. When the driving signal is no longer being supplied or a level thereof is insufficient, the auxiliary power module provides the auxiliary power to keep the LED module 630 continuously light. The rectifying circuit 540 and the filament-simulating circuit 1560 may be omitted and are therefore depicted by dotted lines.

Figure 63C:
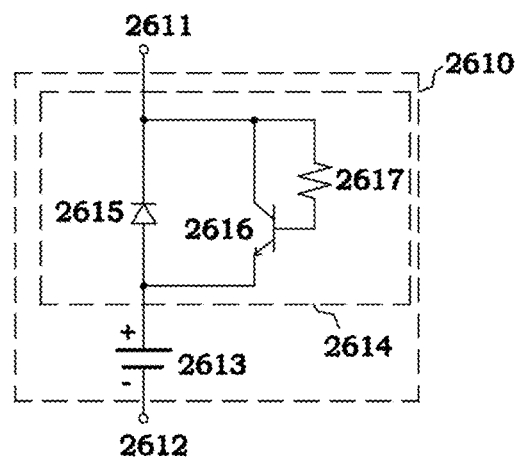

FIG. 63C is a schematic diagram of an auxiliary power module according to an embodiment of the present invention. The auxiliary power module 2610 comprises an energy storage unit 2613 and a voltage detection circuit 2614. The auxiliary power module further comprises an auxiliary power positive terminal 2611 and an auxiliary power negative terminal 2612 for being respectively coupled to the filtering output terminals 521 and 522 or the driving output terminals 1521 and 1522. The voltage detection circuit 2614 detects a level of a signal at the auxiliary power positive terminal 2611 and the auxiliary power negative terminal 2612 to determine whether releasing outward the power of the energy storage unit 2613 through the auxiliary power positive terminal 2611 and the auxiliary power negative terminal 2612.

In the present embodiment, the energy storage unit 2613 is a battery or a supercapacitor. When a voltage difference of the auxiliary power positive terminal 2611 and the auxiliary power negative terminal 2612 (the drive voltage for the LED module) is higher than the auxiliary power voltage of the energy storage unit 2613, the voltage detection circuit 2614 charges the energy storage unit 2613 by the signal in the auxiliary power positive terminal 2611 and the auxiliary power negative terminal 2612. When the drive voltage is lower than the auxiliary power voltage, the energy storage unit 2613 releases the stored energy outward through the auxiliary power positive terminal 2611 and the auxiliary power negative terminal 2612.

The voltage detection circuit 2614 comprises a diode 2615, a bipolar junction transistor (BJT) 2616 and a resistor 2617. A positive end of the diode 2615 is coupled to a positive end of the energy storage unit 2613 and a negative end of the diode 2615 is coupled to the auxiliary power positive terminal 2611. The negative end of the energy storage unit 2613 is coupled to the auxiliary power negative terminal 2612. A collector of the BJT 2616 is coupled to the auxiliary power positive terminal 2611, and the emitter thereof is coupled to the positive end of the energy storage unit 2613. One end of the resistor 2617 is coupled to the auxiliary power positive terminal 2611 and the other end is coupled to a base of the BJT 2616. When the collector of the BJT 2616 is a cut-in voltage higher than the emitter thereof, the resistor 2617 conducts the BJT 2616. When the power source provides power to the LED tube lamp normally, the energy storage unit 2613 is charged by the filtered signal through the filtering output terminals 521 and 522 and the conducted BJT 2616 or by the driving signal through the driving output terminals 1521 and 1522 and the conducted BJT 2616 unit that the collector-emitter voltage of the BJT 2616 is lower than or equal to the cut-in voltage. When the filtered signal or the driving signal is no longer being supplied or the level thereof is insufficient, the energy storage unit 2613 provides power through the diode 2615 to keep the LED driving module 530 or the LED module 630 continuously light.

It is worth noting that in some embodiments, the maximum voltage of the charged energy storage unit 2613 is the cut-in voltage of the BJT 2616 lower than a voltage difference applied between the auxiliary power positive terminal 2611 and the auxiliary power negative terminal 2612. The voltage difference provided between the auxiliary power positive terminal 2611 and the auxiliary power negative terminal 2612 is a turn-on voltage of the diode 2615 lower than the voltage of the energy storage unit 2613. Hence, when the auxiliary power module 2610 provides power, the voltage applied at the LED module 630 is lower (about the sum of the cut-in voltage of the BJT 2616 and the turn-on voltage of the diode 2615). In the embodiment shown in the FIG. 63B, the brightness of the LED module 630 is reduced when the auxiliary power module supplies power thereto. Thereby, when the auxiliary power module is applied to an emergency lighting system or a constant lighting system, the user realizes the main power supply, such as commercial power, is abnormal and then performs necessary precautions therefor.

Figure 64:
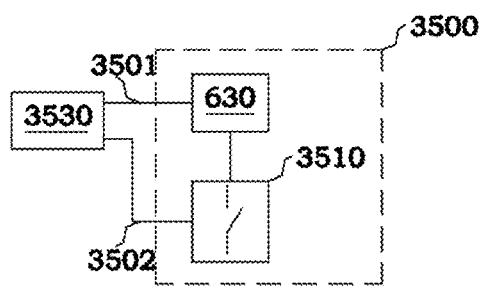

FIG. 64 is a block diagram of a power supply module in an LED tube lamp according to an embodiment of the present invention. Compared to the above mentioned embodiments, the circuits for driving the LED module is installed outside of the LED tube lamp. For example, the LED tube lamp 3500 is driven to emit light by an external driving power 3530 through external driving terminals 3501 and 3502. The LED tube lamp 3500 comprises the LED module 630 and a current control circuit 3510, and does not comprise the rectifying circuit, filtering circuit and the driving circuit. In the present embodiment, the external driving terminals 3501 and 3502 serve as the pins 501 and 502 shown in FIG. 49A and FIG. 49B.

The external driving power 3530 may be directly connected with the commercial power or the ballast for receiving power and converting into an external driving signal to input into the LED tube lamp 3500 through the external driving terminals 3501 and 3502. The external driving signal may be a DC signal, and may preferably be a stable DC current signal. Under a normal condition, the current control circuit 3510 conducts to have a current flowing through and driving the LED module 630 to emit light. The current control circuit 3510 may further detect the current of the LED module 630 for performing a steady current or voltage control, and have a function of ripple filter. Under an abnormal condition, the current control circuit 3510 is cut off to stop inputting the power of the external driving power 3530 into the LED module 630 and enters into a protection state.

When the current control circuit 3510 determines that the current of the LED module 630 is lower than a defined current or a minimum current of a defined current range, the current control circuit 3510 is completely conducted, i.e., the impedance of the current control circuit 3510 comes down a minimum value.

When the current control circuit 3510 determines that the current of the LED module 630 is higher than a defined current or a maximum current of a defined current range, the current control circuit 3510 is cutoff to stop inputting power into the LED tube lamp 3500. The maximum current of a defined current range is in some embodiments set at a value about 30% higher than a rated current of the LED module 630. Thereby, the current control circuit 3510 can keep the brightness of the LED lamp as much as possible when a driving capability of the external driving power 3530 is reduced. Furthermore, the current control circuit 3510 can prevent the LED module 630 from over current when the driving capability of the external driving power 3530 is abnormally increased. Hence, the current control circuit 3510 has a function of over-current protection.

It is worth noting that the external driving power 3530 may be a DC voltage signal. Under a normal condition, the current control circuit 3510 stabilizes the current of the LED module 630 or controls the current linearly, e.g, the current of the LED module 630 is varied linearly with a level of the DC voltage signal. For controlling the current of the LED module at a current value or linearly, a voltage cross the current control circuit 3510 is increased with the level of the DC voltage signal provided by the external driving power 3530 and a power consumption thereof is also increased. The current control circuit 3510 may have a temperature detector. When the level of the DC voltage signal provided by the external driving power 3530 is over a high threshold, the current control circuit 3510 enters into a state of over temperature protection to stop inputting power of the external driving power 3530 into the LED tube lamp 3500. For example, when the temperature detector detects the temperature of the current control circuit 3510 at 120° C., the current control circuit 3510 enters into the state of over temperature protection. Thereby, the current control circuit 3510 has both over temperature and over voltage protections.

In some embodiments, due to the external driving power, the length of the end caps are shortened. For ensuring the total length of the LED tube lamp to conform to a standard for a fluorescent lamp, a length of the lamp tube is lengthened to compensate the shortened length of the end caps. Due to the lengthened length of the lamp tube, the LED light string is correspondingly lengthened. Therefore, the interval of adjacent two LEDs disposed on the LED light string becomes greater under the same illuminance requirement. The greater interval increases the heat dissipation of the LEDs and so the operation temperature of the LEDs is lowered and the life-span of the LED tube lamp is extended.

Referring to FIG. 37, in one embodiment, each of the LED light sources 202 may be provided with an LED lead frame 202b having a recess 202a, and an LED chip 18 disposed in the recess 202a. The recess 202a may be one or more than one in amount. The recess 202a may be filled with phosphor covering the LED chip 18 to convert emitted light therefrom into a desired light color. Compared with a conventional LED chip being a substantial square, the LED chip 18 in this embodiment may be preferably rectangular with the dimension of the length side to the width side at a ratio ranges generally from about 2:1 to about 10:1, in some embodiments from about 2.5:1 to about 5:1, and in some more desirable embodiments from about 3:1 to about 4.5:1. Moreover, the LED chip 18 is in some embodiments arranged with its length direction extending along the length direction of the lamp tube 1 to increase the average current density of the LED chip 18 and improve the overall illumination field shape of the lamp tube 1. The lamp tube 1 may have a number of LED light sources 202 arranged into one or more rows, and each row of the LED light sources 202 is arranged along the length direction (Y-direction) of the lamp tube 1.

Referring again to FIG. 37, the recess 202*a* is enclosed by two parallel first sidewalls 15 and two parallel second sidewalls 16 with the first sidewalls 15 being lower than the second sidewalls 16. The two first sidewalls 15 are arranged to be located along a length direction (Y-direction) of the lamp tube 1 and extend along the width direction (X-direction) of the lamp tube 1, and two second sidewalls 16 are arranged to be located along a width direction (X-direction) of the lamp tube 1 and extend along the length direction (Y-direction) of the lamp tube 1. The extending direction of the first sidewalls 15 may be substantially rather than exactly parallel to the width direction (X-direction) of the lamp tube 1, and the first sidewalls may have various outlines such as zigzag, curved, wavy, and the like. Similarly, the extending direction of the second sidewalls 16 may be substantially rather than exactly parallel to the length direction (Y-direction) of the lamp tube 1, and the second sidewalls may have various outlines such as zigzag, curved, wavy, and the like. In one row of the LED light sources 202, the arrangement of the first sidewalls 15 and the second sidewalls 16 for each LED light source 202 can be same or different.

Having the first sidewalls 15 being lower than the second sidewalls 16 and proper distance arrangement, the LED lead frame 202*b* allows dispersion of the light illumination to cross over the LED lead frame 202*b* without causing uncomfortable visual feeling to people observing the LED tube lamp along the Y-direction. In some embodiments, the first sidewalls 15 may not be lower than the second sidewalls, however, and in this case the rows of the LED light sources 202 are more closely arranged to reduce grainy effects. On the other hand, when a user of the LED tube lamp observes the lamp tube thereof along the X-direction, the second sidewalls 16 also can block user's line of sight from seeing the LED light sources 202, and which reduces unpleasing grainy effects.

Referring again to FIG. 37, the first sidewalls 15 each includes an inner surface 15*a* facing toward outside of the recess 202*a*. The inner surface 15*a* may be designed to be an inclined plane such that the light illumination easily crosses over the first sidewalls 15 and spreads out. The inclined plane of the inner surface 15*a* may be flat or cambered or combined shape. In some embodiments, when the inclined plane is flat, the slope of the inner surface 15*a* ranges from about 30 degrees to about 60 degrees. Thus, an included angle between the bottom surface of the recess 202*a* and the inner surface 15*a* may range from about 120 to about 150 degrees. In some embodiments, the slope of the inner surface 15*a* ranges from about 15 degrees to about 75 degrees, and the included angle between the bottom surface of the recess 202*a* and the inner surface 15*a* ranges from about 105 degrees to about 165 degrees.

There may be one row or several rows of the LED light sources 202 arranged in a length direction (Y-direction) of the lamp tube 1. In case of one row, in one embodiment, the second sidewalls 16 of the LED lead frames 202*b* of all of the LED light sources 202 located in the same row are disposed in same straight lines to respectively form two walls for blocking the user's line of sight seeing the LED light sources 202. In case of several rows, in some embodiments, only the LED lead frames 202*b* of the LED light sources 202 disposed in the outermost two rows are disposed in same straight lines to respectively form walls for blocking user's line of sight seeing the LED light sources 202. In case of several rows, it may be required only that the LED lead frames 202*b* of the LED light sources 202 disposed in the outermost two rows are disposed in same straight lines to respectively from walls for blocking user's line of sight seeing the LED light sources 202. The LED lead frames 202*b* of the LED light sources 202 disposed in the other rows can have different arrangements. For example, as far as the LED light sources 202 located in the middle row (third row) are concerned, the LED lead frames 202*b* thereof may be arranged such that: each LED lead frame 202*b* has the first sidewalls 15 arranged along the length direction (Y-direction) of the lamp tube 1 with the second sidewalls 16 arranged along in the width direction (X-direction) of the lamp tube 1; each LED lead frame 202*b* has the first sidewalls 15 arranged along the width direction (X-direction) of the lamp tube 1 with the second sidewalls 16 arranged along the length direction (Y-direction) of the lamp tube 1; or the LED lead frames 202*b* are arranged in a staggered manner. To reduce grainy effects caused by the LED light sources 202 when a user of the LED tube lamp observes the lamp tube thereof along the X-direction, it may be enough to have the second sidewalls 16 of the LED lead frames 202*b* of the LED light sources 202 located in the outmost rows to block user's line of sight from seeing the LED light sources 202. Different arrangements may be used for the second sidewalls 16 of the LED lead frames 202*b* of one or several of the LED light sources 202 located in the outmost two rows.

In summary, when a plurality of the LED light sources 202 are arranged in a row extending along the length direction of the lamp tube 1, the second sidewalls 16 of the LED lead frames 202*b* of all of the LED light sources 202 located in the same row may be disposed in same straight lines to respectively form walls for blocking user's line of sight seeing the LED light sources 202. When a plurality of the LED light sources 202 are arranged in a number of rows being located along the width direction of the lamp tube 1 and extending along the length direction of the lamp tube 1, the second sidewalls 16 of the LED lead frames 202*b* of all of the LED light sources 202 located in the outmost two rows may be disposed in straight lines to respectively form two walls for blocking user's line of sight seeing the LED light sources 202. The one or more than one rows located between the outmost rows may have the first sidewalls 15 and the second sidewalls 16 arranged in a way the same as or different from that for the outmost rows.

Figure 65:
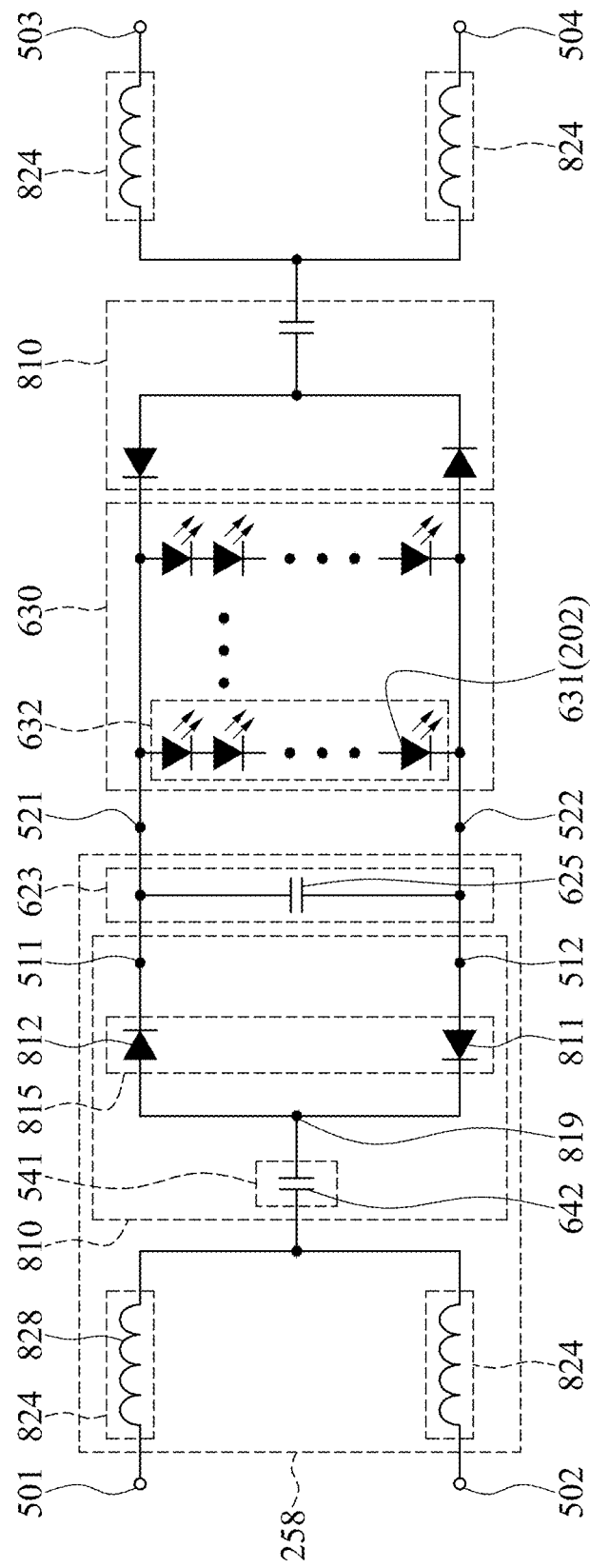

As to FIG. 65, FIG. 65 illustrates a block diagram of an exemplary power supply module in an LED tube lamp according to one embodiment of the present invention. This embodiment is a combination of some features described in FIGS. 2, 52D, 51A, 50C, 52B, and 53A. According to this embodiment, the LED tube lamp comprises a lamp tube 1, a heat shrink sleeve 190 covering on an outer surface of the lamp tube 1, an LED light strip 2 in the lamp tube 1, a plurality of LED light sources 202 (similar to LEDs 631 in FIG. 53A) on the LED light strip 2, two end caps 3 respectively coupled to two opposite ends of the lamp tube 1, and a power supply circuit 258 on the light strip 2. The power supply circuit 258 comprises a plurality of electronic components.

The LED light strip 2 with the plurality of LED light sources 202 and power supply circuit 258 is in the lamp tube 1. In other words, all the electronic components of the power supply circuit 258 are on the light strip 2. Each of the end caps 3 comprises two conductive pins 301 for receiving an external driving signal. The electrical connection between the LED light strip 2 and the pins 301 may be achieved by wire bonding.

In one embodiment, the thickness of the heat shrink sleeve 190 is from 20 um to 200 um and the heat shrink sleeve 190 is substantially transparent with respect to wavelength of light from the plurality of LED light sources 202.

In one embodiment, the LED tube lamp further comprises a reflective film 12 on an inner circumferential surface of the lamp tube 1. The ratio of a circumferential length of the reflective film 12 along the inner circumferential surface of the lamp tube 1 to a circumferential length of the lamp tube 1 is about 0.3 to 0.5. The reflective film 12 has an opening 12a for accommodating the LED light strip 2.

In one embodiment, the LED tube lamp further comprises a diffusion film 13 on the inner surface of the lamp tube 1.

In one embodiment, the LED light strip 2 has a widened part occupying a circumference area of the inner surface of the lamp tube 1 and a ratio of the length of the LED light strip 2 along the circumferential direction to the circumferential length of the lamp tube 1 is about 0.3 to 0.5.

In one embodiment, the LED light strip 2 is fixed by an adhesive sheet to an inner circumferential surface of the lamp tube.

In one embodiment, the power supply circuit 258 comprises a rectifying circuit 810, a filtering circuit 623, and an LED module 630. The rectifying circuit 810 is configured to receive and rectify the external driving signal from the two pins 301 (shown as pins 501 and 502 in FIG. 65) of corresponding one of the end caps 3 and then produce a rectified signal. In this embodiment, the power supply circuit 258 may comprise two rectifying circuits 810 (similar to the rectifying circuits 810 in FIG. 50C), which may respectively correspond to the rectifying circuit 510 and the rectifying circuit 540 mentioned above in FIG. 49E.

The filtering circuit 623 is connected to the rectifying circuit 810 and configured to produce a filtered signal. In one embodiment, the power supply circuit 258 may comprise two filtering circuits 623 and the filtering circuits 623 may be referred to as filtering units 623 of FIG. 52B. Each of the filtering circuits 623 filters the rectified signal as from corresponding one of the rectifying circuits 810 to produce a filtered signal. The LED module 630 has the plurality of LED light sources 202 (631) for receiving the filtered signal and emitting light.

"Corresponding" in above paragraph means the electrical circuit/component on the same side of the lamp tube 1. For example, the rectifying circuit 810 on the left side of FIG. 65 corresponds to the end cap 3 on the left side, and the two pins 301 on the left side, the filtering circuit 623 on the left side, if any. Likewise, the rectifying circuit 810 on the right side of FIG. 65 if any corresponds to the end cap 3 on the right side and the two pins 301 on the right side, and the filtering circuit 623 on the right side, if any.

The power supply circuit 258 may further comprise a filtering unit 824 as mentioned above in FIG. 52D. The filtering unit 824 is connected between one pin of one of the two end caps and the rectifying circuit 810. In some embodiments, the filtering unit 824 comprises an inductor 828. The rectifying circuit 810 comprises a current-limiting capacitor 642 and a rectifying unit 815 connected with the current-limiting capacitor 642. The filtering circuit 623 comprises a capacitor 625. In this embodiment, the power supply circuit 258 may comprise four filtering units 824 as shown in FIG. 65 (the filtering unit 824 is similar to that in FIG. 52D). The filtering units 824 are, respectively, connected between the four pins 301 and the corresponding rectifying circuits 810. Specifically, the pins 301 on the left side are connected to the rectifying circuit 810 on the left side of the FIG. 65 while the pins 301 on the right side are connected to the rectifying circuit 810 on the right side of the FIG. 65. In one embodiment, the filtering units 824 each comprise an inductor 828. And each of the rectifying circuits 810 comprises a current-limiting capacitor 642 and a half-wave rectifying unit 815 connected with the current-limiting capacitor 642. It should be noted that current-limiting capacitor 642 can be a part of, or be regarded as belonging to, a terminal adapter circuit 541 introduced in FIGS. 50C and 50D and also marked in FIG. 65. And each of the four inductors 828 in FIG. 65 can alternatively be regarded as a part of the terminal adapter circuit 541 in FIG. 65, since it's mentioned above that a terminal adapter circuit 541 (as in FIGS. 50C and 50D) may comprise a resistor, a capacitor, an inductor, or any combination thereof.

In one embodiment, each of the end caps 3 comprises a plurality of openings 304 formed one the end caps. The plurality of openings 304 of one of the end caps 3 are symmetric to each other with respect to a plane passing through the middle of a line connecting the two pins 301 and perpendicular to the line connecting the two pins 301. The number of the openings 304 on one of the end caps 3 is two. Alternatively, the number of the plurality of openings 304 on one of the end caps is three and the three openings 304 are arranged in a shape of an arc. All the electronic components of the power supply circuit 258 including the rectifying circuits 810, the filtering circuits 623, the LED module 630, and the filtering units 824 are on the LED light strip 2. The filtering units 824 are inductors 828 and the inductors 828 are closer to the openings 304 of corresponding one of the end caps 3. Accordingly, heat from the inductors 828 may be dissipated more efficiently.

In one embodiment, the LED tube lamp further comprises a hot melt adhesive. The end caps 3 are adhered, respectively, to opposite ends of the lamp tube 1 via the hot melt adhesive.

The LED tube lamps according to various different embodiments of the present invention are described as above. With respect to an entire LED tube lamp, the features including "having the structure-strengthened end region", "adopting the bendable circuit sheet as the LED light strip", "coating the adhesive film on the inner surface of the lamp tube", "coating the diffusion film on the inner surface of the lamp tube", "covering the diffusion film in form of a sheet above the LED light sources", "coating the reflective film on the inner surface of the lamp tube", "the end cap including the thermal conductive member", "the end cap including the magnetic metal member", "the LED light source being provided with the lead frame", and "utilizing the circuit board assembly to connect the LED light strip and the power supply" may be applied in practice singly or integrally such that only one of the features is practiced or a number of the features are simultaneously practiced.

Furthermore, any of the features "having the structure-strengthened end region", "adopting the bendable circuit sheet as the LED light strip", "coating the adhesive film on the inner surface of the lamp tube", "coating the diffusion film on the inner surface of the lamp tube", "covering the diffusion film in form of a sheet above the LED light sources", "coating the reflective film on the inner surface of the lamp tube", "the end cap including the thermal conductive member", "the end cap including the magnetic metal member", "the LED light source being provided with the lead frame", "utilizing the circuit board assembly (including a long circuit sheet and a short circuit board) to connect the LED light strip and the power supply", "a rectifying circuit", "a filtering circuit", "a driving circuit", "a terminal adapter circuit", "an anti-flickering circuit", "a protection circuit", "a mode switching circuit", "an overvoltage protection circuit", "a ballast detection circuit", "a ballast-compatible circuit", "a filament-simulating circuit", and "an auxiliary power module" includes any related technical points and their variations and any combination thereof as described in the abovementioned embodiments of the present invention.

As an example, the feature "having the structure-strengthened end region" may include "the lamp tube includes a main body region, a plurality of rear end regions, and a transition region connecting the main body region and the rear end regions, wherein the two ends of the transition region are arc-shaped in a cross-section view along the axial direction of the lamp tube; the rear end regions are respectively sleeved with end caps; the outer diameter of at least one of the rear end regions is less than the outer diameter of the main body region; the end caps have same outer diameters as that of the main body region."

As an example, the feature "adopting the bendable circuit sheet as the LED light strip" includes "the connection between the bendable circuit sheet and the power supply is by way of wire bonding or soldering bonding; the bendable circuit sheet includes a wiring layer and a dielectric layer arranged in a stacked manner; the bendable circuit sheet has a circuit protective layer made of ink to reflect lights and has widened part along the circumferential direction of the lamp tube to function as a reflective film."

As an example, the feature "coating the diffusion film on the inner surface of the lamp tube" may include "the composition of the diffusion film includes calcium carbonate, halogen calcium phosphate and aluminum oxide, or any combination thereof, and may further include thickener and a ceramic activated carbon; the diffusion film may be a sheet covering the LED light source."

As an example, the feature "coating the reflective film on the inner surface of the lamp tube" may include "the LED light sources are disposed above the reflective film, within an opening in the reflective film or beside the reflective film."

As an example, the feature "the end cap including the thermal conductive member" may include "the end cap includes an electrically insulating tube, the hot melt adhesive is partially or completely filled in the accommodation space between the inner surface of the thermal conductive member and the outer surface of the lamp tube." The feature "the end cap including the magnetic metal member" may include "the magnetic metal member is circular or non-circular, has openings or indentation/embossment to reduce the contact area between the inner peripheral surface of the electrically insulating tube and the outer surface of the magnetic metal member; has supporting portions and protruding portions to support the magnetic metal member or reduce the contact area between the electrically insulating tube and the magnetic metal member."

As an example, the feature "the LED light source being provided with the lead frame" may include "the lead frame has a recess for receive an LED chip, the recess is enclosed by first sidewalls and second sidewalls with the first sidewalls being lower than the second sidewalls, wherein the first sidewalls are arranged to locate along a length direction of the lamp tube while the second sidewalls are arranged to locate along a width direction of the lamp tube."

As an example, the feature "utilizing the circuit board assembly to connect the LED light strip and the power supply" may include "the circuit board assembly has a long circuit sheet and a short circuit board that are adhered to each other with the short circuit board being adjacent to the side edge of the long circuit sheet; the short circuit board is provided with a power supply module to form the power supply; the short circuit board is stiffer than the long circuit sheet."

According to the design of the power supply module, the external driving signal may be low frequency AC signal (e.g., commercial power), high frequency AC signal (e.g., that provided by a ballast), or a DC signal (e.g., that provided by a battery), input into the LED tube lamp through a drive architecture of single-end power supply or dual-end power supply. For the drive architecture of dual-end power supply, the external driving signal may be input by using only one end thereof as single-end power supply.

The LED tube lamp may omit the rectifying circuit when the external driving signal is a DC signal.

According to the design of the rectifying circuit in the power supply module, there may be a signal rectifying circuit, or dual rectifying circuit. First and second rectifying circuits of the dual rectifying circuit are respectively coupled to the two end caps disposed on two ends of the LED tube lamp. The single rectifying circuit is applicable to the drive architecture of signal-end power supply, and the dual rectifying circuit is applicable to the drive architecture of dual-end power supply. Furthermore, the LED tube lamp having at least one rectifying circuit is applicable to the drive architecture of low frequency AC signal, high frequency AC signal or DC signal.

The single rectifying circuit may be a half-wave rectifier circuit or full-wave bridge rectifying circuit. The dual rectifying circuit may comprise two half-wave rectifier circuits, two full-wave bridge rectifying circuits or one half-wave rectifier circuit and one full-wave bridge rectifying circuit.

According to the design of the pin in the power supply module, there may be two pins in single end (the other end has no pin), two pins in corresponding end of two ends, or four pins in corresponding end of two ends. The designs of two pins in single end two pins in corresponding end of two ends are applicable to signal rectifying circuit design of the of the rectifying circuit. The design of four pins in corresponding end of two ends is applicable to dual rectifying circuit design of the of the rectifying circuit, and the external driving signal can be received by two pins in only one end or in two ends.

According to the design of the filtering circuit of the power supply module, there may be a single capacitor, or $\pi$ filter circuit. The filtering circuit filers the high frequency component of the rectified signal for providing a DC signal with a low ripple voltage as the filtered signal. The filtering circuit also further comprises the LC filtering circuit having a high impedance for a specific frequency for conforming to current limitations in specific frequencies of the UL standard. Moreover, the filtering circuit according to some embodiments further comprises a filtering unit coupled between a rectifying circuit and the pin(s) for reducing the EMI.

According to the design of the LED driving module of the power supply module according to some embodiments, the LED driving may comprise the LED module and the driving circuit or only the LED module. The LED module may be connected with a voltage stabilization circuit for prevent the LED module from over voltage. The voltage stabilization circuit may be a voltage clamping circuit, such as zener diode, DIAC and so on. When the rectifying circuit has a capacitive circuit, in some embodiments, two capacitors are respectively coupled between corresponding two pins in two end caps and so the two capacitors and the capacitive circuit as a voltage stabilization circuit perform a capacitive voltage divider.

If there are only the LED module in the LED driving module and the external driving signal is a high frequency AC signal, a capacitive circuit is in at least one rectifying circuit and the capacitive circuit is connected in series with a half-wave rectifier circuit or a full-wave bridge rectifying circuit of the rectifying circuit and serves as a current modulation circuit to modulate the current of the LED module due to that the capacitor equates a resistor for a high frequency signal. Thereby, even different ballasts provide high frequency signals with different voltage levels, the current of the LED module can be modulated into a defined current range for preventing overcurrent. In addition, an energy-releasing circuit is connected in parallel with the LED module. When the external driving signal is no longer supplied, the energy-releasing circuit releases the energy stored in the filtering circuit to lower a resonance effect of the filtering circuit and other circuits for restraining the flicker of the LED module.

In some embodiments, if there are the LED module and the driving circuit in the LED driving module, the driving circuit may be a buck converter, a boost converter, or a buck-boost converter. The driving circuit stabilizes the current of the LED module at a defined current value, and the defined current value may be modulated based on the external driving signal. For example, the defined current value may be increased with the increasing of the level of the external driving signal and reduced with the reducing of the level of the external driving signal. Moreover, a mode switching circuit may be added between the LED module and the driving circuit for switching the current from the filtering circuit directly or through the driving circuit inputting into the LED module.

A protection circuit may be additionally added to protect the LED module. The protection circuit detects the current and/or the voltage of the LED module to determine whether to enable corresponding over current and/or over voltage protection.

According to the design of the ballast detection circuit of the power supply module, the ballast detection circuit is substantially connected in parallel with a capacitor connected in series with the LED module and determines the external driving signal whether flowing through the capacitor or the ballast detection circuit (i.e., bypassing the capacitor) based on the frequency of the external driving signal. The capacitor may be a capacitive circuit in the rectifying circuit.

According to the design of the filament-simulating circuit of the power supply module, there may be a single set of a parallel-connected capacitor and resistor, two serially connected sets, each having a parallel-connected capacitor and resistor, or a negative temperature coefficient circuit. The filament-simulating circuit is applicable to program-start ballast for avoiding the program-start ballast determining the filament abnormally, and so the compatibility of the LED tube lamp with program-start ballast is enhanced. Furthermore, the filament-simulating circuit almost does not affect the compatibilities for other ballasts, e.g., instant-start and rapid-start ballasts.

According to the design of the ballast-compatible circuit of the power supply module in some embodiments, the ballast-compatible circuit can be connected in series with the rectifying circuit or connected in parallel with the filtering circuit and the LED driving module. Under the design of being connected in series with the rectifying circuit, the ballast-compatible circuit is initially in a cutoff state and then changes to a conducting state in an objective delay. Under the design of being connected in parallel with the filtering circuit and the LED driving module, the ballast-compatible circuit is initially in a conducting state and then changes to a cutoff state in an objective delay. The ballast-compatible circuit makes the electronic ballast really activate during the starting stage and enhances the compatibility for instant-start ballast. Furthermore, the ballast-compatible circuit almost does not affect the compatibilities with other ballasts, e.g., program-start and rapid-start ballasts.

According to the design of the auxiliary power module of the power supply module, the energy storage unit may be a battery or a supercapacitor, connected in parallel with the LED module. The auxiliary power module is applicable to the LED driving module having the driving circuit.

According to the design of the LED module of the power supply module, the LED module comprises plural strings of LEDs connected in parallel with each other, wherein each LED may have a single LED chip or plural LED chips emitting different spectrums. Each LEDs in different LED strings may be connected with each other to form a mesh connection.

Figure 66:
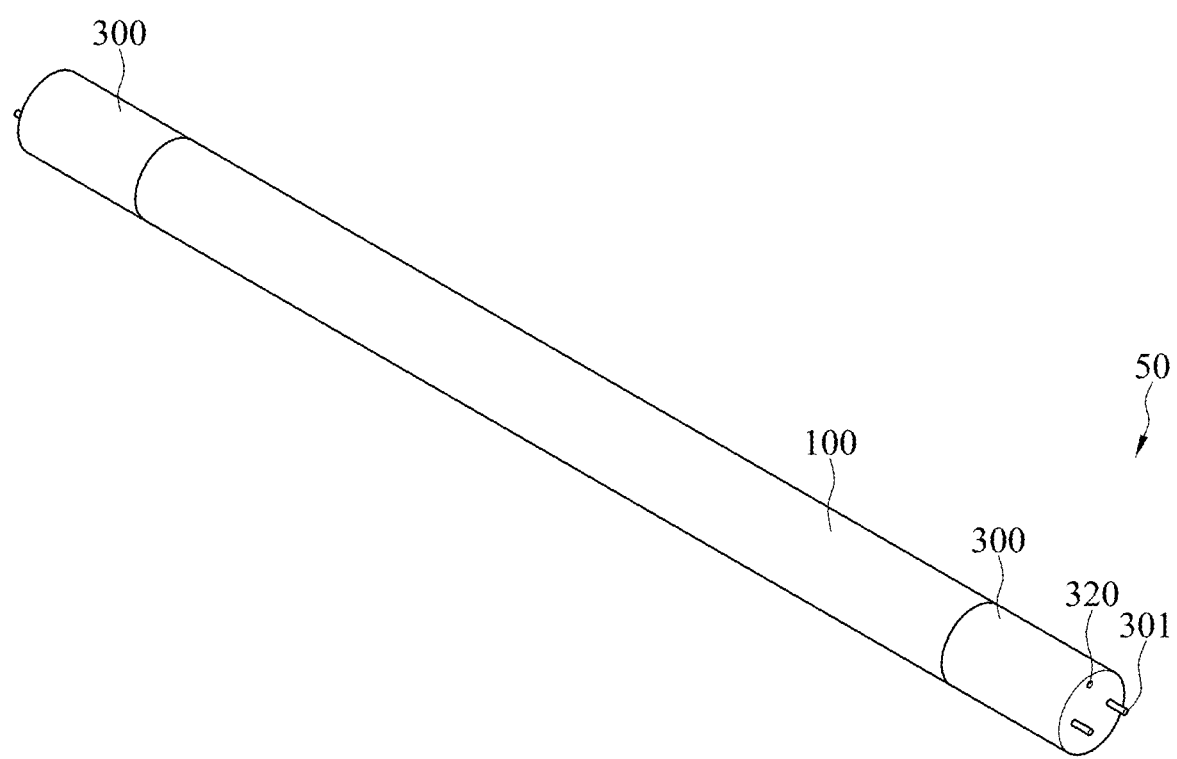
Figure 67:
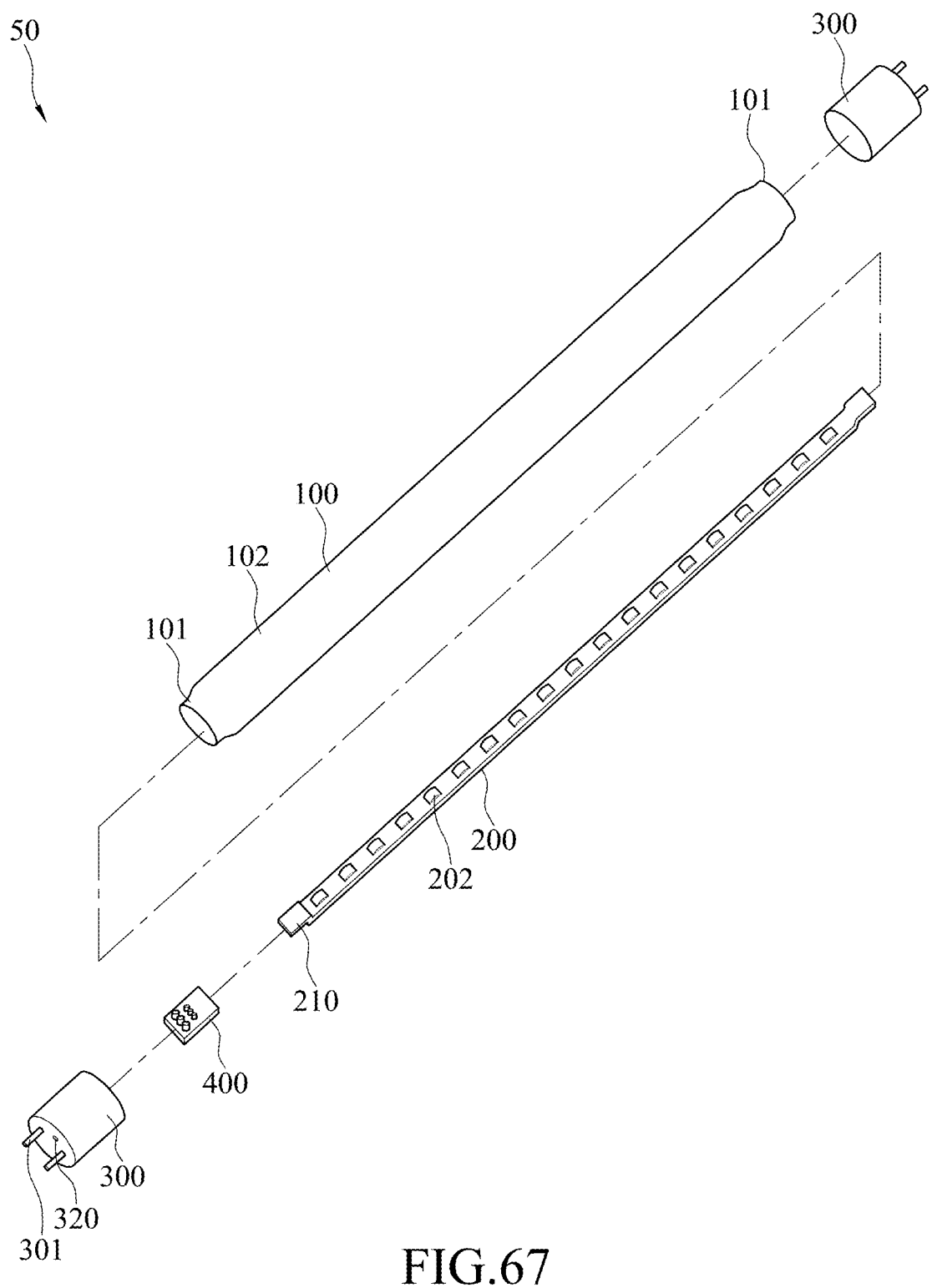

Referring to FIG. 66 and FIG. 67, the instant disclosure provides an embodiment of an LED tube lamp 50 which comprises a tube 100, an LED light strip 200, and end caps 300. The LED light strip 200 is disposed inside the tube 100. Two end caps 300 are respectively disposed on two ends of the tube 100. The LED tube lamp 100 can be a plastic tube, a glass tube, a plastic-metal combined tube, or a glass-metal combined tube. The two end caps 300 can have the same size or have different sizes. Referring to FIG. 67, several LED light sources 202 are disposed on the LED light strip 200, and a power supply 400 is disposed in the end cap 300. The power supply 400 may be in the form of a single integrated unit (e.g., with all components of the power supply 400 are within a body) disposed in an end cap 300 at one end of the tube 100. Alternatively, the power supply 400 may be in form of two separate parts (e.g., with the components of the power supply 400 are separated into two pieces) respectively disposed in two end caps 300. The LED light sources 202 and the power supply 400 can be electrically connected to each other via the LED light strip 200. The LED light strip 200 can be a bendable circuit sheet. Moreover, in some embodiments, the length of the bendable circuit sheet is greater than the length of the tube 100 (not including the length of the two end caps 300 respectively connected to two ends of the tube 100), or at least greater than a central portion of the tube 100 between two transition regions (e.g., where the circumference of the tube narrows) on either end. In one embodiment, the longitudinally projected length of the bendable circuit sheet as the LED light strip 200 is larger than the length of the tube 100. Middle part of the LED light strip 200 can be mounted on the inner surface of the tube 100. Instead, two opposite, short edges of the LED light strip 200 are not mounted on the inner surface of the tube 100. The LED light strip 200 comprises two freely extending end portions 210. The two freely extending end portions 210 are respectively disposed on the two opposite, short edges of the LED light strip 200. The two freely extending end portions 210 respectively extend outside the tube 100 through two holes at two opposite ends of the tube 100 along the axial direction of the tube 100. The two freely extending end portions 210 can respectively extend to inside area of the end caps 300 and can be electrically connected to the power supply 400. Each of the end caps 300 comprises a pair of hollow conductive pins 301 utilized for being connected to an outer electrical power source. When the LED tube lamp 50 is installed to a lamp base, the hollow conductive pins 301 are plugged into corresponding conductive sockets of the lamp base such that the LED tube lamp 50 can be electrically connected to the lamp base. In one embodiment, the LED light strip 2 includes a bendable circuit sheet having a conductive wiring layer and a dielectric layer that are arranged in a stacked manner, wherein the wiring layer and the dielectric layer have same area or the wiring layer has a bit less area (not shown) than the dielectric layer. The LED light source 202 is disposed on one surface of the wiring layer, the dielectric layer is disposed on the other surface of the wiring layer that is away from the LED light sources 202. The wiring layer is electrically connected to the power supply 400 to carry direct current (DC) signals. Meanwhile, the surface of the dielectric layer away from the wiring layer is fixed to the inner circumferential surface of the tube 100 by means of the adhesive sheet (not shown). The wiring layer can be a metal layer or a power supply layer including wires such as copper wires.

In another embodiment, the outer surface of the wiring layer or the dielectric layer may be covered with a circuit protective layer made of an ink with function of resisting soldering and increasing reflectivity (not shown). Alternatively, the dielectric layer can be omitted and the wiring layer can be directly bonded to the inner circumferential surface of the tube 100, and the outer surface of the wiring layer is coated with the circuit protective layer. Whether the wiring layer has a one-layered, or two-layered structure, the circuit protective layer can be adopted. In some embodiments, the circuit protective layer is disposed only on one side/surface of the LED light strip 200, such as the surface having the LED light source 202. In some embodiments, the bendable circuit sheet is a one-layered structure made of just one wiring layer, or a two-layered structure made of one wiring layer and one dielectric layer, and thus is more bendable or flexible to curl when compared with the conventional three-layered flexible substrate (one dielectric layer sandwiched with two wiring layers). As a result, the bendable circuit sheet of the LED light strip 200 can be installed in a tube with a customized shape or non-tubular shape, and fitly mounted to the inner surface of the tube 100. The bendable circuit sheet closely mounted to the inner surface of the tube 100n is preferable in some cases. In addition, using fewer layers of the bendable circuit sheet improves the heat dissipation and lowers the material cost.

Nevertheless, the bendable circuit sheet is not limited to being one-layered or two-layered; in other embodiments, the bendable circuit sheet may include multiple layers of the wiring layers and multiple layers of the dielectric layers, in which the dielectric layers and the wiring layers are sequentially stacked in a staggered manner, respectively (not shown). These stacked layers are away from the surface of the outermost wiring layer which has the LED light source 202 disposed thereon and is electrically connected to the power supply 400. Moreover, the projected length of the bendable circuit sheet is greater than the length of the tube 100.

In one embodiment, the LED light strip 200 includes a bendable circuit sheet having in sequence a first wiring layer, a dielectric layer, and a second wiring layer (not shown). The thickness of the second wiring layer is greater than that of the first wiring layer, and/or the projected length of the LED light strip 200 is greater than that of the tube 100. The end region of the light strip 200 extending beyond the end portion of the tube 100 without disposition of the light source 202 is formed with two separate through holes to respectively electrically communicate the first wiring layer and the second wiring layer (not shown). The through holes are not communicated to each other to avoid short circuit.

In this way, the greater thickness of the second wiring layer allows the second wiring layer to support the first wiring layer and the dielectric layer, and meanwhile allow the LED light strip 200 to be mounted onto the inner circumferential surface without being liable to shift or deform, and thus the yield rate of product can be improved. In addition, the first wiring layer and the second wiring layer are in electrical communication such that the circuit layout of the first wiring later can be extended downward to the second wiring layer to reach the circuit layout of the entire LED light strip 200. In some circumstances, the first wiring connects the anode and the second wiring connects the cathode. Moreover, since the land for the circuit layout becomes two-layered, the area of each single layer and therefore the width of the LED light strip 200 can be reduced such that more LED light strips 200 can be put on a production line to increase productivity. Furthermore, the first wiring layer and the second wiring layer of the end region of the LED light strip 200 that extends beyond the end portion of the tube 100 without disposition of the light source 202 can be used to accomplish the circuit layout of a power supply 400 so that the power supply 400 can be directly disposed on the bendable circuit sheet of the LED light strip 200.

As shown in FIG. 67, the tube 100 comprises two rear end regions 101, two transition regions, and one main body region 102. The two rear end regions 101 are at two opposites ends of the main body region 102. The two transition regions are respectively between the two rear end regions 101 and the main body region 102. The two end caps 300 are respectively connected to the two rear end regions 101. The rear end regions 101 are the portions of the tube 100 shrunk in the radial direction. The rear end regions 101 form shrunk holes. The bore of the rear end region 101 is less than that of the main body region 102. In other words, in the transition region, the tube 100 narrows, or tapers to have a smaller diameter when moving along the length of the tube 100 from the main body region 102 to the rear end region 101. The tapering/narrowing may occur in a continuous, smooth manner (e.g., to be a smooth curve without any linear angles). By avoiding angles, in particular any acute angles, the tube 100 is less likely to break or crack under pressure. Furthermore, the transition region is formed by two curves at both ends, wherein one curve is toward inside of the tube 100 and the other curve is toward outside of the tube 100. For example, one curve closer to the main body region 102 is convex from the perspective of an inside of the tube 100 and one curve closer to the rear end region 101 is concave from the perspective of an inside of the tube 100. The transition region of the tube 100 in one embodiment includes only smooth curves, and does not include any angled surface portions. As shown in FIG. 816, the appearance of the LED tube lamp 50 is identical from the tube 100 to the end caps 300, meaning that the outer surfaces of the end caps 300 are aligned with that of the tube 100.

Figure 68:
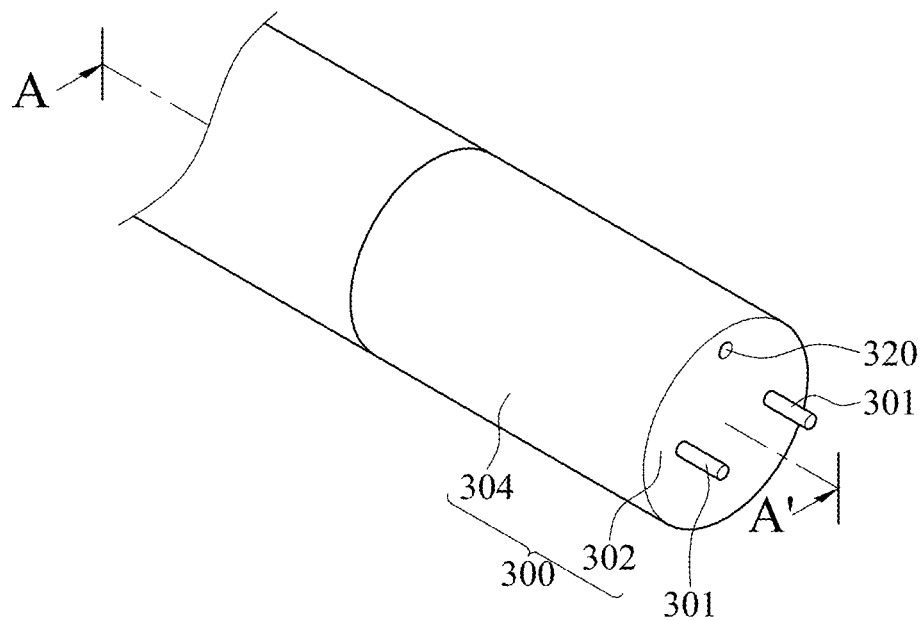
Figure 69:
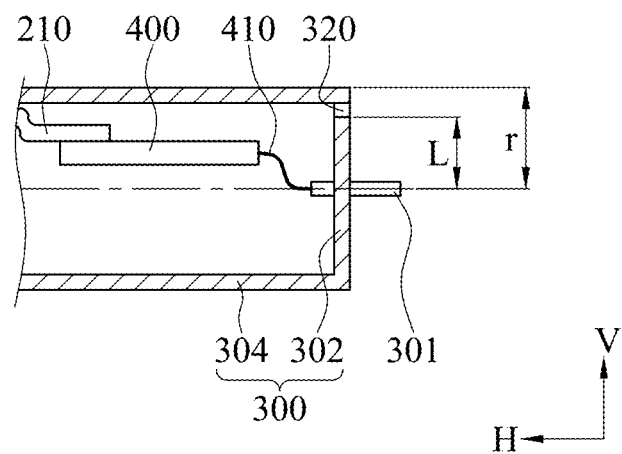

Referring to FIG. 68 and FIG. 69, FIG. 68 is a partial view of the LED tube lamp 50, and FIG. 69 is a cross section of FIG. 68 along the line A-A'. The end cap 300 of the embodiment further comprises a lateral wall 304, an end wall 302, and an opening 320. The lateral wall 304 is tubular shape. The lateral wall 304 and the tube 100 are coaxial and are connected to each other. More specifically, the lateral wall 304 and the tube 100 are substantially coaxial but the alignment of the axial directions of the lateral wall 304 and the tube 100 may have a slightly shift due to manufacturing tolerance. The end wall 302 is substantially perpendicular to the axial direction of the lateral wall 304. The end wall 302 is connected to an end of the lateral wall 304 away from the tube 100. More specifically, the end wall 302 is substantially perpendicular to the axial direction of the lateral wall 304 but the angle between the end wall 302 and the axial direction of the lateral wall 304 may not be exactly 90 degrees maybe due to manufacturing tolerance. This is still within the scope of substantially perpendicular. Even if the end wall 302 relative to the axial direction of the lateral wall 304 is slightly inclined, the end wall 302 and the lateral wall 304 can still form a receiving space for receiving the power supply 400 and can mate the lamp base. The end wall 302 and the lateral wall 304 form an inner space of the end cap 300. The power supply 400 is disposed in the inner space of the end cap 300. The opening 320 penetrates through the end wall 302. The inner space of the end cap 300 can communicate with outside area through the opening 320. Air can flow through the opening 320 between the inner space of the end cap 300 and outside area. Moreover, the opening 320 is good for pressure releasing, and a light sensor can be configured inside the end cap 300 to collimate with the opening 320 for light detection and electric-shock prevention during installation of the LED tube lamp 50 to a lamp base (not shown).

The power supply 400 can be a module, e.g., an integrated power module. The power supply 400 may be in the form of a single integrated unit (e.g., with all components of the power supply 400 are within a body) disposed in an end cap 300 at one end of the tube 100. Alternatively, the power supply 400 may be in form of two separate parts (e.g., with the components of the power supply 400 are separated into two pieces) respectively disposed in two end caps 300. The power supply 400 further comprises a pair of metal wires 410. The metal wires 410 extend from the power supply 400 to the inside of the hollow conductive pins 301 and are connected to the hollow conductive pins 301. In other words, the power supply 400 can be electrically connected to the outer electrical power source through the metal wires 410 and the hollow conductive pins 301. The hollow conductive pins 301 are disposed outside the end wall 302 and extend along the axial direction of the lateral wall 304. Referring to FIG. 69, when the LED tube lamp 50 is installed to a horizontal lamp base (not shown), the axle of the lateral wall 304 is substantially parallel with the horizontal direction "H", and the pair of the hollow conductive pins 301 are at the same altitude and overlap each other in the vertical direction "V". Under the circumstances, the altitude of the opening 320 is higher than that of the axle of the lateral wall 304 in the vertical direction "V".

In the embodiment, as shown in FIG. 69, the axial direction of the opening 320 is substantially parallel with that of the lateral wall 304. The axial direction of the opening 320 is defined as an extending direction of the opening 320 extending from the inner surface of the end wall 302 (the surface inside the end cap 300) to the outer surface of the end wall 302 (the surface outside). In the embodiment, the opening 320 is substantially aligned with the inner surface of the lateral wall 304 (the surface inside the end cap 300). Specifically, a part of the inner surface of the opening 320 is substantially aligned with a part of the inner surface of the lateral wall 304.

In the embodiment, as shown in FIG. 69, an end wall radius "r" is defined as the shortest distance between the center of the end wall 302 (the point of the end wall 302 through which the axle of the lateral wall 304 passes) and the periphery of the end wall 302 in the radial direction of the end cap 300 (the direction substantially parallel with the vertical direction "V" shown in FIG. 69). A distance "L" is defined as the shortest distance between the center of the end wall 302 and the opening 320 in the radial direction of the end cap 300. The distance "L" is a ratio from ⅖ to ⅘ of the end wall radius "r". That is to say, the relation of the opening 320 and the end wall 302 matches an equation listed below:

$$0.4r \leq L \leq 0.8r$$

When the position of the opening 320 relative to the center of the end wall 302 matches the aforementioned equation, the convection of air between the LED tube lamp 50 and outside area can be more efficiently.

Figure 70:
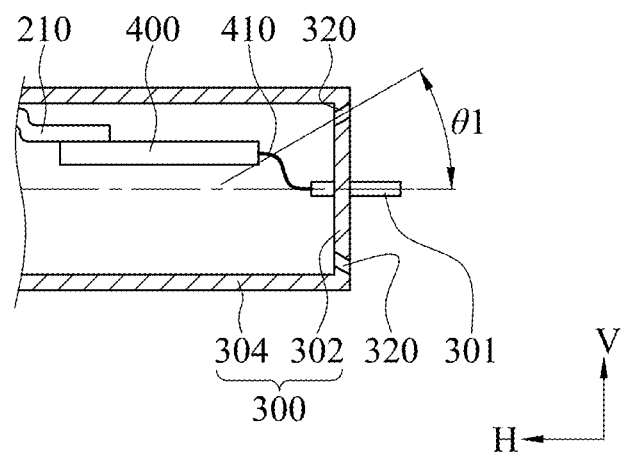

Referring to FIG. 70, the difference between the LED tube lamps 50 of FIG. 70 and FIG. 69 is the forms of the openings 320. In the embodiment, as shown in FIG. 70, the opening 320 can be inclined. The axial direction of the opening 320 and the axial direction of the lateral wall 304 define an angle 61. The angle 61 is an acute angle. The axial direction of the opening 320 is defined as an extending direction of the opening 320 extending from the inner surface of the end wall 302 to the outer surface of the end wall 302. When the LED tube lamp 50 is installed to the horizontal lamp base, the axial directions of the tube 100 and the end cap 300 are substantially parallel with the horizontal direction "H", and the altitude of the opening 320 is higher than that of the axle of the tube 100 and the end cap 300 in the vertical direction "V". When the power supply 400 generates heat in operation, the inclined opening 320 shown in FIG. 70 is beneficial to the process that heated air rises (along the vertical direction "V") and flows to outside area through the opening 320.

Additionally, two openings 320 are acceptable. As shown in FIG. 70, two inclined openings 320 are substantially symmetrical to each other. When the LED tube lamp 50 is installed to the horizontal lamp base, the axial directions of the tube 100 and the end cap 300 are substantially parallel with the horizontal direction "H", and the altitude of one of the two openings 320 is higher than that of the axle of the tube 100 and the end cap 300 in the vertical direction "V" while the other one of the two openings 320 is lower than that of the axle of the tube 100 and the end cap 300 in the vertical direction "V". Each of the axial directions of the two openings 320 and the axial direction of the lateral wall 304 respectively define an acute angle. When the power supply 400 generates heat in operation, the upper opening 320 shown in FIG. 70 is beneficial to the process that heated air rises (along the vertical direction "V") and flows to outside area through the upper opening 320, and the lower opening 320 shown in FIG. 70 is beneficial to the process that cool air from outside area flow to inside of the end cap 300 through the lower opening 320. As a result, convection of the heated air and cool air is improved, and, consequently, the effect of heat dissipation is better.

Figure 71:
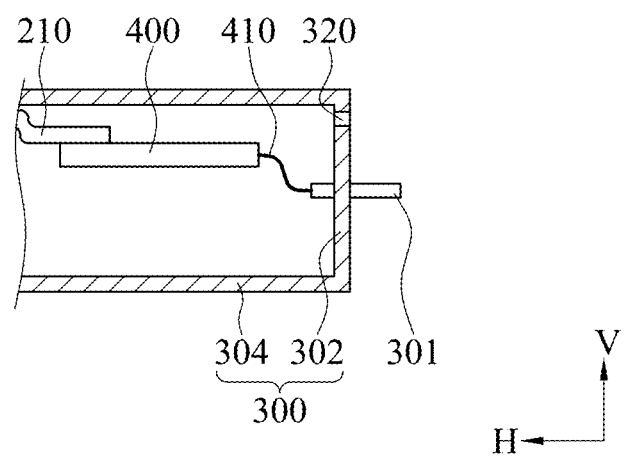

Referring to FIG. 71, the difference between the LED tube lamps 50 of FIG. 71 and FIG. 69 is the forms of the openings 320. As shown in FIG. 71, the opening 320 is not aligned with the inner surface of the lateral wall 304. Comparing to the opening 320 of FIG. 69, the opening 320 of FIG. 71 is away from the end wall 302.

If the opening 320 is too large, dust from outside area may easily pass through the opening 320 and enter the inner space of the end cap 300. Dust may accumulate on the power supply 400 and negatively affect the effect of heat dissipation. To prevent dust from passing through the opening 320, the radial area of the opening 320 is preferably less than 1/10 of the radial area of the end wall 302. Under the circumstances, dust is restricted to pass through the opening 320 to enter the inner space of the end cap 300. In an example that the LED tube lamp 50 is a T8 tube lamp of which the external diameter of the tube 100 is 25 mm to 28 mm, and the external diameter of the end cap 300 (i.e., the diameter of the end wall 302 in the vertical direction "V" shown in FIG. 69) is equal to that of the tube 100. If the diameter of the end wall 302 in the vertical direction "V" shown in FIG. 69 is 25 mm, the area of the end wall 302 in the vertical direction "V" is 490.625 mm2 (square of the radius of the end wall 302 times 3.14), and the bore area (the radial area) of the opening 320 in the vertical direction "V" is 0.5 mm2 to 6 mm2. For example, the radial area of the opening 320 is 6 mm2 and the radial area of the end wall 302 is 490.625 mm2, the radial area of the opening 320 is about 1/100 of the radial area of the end wall 302. Under the circumstances, dust is hard to pass through the opening 320 to enter the inner space of the end cap 300. In different embodiments, the bore area (the radial area) of the opening 320 in the vertical direction "V" is 0.5 mm2 to 3 mm2. Under the circumstances, dust is much harder to pass through the opening 320 to enter the inner space of the end cap 300.

In different embodiments, the end cap 300 further comprises a dust-proof net (not shown). The dust-proof net is a net with fine meshes. The dust-proof net can cover the opening 320. For example, the dust-proof net can be mounted on the outer surface or the inner surface of the end wall 302 and cover the opening 320. As a result, the dust-proof net can prevent dust from entering the opening 320 and keep ventilation well.

Figure 72:
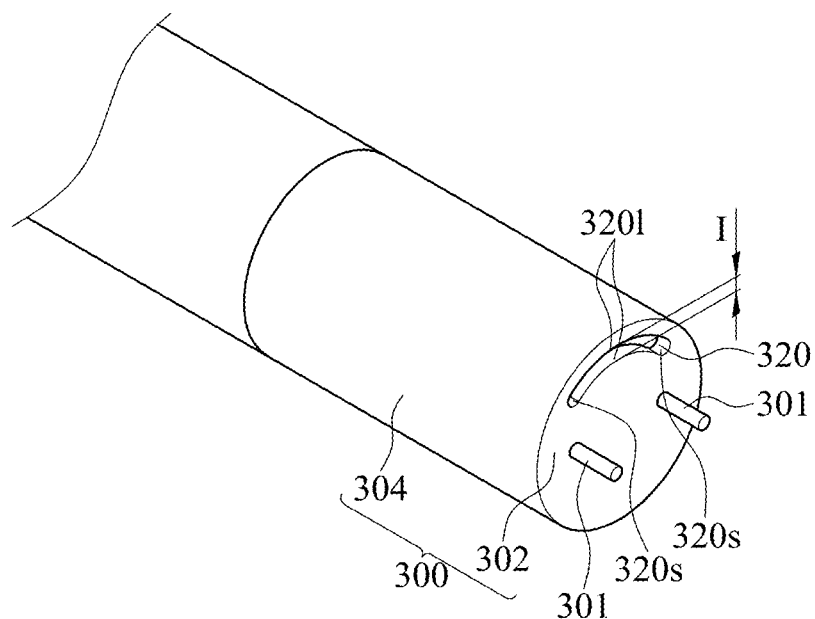

Referring to FIG. 72, the difference between the end caps 300 of FIG. 72 and FIG. 68 is the forms of the openings 320. The opening 320 shown in FIG. 68 is a circular opening. In the embodiment, the opening 320 shown in FIG. 72 is an arc-shaped opening which is long and flat. The opening 320 shown in FIG. 72 includes two opposite long edges 3201 (arc edges) and two opposite short edges 320s between the two long edges 3201. The opening 320 has an interval "1" which is the shortest distance between the two long edges 3201. Under the circumstances, the interval "1" of the opening 320 is much shorter than the length of the long edge 3201. Even if the interval "1" of the opening 320 is equal to or slightly less than the diameter (i.e., the bore) of the opening 320 shown in FIG. 68, the bore area of the opening 320 shown in FIG. 72 is still greater than that of the opening 320 shown in FIG. 68. As a result, the opening 320 of FIG. 72 can not only prevent most of the dust from passing through but also keep ventilation well. In an embodiment, the distance of the interval "1" of the opening is between 0.5 mm to 1.5 mm, and the length of the long edge 3201 of the opening is between 1 mm to 7 mm.

In different embodiments, the number, the shape, the position, or the arrangement of the opening(s) 320 can be varied according to different design. Details are described below.

Figure 73:
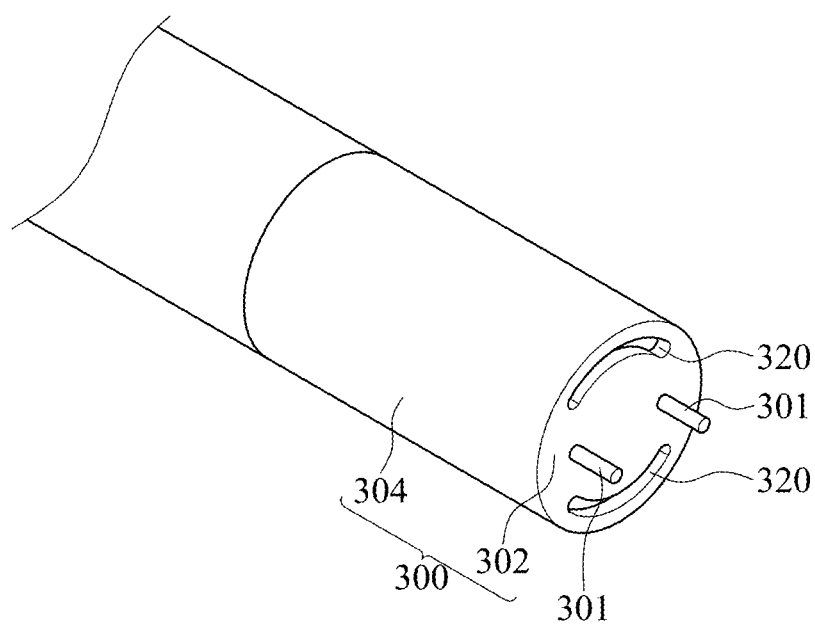

Referring to FIG. 73, the difference between the end caps 300 of FIG. 73 and FIG. 72 is the amount and forms of the openings 320. In the embodiment, there are two openings 320 shown in FIG. 73, and the two openings 320 are substantially symmetrical to each other. The two symmetrical openings 320 shown in FIG. 73 are beneficial to convection of heated air and cool air. The better the convection is, the better the effect of heat dissipation is.

Figure 74:
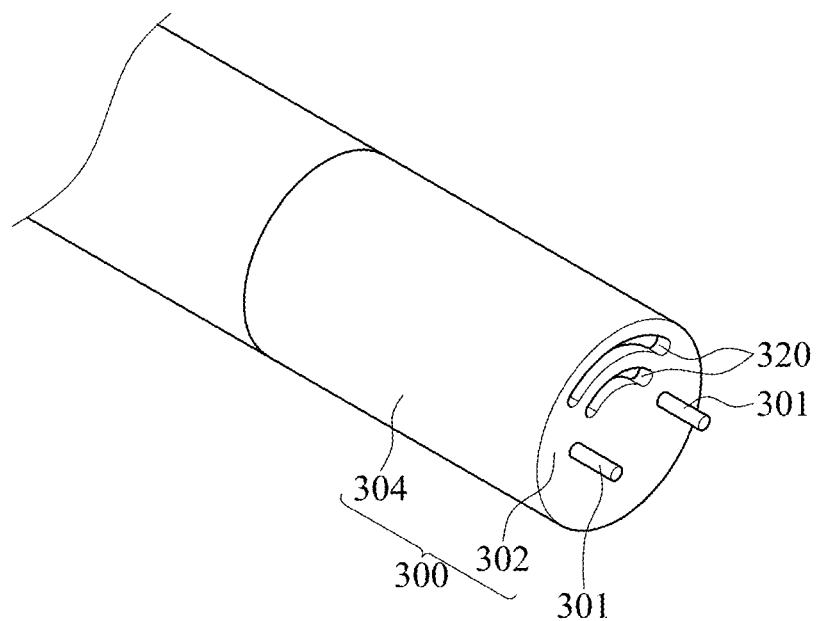

Referring to FIG. 74, the difference between the end caps 300 of FIG. 74 and FIG. 72 is the amount and forms of the openings 320. In the embodiment, there are two openings 320 shown in FIG. 74, and the two openings 320 are adjacent to each other. Under the circumstances that the interval between the two long edges of either opening 320 shown in FIG. 74 is substantially equal to that of the opening 320 shown in FIG. 72, the sum of the bore areas of the two adjacent openings 320 shown in FIG. 74 is greater than the bore area of the single opening 320 shown in FIG. 72. The two adjacent openings 320 shown in FIG. 74 are not only beneficial to convection but also beneficial to prevent most of the dust from passing through the opening 320 and entering the end cap 300.

Figure 75:
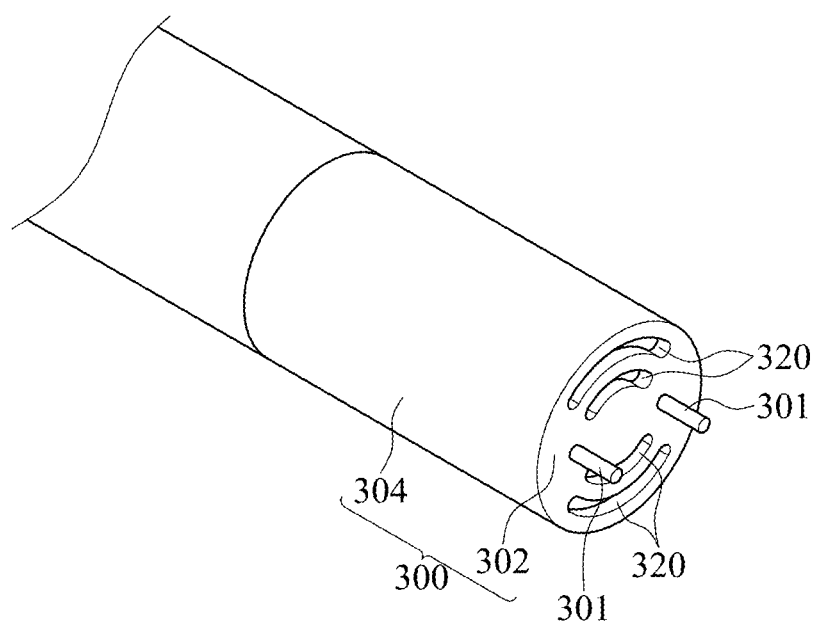

Referring to FIG. 75, the difference between the end caps 300 of FIG. 75 and FIG. 74 is the amount and forms of the openings 320. In the embodiment, there are two set of two openings 320 shown in FIG. 75, and the two set of two openings 320 are symmetrical to each other. The two set of two openings 320 shown in FIG. 75 are not only beneficial to convection of heated air and cool air but also beneficial to prevent dust from passing through the opening 320 and entering the end cap 300.

Figure 76:
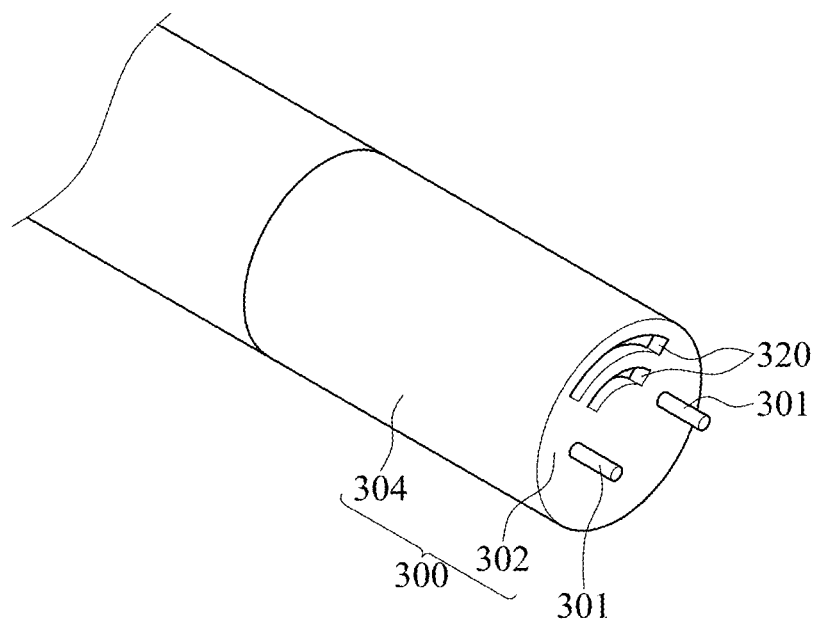
Figure 77:
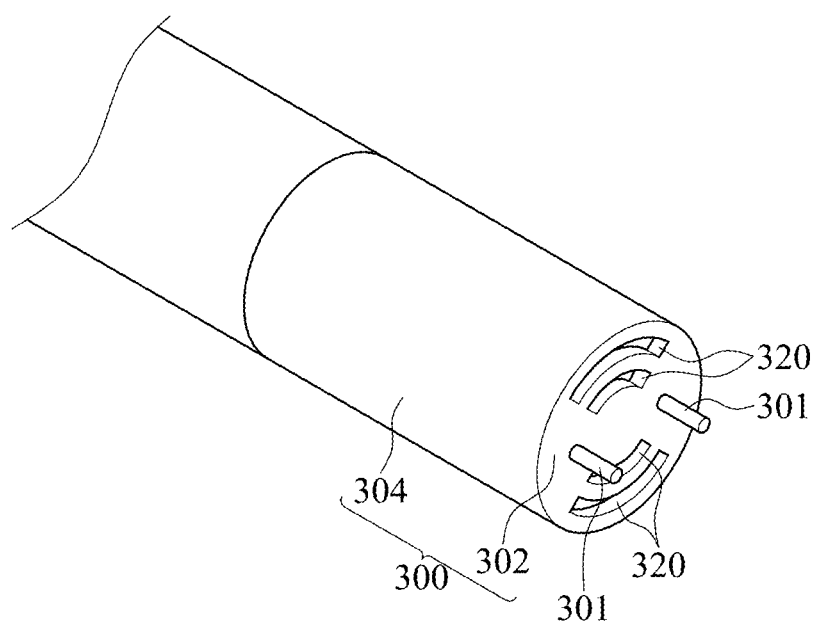

Referring to FIG. 76, the difference between the end caps 300 of FIG. 76 and FIG. 74 is the forms of the openings 320. The two short edges opposite to each other of each opening 320 shown in FIG. 9 are round. In the embodiment, the two short edges opposite to each other of each opening 320 shown in FIG. 76 are rectangular. Referring to FIG. 77, the difference between the end caps 300 of FIG. 77 and FIG. 10 is the forms of the openings 320. The two short edges opposite to each other of each opening 320 shown in FIG. 10 are round. In the embodiment, the two short edges opposite to each other of each opening 320 shown in FIG. 77 are rectangular. In different embodiments, the opening 320 can be a long, narrow and straight shaped opening.

Figure 78:
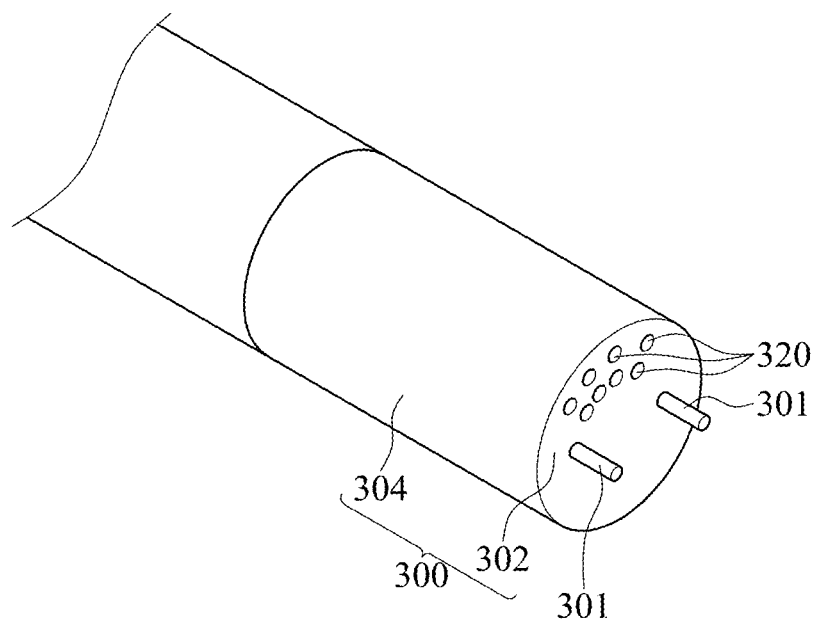

Referring to FIG. 78, the difference between the end caps 300 of FIG. 78 and FIG. 3 is the amount and forms of the openings 320. In the embodiment, the end cap 300 shown in FIG. 78 comprises several openings 320. The openings 320 are a plurality of circular shaped openings and are asymmetrically arranged on the end wall 302. Referring to FIG. 3 and FIG. 78, when the LED tube lamp 50 is installed to the horizontal lamp base, the axial directions of the tube 100 and the end cap 300 are substantially parallel with the horizontal direction "H", and the altitude of at least one of the openings 320 shown in FIG. 78 is higher than that of the axle of the tube 100 and the end cap 300 in the vertical direction "V". In the embodiment, the altitudes of all of the openings 320 shown in FIG. 78 are higher than that of the axle of the tube 100 and the end cap 300 in the vertical direction "V". In different embodiments, the openings 320 symmetrically arranged on the end wall 302 have different shapes, e.g., a long, circular shape. Moreover, at least a part of at least one of the openings 320 is higher than the axle of the tube 100 and the end cap 300 in the vertical direction "V".

Figure 79:
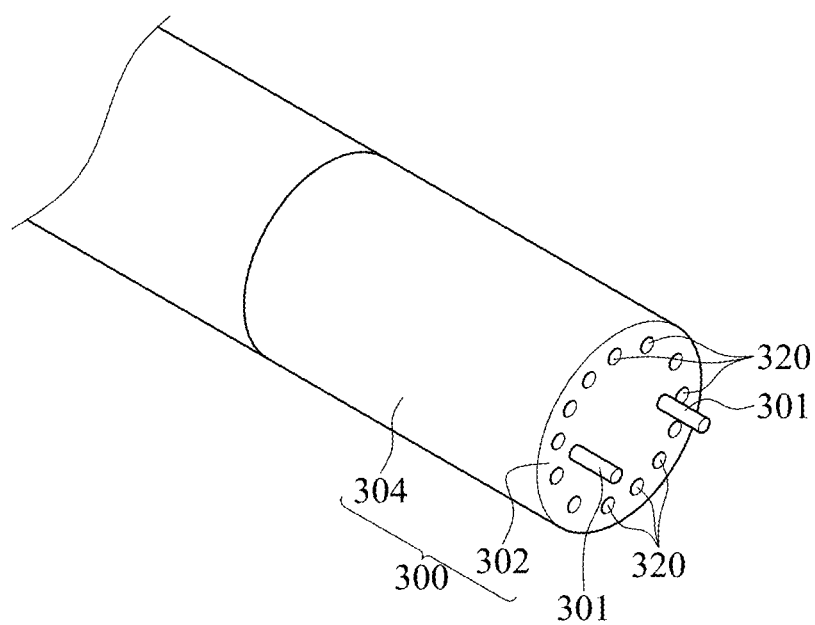

Referring to FIG. 79, the difference between the end caps 300 of FIG. 79 and FIG. 78 is the amount, arrangement, and forms of the openings 320. In the embodiment, the end cap 300 shown in FIG. 79 comprises several openings 320, and the openings 320 relative to the axle of the end cap 300 are symmetrical. The openings 320 are arranged on the end wall 302 and are around the axle of the end cap 300 in point symmetry.

Figure 80:
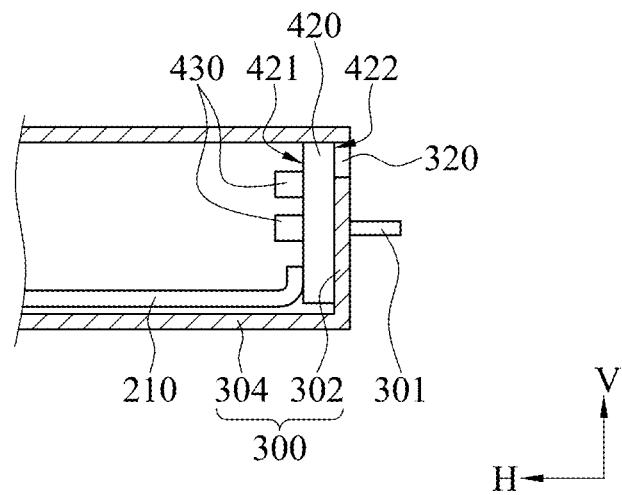

Referring to FIG. 80, the differences between the LED tube lamps 50 of FIG. 80 and FIG. 4 are the forms of the power supply 400 and the opening 320. The power supply 400 shown in FIG. 80 comprises a printed circuit board 420 and one or more electronic components 430. The printed circuit board 420 comprises a first surface 421 and a second surface 422 opposite to and substantially parallel with each other. The first surface 421 and the second surface 422 of the printed circuit board 420 are perpendicular to the axial direction of the lateral wall 304. The second surface 422 of the printed circuit board 420 relative to the first surface 421 is closer to the end wall 302 of the end cap 300 which at least part of the power supply 400 is inside. The electronic components 430 are disposed on the first surface 421 of the printed circuit board 420. The electronic components 430 can be, for example, capacitors.

In the embodiment, as shown in FIG. 80, the second surface 422 of the printed circuit board 420 contacts the inner surface of the end wall 302. Moreover, the metal wires 410 (not shown in FIG. 80) of the power supply 400 can be directly inserted in the hollow conductive pins 301 from the printed circuit board 420. Alternatively, the hollow conductive pins 301 can be directly contacted by a pair of corresponding contacts (not shown) on the second surface 422 of the printed circuit board 420. In addition, the freely extending end portion 210 is connected to the first surface 421 of the printed circuit board 420. In different embodiments, the second surface 422 of the printed circuit board 420 does not contact the inner surface of the end wall 302 and instead the second surface 422 of the printed circuit board 420 is spaced from the inner surface of the end wall 302 by a predetermined interval. The interval between the printed circuit board 420 and the end wall 302 is beneficial to convection of air. In addition, the freely extending end portion 210 is connected to the second surface 422 of the printed circuit board 420 (not shown).

In the embodiment, as shown in FIG. 80, the second surface 422 of the printed circuit board 420 fully contacts the inner surface of the end wall 302 and covers the opening 320; therefore, heat generated by the printed circuit board 420 can be directly transferred to cool air outside the end cap 300 through the opening 320 and, consequently, the effect of heat dissipation is well. Furthermore, under the circumstances that the second surface 422 of the printed circuit board 420 fully covers the opening 320, dust is blocked by the printed circuit board 420 so that dust won't pass through the opening 320 to enter the inner space of the end cap 300. Thus, the bore area of the opening 320 shown in FIG. 80 can be greater than that of the opening 320 shown in FIG. 4.

In different embodiments, the second surface 422 of the printed circuit board 420 contacts the inner surface of the end wall 302 while the end cap 300 has no opening 320. In the situation, the end wall 302 can comprise a material with high thermal conductivity. The end wall 302, for example, can be made by composite materials. The part of the end wall 320 which is connected to the hollow conductive pins 301 is made by an insulating material, and the other part of the end wall 320 is made by aluminum. Heat generated by the printed circuit board 420 can be directly transferred to the part of aluminum of the end wall 302 and then can be transferred to cool air outside the end cap 300 through the part of Aluminum; therefore, the effect of heat dissipation is well. In different embodiments, the opening 320 can be disposed on the lateral wall 304 such that when the LED tube lamp 50 is installed to the horizontal lamp base, the altitude of the opening 320 on the lateral wall 304 is higher than that of the axle of the tube 100 and the end cap 300 in the vertical direction "V".

Figure 81:
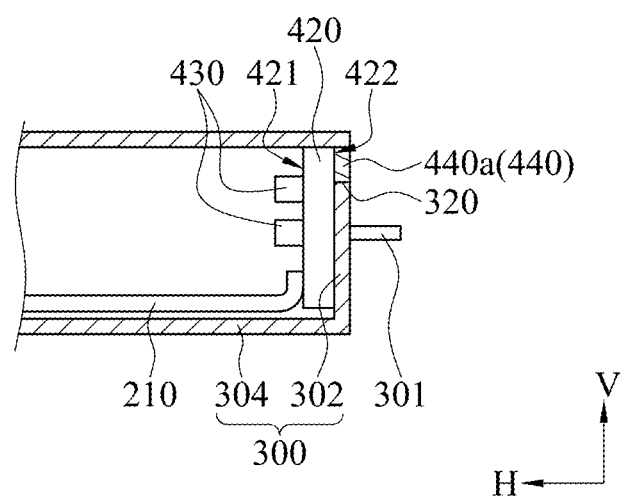

Referring to FIG. 81, the difference between the LED tube lamps 50 of FIG. 81 and FIG. 80 is that the power supply 400 shown in FIG. 81 further comprises a heat-dissipating element or a driving module 440. The heat-dissipating element or driving module 440 is disposed on the second surface 422 of the printed circuit board 420 and extends into the opening 320. In an embodiment, the heat-dissipating element 440a is a metal heat pipe or a metal fin. Heat generated by electronic components 430 on the printed circuit board 420 can be transferred to the heat-dissipating element 440a and then can be transferred to cool air outside the end cap 300 through the heat-dissipating element 440a; therefore, the effect of heat dissipation is well. Since the driving module 440b is a main heat source among the electronic components of the power supply 400, the idea of separation of the general electronic components 430 (the general electronic components 430 generating less heat than the driving module 440b) and the driving module 440b is beneficial to improve the effect of heat dissipation. For example, the general electronic components 430 are disposed on the first surface 421 of the printed circuit board 420 and the driving module 440b generating significant heat is disposed on the second surface 422 of the printed circuit board 420 and locates adjacently to the at least one opening 320. The heat-dissipating element or driving module 440 can be disposed in the opening 320 such that the heat generated by the driving module 440b or the heat of heat-dissipating element can be directly transferred to cool air outside the end cap 300; therefore, the effect of heat dissipation is improved. The driving module 440b comprises one or more specific electronic components generating significant heat including an inductor, a transistor, or an integrated circuit. The arrangement of having the inductor, the transistor, or the integrated circuit positioned in the opening 320 is beneficial to improve the effect of heat dissipation.

In different embodiments, several heat-dissipating elements or driving modules 440 of the power supply 400 can be respectively disposed in several openings 320. For example, the inductor, the transistor, and the integrated circuit can be respectively disposed in different openings 320. Alternatively, the heat-dissipating element, the inductor, the transistor, and the integrated circuit can be respectively disposed in different openings 320.

Figure 82:
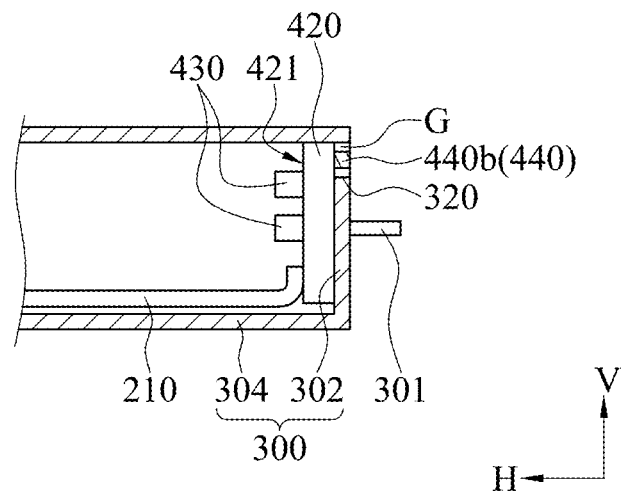

Referring to FIG. 81 and FIG. 82, the difference between FIG. 81 and FIG. 82 is whether the heat-dissipating element or driving module 440 and the opening 320 are sealed in the radial direction of the opening 320. The heat-dissipating element or driving module 440 (the heat-dissipating element 440a in the example) and the opening 320 shown in FIG. 81 are sealed, which means that the shape and the size of the cross section of the heat-dissipating element or driving module 440 in the radial direction exactly match the shape and the size of the bore of the opening 320 in the radial direction. In one embodiment, at least one component of the heat-dissipating element or the driving module 440 and the at least one opening 320 are substantially sealed in the radial direction of the at least one opening. Instead, there is a gap "G" between the heat-dissipating element or driving module 440 (the driving module 440b in the example) and the opening 320 in the radial direction shown in FIG. 82. Thus the outside air can freely flow through the gap "G" to enter the end cap 300 while the heat-dissipating element or driving module 440 is in the opening 320. The effect that the heat-dissipating element or driving module 440 and the opening 320 are sealed in the radial direction is not the same as the effect of air tight. There may be small gaps hard to be seen by eyes but still exist between the heat-dissipating element or driving module 440 and the opening 320 shown in FIG. 81. However, the small gaps between the heat-dissipating element or driving module 440 and the opening 320 shown in FIG. 81 is much smaller than the gap "G" shown in FIG. 82 and, consequently, the heat-dissipating element or driving module 440 and the opening 320 shown in FIG. 81 block cool air outside the opening 320 to a great extent.

Figure 83:
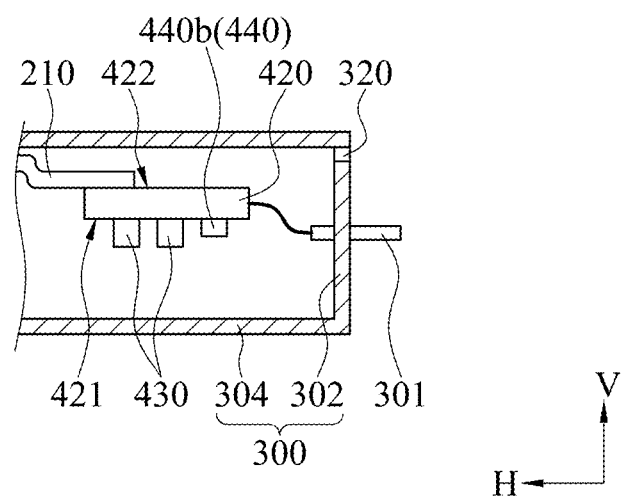

Referring to FIG. 83, the differences between the LED tube lamps 50 of FIG. 83 and FIG. 4 are the forms of the power supply 400. The power supply 400 shown in FIG. 83 comprises a printed circuit board 420, one or more electronic components 430, and a heat-dissipating element or driving module 440. The printed circuit board 420 comprises a first surface 421 and a second surface 422 opposite to and substantially parallel with each other. The first surface 421 and the second surface 422 of the printed circuit board 420 are substantially parallel with the axial direction of the lateral wall 304. The electronic components 430 and the heat-dissipating element or driving module 440 (the driving module 440b in the example) are all disposed on the first surface 421 of the printed circuit board 420. The heat-dissipating element or driving module 440 relative to the electronic components 430 is closer to the opening 320. In an embodiment, the heat-dissipating element 440a is a metal heat pipe or a metal fin. Heat generated by the printed circuit board 420 can be transferred to the heat-dissipating element 440a. Since the heat-dissipating element 440a relative to the electronic components 430 is closer to the opening 320, it is beneficial to heat exchange between the heat-dissipating element 440a and outside cool air, and, consequently, the effect of heat dissipation is better. In an embodiment, the driving module 440b relative to the electronic components 430 (the general electronic components generating less heat than the driving module 440b) is closer to the opening 320, which is beneficial to heat exchange between the driving module 440b and outside cool air. Thus the effect of heat dissipation is better. The driving module 440b comprises one or more specific electronic components generating significant heat. The specific electronic components includes an inductor, a transistor, or an integrated circuit. The arrangement that the inductor, the transistor, or the integrated circuit relative to the general electronic components 430 is closer to the opening 320 is beneficial to improve the effect of heat dissipation.

Referring to FIG. 84, FIG. 84 is a part of a cross section of the LED tube lamp 50 installed to a lamp base 1060. The LED tube lamp 50 shown in FIG. 84 comprises a coupling structure. A part of the coupling structure is disposed on the rear end region 101 of the tube 100, and the other part of the coupling structure is disposed on the end cap 300. The tube 100 and the end cap 300 can be connected to each other by the coupling structure. The coupling structure comprises a first thread 3001 disposed on the lateral wall 304 and a second thread 1001 disposed on the rear end region 101 of the tube 100. The first thread 3001 is on the inner surface of the lateral wall 304 and is at an end of the lateral wall 304 away from the end wall 302. The second thread 1001 is on the outer surface of the rear end region 101 of the tube 100 and is close to the open end of the tube 100 (i.e., the two opposite ends of the tube 100). The first thread 3001 is corresponding to the second thread 1001. The end cap 300 can be connected to the tube 100 by relative rotation of the first thread 3001 and the second thread 1001. Based on the coupling structure, the end cap 300 can be easily assembled to the tube 100 or disassembled from the tube 100.

As shown in FIG. 84, in the embodiment, when the relative rotation of the first thread 3001 and the second thread 1001 is done and the first thread 3001 fully matches the second thread 1001 (i.e., the end cap 300 is properly assembled to the tube 100), the opening 320 is rotated about the axle of the tube 100 to a predetermined position. Specifically, while the lamp base 1060 is horizontal or substantially horizontal and the LED tube lamp 50 is horizontally installed to the lamp base 1060, the axial directions of the tube 100 and the end cap 300 are substantially parallel with the horizontal direction "H", and the predetermined position means that the altitude of the opening 320 is higher than that of the axle of the lateral wall 302 in the vertical direction "V" in the configuration.

As shown in FIG. 84, in the embodiment, the coupling structure further comprises a first positioning unit 3002 disposed on the lateral wall 304 and a second positioning unit 1002 disposed on the rear end region 101 of the tube 100. The first positioning unit 3002 is corresponding to the second positioning unit 1002. When the relative rotation of the first thread 3001 and the second thread 1001 is done and the first thread 3001 fully matches the second thread 1001, the first positioning unit 3002 mates the second positioning unit 1002, such that the tube 100 and the end cap 300 are positioned to each other. In the embodiment, the first positioning unit 3002 is a concave point on the inner surface of the lateral wall 304, and the second positioning unit 1002 is a convex point on the outer surface of the rear end region 101 of the tube 100. When the first thread 3001 fully matches the second thread 1001, the convex point of the second positioning unit 1002 falls in the concave point of the first positioning unit 3002 to assist the fixation of the LED tube lamp 50 and to inform people assembling the LED tube lamp 50 that the end cap 300 has been properly assembled to the tube 100. More particularly, when the first positioning unit 3002 and the second positioning unit 1002 are coupled to each other along with slightly sound and vibration, people assembling the LED tube lamp 50 can be informed by hearing the sound or feeling the vibration and can immediately realize that the end cap 300 has been properly assembled to the tube 100. In the assembling process of the LED tube lamp 50, operator, based on the sound and the vibration generated by the mating (coupling) of the first positioning unit 3002 and the second positioning unit 1002, can finish the assembling process of an assembled LED tube lamp 50 in time. Thus the efficiency of assembling can be improved.

In different embodiments, the first positioning unit 3002 can be a convex point, and the second positioning unit 1002 can be a concave point. In different embodiments, the first positioning unit 3002 and the second positioning unit 1002 can respectively be disposed on different positions of the end cap 300 and the rear end region 101 of the tube 100 on the premise that the first positioning unit 3002 mates the second positioning unit 1002 only when the end cap 300 is properly assembled to the tube 100.

As shown in FIG. 84, the method of having the LED tube lamp 50 installed to the lamp base 1060 is: plugging the hollow conductive pins 301 of the end cap 300 into the conductive sockets 61 of the lamp base 1060, and rotating the LED tube lamp 50 about the axle of the tube 100 and the end cap 300 until the hollow conductive pins 301 in the conductive sockets 61 are rotated to a predetermined position. The assembling is done when the hollow conductive pins 301 in the conductive sockets 61 are in the predetermined position.

In the embodiment, torque applied to the tube 100 and the end cap 300 to have the first thread 3001 and the second thread 1001 relatively rotated until the first thread 3001 fully matches the second thread 1001 is greater than that applied to the LED tube lamp 50 to have the LED tube lamp 50 installed to the lamp base 1060 (i.e., torque for rotating the hollow conductive pins 301 in the conductive sockets 61). In other words, friction force between the first thread 3001 and the second thread 1001 of the assembled LED tube lamp 50 is greater than that between the hollow conductive pins 301 and the conductive sockets 61 when the LED tube lamp 50 is installed to the lamp base 1060. In an embodiment, the friction force between the first thread 3001 and the second thread 1001 is at least twice greater than that between the hollow conductive pins 301 and the conductive sockets 61. When the installed LED tube lamp 50 is going to be uninstalled from the lamp base 1060, the hollow conductive pins 301 in the conductive sockets 61 have to be reversely rotated to a predetermined position in advance, and then the LED tube lamp 50 can be unplugged from the lamp base 1060 (i.e., the hollow conductive pins 301 can be unplugged from the conductive sockets 61). Since the friction force between the first thread 3001 and the second thread 1001 is greater than that between the hollow conductive pins 301 and the conductive sockets 61, the relative position of the first thread 3001 and the second thread 1001 remains still during the reverse rotation of the hollow conductive pins 301 in the conductive sockets 61. As a result, the end cap 300 won't accidentally loose from the tube 100 during the process of uninstalling the LED tube lamp 50 from the lamp base 1060.

Referring to FIG. 85, FIG. 85 is a part of a cross section of the LED tube lamp 50 installed to the lamp base 1060, the difference between the LED tube lamps 50 of the FIG. 85 and FIG. 84 is with respect to the coupling structures. As shown in FIG. 85, the coupling structure comprises an annular convex portion 3003 disposed on the lateral wall 304 and an annular trough 1003 disposed on the rear end region 101 of the tube 100. The annular convex portion 3003 is on the inner surface of the lateral wall 304 and is at an end of the lateral wall 304 away from the end wall 302. The annular trough 1003 is on the outer surface of the rear end region 101 of the tube 100. The annular convex portion 3003 is corresponding to the annular trough 1003. The end cap 300 can be connected to the tube 100 by the coupling of the annular convex portion 3003 and the annular trough 1003. The annular convex portion 3003 and the annular trough 1003 are rotatably connected to each other. More particularly, the annular convex portion 3003 is capable of sliding along the annular trough 1003, and, consequently, the tube 100 and the end cap 300 have a degree of freedom capable of rotating relative to each other about the axle of the tube 100 and the end cap 300 by the annular convex portion 3003 and the annular trough 1003.

As shown in FIG. 85, in the embodiment, the coupling structure further comprises a first positioning unit 3002 disposed on the lateral wall 304 and a second positioning unit 1002 disposed on the rear end region 101 of the tube 100. The structure and the function of the first positioning unit 3002 and the second positioning unit 1002 are described above and there is no need to repeat. Although the tube 100 and the end cap 300 are rotatably connected to each other by the coupling of the annular convex portion 3003 and the annular trough 1003, the first positioning unit 3002 mates the second positioning unit 1002 (e.g., the concave point of the first positioning unit 3002 and the convex point of the second positioning unit 1002 are coupled to each other) when the tube 100 and the end cap 300 are rotated relative to each other to a predetermined position to assist the positioning in the assembling process of the tube 100 and the end cap 300 and to enhance the fixation of the tube 100 and the end cap 300. Based on the coupling structure, the end cap 300 can be easily assembled to the tube 100 or disassembled from the tube 100.

As shown in FIG. 85, in the embodiment, the rear end regions 101 of the tube 100 utilized for being connected to the end cap 300 is shrunk in the radial direction. The extent that the rear end regions 101 shrunk (i.e., difference between the main body region 102 and the rear end regions 101 in radial direction) is equivalent to the thickness of the lateral wall 304 of the end cap 300. Thus the outer surface of the lateral wall 304 of the end cap 300 is aligned with the outer surface of the main body region 102 of the tube 100 while the end cap 300 and the tube 100 are connected to each other.

In different embodiments, the annular trough 1003 can be disposed on the lateral wall 304, and the annular convex portion 3003 can be disposed on the rear end region 101 of the tube 100. Additionally, the coupling structure can further comprise a hot melt adhesive. The hot melt adhesive can be disposed in the joint of the tube 100 and the end cap 300 (e.g., between the rear end region 101 and the lateral wall 304). When assembling the tube 100 and the end cap 300, the end cap 300 can be assembled to the tube 100 via the coupling structure in advance, and the hot melt adhesive is in liquid state in the assembling process. After heating up the hot melt adhesive, and upon expansion due to heat absorption, the hot melt adhesive flows, and then solidifies upon cooling, thereby bonding together the end cap 300 to the tube 100 (not shown). The volume of the hot melt adhesive may expand to about 1.3 times the original size when heated from room temperature (e.g., between about 15 and 30 degrees Celsius) to about 200 to 250 degrees Celsius. The end cap 300 and the end of the tube 100 could be secured by using the hot melt adhesive and therefore qualified in a torque test of about 1.5 to about 5 newton-meters (Nt-m) and/or in a bending test of about 5 to about 10 newton-meters (Nt-m). During the heating and solidification of the hot melt adhesive, the heat and pressure inside the end cap increase and are then released through the at least one opening 320 on the end cap 300. After the hot melt adhesive hardens, the end cap 300 can be firmly fixed to the tube 100. Under the circumstances, the end cap 300 and the tube 100 is hard to disassemble unless the hardened hot melt adhesive returns to liquid state by certain process. The design of the LED tube lamp 50 is to take into account both the convenience regarding the assembling process of the LED tube lamp 50 and the robustness regarding the assembled LED tube lamp 50.

Referring to FIG. 86, FIG. 86 is a perspective view of the LED tube lamp 50 installed to an inclined lamp base 1060. In different embodiments, the LED tube lamp 50 can be installed to an inclined or a vertical lamp base 1060 in an inclined or vertical pose. In the embodiment, as shown in FIG. 86, the lamp base 1060 is inclined. Thus the axle of the LED tube lamp 50 and the horizontal direction "H" define an acute angle while the LED tube lamp 50 is installed to the lamp base 1060. Under the circumstances that the LED tube lamp 50 installed to the lamp base 1060 is inclined, the altitude of the opening 320 of the end cap 300 is still higher than that of the axle of the LED tube lamp 50 in the vertical direction "V", which is beneficial to improve the effect of heat dissipation.

Referring to FIGS. 87, 88 and 89, FIG. 87 is a partial view of the LED tube lamp 50, FIG. 88 is a cross section of FIG. 87 along the line B-B', and FIG. 89 is a partially cross section of FIG. 87. Wherein a part of components of the end cap 300 is not shown in FIG. 89. The difference between the end cap 300 of FIGS. 87 to 89 and the end cap 300 of FIG. 68 is the forms of the openings 320. Additionally, the end cap 300 of FIGS. 87 to 89 further comprises two vertical ribs 330, and the vertical ribs 330 are utilized for fixation of the printed circuit board 420 of the power supply 400. Thus the relative position between the printed circuit board 420 of the power supply 400 and the end cap 300 of FIGS. 87 to 89 can be varied based on the shape of the vertical ribs 300.

As shown in FIG. 87, in the embodiment, the opening 320 has a bow-shaped opening. The size and the position of the opening 320 are corresponding to the two vertical ribs 330. That is to say, the two vertical ribs can be seen from outside the opening 320 in the viewing angle which is substantially parallel with and is along the axial direction of the end cap 300. Furthermore, the two vertical ribs 330 are disposed on the inner surface of the lateral wall 304, and the two vertical ribs are spaced from each other and extend along the axial direction of the lateral wall 304. The vertical ribs 330 are perpendicular to a plane at which the printed circuit board 420 of the power supply 400 is located. In other words, the two vertical ribs 330 are perpendicular to a side of the printed circuit board 420 of the power supply 400 in the radial direction of the end cap 300. For illustration, as shown in FIG. 88, when the LED tube lamp 50 is horizontally installed, the axial directions of the end cap 300 is substantially parallel with the horizontal direction "H", and the vertical ribs 300 extend from the inner surface of the lateral wall 304 along the vertical direction "V" and is connected to the printed circuit board 420 of the power supply 400.

As shown in FIG. 88 and FIG. 89, the vertical rib 330 comprises a first side 331, a second side 332, and a third side 333. The first side 331 and the second side 332 are opposite to each other. The second side 332 relative to the first side 331 is closer to the opening 320. The third side 333 is away from the lateral wall 304 and is between the first side 331 and the second side 332. The third side 333 is connected to the printed circuit board 420 of the power supply 400. The third side 333 is, but is not limited to, adhered to or coupled to the printed circuit board 420 of the power supply 400.

In the embodiment, as shown in FIGS. 87 to 89, the shortest distance between the third side 333 of the vertical rib 330 and the lateral wall 304 gradually decreases along the axial direction of the lateral wall 304 towards the end wall 302. For illustration, as shown in FIG. 88, the height of any point of the vertical rib 330 along the horizontal direction "H" relative to the lateral wall 304 in the vertical direction "V" is the shortest distance between the third side 333 of the vertical rib 330 and the lateral wall 304. The height of the vertical rib 330 gradually decreases along the axial direction of the lateral wall 304 towards the end wall 302. That is to say, the height of the vertical rib 330 relative to the lateral wall 304 gradually decreases from the first side 331 to the second side 332. Thus an extending direction of the third side 333 and the axial direction of the end cap 300 define an acute angle, and, consequently, the printed circuit board 420 of the power supply 400 connected to the third side 333 is inclined. For illustration, as shown in FIG. 88, the altitude of one side of the printed circuit board 420 of the power supply 400 close to the end wall 302 is different from that of the other side of the printed circuit board 420 of the power supply 400 away from the end wall 302 in the vertical direction "V". The altitude of the side of the printed circuit board 420 of the power supply 400 close to the end wall 302 is higher than that of the other side of the printed circuit board 420 of the power supply 400 away from the end wall 302. The side of the printed circuit board 420 of the power supply 400 close to the end wall 302 relative to the other side of the printed circuit board 420 of the power supply 400 is closer to the opening 320. Under the circumstances, heated air generated by the power supply 400 can rise along the inclined power supply 400 and flow through the opening 320 to outside area of the end cap 300, which is beneficial to improve the effect of heat dissipation.

Referring to FIG. 90, the difference between the end cap 300 of FIG. 90 and the end cap 300 of FIGS. 87 to 89 is the forms of the vertical ribs 330. The shortest distance between the third side 333 of the vertical rib 330 shown in FIG. 90 and the lateral wall 304 gradually increases along the axial direction of the lateral wall 304 towards the end wall 302. That is to say, the height of the vertical rib 330 relative to the lateral wall 304 gradually increases from the first side 331 to the second side 332. Under the circumstances, the altitude of one side of the printed circuit board 420 of the power supply 400 connected to the third side 333 of the vertical rib 330 close to the end wall 302 is lower than that of the other side of the printed circuit board 420 of the power supply 400 away from the end wall 302. The configuration of the vertical ribs 330 and the printed circuit board 420 of the power supply 400 shown in FIG. 90 is beneficial to convection of inside heated air and outside cool air since outside cool air can easily enter the inner space of the end cap 300.

Referring to FIG. 91, the difference between the end cap 300 of FIG. 91 and the end cap 300 of FIGS. 87 to 89 is the forms of the vertical ribs 330. In addition, the power supply 400 shown in FIG. 91 further comprises a printed circuit board 420. In different embodiments, the power supply 400 can further comprise a power module disposed on the printed circuit board 420 or can further comprise one or more electronic components 430 and one or more heat-dissipating elements or driving modules 440 disposed on the printed circuit board 420. In different embodiments, the power supply 400 can be a module, e.g., an integrated power module integrated with the printed circuit board 420 and electronic components.

As shown in FIG. 91, in the embodiment, the power supply 400 further comprises electronic components 430 and a heat-dissipating element or driving module 440 disposed on the printed circuit board 420. Specifically, the printed circuit board 420 comprises a first surface 421 and a second surface 422 opposite to each other. The electronic components 430 and the heat-dissipating element or driving module 440 are disposed on the first surface 421. The second surface 422 is connected to the third sides 333 of the vertical ribs 330. In the embodiment, the height of the vertical rib 330 relative to the lateral wall 304 from the first side 331 to the second side 332 is identical, and, consequently, the printed circuit board 420 connected to the third side 333 is horizontal but not inclined. The heat-dissipating element or driving module 440 can be a heat-dissipating element, an inductor, a transistor, or an integrated circuit. The heat-dissipating element or driving module 440 relative to the electronic components 430 is closer to the opening 320. In addition, the second surface 422 of the printed circuit board 420 is spaced from the lateral wall 304 by a certain interval based on the vertical ribs 330. An extending direction of the vertical rib 330 from the first side 331 to the second side 332 is towards the opening 320. As a result, there is a space for convection of air between the power supply 400 and the lateral wall 304, and heated air can easily flow through the opening 320 to outside area of the end cap 300.

Referring to FIGS. 92 to 94, FIG. 92 is an end view of the LED tube lamp 50 in which the viewing angle is substantially parallel with the axle of the end cap 300, FIG. 93 is a radial cross section of the end cap 300 of FIG. 92, and FIG. 94 is a part of an axial cross section of FIG. 92 along the line C-C'. The difference between the end caps 300 between FIGS. 92 to 94 and FIG. 91 is that the end cap 300 shown in FIGS. 92 to 94 further comprises two horizontal ribs 340, and the power supply 400 shown in FIGS. 92 to 94 is a power module.

The opening 320 is the bow-shaped opening, as described above. The size and the position of the opening 320 are corresponding to the two vertical ribs 330. More particularly, a projection of the two vertical ribs 330 is inside a projection of the opening 320 on a plane of projection perpendicular to the axial direction of the end cap 300. In other words, as shown in FIG. 92, the two vertical ribs can be seen from outside the opening 320 when seeing into the opening 320 along the axial direction of the end cap 300. As a result, the space for convection between the two vertical ribs 330 and power supply 400 is corresponding to the opening 320 which is beneficial to improve the effect of heat dissipation.

In the embodiment, as shown in FIGS. 92 to 94, the two horizontal ribs 340 are disposed on the inner surface of the lateral wall 304, and the two horizontal ribs 340 are spaced from each other and extend along the axial direction of the lateral wall 304. Each of the horizontal ribs 340 has a long and flat shape. The two horizontal ribs 340 are opposite to each other and are symmetric. The two horizontal ribs 340 are respectively corresponding to the two vertical ribs 330. The printed circuit board 420 of the power supply 400 is sandwiched between the vertical ribs 330 and the horizontal ribs 340. In other words, one side of the printed circuit board 420 of the power supply 400 is connected to the vertical ribs 330, and the other side of the printed circuit board 420 of the power supply 400 is connected to the horizontal ribs 340. The collaboration of the vertical ribs 330 and the horizontal ribs 340 can firmly clamp and fix the printed circuit board 420 of the power supply 400.

Referring to FIG. 95, the difference between the end caps 300 of FIG. 95 and FIG. 94 is that the horizontal rib 340 shown in FIG. 94 is a whole piece and instead, the horizontal rib 340 shown in FIG. 95 has a cut portion. More particularly, the horizontal rib 340 shown in FIG. 95 comprises a first rib portion 341, a second rib portion 342, and a cut portion 343. The cut portion 343 is between the first rib portion 341 and the second rib portion 342. That is to say, the first rib portion 341 and the second rib portion 342 are spaced from each other by the cut portion 343. The cut portion 343 can be utilized for convection of air and is beneficial to improve the effect of heat dissipation.

In addition, the difference between the end caps 300 of FIG. 95 and FIG. 94 is that the end cap 300 shown in FIG. 95 further comprises a blocking plate 350. The blocking plate 350 is disposed on the inner surface of the lateral wall 304. The blocking plate 350 and the end wall 302 are spaced from each other in the axial direction of the lateral wall 304. A side of the printed circuit board 420 of the power supply 400 facing towards the end wall 302 contacts the blocking plate 350. The printed circuit board 420 of the power supply 400 is spaced from the end wall 302 by the blocking plate 350 such that there is a gap between the printed circuit board 420 of the power supply 400 and the end wall 302 in the axial direction of the lateral wall 304. The gap can be utilized for convection of air and is beneficial to improve the effect of heat dissipation.

Referring to FIG. 96, the difference between the end caps 300 of FIG. 96 and FIG. 94 is that the horizontal rib 340 shown in FIG. 94 is a whole piece and instead, the horizontal rib 340 shown in FIG. 96 comprises one or more through holes. More particularly, each of the horizontal ribs 340 shown in FIG. 96 comprises a plurality of ventilating holes 344. The ventilating hole 344 penetrates through the horizontal rib 340 and the ventilating holes 344 are arranged on the horizontal rib 340. The ventilating holes 344 can be utilized for convection of air and is beneficial to improve the effect of heat dissipation.

Referring to FIG. 97, the difference between the LED tube lamps 50 of FIG. 97 and FIGS. 66 to 69 is with respect to the relationship of the LED light strip 200 and the printed circuit board 420 of the power supply 400. A plane at which the LED light strip 200 shown in FIGS. 66 to 69 locates is substantially parallel with a plane at which the printed circuit board 420 of the power supply 400 locates. However, a plane at which the LED light strip 200 shown in FIG. 97 locates is not parallel with a plane at which the printed circuit board 420 of the power supply 400 locates. More particularly, as shown in FIG. 97, the LED light strip 200 locates at a first plane P1, and the printed circuit board 420 of the power supply 400 locates at a second plane P2. The first plane P1 and the second plane P2 are substantially parallel with the axial direction of the tube 100, and the first plane P1 and the second plane P2 define an angle 82 about the axial direction of the tube 100. The angle 82 is greater than 0 degree and is less than 90 degrees. In other words, comparing to the printed circuit board 420 of the power supply 400 and the LED light strip 200 shown in FIGS. 66 to 69, the printed circuit board 420 of the power supply 400 shown in FIG. 97 relative to the LED light strip 200 rotates about the axial direction of the tube 100 to the angle 82. Based on the configuration that the plane at which the LED light strip 200 locates and the plane at which the printed circuit board 420 of the power supply 400 locates are not parallel with each other and instead intersect on a plane of projection along the axial direction of the tube 100, the heated air heated by the LED light strip 200 and the LED light sources 202 can easily flow through the tube 100 to the end cap 300 so as to further flow through the opening 320 to outside area of the end cap 300, which is beneficial to improve the effect of heat dissipation.

Referring to FIG. 98, the difference between the end caps 300 of FIG. 98 and FIGS. 66 to 69 is the forms of the openings 320. The opening 320 shown in FIG. 98 is, but is not limited to, at the center of the end wall 302. In the assembling process of the LED tube lamp 50, two end caps 300 have to be assembled to two ends of the tube 100. After one of the two end caps 300 is assembled to one end of the tube 100, it is more difficult to have the other end caps 300 assembled to the other end of the tube 100. The reason is that if the inner space of the tube 100 and end caps 300 is sealed or is almost sealed, the pressure inside the tube 100 and end caps 300 increases along with compression of gas inside the tube 100 and end caps 300. More strength is required to assemble the end cap 300 to the tube 100 to against the increased pressure inside the tube 100 and end caps 300, which leads to difficulty of assembling. The opening 320 shown in FIG. 98 can function as a pressure-releasing tunnel. Under the circumstances, gas inside the tube 100 and end caps 300 can be released through the opening 320 during the process of assembling the last one of the two end caps 300 to the tube 100, such that the pressure inside the tube 100 and end caps 300 can be constant. It is beneficial to the assembling process of the LED tube lamp 50 and to improve the efficiency of assembling. On the other hand, if there is no opening on the end caps 300, the pressure inside the tube 100 and the end caps 300 of the LED tube lamp 50 may become negative pressure resulting from the lowering of the temperature inside the tube 100 and the end caps 300. The opening 320 functioning as the pressure-releasing tunnel also allows the outside gas capable of flowing into the tube 100 and the end caps 300 such that the pressure inside the tube 100 and the end caps 300 can remain constant (equal to the pressure outside the tube 100 and the end caps 300); therefore, during a disassembling process of the LED tube lamp 50, the end cap 300 is easily to be disassembled from the tube 100.

In addition, when the LED tube lamp 50 operates, the electronic components of the LED tube lamp 50 keep generating heat such that the temperature inside the LED tube lamp 50 increases. According to the equation of state of a hypothetical ideal gas, the result of multiplication of pressure and volume of gas inside the LED tube lamp 50 increases along with the increase of the temperature. If gas is sealed in the tube 100 and the end caps 300, the volume of the gas is constant. Thus the pressure increases along with the increase of the temperature. Under the circumstances, when the LED tube lamp 50 continuously operates, the electronic components continuously suffer high temperature and high pressure and, consequently, are easily damaged. The opening 320 shown in FIG. 98 can function as a pressure-releasing tunnel. In other words, the expanding gas can be released from the opening 320 when the temperature of the gas inside the LED tube lamp 50 increases, which is beneficial to decrease the pressure inside the LED tube lamp 50.

Referring to FIG. 99, FIG. 99 is a part of a cross section of FIG. 98 along the line D-D'. The difference between FIG. 99 and FIG. 98 is that the LED tube lamp 50 shown in FIG. 99 further comprises a light sensor 450 and a circuit safety switch (not shown). In the embodiment, the light sensor 450 and the circuit safety switch are, but are not limited to, disposed on the printed circuit board 420 of the power supply 400 and are electrically connected to the printed circuit board 420 of the power supply 400. Moreover, the power supply 400 can comprise a built-in electricity source. For example, the power supply 400 can comprise a mini battery; therefore, the power supply 400 can be supplied by the mini battery so as to supply the operation of the light sensor 450 and the circuit safety switch before the LED tube lamp 50 is installed to a lamp base. The circuit safety switch is integrated in the power supply 400. The light sensor 450 is positioned corresponding to the opening 320, and the light sensor 450 is collimated with the opening 320. In different embodiments, the light sensor 450 does not extend into the opening 320. Alternatively, the light sensor 450 can extend into the opening 320. The light sensor 450 can sense light inside the opening 320 or ambient light outside the opening 320 but near the end wall 302. Furthermore, the light sensor 450 can generate sensing signals according to the intensity of the sensed light (e.g., brightness). The sensing signals are transmitted to the circuit safety switch. The circuit safety switch determines whether to close or to open the circuit of the power supply 400 based on the received sensing signals.

How the light sensor 450 and the circuit safety switch work are described below and the description is merely an example but not a limitation. When the brightness sensed by either one of the light sensors 450 of the end caps 300 is greater than a predetermined threshold, the circuit safety switch opens the circuit of the power supply 400. When the brightness sensed by both of the light sensors 450 of the end caps 300 are less than the predetermined threshold, the circuit safety switch closes the circuit of the power supply 400.

For instance, when a user holds the LED tube lamp 50 and is going to install the LED tube lamp 50 to the lamp base 1060 (referring to FIGS. 84 to 86), the end caps 300 at two ends of the LED tube lamp 50 are exposed to the environment and do not obstructed by anything such that the brightness sensed by both of the light sensors 450 of the end caps 300 are greater than the predetermined threshold, the circuit safety switch opens the circuit of the power supply 400. Next, when the user has the hollow conductive pins 301 of the end cap 300 of one end of the LED tube lamp 50 plugged into the conductive sockets 61 of one end of the lamp base 1060, the light sensor 450 in the end cap 300 having been plugged into one end of the lamp base 1060 is obstructed by the lamp base 1060, and, consequently, brightness sensed by the light sensor 450 is less than the predetermined threshold. However, brightness sensed by the light sensor 450 in the other end cap 300 which is not yet plugged into the conductive sockets 1061 is still greater than the predetermined threshold. In the situation, the circuit safety switch still has the circuit of the power supply 400 remain open. Thus there is no risk of electric shock to the user. Finally, when the user properly install the LED tube lamp 50 to the lamp base 60, both of the end caps 300 at two ends of the LED tube lamp 50 are obstructed by the lamp base 60, and brightness sensed by both of the light sensors 450 of the two end caps 300 are less than the predetermined threshold. Under the circumstances that brightness sensed by both of the light sensors 450 of the two end caps 300 are less than the predetermined threshold, the circuit safety switch closes the circuit of the power supply 400, and the power supply 400 of which the circuit is closed can received electricity from the lamp base 60 and can supply the LED light strip 200 and the LED light source 202.

According to the light sensors 450 and the circuit safety switches of the LED tube lamp 50 shown in FIG. 99, under the circumstances that the hollow conductive pins 301 of the end cap 300 of one end of the LED tube lamp 50 is plugged into the conductive sockets 61 of one end of the lamp base 60 and the hollow conductive pins 301 of the end cap 300 of the other end of the LED tube lamp 50 is still exposed to environment, the circuit safety switches automatically open the circuits of the power supply 400 (or have the circuits of the power supply 400 remain open). Thus the user has no risk of electric shock even if the exposed hollow conductive pins 301 are contacted by the user. As a result, safety regarding the use of the LED tube lamp 50 can be ensured.

Referring to FIG. 100 to FIG. 103, FIG. 100 is a perspective view of a LED light strip 200, e.g., a bendable circuit sheet, and a printed circuit board 420 of a power supply 400 soldered to each other and FIG. 101 to FIG. 103 are diagrams of a soldering process of the LED light strip 200 and the printed circuit board 420 of the power supply 400. In the embodiment, the LED light strip 200 and the freely extending end portions 210 have the same structure. The freely extending end portions 210 are the portions of two opposite ends of the LED light strip 200 and are utilized for being connected to the printed circuit board 420. The LED light strip 200 and the power supply 400 are electrically connected to each other by soldering. Two opposite ends of the LED light strip 200 are utilized for being respectively soldered to the printed circuit board 420 of the power supply 400. In other embodiments, only one end of the LED light strip 200 is soldered to the power supply 400. The LED light strip 200 is, but not limited to, a bendable circuit sheet, and the LED light strip 200 comprises a circuit layer 200a and a circuit protecting layer 200c over a side of the circuit layer 200a.

In one embodiment, the LED light strip 200 includes a bendable circuit sheet having a conductive wiring layer and a dielectric layer that are arranged in a stacked manner, wherein the wiring layer and the dielectric layer have same areas (not shown) or the wiring layer has less area than the dielectric layer. The LED light source 202 is disposed on one surface of the wiring layer, the dielectric layer is disposed on the other surface of the wiring layer that is away from the LED light sources 202. The wiring layer is electrically connected to the power supply 400 to carry direct current (DC) signals. Meanwhile, the surface of the dielectric layer away from the wiring layer is fixed to the inner circumferential surface of the tube 100 by means of an adhesive sheet (not shown). The wiring layer can be a metal layer or a power supply layer including wires such as copper wires.

In another embodiment, the outer surface of the wiring layer or the dielectric layer may be covered with a circuit protective layer made of an ink with function of resisting soldering and increasing reflectivity (not shown). Alternatively, the dielectric layer can be omitted and the wiring layer can be directly bonded to the inner circumferential surface of the tube 100, and the outer surface of the wiring layer is coated with the circuit protective layer. Whether the wiring layer has a one-layered, or two-layered structure, the circuit protective layer can be adopted. In some embodiments, the circuit protective layer is disposed only on one side/surface of the LED light strip 200, such as the surface having the LED light source 202. In some embodiments, the bendable circuit sheet is a one-layered structure made of just one wiring layer, or a two-layered structure made of one wiring layer and one dielectric layer, and thus is more bendable or flexible to curl when compared with the conventional three-layered flexible substrate (one dielectric layer sandwiched with two wiring layers). As a result, the bendable circuit sheet of the LED light strip 200 can be installed in a tube with a customized shape or non-tubular shape, and fitly mounted to the inner surface of the tube 100. The bendable circuit sheet closely mounted to the inner surface of the tube 100 is preferable in some cases. In addition, using fewer layers of the bendable circuit sheet improves the heat dissipation and lowers the material cost.

Nevertheless, the bendable circuit sheet is not limited to being one-layered or two-layered; in other embodiments, the bendable circuit sheet may include multiple layers of the wiring layers and multiple layers of the dielectric layers, in which the dielectric layers and the wiring layers are sequentially stacked in a staggered manner, respectively (not shown). These stacked layers are away from the surface of the outermost wiring layer which has the LED light source 202 disposed thereon and is electrically connected to the power supply 400. Moreover, the length of the bendable circuit sheet is greater than the length of the tube 100.

In one embodiment, the LED light strip 200 includes a bendable circuit sheet having in sequence a first wiring layer, a dielectric layer, and a second wiring layer. The thickness of the second wiring layer is greater than that of the first wiring layer, and the length of the LED light strip 200 is greater than that of the tube 100. The end region of the light strip 200 extending beyond the end portion of the tube 100 without disposition of the light source 202 is formed with two separate through holes to respectively electrically communicate the first wiring layer and the second wiring layer. The two separate through holes are not communicated to each other to avoid short.

In this way, the greater thickness of the second wiring layer allows the second wiring layer to support the first wiring layer and the dielectric layer, and meanwhile allow the LED light strip 200 to be mounted onto the inner circumferential surface without being liable to shift or deform, and thus the yield rate of product can be improved. In addition, the first wiring layer and the second wiring layer are in electrical communication such that the circuit layout of the first wiring later can be extended downward to the second wiring layer to reach the circuit layout of the entire LED light strip 200. Moreover, since the land for the circuit layout becomes two-layered, the area of each single layer and therefore the width of the LED light strip 200 can be reduced such that more LED light strips 200 can be put on a production line to increase productivity. Furthermore, the first wiring layer and the second wiring layer of the end region of the LED light strip 200 that extends beyond the end portion of the tube 100 without disposition of the light source 202 can be used to accomplish the circuit layout of a power supply 400 so that the power supply 400 can be directly disposed on the bendable circuit sheet of the LED light strip 200.

Moreover, the LED light strip 200 comprises two opposite surfaces which are a first surface 2001 and a second surface 2002. The first surface 2001 is the one on the circuit layer 200a and away from the circuit protecting layer 200c. The second surface 2002 is the other one on the circuit protecting layer 200c and away from the circuit layer 200a. Several LED light sources 202 are disposed on the first surface 2001 and are electrically connected to circuits of the circuit layer 200a. The circuit protecting layer 200c has less electrical and thermal conductivity but being beneficial to protect the circuits. The first surface 2001 of the LED light strip 200 comprises soldering pads "b". Soldering material "g" can be placed on the soldering pads "b". In the embodiment, the LED light strip 200 further comprises a notch "f". The notch "f" is disposed on an edge of the end of the LED light strip 200 soldered to the printed circuit board 420 of the power supply 400. The printed circuit board 420 comprises a power circuit layer 420a and soldering pads "a". Moreover, the printed circuit board 420 comprises two opposite surfaces which are a first surface 421 and a second surface 422. The second surface 422 is the one on the power circuit layer 420a. The soldering pads "a" are respectively disposed on the first surface 421 and the second surface 422. The soldering pads "a" on the first surface 421 are corresponding to those on the second surface 422. Soldering material "g" can be placed on the soldering pad "a". In the embodiment, considering the stability of soldering and the optimization of automatic process, the LED light strip 200 is disposed below the printed circuit board 420 (the direction is referred to FIG. 101). That is to say, the first surface 2001 of the LED light strip 200 is connected to the second surface 422 of the printed circuit board 420.

As shown in FIG. 102 and FIG. 103, in the soldering process of the LED light strip 200 and the printed circuit board 420, the circuit protecting layer 200c of the LED light strip 200 is placed on a supporting table 52 (i.e., the second surface 2002 of the LED light strip 200 contacts the supporting table 52) in advance. The soldering pads "a" on the second surface 422 of the printed circuit board 420 directly sufficiently contact the soldering pads "b" on the first surface 2001 of the LED light strip 200. And then a thermo-compression heating head 51 presses on a portion where the LED light strip 200 and the printed circuit board 420 are soldered to each other. When soldering, the soldering pads "b" on the first surface 2001 of the LED light strip 200 contact the soldering pads "a" on the second surface 422 of the printed circuit board 420, and the soldering pads "a" on the first surface 421 of the printed circuit board 420 contact the thermo-compression heating head 51. Under the circumstances, the heat from the thermo-compression heating head 51 can directly transmit through the soldering pads "a" on the first surface 421 of the printed circuit board 420 and the soldering pads "a" on the second surface 422 of the printed circuit board 420 to the soldering pads "b" on the first surface 2001 of the LED light strip 200. The transmission of the heat between the thermo-compression heating head 51 and the soldering pads "a" and "b" is not likely to be affected by the circuit protecting layer 200c which has relatively less thermal conductivity, and, consequently, the efficiency and stability regarding the connections and soldering process of the soldering pads "a" and "b" of the printed circuit board 420 and the LED light strip 200 can be improved. As shown in FIG. 102, the printed circuit board 420 and the LED light strip 200 are firmly connected to each other by the soldering material "g". Components between the virtual line M and the virtual line N of FIG. 102 from top to bottom are the soldering pads "a" on the first surface 421 of the printed circuit board 420, the printed circuit board 420, the power circuit layer 420a, the soldering pads "a" on the second surface 422 of the printed circuit board 420, the soldering pads "b" on the first surface 2001 of LED light strip 200, the circuit layer 200a of the LED light strip 200, and the circuit protecting layer 200c of the LED light strip 200. The connection of the printed circuit board 420 and the LED light strip 200 are firm and stable.

In other embodiments, an additional circuit protecting layer can be disposed over the first surface 2001 of the circuit layer 200a. In other words, the circuit layer 200a is sandwiched between two circuit protecting layers 200c, and therefore the first surface 2001 of the circuit layer 200a can be protected by the circuit protecting layer 200c. A part of the circuit layer 200a (the part having the soldering pads "b") is exposed for being connected to the soldering pads "a" of the printed circuit board 420. Under the circumstances, a part of the bottom of the LED light source 202 contacts the circuit protecting layer 200c on the first surface 2001 of the circuit layer 200a, and the other part of the bottom of the LED light source 202 contacts the circuit layer 200a.

In addition, according to the embodiment shown in FIG. 100 to FIG. 103, the printed circuit board 420 further comprises through holes "h" passing through the soldering pads "a". In an automatic soldering process, when the thermo-compression heating head 51 automatically presses the printed circuit board 420, the soldering material "g" on the soldering pads "a" can be pushed into the through holes "h" by the thermo-compression heating head 51 accordingly, which fits the needs of automatic process.

Power supply may be otherwise referred to as a power conversion module/circuit or power module, and encompass the conventional meanings of the term "power supply" commonly understood by one of ordinary skill in the art, including a meaning of "a circuit that converts ac line voltage to dc voltage and supplies power to the LED or LED module". They are called a "power supply" herein as they are for supplying or providing power, from external signal(s) as from AC powerline or a ballast, to the LED module. And these different terms of a "power conversion module/circuit" and a "power module" may be used herein or in future continuing applications to mean/denote the power supply.

As depicted above, in some embodiments, power supply 5 may include a printed circuit board and electronic components. The electronic components have at least one inductor, transistor, capacitor, resistor, or integrated circuit on the first surface of the printed circuit board. The expression of "have at least one . . . or" in the disclosure excluding its parent and child applications means at least one, or any combination thereof. For example, the electronic components may comprise one inductor. The electronic components may comprise two inductors. The electronic components may comprise one resistor. The electronic components may comprise two resistors. The electronic components may comprise one transistor. The electronic components may comprise one integrated circuit. The electronic components may comprise one integrated circuit and one resistor. Alternatively, the electronic components may comprise any combination of at least two of an inductor, a transistor, a capacitor, a resistor, and an integrated circuit. In other words, electronic components may be at least one selected from the group consisting essentially of an inductor, a transistor, a capacitor, a resistor, and an integrated circuit.

If any terms in this application conflict with terms used in any application(s) from which this application claims priority, or terms incorporated by reference into this application or the application(s) from which this application claims priority, a construction based on the terms as used or defined in this application should be applied.

The above-mentioned features of the present invention can be accomplished in any combination to improve the LED tube lamp, and the above embodiments are described by way of example only. The present invention is not herein limited, and many variations are possible without departing from the spirit of the present invention and the scope as defined in the appended claims.

What is claimed is:

1. An LED tube lamp, comprising:
   a glass tube having two ends;
   two end caps respectively attached at the two ends of the glass tube, each of the two end caps comprising a lateral wall and an end wall, the lateral wall being substantially coaxial with the glass tube and connected to the glass tube, the end wall being substantially perpendicular to an axial direction of the lateral wall and connected to an end of the lateral wall away from the glass tube, wherein the end wall comprises an insulating portion made of an insulating material;
   an LED light strip attached to an inner circumferential surface of the glass tube by a glue, wherein at least two first connecting pads are arranged at an end of the LED light strip in one of the two end caps;
   a plurality of LED light sources mounted on the LED light strip; and
   a power supply module electrically connected to the LED light strip and configured to drive the plurality of LED light sources, the power supply module comprising a printed circuit board separated from the LED light strip, the printed circuit board comprising a first surface and a second surface opposite to and substantially parallel to the first surface, and the first surface and the second surface of the printed circuit board being substantially parallel with the axial direction of the lateral wall, wherein the power supply module further comprises a plurality of electronic components mounted on the printed circuit board;

wherein the power supply module comprises a rectifying circuit and a filtering circuit electrically connected to the rectifying circuit, the rectifying circuit has at least two input terminals and is configured to rectify a signal received from the at least two input terminals;

wherein the power supply module comprises an integrated circuit disposed on the first surface of the printed circuit board, and at least two second connecting pads are arranged on the first surface of the printed circuit board and electrically connected to the at least two first connecting pads, respectively.

2. The LED tube lamp according to claim 1, wherein the LED light strip comprises a protective layer disposed on a surface thereof on which the plurality of LED light sources being disposed, and the other surface of the LED light strip is attached to the inner circumferential surface of the glass tube by the glue.

3. The LED tube lamp according to claim 2, wherein the printed circuit board is disposed on the end of the LED light strip.

4. The LED tube lamp according to claim 3, wherein the at least two first connecting pads are arranged on the end of the LED light strip, and the printed circuit board is disposed on the two first connecting pads.

5. The LED tube lamp according to claim 4, wherein the power supply module further comprises a resistor positioned close to an end wall of one of the two end caps and connected to one of the at least two input terminals of the rectifying circuit.

6. The LED tube lamp according to claim 5, wherein the resistor is a fuse resistor.

7. The LED tube lamp according to claim 5, wherein an outer diameter of each of the lateral walls is substantially the same as an outer diameter of the glass tube.

8. The LED tube lamp according to claim 7, wherein the rectifying circuit comprises:
a first full-wave bridge rectifying circuit, having two input terminals electrically connected to two conductive pins of one of the two end caps, respectively, and having a positive output terminal and a negative output terminal; and
a second full-wave bridge rectifying circuit, having two input terminals electrically connected to two conductive pins of the other one of the two end caps, respectively, and having a positive output terminal and a negative output terminal,
wherein the positive output terminal of the first full-wave bridge rectifying circuit and the positive output terminal of the second full-wave bridge rectifying circuit are electrically connected to each other, and the negative output terminal of the first full-wave bridge rectifying circuit and the negative output terminal of the second full-wave bridge rectifying circuit are electrically connected to each other.

9. The LED tube lamp according to claim 8, wherein the filtering circuit comprises:
an inductor, wherein an end of the inductor is electrically connected to the positive output terminal of the first full-wave bridge rectifying circuit and the positive output terminal of the second full-wave bridge rectifying circuit, and the other end of the inductor is regarded as one of filtering output terminals of the filtering circuit;
a first capacitor, wherein an end of the first capacitor is electrically connected to one end of the inductor, and the other end of the first capacitor is electrically connected to the negative output terminal of the first full-wave bridge rectifying circuit and the negative output terminal of the second full-wave bridge rectifying circuit; and
a second capacitor, wherein an end of the second capacitor is electrically connected to the other end of the inductor, and the other end of the second capacitor is regarded as the other one of the filtering output terminals of the filtering circuit.

10. The LED tube lamp according to claim 7, wherein the rectifying circuit comprises:
a full-wave bridge rectifying circuit, having two input terminals electrically connected to two conductive pins of one of the two end caps, respectively, and having a positive output terminal and a negative output terminal; and
a half-wave bridge rectifying circuit, having an input terminal electrically connected to one of two conductive pins of the other one of the two end caps, and having a positive output terminal and a negative output terminal,
wherein the positive output terminal of the full-wave bridge rectifying circuit and the positive output terminal of the half-wave bridge rectifying circuit are electrically connected to each other, and the negative output terminal of the full-wave bridge rectifying circuit and the negative output terminal of the half-wave bridge rectifying circuit are electrically connected to each other.

11. The LED tube lamp according to claim 10, wherein the filtering circuit comprises:
a first capacitor, wherein an end of the first capacitor is electrically connected to the positive output terminal of the full-wave bridge rectifying circuit and the positive output terminal of the half-wave bridge rectifying circuit, and the other end of the first capacitor is electrically connected to the negative output terminal of the full-wave bridge rectifying circuit and the negative output terminal of the half-wave bridge rectifying circuit.

12. The LED tube lamp according to claim 11, wherein the filtering circuit further comprises:
an inductor, wherein an end of the inductor is electrically connected to the end of the first capacitor, and the other end of the inductor is regarded as one of filtering output terminals of the filtering circuit; and
a second capacitor, wherein an end of the second capacitor is electrically connected to the other end of the inductor, and the other end of the second capacitor is regarded as the other one of the filtering output terminals of the filtering circuit.

13. The LED tube lamp according to claim 11, wherein the filtering circuit further comprises:
an EMI-reducing capacitor, coupled between two conductive pins of one of the two end caps.

14. The LED tube lamp according to claim 7, wherein the power supply module further comprises a driving circuit electrically connected to filtering output terminals of the filtering circuit and has two driving output terminals electrically connected to the LED light strip; and wherein the driving circuit further comprises:

a controller;
a diode, having an anode electrically connected to one of the filtering output terminals and one of the two driving output terminals;
a switch, having a first terminal coupled to the other one of the filtering output terminals, a second terminal electrically connected to a cathode of the diode, and a control terminal coupled to the controller, wherein the switch is turned on or off in response to a signal received from the controller; and
an inductor, wherein an end of the inductor is electrically connected to the second terminal of the switch, and the other end of the inductor is electrically connected to the LED light strip via the other one of the two driving output terminals.

15. The LED tube lamp according to claim 14, wherein the driving circuit further comprises:
a capacitor, electrically connected between the two driving output terminals.

16. The LED tube lamp according to claim 7, wherein the power supply module further comprises a driving circuit electrically connected to filtering output terminals of the filtering circuit and has two driving output terminals electrically connected to the LED light strip; and wherein the driving circuit further comprises:
a controller;
a diode, having an anode electrically connected to one of the filtering output terminals and one of the two driving output terminals;
a switch, having a first terminal coupled to a cathode of the diode, a second terminal coupled to the other one of the filtering output terminals, and a control terminal coupled to the controller, wherein the switch is turned on or off in response to a signal received from the controller; and
an inductor, wherein an end of the inductor is electrically connected to the first terminal of the switch and the anode of the diode, and the other end of the inductor is electrically connected to the LED light strip via the other one of the two driving output terminals.

17. The LED tube lamp according to claim 7, wherein the power supply module further comprises a first circuit electrically connected between the rectifying circuit and the filtering circuit to cause a delay before the LED tube lamp lights up.

18. The LED tube lamp according to claim 17, wherein the first circuit comprises a capacitor configured to be charged when an AC driving signal is provided to the LED tube lamp to cause the LED tube lamp to conduct when a voltage of the capacitor exceeds a threshold trigger voltage.

19. The LED tube lamp according to claim 18, wherein the LED tube lamp is delayed to light up by 0.1 to 3 seconds.

20. An LED tube lamp, comprising:
a glass tube having two ends;
two end caps respectively attached at the two ends of the glass tube, each of the two end caps comprising a lateral wall and an end wall, the lateral wall being substantially coaxial with the glass tube and connected to the glass tube, the end wall being substantially perpendicular to an axial direction of the lateral wall and connected to an end of the lateral wall away from the glass tube, wherein the end wall comprises an insulating portion made of an insulating material;
an LED light strip attached to an inner circumferential surface of the glass tube by a glue, wherein at least two first connecting pads are arranged at an end of the LED light strip in one of the two end caps;
a plurality of LED light sources mounted on the LED light strip; and
a power supply module electrically connected to the LED light strip and configured to drive the plurality of LED light sources, the power supply module comprising a printed circuit board separated from the LED light strip, the printed circuit board comprising a first surface and a second surface opposite to and substantially parallel to the first surface, and the first surface and the second surface of the printed circuit board being substantially parallel with the axial direction of the lateral wall, wherein the power supply module further comprises a plurality of electronic components mounted on the printed circuit board;
wherein the power supply module comprises a rectifying circuit and a filtering circuit electrically connected to the rectifying circuit, the rectifying circuit has at least two input terminals and is configured to rectify a signal received from the at least two input terminals;
wherein the power supply module comprises an integrated circuit disposed on the first surface of the printed circuit board, and at least two second connecting pads are arranged on the second surface of the printed circuit board and electrically connected to the at least two first connecting pads, respectively.

21. The LED tube lamp according to claim 20, wherein the LED light strip comprises a protective layer disposed on a surface thereof on which the plurality of LED light sources being disposed, and the other surface of the LED light strip is attached to the inner circumferential surface of the glass tube by the glue.

22. The LED tube lamp according to claim 21, wherein the printed circuit board is disposed on the end of the LED light strip.

23. The LED tube lamp according to claim 22, wherein the at least two first connecting pads are arranged on the end of the LED light strip, and the printed circuit board is disposed on the two first connecting pads.

24. The LED tube lamp according to claim 23, wherein the power supply module further comprises a resistor positioned close to an end wall of one of the two end caps and connected to one of the at least two input terminals of the rectifying circuit.

25. The LED tube lamp according to claim 24, wherein the resistor is a fuse resistor.

26. The LED tube lamp according to claim 24, wherein an outer diameter of each of the lateral walls is substantially the same as an outer diameter of the glass tube.

27. The LED tube lamp according to claim 26, wherein the rectifying circuit comprises:
a first full-wave bridge rectifying circuit, having two input terminals electrically connected to two conductive pins of one of the two end caps, respectively, and having a positive output terminal and a negative output terminal; and
a second full-wave bridge rectifying circuit, having two input terminals electrically connected to two conductive pins of the other one of the two end caps, respectively, and having a positive output terminal and a negative output terminal,
wherein the positive output terminal of the first full-wave bridge rectifying circuit and the positive output terminal of the second full-wave bridge rectifying circuit are electrically connected to each other, and the negative output terminal of the first full-wave bridge rectifying circuit and the negative output terminal of the second full-wave bridge rectifying circuit are electrically connected to each other.

28. The LED tube lamp according to claim 27, wherein the filtering circuit comprises:
   an inductor, wherein an end of the inductor is electrically connected to the positive output terminal of the first full-wave bridge rectifying circuit and the positive output terminal of the second full-wave bridge rectifying circuit, and the other end of the inductor is regarded as one of filtering output terminals of the filtering circuit;
   a first capacitor, wherein an end of the first capacitor is electrically connected to one end of the inductor, and the other end of the first capacitor is electrically connected to the negative output terminal of the first full-wave bridge rectifying circuit and the negative output terminal of the second full-wave bridge rectifying circuit; and
   a second capacitor, wherein an end of the second capacitor is electrically connected to the other end of the inductor, and the other end of the second capacitor is regarded as the other one of the filtering output terminals of the filtering circuit.

29. The LED tube lamp according to claim 26, wherein the rectifying circuit comprises:
   a full-wave bridge rectifying circuit, having two input terminals electrically connected to two conductive pins of one of the two end caps, respectively, and having a positive output terminal and a negative output terminal; and
   a half-wave bridge rectifying circuit, having an input terminal electrically connected to one of two conductive pins of the other one of the two end caps, and having a positive output terminal and a negative output terminal,
   wherein the positive output terminal of the full-wave bridge rectifying circuit and the positive output terminal of the half-wave bridge rectifying circuit are electrically connected to each other, and the negative output terminal of the full-wave bridge rectifying circuit and the negative output terminal of the half-wave bridge rectifying circuit are electrically connected to each other.

30. The LED tube lamp according to claim 29, wherein the filtering circuit comprises:
   a first capacitor, wherein an end of the first capacitor is electrically connected to the positive output terminal of the full-wave bridge rectifying circuit and the positive output terminal of the half-wave bridge rectifying circuit, and the other end of the first capacitor is electrically connected to the negative output terminal of the full-wave bridge rectifying circuit and the negative output terminal of the half-wave bridge rectifying circuit.

31. The LED tube lamp according to claim 30, wherein the filtering circuit further comprises:
   an inductor, wherein an end of the inductor is electrically connected to the end of the first capacitor, and the other end of the inductor is regarded as one of filtering output terminals of the filtering circuit; and
   a second capacitor, wherein an end of the second capacitor is electrically connected to the other end of the inductor, and the other end of the second capacitor is regarded as the other one of the filtering output terminals of the filtering circuit.

32. The LED tube lamp according to claim 30, wherein the filtering circuit further comprises:
   an EMI-reducing capacitor, coupled between two conductive pins of one of the two end caps.

33. The LED tube lamp according to claim 26, wherein the power supply module further comprises a driving circuit electrically connected to filtering output terminals of the filtering circuit and has two driving output terminals electrically connected to the LED light strip; and wherein the driving circuit further comprises:
   a controller;
   a diode, having an anode electrically connected to one of the filtering output terminals and one of the two driving output terminals;
   a switch, having a first terminal coupled to the other one of the filtering output terminals, a second terminal electrically connected to a cathode of the diode, and a control terminal coupled to the controller, wherein the switch is turned on or off in response to a signal received from the controller; and
   an inductor, wherein an end of the inductor is electrically connected to the second terminal of the switch, and the other end of the inductor is electrically connected to the LED light strip via the other one of the two driving output terminals.

34. The LED tube lamp according to claim 33, wherein the driving circuit further comprises:
   a capacitor, electrically connected between the two driving output terminals.

35. The LED tube lamp according to claim 26, wherein the power supply module further comprises a driving circuit electrically connected to filtering output terminals of the filtering circuit and has two driving output terminals electrically connected to the LED light strip; and wherein the driving circuit further comprises:
   a controller;
   a diode, having an anode electrically connected to one of the filtering output terminals and one of the two driving output terminals;
   a switch, having a first terminal coupled to a cathode of the diode, a second terminal coupled to the other one of the filtering output terminals, and a control terminal coupled to the controller, wherein the switch is turned on or off in response to a signal received from the controller; and
   an inductor, wherein an end of the inductor is electrically connected to the first terminal of the switch and the anode of the diode, and the other end of the inductor is electrically connected to the LED light strip via the other one of the two driving output terminals.

36. The LED tube lamp according to claim 26, wherein the power supply module further comprises a first circuit electrically connected between the rectifying circuit and the filtering circuit to cause a delay before the LED tube lamp lights up.

37. The LED tube lamp according to claim 36, wherein the first circuit comprises a capacitor configured to be charged when an AC driving signal is provided to the LED tube lamp to cause the LED tube lamp to conduct when a voltage of the capacitor exceeds a threshold trigger voltage.

38. The LED tube lamp according to claim 37, wherein the LED tube lamp is delayed to light up by 0.1 to 3 seconds.

* * * * *